(12) United States Patent
Baek et al.

(10) Patent No.: US 9,923,746 B2
(45) Date of Patent: Mar. 20, 2018

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG ELECTRONICS INC., Seoul (KR)

(72) Inventors: Jongseob Baek, Seoul (KR); Woosuk Ko, Seoul (KR); Seoyoung Back, Seoul (KR); Sungryong Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/402,796

(22) Filed: Jan. 10, 2017

(65) Prior Publication Data

US 2017/0149596 A1    May 25, 2017

Related U.S. Application Data

(63) Continuation of application No. 14/830,346, filed on Aug. 19, 2015, now Pat. No. 9,571,319.

(60) Provisional application No. 62/097,138, filed on Dec. 29, 2014, provisional application No. 62/097,558, filed on Dec. 29, 2014, provisional application No. 62/098,318, filed on Dec. 30, 2014, provisional application No. 62/099,592, filed on Jan. 5, 2015.

(51) Int. Cl.
*H04L 1/02*        (2006.01)
*H04L 27/26*      (2006.01)
*H04L 1/00*        (2006.01)

(52) U.S. Cl.
CPC ........ *H04L 27/2627* (2013.01); *H04L 1/0071* (2013.01); *H04L 27/2602* (2013.01)

(58) Field of Classification Search
CPC . H04L 1/0003; H04L 1/0071; H04L 27/2627; H04L 1/0057; H04L 27/26; H04B 7/0413; H04B 1/707
USPC ........................................ 375/295, 260, 340
See application file for complete search history.

(56) References Cited

U.S. PATENT DOCUMENTS

| | | |
|---|---|---|
| 7,668,257 B2 | 2/2010 | Limberg |
| 9,009,775 B2 | 4/2015 | Ko et al. |
| 2002/0174398 A1 | 11/2002 | Furutani |
| 2003/0152020 A1 | 8/2003 | Schulze et al. |

(Continued)

FOREIGN PATENT DOCUMENTS

| | | |
|---|---|---|
| CN | 103780568 A | 5/2014 |
| KR | 10-2002-0031009 | 4/2002 |

(Continued)

*Primary Examiner* — Khai Tran
(74) *Attorney, Agent, or Firm* — Dentons US LLP

(57) ABSTRACT

A method and an apparatus for transmitting broadcast signals thereof are disclosed. The apparatus for transmitting broadcast signals, the apparatus comprises an encoder to encode service data, a time interleaver to interleave the encoded service data, a frame builder to build at least one signal frame including the time interleaved service data, wherein the at least one signal frame includes a plurality of OFDM symbols, a modulator to modulate data in the built at least one signal frame by an OFDM (Orthogonal Frequency Division Multiplex) scheme, and a transmitter to transmit the broadcast signals having the modulated data.

8 Claims, 128 Drawing Sheets

(56) References Cited

U.S. PATENT DOCUMENTS

| | | |
|---|---|---|
| 2007/0064588 A1 | 3/2007 | Kisoda et al. |
| 2008/0025424 A1 | 1/2008 | Yang et al. |
| 2008/0317175 A1 | 12/2008 | Ito |
| 2010/0251078 A1 | 9/2010 | Yokokawa et al. |
| 2011/0274204 A1 | 11/2011 | Ko et al. |
| 2011/0280327 A1 | 11/2011 | Ko et al. |
| 2012/0278498 A1 | 11/2012 | Zink et al. |
| 2012/0327955 A1 | 12/2012 | Herrmann et al. |
| 2013/0216001 A1 | 8/2013 | Petrov |
| 2013/0235952 A1 | 9/2013 | Ko et al. |
| 2013/0321672 A1* | 12/2013 | Silverstein ............ H04N 5/365 348/241 |
| 2014/0334570 A1 | 11/2014 | Baek |
| 2014/0341103 A1 | 11/2014 | Hwang et al. |
| 2014/0376658 A1 | 12/2014 | Baek et al. |
| 2015/0003538 A1 | 1/2015 | Baek et al. |
| 2015/0016453 A1 | 1/2015 | Kim et al. |
| 2015/0020143 A1 | 1/2015 | Kim et al. |
| 2015/0030100 A1 | 1/2015 | Hwang et al. |
| 2015/0043672 A1 | 2/2015 | Kim et al. |
| 2015/0049711 A1 | 2/2015 | Hwang et al. |
| 2015/0078477 A1 | 3/2015 | Hong et al. |
| 2015/0092881 A1 | 4/2015 | Hwang et al. |
| 2015/0139353 A1 | 5/2015 | Beek et al. |
| 2015/0146608 A1 | 5/2015 | Kim et al. |
| 2015/0288554 A1 | 10/2015 | Baek et al. |
| 2015/0349813 A1 | 12/2015 | Baek et al. |
| 2015/0349871 A1 | 12/2015 | Baek et al. |
| 2015/0349872 A1 | 12/2015 | Baek et al. |
| 2015/0349925 A1 | 12/2015 | Baek et al. |
| 2015/0349997 A1 | 12/2015 | Baek et al. |
| 2016/0050048 A1 | 2/2016 | Baek et al. |
| 2016/0212042 A1* | 7/2016 | Kwon ..................... H04L 69/04 |

FOREIGN PATENT DOCUMENTS

| | | |
|---|---|---|
| KR | 10-2010-0005068 | 1/2010 |
| KR | 10-2011-0129380 A | 12/2011 |
| WO | 2012-138180 A2 | 10/2012 |
| WO | 2014-193160 A1 | 12/2014 |

* cited by examiner

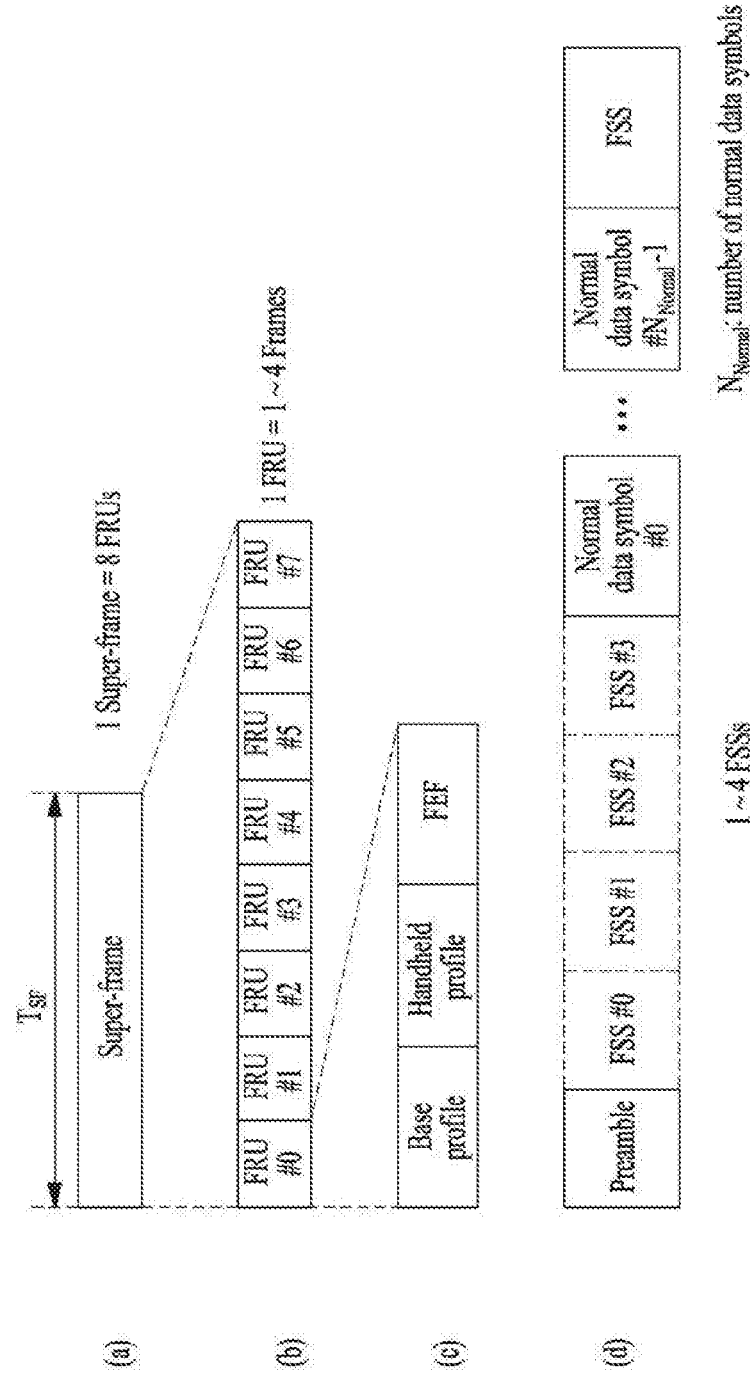

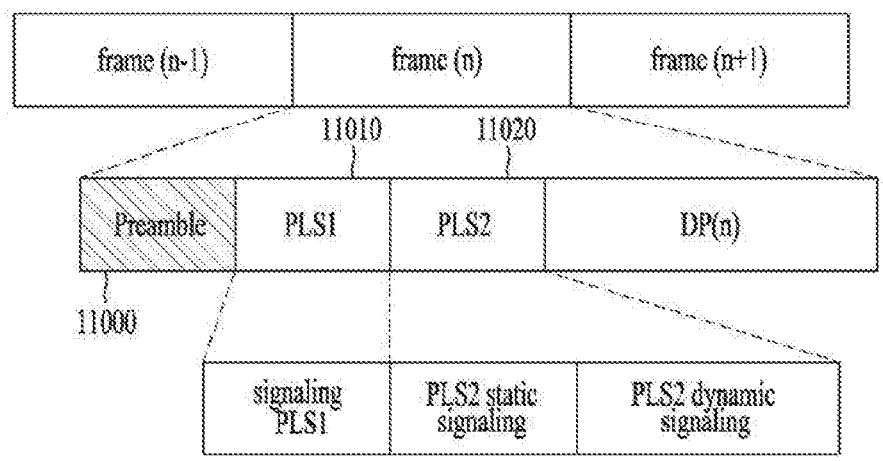

FIG. 13

| Content | Bits |
|---|---|
| PREAMBLE_DATA<br>NUM_FRAME_FRU<br>PAYLOAD_TYPE<br>NUM_FSS<br>SYSTEM_VERSION | 20<br>2<br>3<br>2<br>8 |
| CELL_ID<br>NETWORK_ID<br>SYSTEM_ID | 16<br>16<br>16 |
| for i = 0:3<br>    FRU_PHY_PROFILE<br>    FRU_FRAME_LENGTH<br>    FRU_GI_FRACTION<br>    RESERVED<br>end | <br>3<br>2<br>3<br>4 |
| PLS2_FEC_TYPE<br>PLS2_MOD<br>PLS2_SIZE_CELL<br>PLS2_STAT_SIZE_BIT<br>PLS2_SYN_SIZE_BIT<br>PLS2_REP_FLAG<br>PLS2_REP_SIZE_CELL<br>PLS2_NEXT_FEC_TYPE<br>PLS2_NEXT_MODE<br>PLS2_NEXT_REP_FLAG<br>PLS2_NEXT_REP_SIZE_CELL<br>PLS2_NEXT_REP_STAT_SIZE_BIT<br>PLS2_NEXT_REP_DYN_SIZE_BIT<br>PLS2_AP_MODE<br>PLS2_AP_SIZE_CELL<br>PLS2_NEXT_AP_MODE<br>PLS2_NEXT_AP_SIZE_CELL | 2<br>3<br>15<br>14<br>14<br>1<br>15<br>2<br>3<br>1<br>15<br>14<br>14<br>2<br>15<br>2<br>15 |
| RESERVED<br>CRC_32 | 32<br>32 |

FIG. 14

| Content | Bits |
|---|---|
| FIC_FLAG | 1 |
| AUX_FLAG | 1 |
| NUM_DP | 6 |
| for i = 1: NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
|     if DP_PAYLOAD_TYPE == TS('00') | |
|         DNP_MODE | 2 |
|         ISSY_MODE | 2 |
|         HC_MODE_TS | 2 |
|         if HC_MODE_TS == '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG == 1 | |
|     FIC_VERSION | 8 |
|     FIC_LENGTH_BYTE | 13 |
|     RESERVED | 8 |
| end | |
| if AUX_FLAG == 1 | |
|     NUM_AUX | 4 |
|     AUX_CONFIG_RFU | 8 |
|     for - 1: NUM_AUX | |
|         AUX_STREAM_TYPE | 4 |
|         AUX_PRIVATE_CONF | 28 |
|     end | |
| end | |

| Content | Bit |
|---|---|
| FRAME_INDEX | 5 |
| PLS_CHANGE_COUNTER | 4 |
| FIC_CHANGE_COUNTER | 4 |
| RESERVED | 16 |
| for i = 1:NUM_DP | |
| DP_ID | 6 |
| DP_START | 15 (or 13) |
| DP_NUM_BLOCK | 10 |
| end　　　RESERVED | 8 |
| EAC_FLAG | 1 |
| EAS_WAKE_UP_VERSION_NUM | 8 |
| if EAC_FLAG == 1 | |
| EAC_LENGTH_BYTE | 12 |
| else | |
| EAC_COUNTER | 12 |
| end | |
| for i=1:NUM_AUX | |
| AUX_PRIVATE_DYN | 48 |
| end | |
| CRC 32 | 32 |

FIG. 57
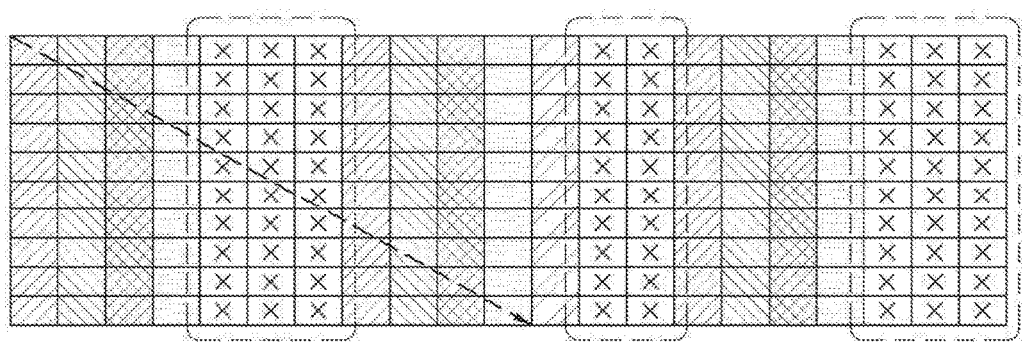
IF-0
skip operation
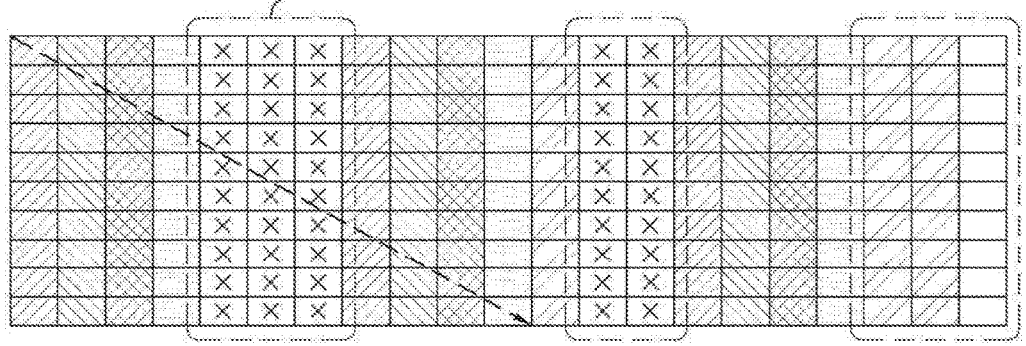
IF-1
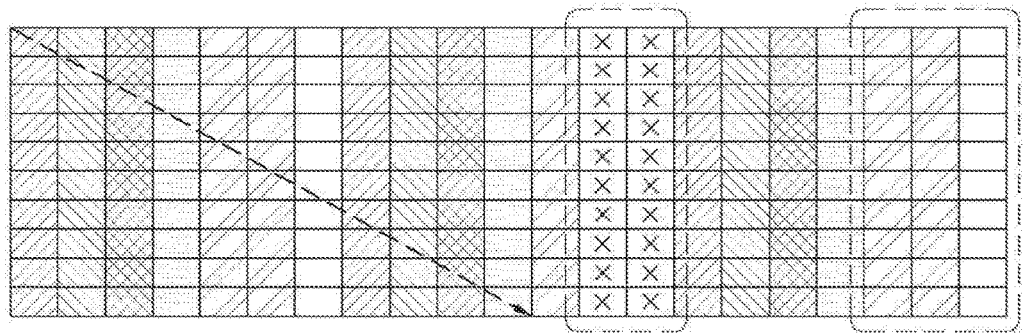
IF-2

FIG. 64 for $0 \leq k \leq N_{cells} N'_{BLOCKTI} - 1$
$\quad r_k = mod(k, N_{cells})$,
$\quad t_k = mod(S_T \times r_k, N'_{BLOCKTI})$,
$\quad c_k = mod\left(t_{j,k} + \left\lfloor \dfrac{k}{N_{cells}} \right\rfloor, N'_{BLOCKTI}\right)$,
$\quad \pi(k) = N_{cells} c_k + r_k$
end
where $S_T$ is defined as
$$S_T = \dfrac{N'_{BLOCKTI} - 1}{2} + 1 \text{ for } \begin{cases} N'_{BLOCKTI} = N_{BLOCKTI} + 1, & \text{if } N_{BLOCKTI} \bmod 2 = 0 \\ N'_{BLOCKTI} = N_{BLOCKTI} & \text{if } N_{BLOCKTI} \bmod 2 = 1 \end{cases}$$

$\pi(k)$ : the k-th address for reading memory data
$S_T$ : shift value for use in interleaving (constant value)

FIG. 65

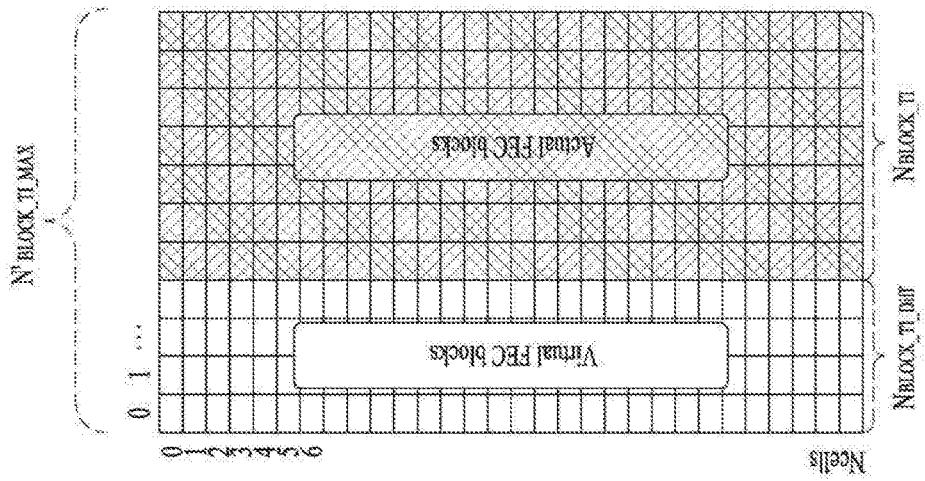

$N'_{BLOCK\_TI\_MAX}$ : Maximum number of FEC blocks in a TI group $N_{BLOCK\_TI}$ : The actual number of FEC blocks in a TI group $N_{BLOCK\_TI\_Diff} = N'_{BLOCK\_TI\_MAX} - N_{BLOCK\_TI}$ $\begin{cases} N'_{BLOCKTI\_MAX} = N_{BLOCKTI\_MAX}+1, & \text{if } N_{BLOCKTI\_MAX} \bmod 2 = 0 \\ N'_{BLOCKTI\_MAX} = N_{BLOCKTI\_MAX}, & \text{if } N_{BLOCKTI\_MAX} \bmod 2 = 1 \end{cases}$ $N_{BLOCKTI\_Diff,j} = N'_{BLOCKTI\_MAX} - N_{BLOCKTI,j}$

FIG. 66 for $0 \leq k < N_{cells} N'_{BLOCK\_T1\_MAX} - 1$
$r_k = mod(k, N_{cells})$,
$t_k = mod(S_T \times r_k, N'_{BLOCK\_T1\_MAX})$,
$c_k = mod(t_k + \left\lfloor \frac{k}{N_{cells}} \right\rfloor, N'_{BLOCK\_T1\_MAX})$,
$V(k) = N_{cells} c_k + r_k$
if $V(k) \geq N_{cells} N_{BLOCK\_T1\_Diff}$       Skip virtual FEC blocks
    $\pi(C_{cnt}) = O(k)$,
    $C_{cnt} = C_{cnt} + 1$,
  end
end
where
$C_{cnt} = 0$,
$S_T = \frac{N'_{BLOCK\_T1\_MAX} - 1}{2} + 1$ for $\begin{cases} N'_{BLOCK\_T1\_MAX} = N_{BLOCK\_T1\_MAX} + 1, & \text{if } N_{BLOCK\_T1\_MAX} \bmod 2 = 0 \\ N'_{BLOCK\_T1\_MAX} = N_{BLOCK\_T1\_MAX}, & \text{if } N_{BLOCK\_T1\_MAX} \bmod 2 = 1, \end{cases}$
$N_{BLOCK\_T1\_Diff} = N'_{BLOCK\_T1\_MAX} - N_{BLOCK\_T1}$

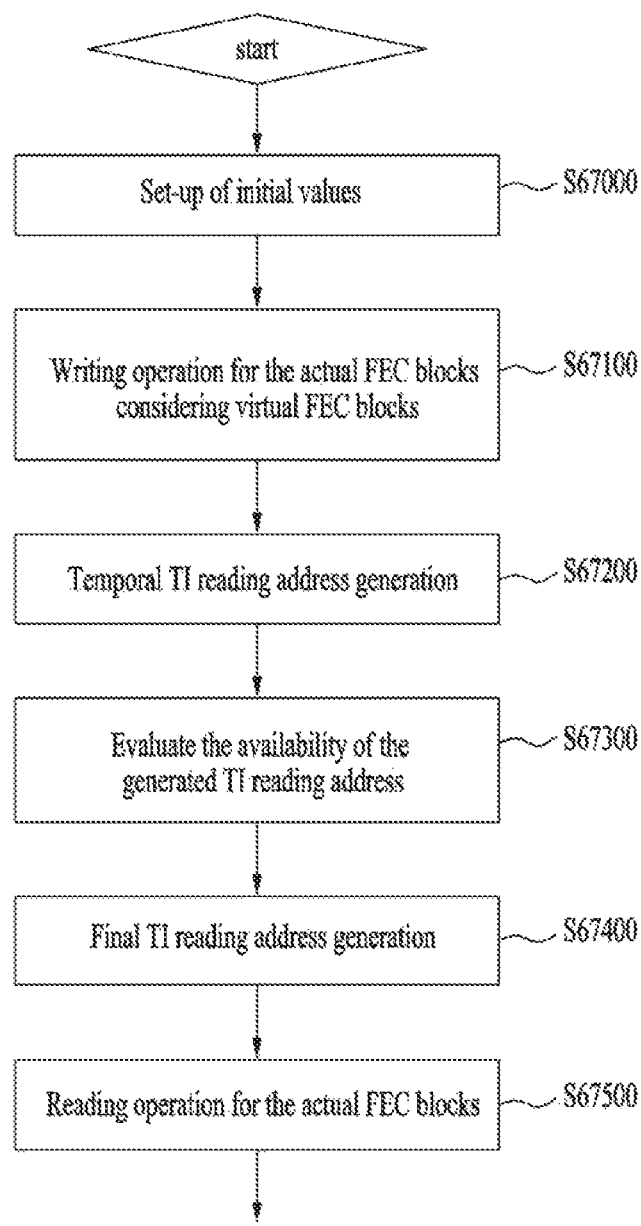

FIG. 74 for $0 \leq k \leq N_{cells}N'_{BLOCKTI\_MAX}-1$
$r_k = mod(k, N_{cells})$,
$t_k = mod(S_R \times r_k, N'_{BLOCKTI\_MAX})$,
$c_k = mod(t_k + \lfloor \frac{k}{N_{cells}} \rfloor, N'_{BLOCKTI\_MAX})$,
$V(k) = N_{cells}c_k + r_k$,     *Skip virtual FEC blocks* if $V(k) \geq N_{cells}N_{BLOCKTI\_Diff}$
  $\pi(C_{ent}) = \theta(k)$,
  $C_{ent} = C_{ent} + 1$,
 end end
where
$C_{ent} = 0$,
$S_R = N'_{BLOCKTI\_MAX} - S_T$,
$N_{BLOCKTI\_Diff} = N'_{BLOCKTI\_MAX} - N_{BLOCKTI}$ Time interleaver (TX)　　　　Time deinterleaver (RX)

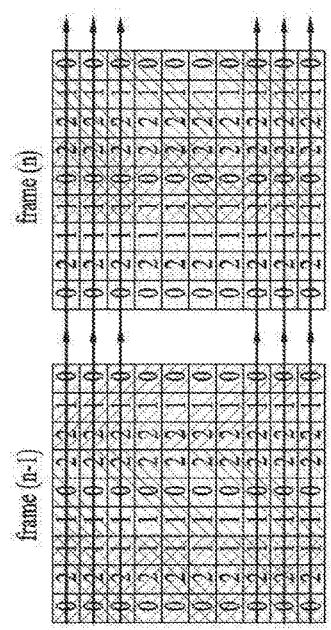
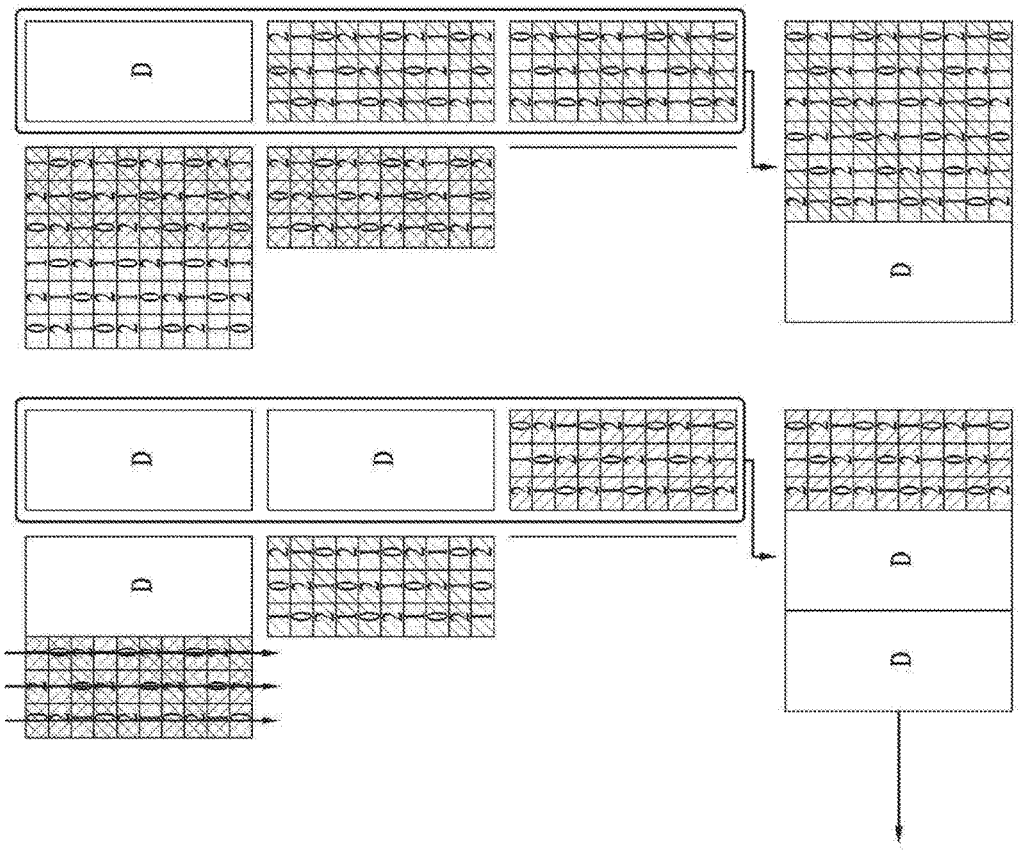
FIG. 82

| PLP_NUM | 1 | >1 |
|---|---|---|
| Interleaving type | CI | CI+BI |

<Hybrid TI structure: example-1>

<Hybrid TI structure: example-2>

<Hybrid TDI structure: example-1>

<Hybrid TDI structure: example-2>

FIG. 96

1. The input FEC block shall be the data cells G(r) of the FEC block of index r:
$$G(r) = [g_{r,0}, g_{r,1}, g_{r,2}, \cdots, g_{r,Ncells-2}, g_{r,Ncells-1}]$$

2. The input FEC block shall be the data cells G(r) of the FEC block of index r:
$$T(r) = [t_{r,0}, t_{r,1}, t_{r,2}, \cdots, t_{r,Ncells-2}, t_{r,Ncells-1}]$$

3. The interleaving processor is defined as $$\boxed{t_{r,q} = g_{r,L_r(q)}, \text{ for } q = 0, \cdots, N_{cells}-1}$$

where $L_{r(q)}$ is a permutation function and it is given by
$$L_{r(q)} = [L_0(q) + P(r)] \bmod N_{cells}$$

where $L_{r(q)}$ is the basic permutation function and
$P_{(r)}$ is a shift value to be used in the rth FEC block of the TI-block

FIG. 97

- Multiple-PLP (M-PLP)
  - Change interleaving sequence every FEC block within an interleaving frame
    $$t_{r,q} = g_{r,L_r(q)}, \text{ for } q = 0, \cdots, N_{cells}-1$$
    where $L_{r(q)}$ is a permutation function and it is given by
    $$L_{r(q)} = [L_0(q) + \boxed{P(r)}] \bmod N_{cells}$$
    where $L_{0(q)}$ is the basic permutation function and
    $P_{(r)}$ is a shift value to be used in the rth FEC block of the TI-block.

- Single-PLP (S-PLP)
  - Fix interleaving sequence
    $$L_{r(q)} = [L_0(q) + \boxed{P(0)}] \bmod N_{cells}$$

FIG. 99

```
for 0 ≤ k ≤ N_cells N'_FEC_TI_max - 1
    r_k = mod (k, N_cells),
    t_k = mod (S_T × r_k, N'_FEC_TI_max),
    c_k = mod (t_k + ⌊k/N_cells⌋, N'_FEC_TI_max),
    θ_k = N_row × c_k + r_k, if  θ_k ≥ N_cells N_FEC_TI_Diff
        π(C_cnt) = θ_k,
        C_cnt = C_cnt + 1,
    end                    skip operation
end
``` where $C_{cnt} = 0$, and $S_T$ is a shift value is defined as $$S_T = \frac{N'_{FEC\_TI\_max} - 1}{2} + 1$$

$N_{FEC\_TI\_max} = 2, N_{FEC\_TI} = 2, N_{cells} = 6$

1. $N_{FEC\_TI\_max}$ is the max. FEC number contained in a TI block

2. $N_{IU}$ : the number of interleaving units (IUs).

3. $L_{IU} \in \{L_{IU,min}, L_{IU,min}+1\}$ : a row size of an IU
   where $L_{IU,min}$ is the minimum IU length and it is defined as 4. $L_{IU,min} = \left\lfloor \dfrac{N_{cells}}{N_{IU}} \right\rfloor$

FIG. 105

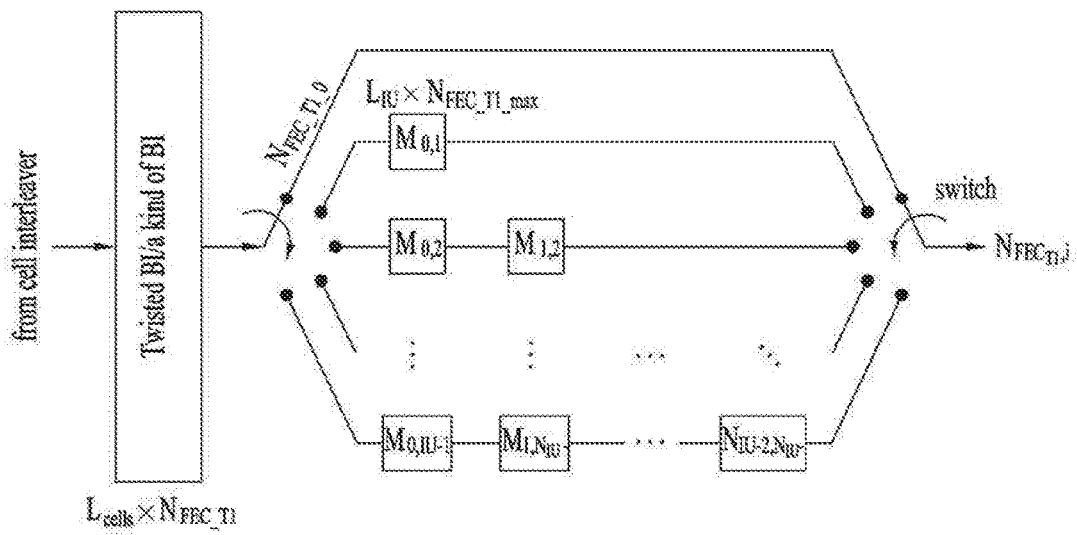

$M_{i,j}$: the ith IF's contents on the jth branch

FIG. 106 for $0 \leq k \leq N_{cells} N'_{FEC\_TI\_max} - 1$
  $r_k = mod(k, N_{cells})$,
  $t_k = mod(S_T \times r_k, N'_{FEC\_TI\_max})$,
  $c_k = mod(t_k + \lfloor \frac{k}{N_{cells}} \rfloor, N'_{FEC\_TI\_max})$,
  $\theta_k = N_{row} \times c_k + r_k$, if $k \geq N_{cells} N_{FEC\_TI\_Diff}$
    $\pi(C_{cnt}) = \theta_k$,
    $C_{cnt} = C_{cnt} + 1$,
  end
                    skip operation
end where $C_{cnt} = 0$, and $S_R$ is a shift value is defined as $S_R = mod(S_R \cdot S_T, N'_{FEC\_TI\_max})$

FIG. 107 for $0 \leq k \leq N_{cells} N_{FEC\_TI\_max} - 1$
  $r_k = mod(k, N_{cells})$,
  $t_k = mod(S_T \times r_k, N_{FEC\_TI\_max})$,
  $c_k = mod(t_k + \lfloor \frac{k}{N_{cells}} \rfloor, N_{FEC\_TI\_max})$,
  $\theta_k = N_{row} \times c_k + r_k$, if $k \geq N_{cells} N_{FEC\_TI\_Diff}$
    $\pi(C_{cnt}) = \theta_k$,
    $C_{cnt} = C_{cnt} + 1$,
  end
                                    skip operation
end where $C_{cnt} = 0$, and $\boxed{S_R = mod(S_R - S_T, N_{FEC\_TI\_max})}$ with $S_T = 1$

FIG. 108

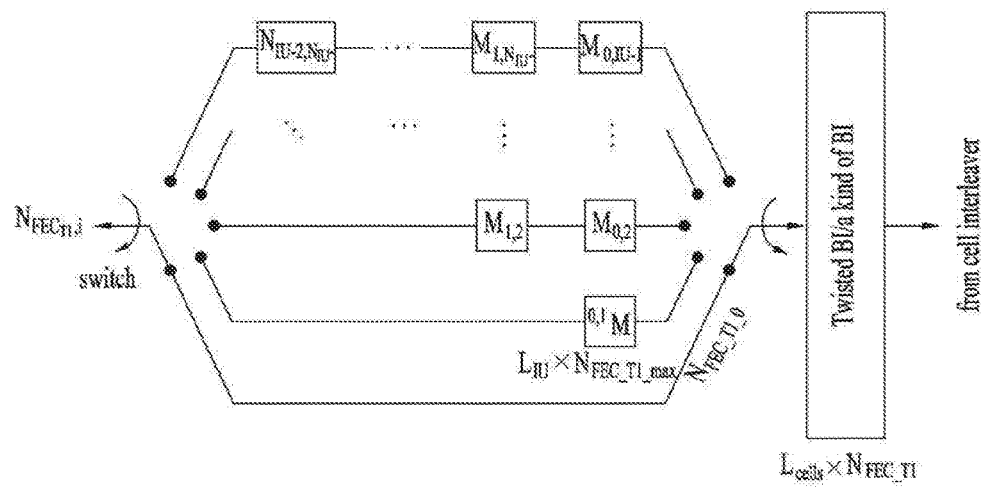

$M_{i,j}$: the ith IF's contents on the jth branch

FIG. 116

- Single -PLP (S -PLP)
  - * Fix interleaving sequence $L_{r(q)} = [L_0(q) + P(0)] mod N_{cells}$,

- * Change interleaving sequence every FEC block within an interleaving frame as like M-PLP $L_{r(q)} = [L_0(q) + P(r)] mod N_{cells}$,

FIG. 117

$C_{out} = 0$, for $0 \leq k \leq N_{cells} N'_{FEC\_TI\_max} - 1$ $r_k = mod(k, N_{cells})$, $t_k = mod(S_T \times r_k, N'_{FEC\_TI\_max})$, $c_k = mod(t_k + \left\lfloor \dfrac{k}{N_{cells}} \right\rfloor, N'_{FEC\_TI\_max})$, $\theta_k = N_{cells} \times c_k + r_k$, ---
if $\theta_k \geq N_{cells} N_{FEC\_TI\_Diff}$ $\pi(C_{out}) = \theta_k$, $C_{out} = C_{out} + 1$ end          skip operation

--- end where $S_T$ is a shift value is defined as $S_T = \dfrac{N'_{FEC\_TI\_max} - 1}{2} + 1$

FIG. 118

$C_{cnt} = 0,$
for $0 \leq k \leq N_{cells} N_{FEC\_TI\_max} - 1$
$\quad r_k = \mathrm{mod}(k, N_{cells}),$
$\quad t_k = \mathrm{mod}(r_k, N_{FEC\_TI\_max}),$
$\quad c_k = \mathrm{mod}(t_k + \left\lfloor \dfrac{k}{N_{cells}} \right\rfloor, N_{FEC\_TI\_max}),$
$\quad \theta_k = N_{cells} \times c_k + r_k,$ > if $\ k \geq N_{cells} N_{FEC\_TI\_Diff}$
> $\quad \pi(C_{cnt}) = \theta_k,$
> $\quad C_{cnt} = C_{cnt} + 1$
> end $\qquad$ skip operation end
where $S_T = 1$ is assumed

FIG. 119

$C_{cnt} = 0,$
for $0 \leq k \leq N_{cells} N_{FEC\_TI\_max} - 1$
$\quad r_k = \mathrm{mod}(k, N_{cells}),$
$\quad t_k = \mathrm{mod}(S_{R,j} \times r_k, N'_{FEC\_TI\_max}),$
$\quad c_k = \mathrm{mod}(t_k + \left\lfloor \dfrac{k}{N_{cells}} \right\rfloor, N'_{FEC\_TI\_max}),$
$\quad \theta_k = N_{cells} \times c_k + r_k,$ > if $\ k \geq N_{cells} N_{FEC\_TI\_Diff}$
> $\quad \pi(C_{cnt}) = \theta_k,$
> $\quad C_{cnt} = C_{cnt} + 1$
> end $\qquad$ skip operation end
$S_{R,j}$ is a shift value is defined as
$S_{R,j} = \mathrm{mod}(S_{R,j-1} - S_T, N'_{FEC\_TI\_max})$ with $S_{R,-1} = 0, j = 0, 1, \cdots$

FIG. 120

$C_{cnt} = 0$,
for $0 \leq k \leq N_{cells} N_{FEC\_TI\_max} - 1$
 $r_k = \mod(k, N_{cells})$,
 $t_k = \mod(S_{R,j} \times r_k, N_{FEC\_TI\_max})$,
 $c_k = \mod\left(t_k + \left\lfloor \dfrac{k}{N_{cells}} \right\rfloor, N_{FEC\_TI\_max}\right)$,
 $\theta_k = N_{cells} \times c_k + r_k$, > if $k \geq N_{cells} N_{FEC\_TI\_off}$
>  $\pi(C_{cnt}) = \theta_k$,
>  $C_{cnt} = C_{cnt} + 1$
> end                              skip operation end
$S_{R,j} = \mod(S_{R,j-1} - 1, N_{FEC\_TI\_max})$ with assumption of $S_T = 1$ and $S_{R,-1} = 0$, $j = 0,1,\cdots$ FIG. 124
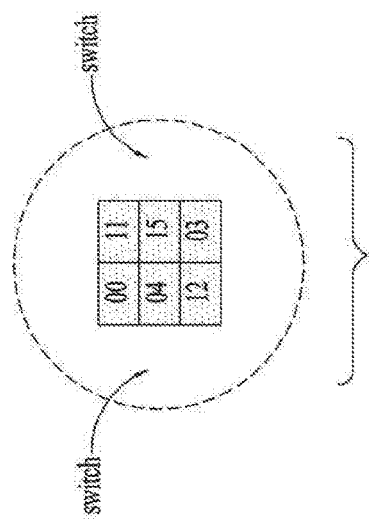
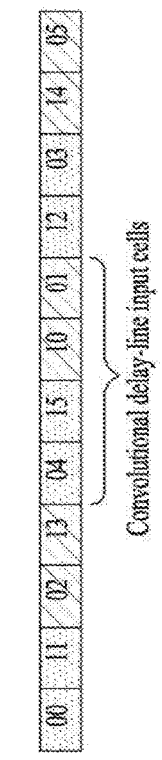
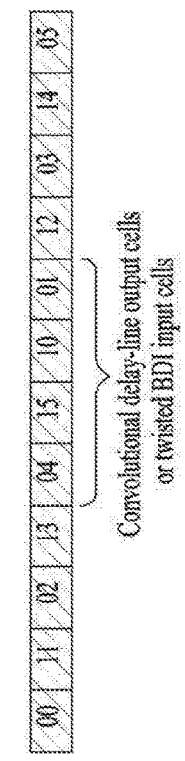

FIG. 127

Case-1: $N_{column} = N_{row} - 1$
$N_{cells} = \alpha \cdot N_{row}$, where $\alpha$ is an integer Case-2: $N_{column} = N_{row} - 1$
$1 \leq N_{row} \leq N_{max\_row}$ Case-3: $N_{row} = N_{column} = 0$ IF PLP_TI_FECBLOCK_START="don't care"
PLP_TI_FECBLOCK_START means $N_{row}, N_{column}$
else if
PLP_TI_FECBLOCK_START=(PLP_NUM_TI_ROW-PLP_TI_START_ROW-1)$\cdot N_{row} \cdot N_{column}$
$+(N_{cells} - M_{N_{row}-1, N_{column}-1})$

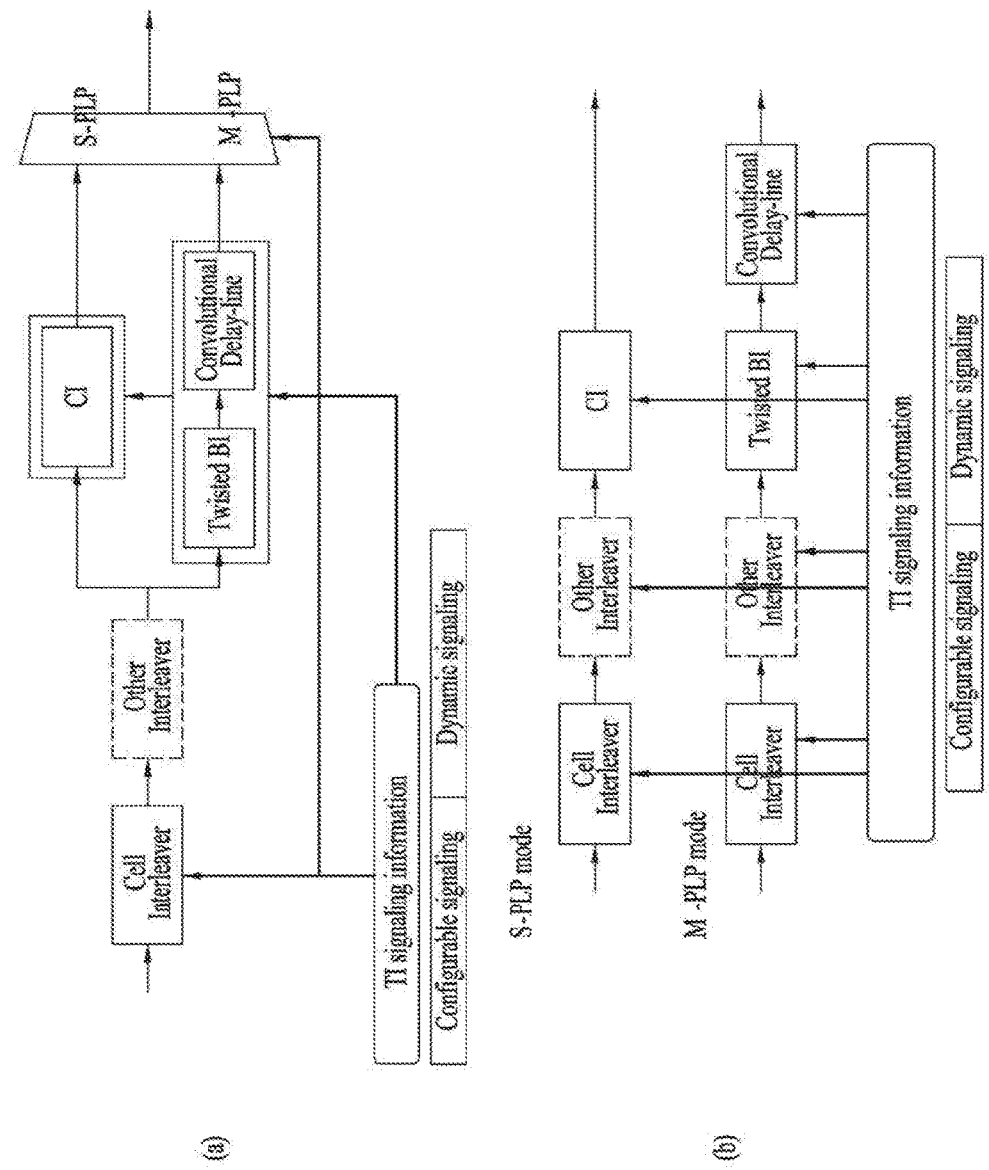

FIG. 137

| | Configurable signaling | Dynamic signaling |
|---|---|---|
| NUM_PLP | (x bits), i.e., 8 bits | |
| for i=0:NUM_PLP -1 { | | |
| if NUM_PLP=1 { | | |
| PLP_TI_NUM_ROW_MAX | (x bits), i.e., 10 bits | |
| PLP_TI_NUM_ROW | (x bits), i.e., 10 bits | |
| PLP_TI_START_ROW | (x bits), i.e., 10 bits | |
| PLP_TI_FECBLOCK_START} | (x bits), i.e., 15/16 bits | |
| else { | | |
| TIME_IL_LENGTH | (x bits), i.e., 8 bits | |
| TIME_IL_TYPE | (x bits), i.e., 1 bit | |
| PLP_NUM_BLOCKS_MAX } | (x bits), i.e., 10 bits | |
| FRAME_INTERVAL | (x bits), i.e., 8 bits | |
| } | | |

Single-PLP: PLP_TI_NUM_ROW_MAX, PLP_TI_NUM_ROW, PLP_TI_START_ROW, PLP_TI_FECBLOCK_START Multiple-PLP: TIME_IL_LENGTH, TIME_IL_TYPE, PLP_NUM_BLOCKS_MAX, FRAME_INTERVAL

FIG. 138

| Configurable signaling | Dynamic signaling | |
|---|---|---|
| | for i=0:NUM_PLP-1 { | |
| | if NUM_PLP=1 { | |
| Single-PLP | PLP_TI_NUM_ROW | (x bits), i.e., 10 bits |
| | PLP_TI_START_ROW | (x bits), i.e., 10 bits |
| Multiple-PLP | PLP_TI_FECBLOCK_START} | (x bits), i.e., 15/16 bits |
| | else { | |
| | PLP_NUM_BLOCKS} | (x bits), i.e., 10 bits |
| | } | |

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

This application is a Continuation Application of application Ser. No. 14/830,346, filed on Aug. 19, 2015, which claims the benefit of U.S. Provisional Patent Application Nos. 62/097,138, 62/097,558, 62/098,318 and 62/099,592, filed on Dec. 29, 2014, Dec. 29, 2014, Dec. 30, 2014 and Jan. 5, 2015 which are hereby incorporated by reference as if fully set forth herein.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

Technical Solution

To achieve the object and other advantages and in accordance with the purpose of the invention, as embodied and broadly described herein, a method for transmitting broadcast signals comprises encoding service data, time interleaving the encoded service data, building at least one signal frame including the time interleaved service data, wherein the at least one signal frame includes a plurality of OFDM (Orthogonal Frequency Division Multiplex) symbols, modulating data in the built at least one signal frame by an OFDM scheme, and transmitting the broadcast signals having the modulated data.

Advantageous Effects

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 10 illustrates a frame structure according to an embodiment of the present invention.

FIG. 11 illustrates a signaling hierarchy structure of the frame according to an embodiment of the present invention.

FIG. 12 illustrates preamble signaling data according to an embodiment of the present invention.

FIG. 13 illustrates PLS1 data according to an embodiment of the present invention.

FIG. 14 illustrates PLS2 data according to an embodiment of the present invention.

FIG. 27 illustrates an operation of a twisted row-column block interleaver according to another embodiment of the present invention.

FIG. 29 illustrates interleaved XFECBLOCKs from each interleaving array according to an embodiment of the present invention.

FIG. 38 illustrates a process of generating TI output memory indexes according to another embodiment of the present invention.

FIG. 57 illustrates operation of the block interleaver according to another embodiment of the present invention.

FIG. 64 shows equations representing block interleaving according to an embodiment of the present invention.

FIG. 65 illustrates virtual FEC blocks according to an embodiment of the present invention.

FIG. 66 shows equations representing reading operation after insertion of virtual FEC blocks according to an embodiment of the present invention.

FIG. 67 is a flowchart illustrating a time interleaving process according to an embodiment of the present invention.

FIG. 69 illustrates writing operation according to an embodiment of the present invention.

FIG. 70 illustrates reading operation according to an embodiment of the present invention.

FIG. 71 illustrates a result of skip operation in reading operation according to an embodiment of the present invention.

FIG. 72 shows a writing process of time deinterleaving according to an embodiment of the present invention.

FIG. 73 illustrates a writing process of time deinterleaving according to another embodiment of the present invention.

FIG. 74 shows equations representing reading operation of time deinterleaving according to another embodiment of the present invention.

FIG. 82 is a view illustrating a time deinterleaving operation according to an embodiment of the present invention.

FIG. 96 shows equations that express a read-write operation of the cell interleaver.

FIG. 97 shows a shift value applicable to the cell interleaver according to the present embodiment and the interleaving sequence according to the shift value expressed as an equation.

FIG. 99 shows an equation indicating the twisted read operation performed after the virtual FEC blocks are inserted according to an embodiment of the present invention.

FIG. 105 illustrates a structure of the NGH-CI according to the present embodiment.

FIG. 106 shows an equation that indicates twisted block deinterleaving of the hybrid time deinterleaver according to the present embodiment.

FIG. 107 shows an equation that indicates twisted block deinterleaving of the hybrid time deinterleaver according to the present embodiment.

FIG. 108 illustrates a structure of an NGH-CDI according to an embodiment of the present invention.

FIG. 116 illustrates a shift value applicable to a cell interleaver according to another embodiment of the present invention and an interleaving sequent according to the shift value expressed as a mathematical expression.

FIG. 117 shows an equation indicating a twisted reading operation after virtual FEC blocks are inserted according to an embodiment of the present invention.

FIG. 118 shows an equation indicating a twisted read operation performed after virtual FEC blocks are inserted when a shift value is fixed to 1 according to an embodiment of the present invention.

FIG. 119 shows an equation indicating twisted block deinterleaving of a hybrid time deinterleaver according to an embodiment of the present invention.

FIG. 120 corresponds to the equation indicating the twisted read operation of the twisted block interleaver described with reference to FIG. 118.

Figure 121:
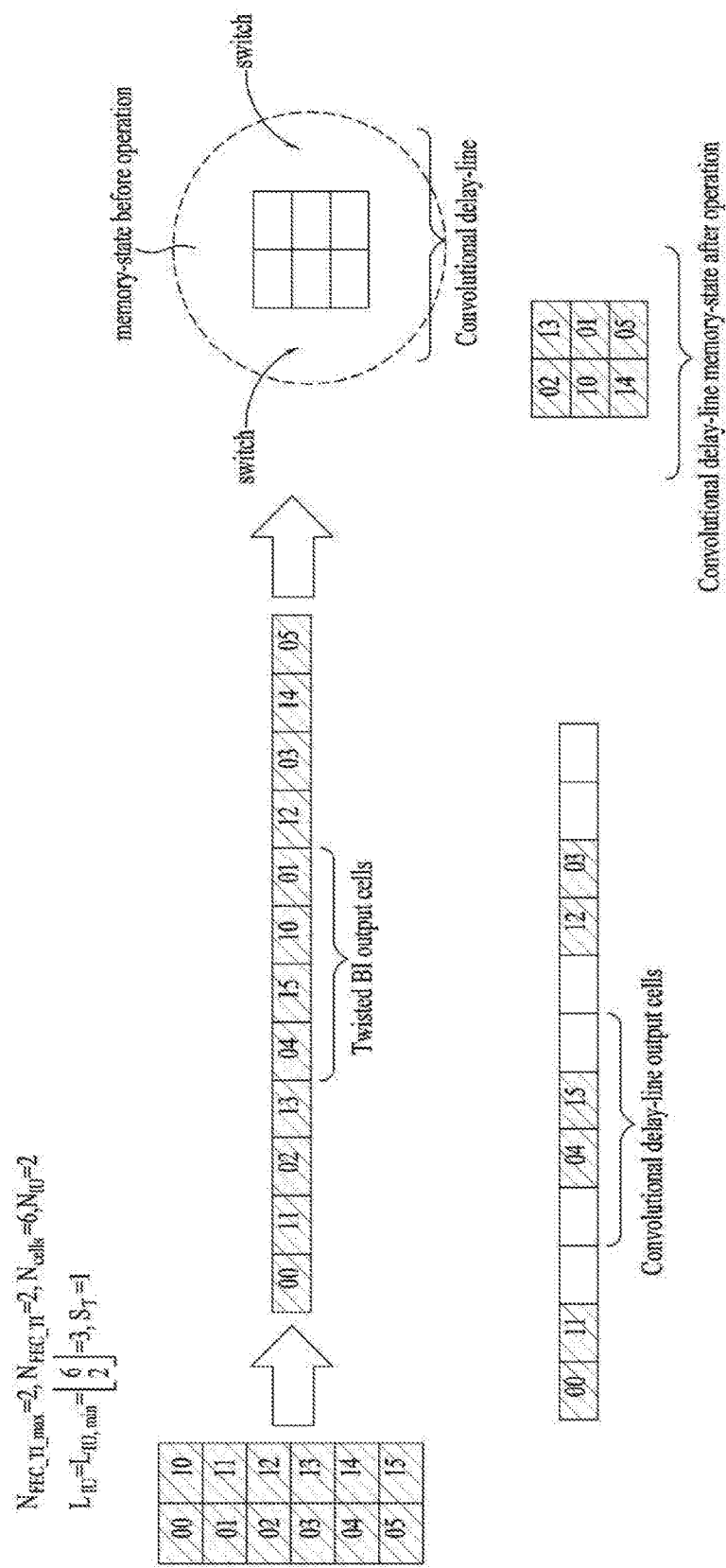

FIG. 121 illustrates an operation of the hybrid time interleaver according to an embodiment of the present invention.

Figure 122:
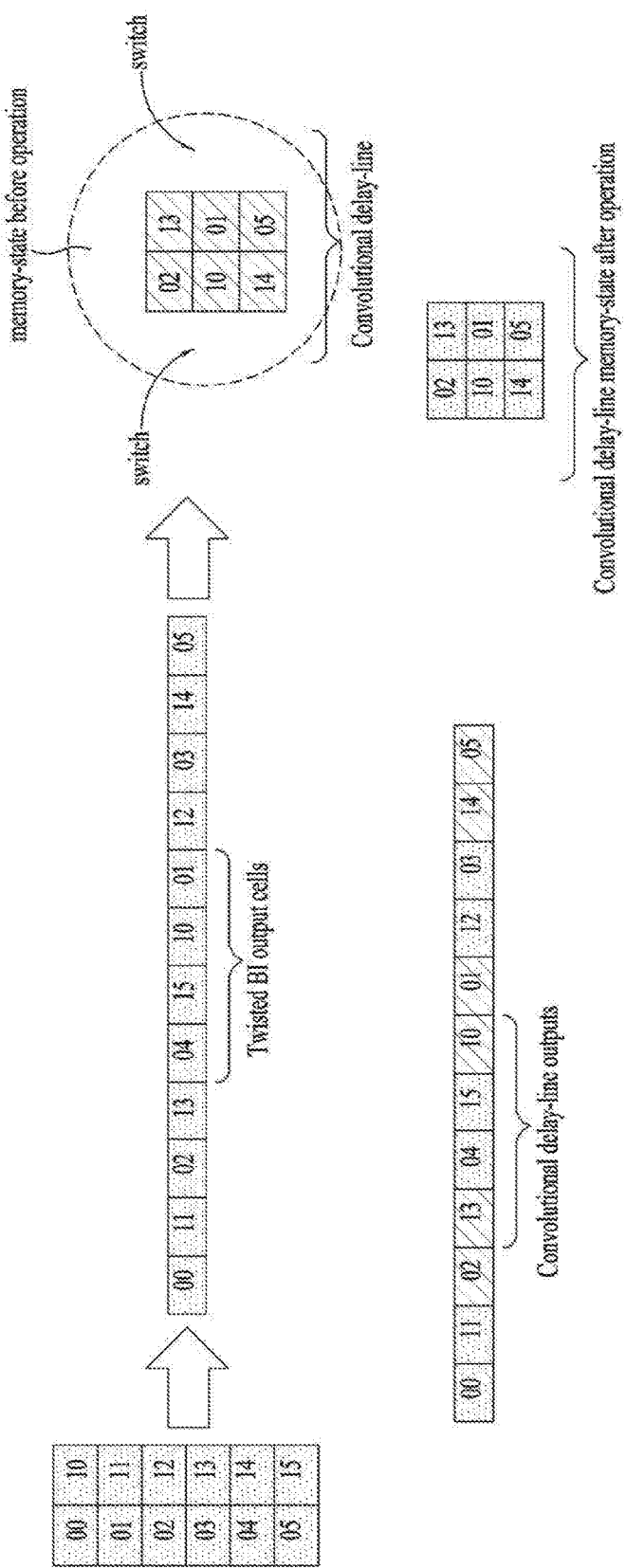

FIG. 122 illustrates an operation of the hybrid time interleaver according to an embodiment of the present invention.

Figure 123:
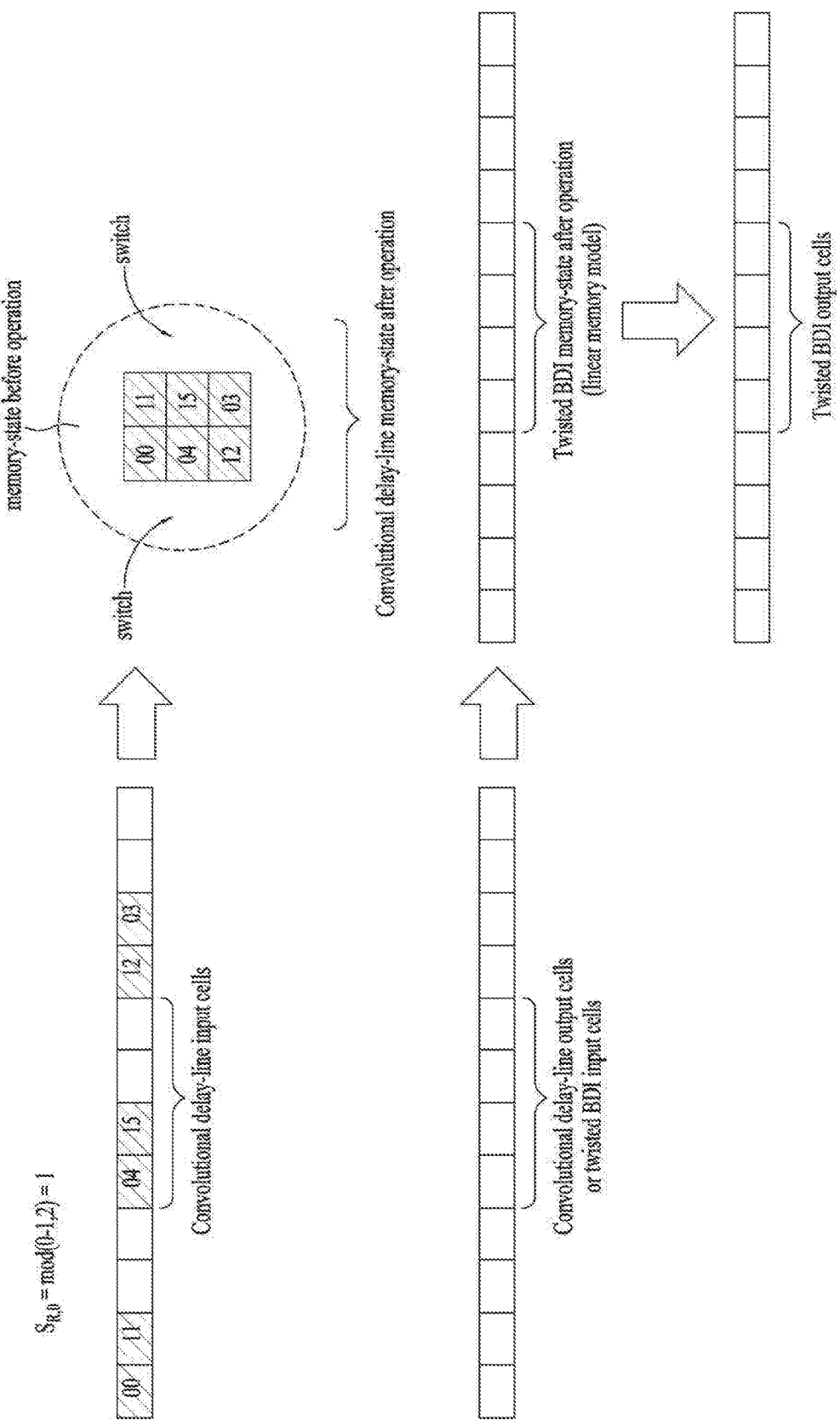

FIG. 123 illustrates an operation of the hybrid time deinterleaver according to an embodiment of the present invention.

FIG. 124 illustrates an operation of the hybrid time deinterleaver according to an embodiment of the present invention.

Figure 125:
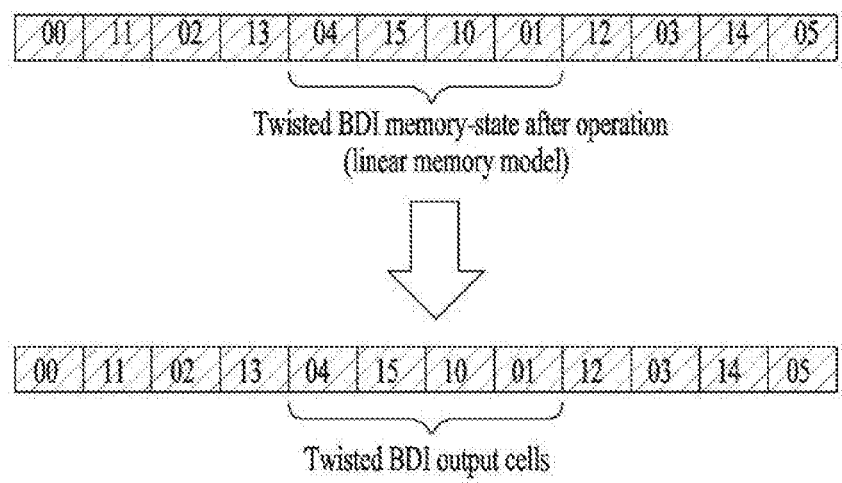

FIG. 125 illustrates an operation of the hybrid time deinterleaver according to an embodiment of the present invention.

Figure 126:
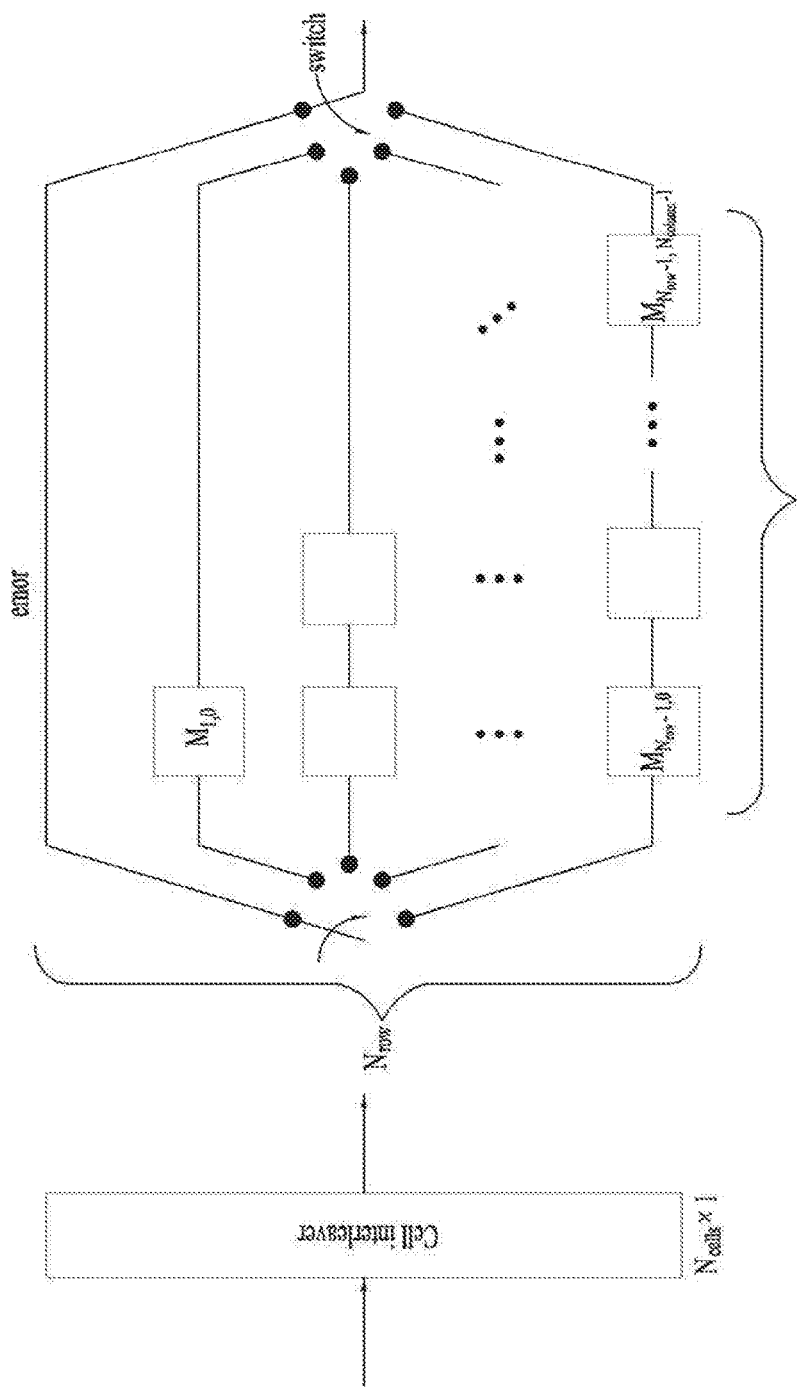

FIG. 126 illustrates a configuration of the CI according to an embodiment of the present invention.

FIG. 127 shows parameters used in a convolutional interleaver according to an embodiment of the present invention.

Figure 128:
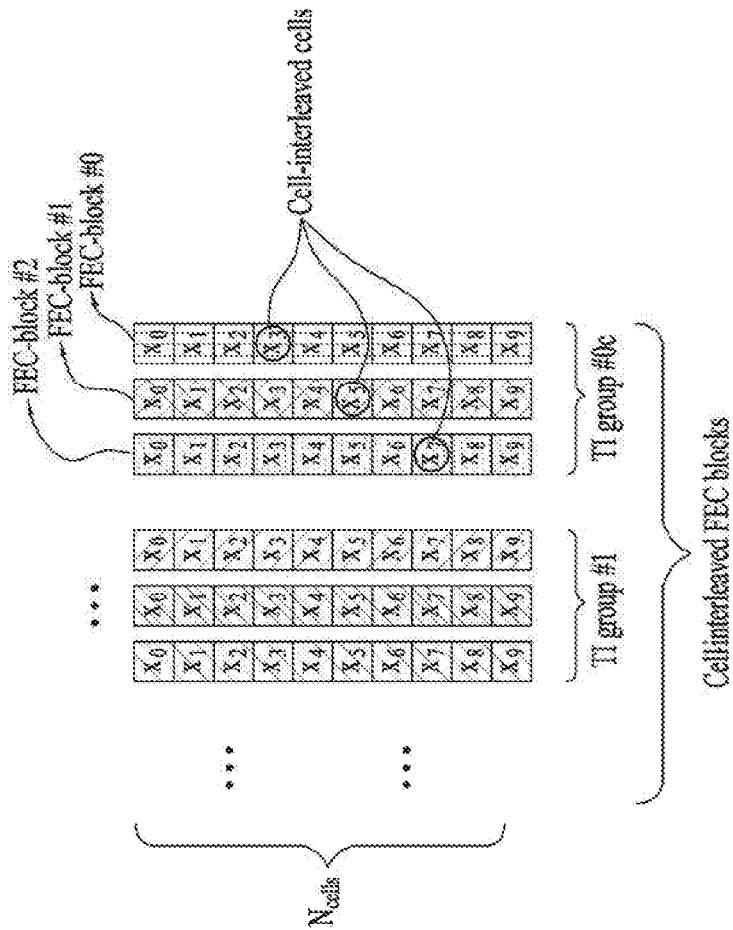

FIG. 128 illustrates a method of generating signaling information and a convolutional interleaver according to an embodiment of the present invention.

Figure 129:
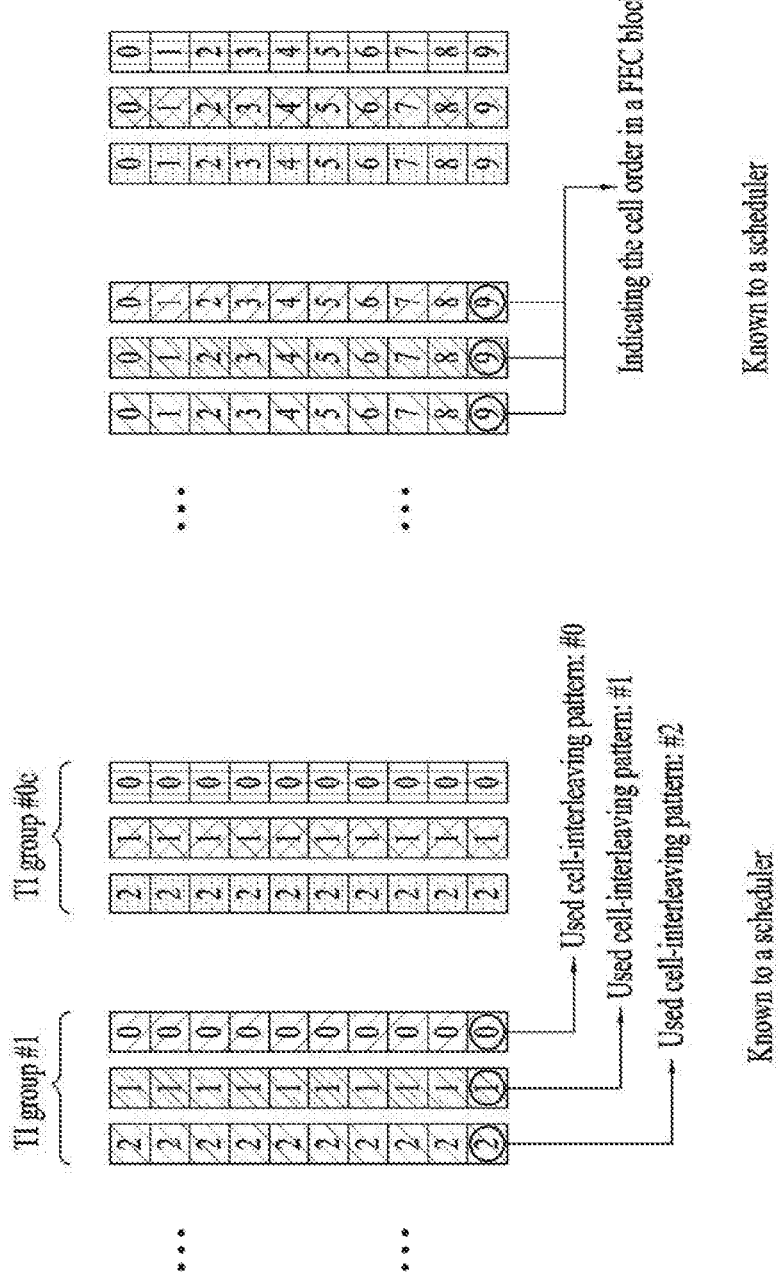

FIG. 129 illustrates a method of acquiring signaling information related to interleaving by a broadcast signal transmission apparatus according to an embodiment of the present invention.

Figure 130:
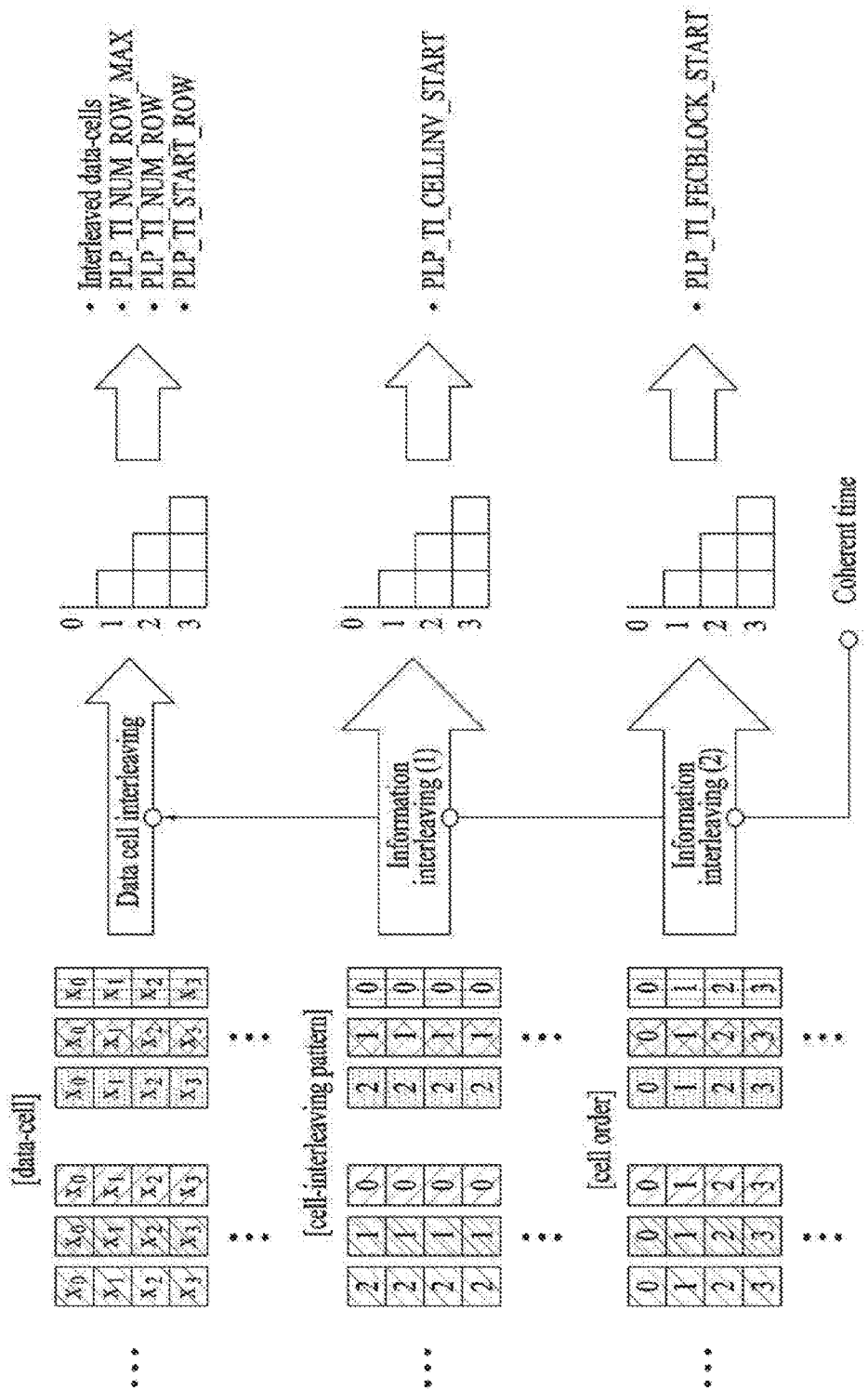

FIG. 130 illustrates an operation of a convolutional interleaver according to an embodiment of the present invention.

Figure 131:
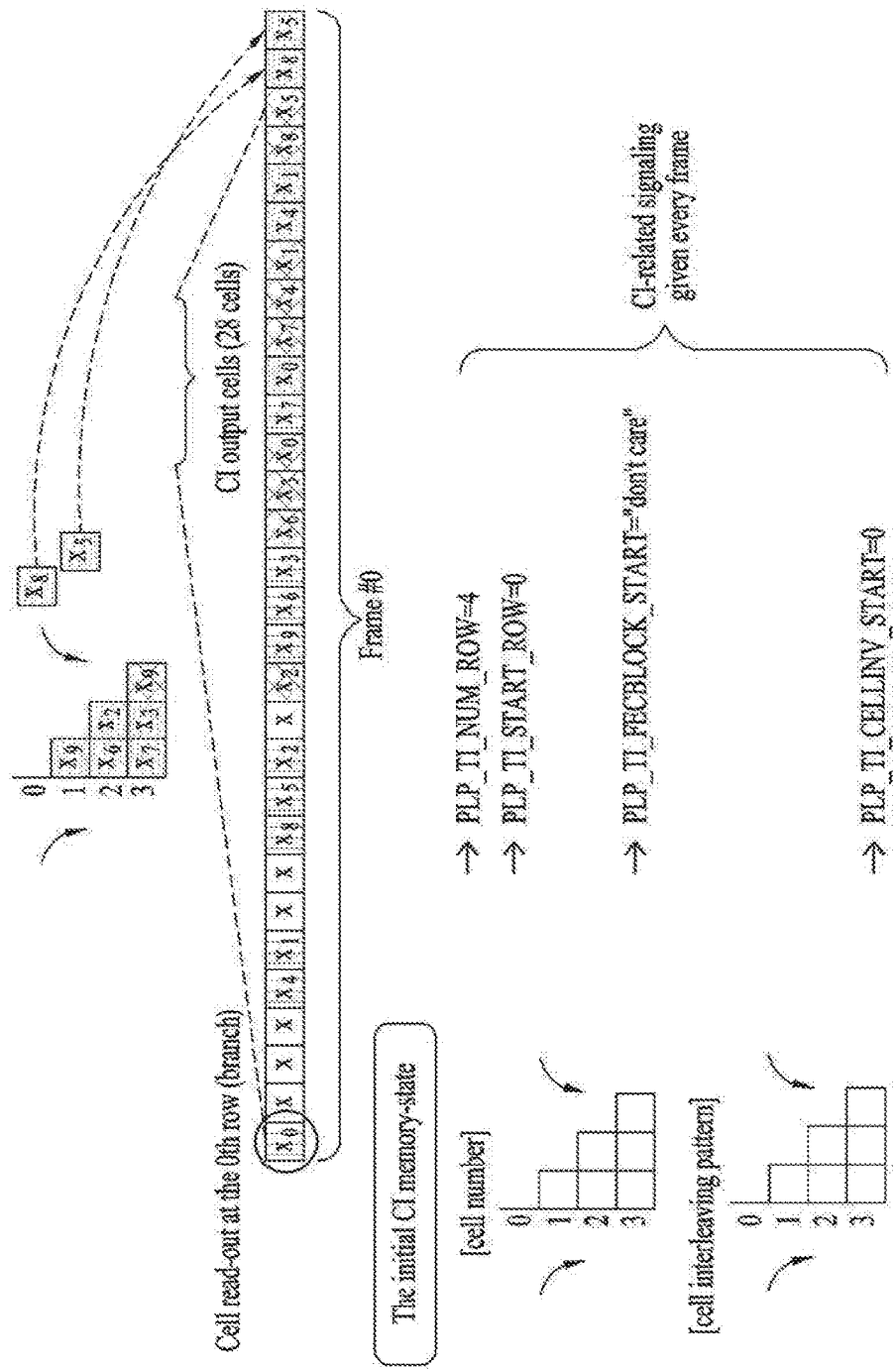

FIG. 131 illustrates a method of configuring a frame by a convolutional interleaver according to an embodiment of the present invention.

Figure 132:
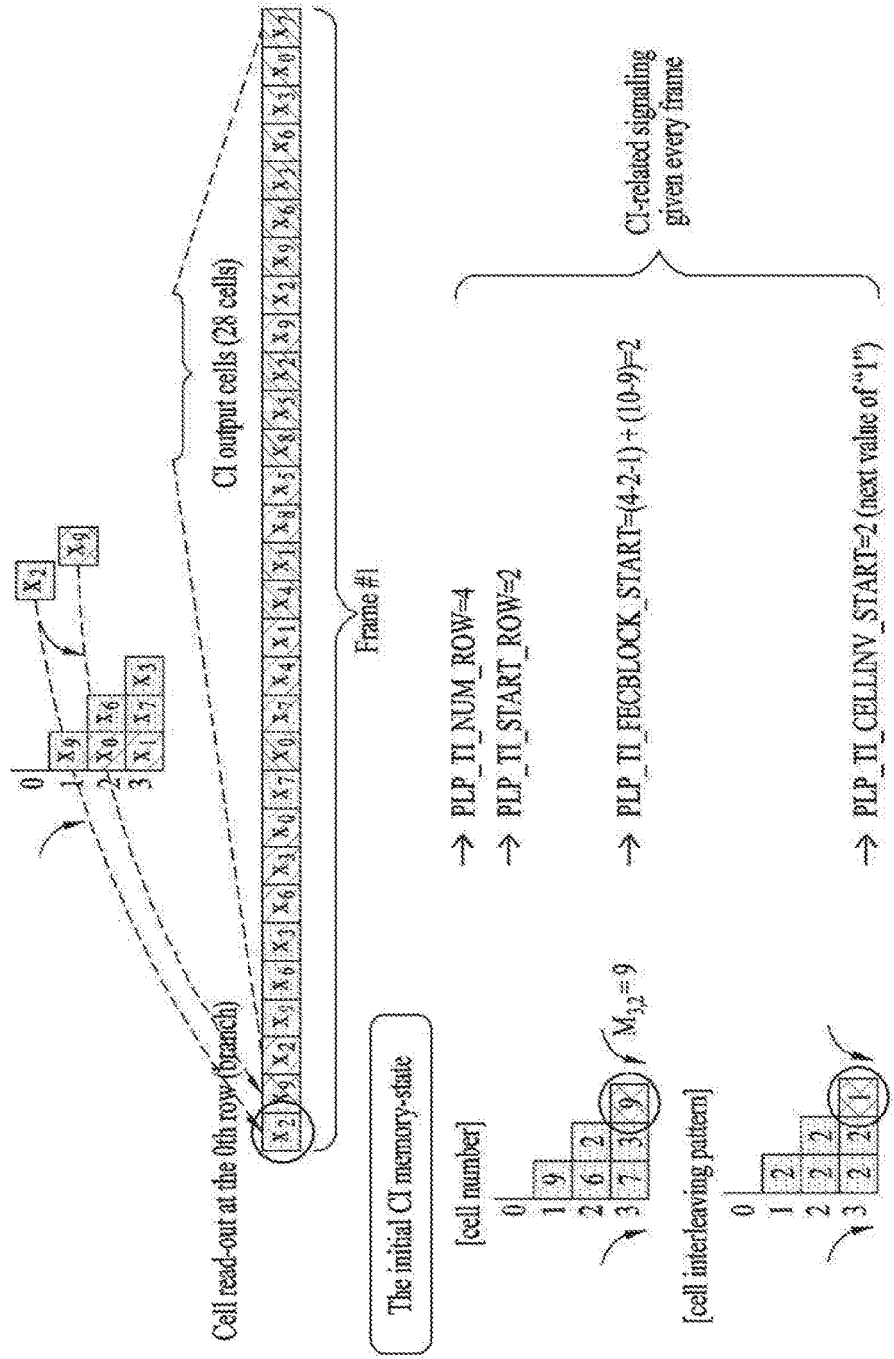

FIG. 132 illustrates a method of configuring a frame by a convolutional interleaver according to an embodiment of the present invention.

Figure 133:
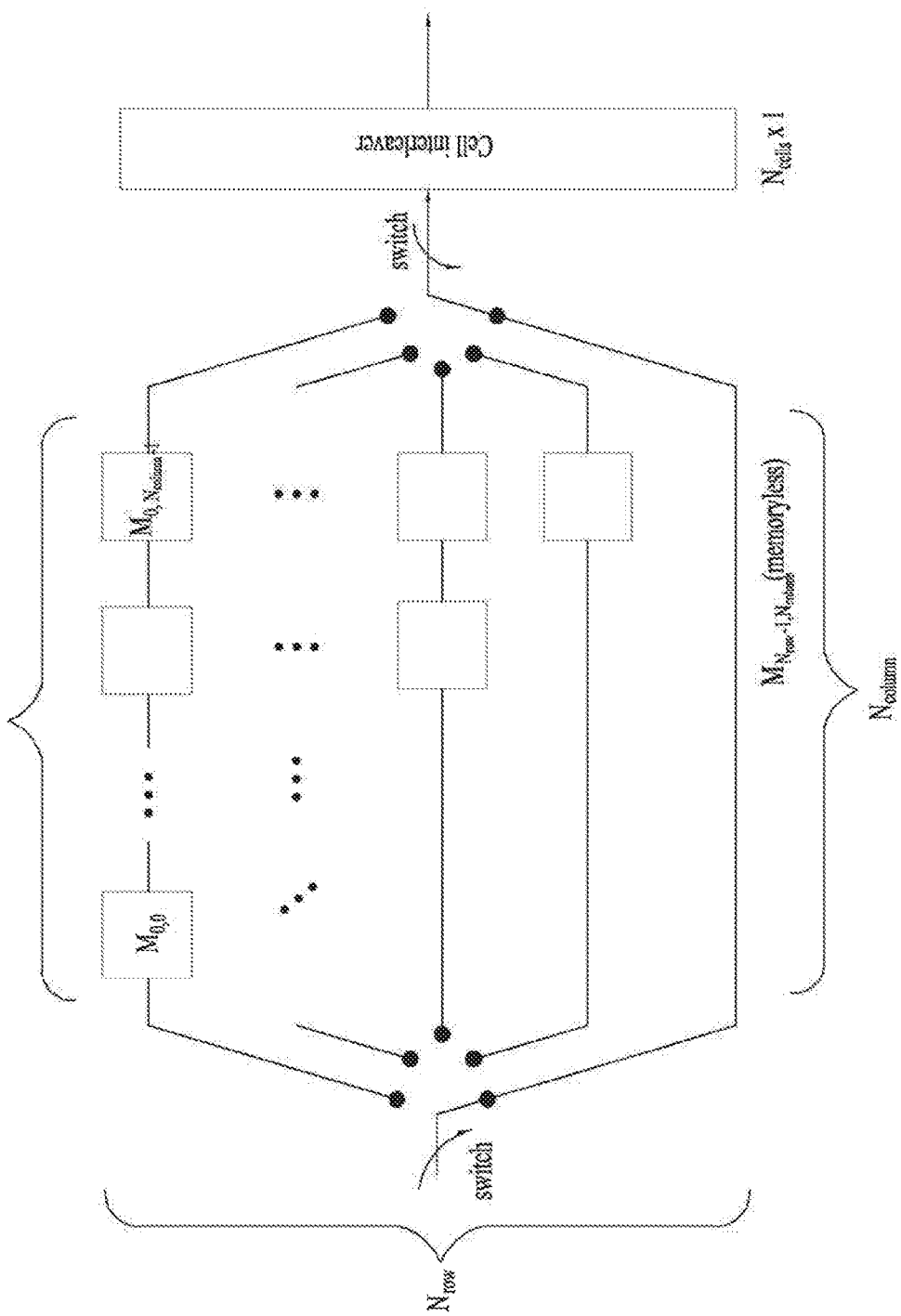

FIG. 133 illustrates a configuration of a CDI according to an embodiment of the present invention.

Figure 134:
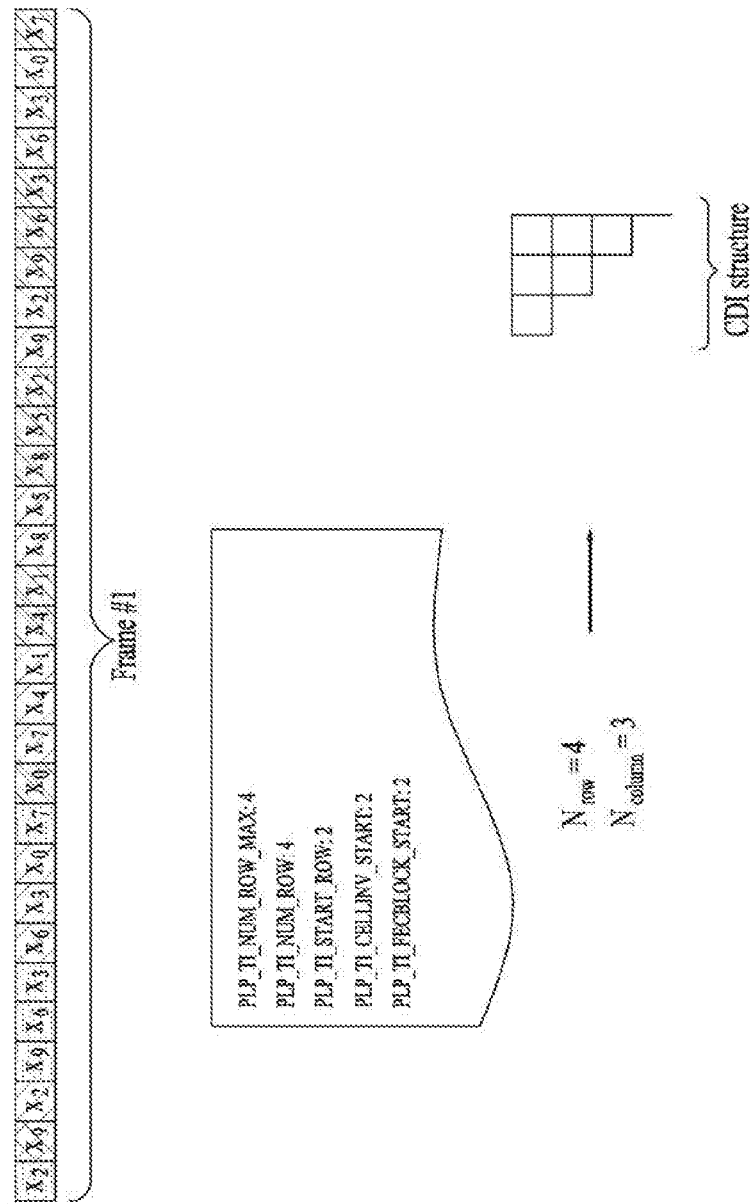

FIG. 134 illustrates an operation method of a convolutional deinterleaver according to an embodiment of the present invention.

Figure 135:
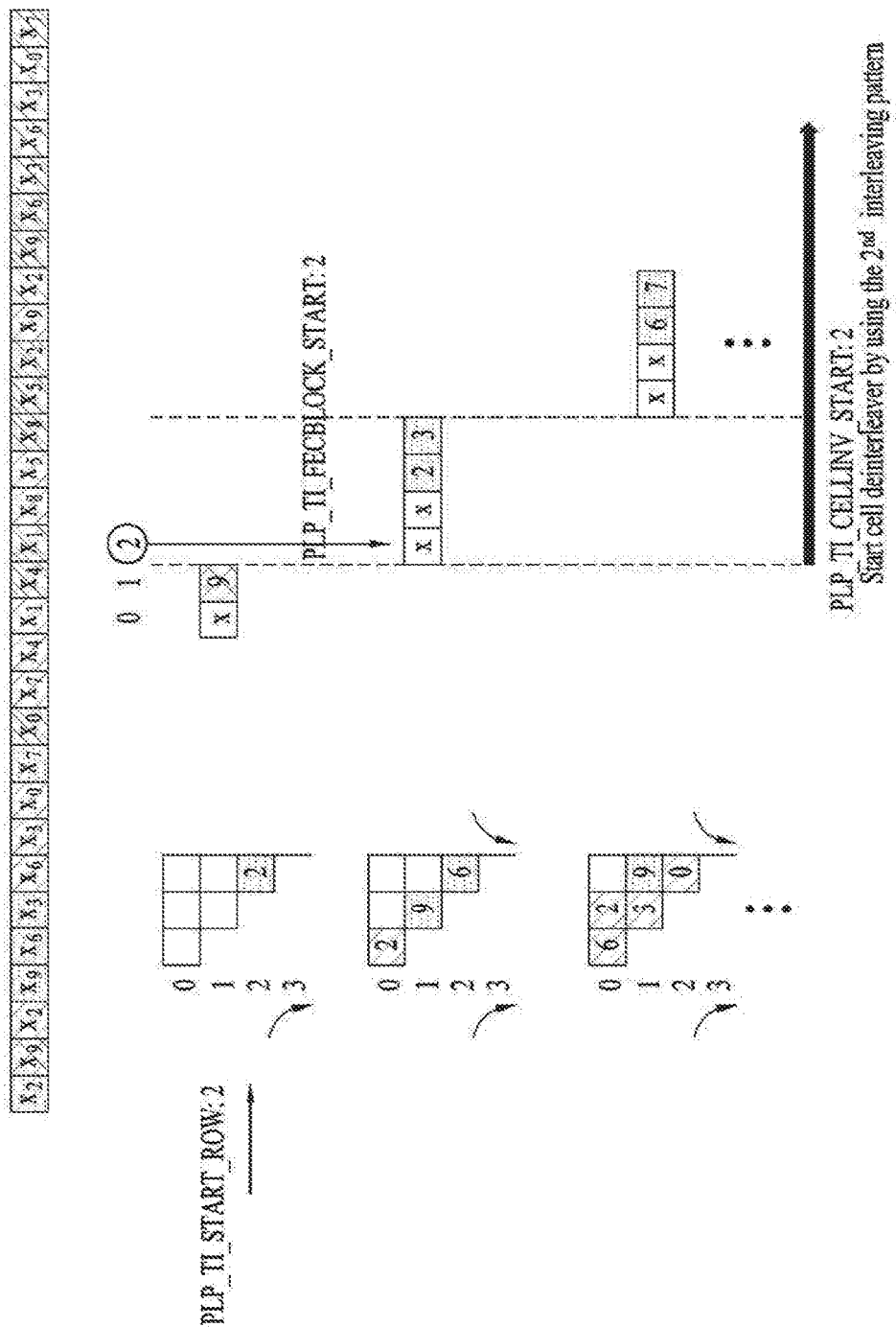

FIG. 135 illustrates an operation method of a convolutional deinterleaver according to an embodiment of the present invention.

FIG. 136 illustrates a time interleaver according to an embodiment of the present invention.

FIG. 137 illustrates a portion of time interleaving signaling information according to an embodiment of the present invention.

FIG. 138 illustrates the other portion of the time interleaving signaling information according to an embodiment of the present invention.

Figure 139:
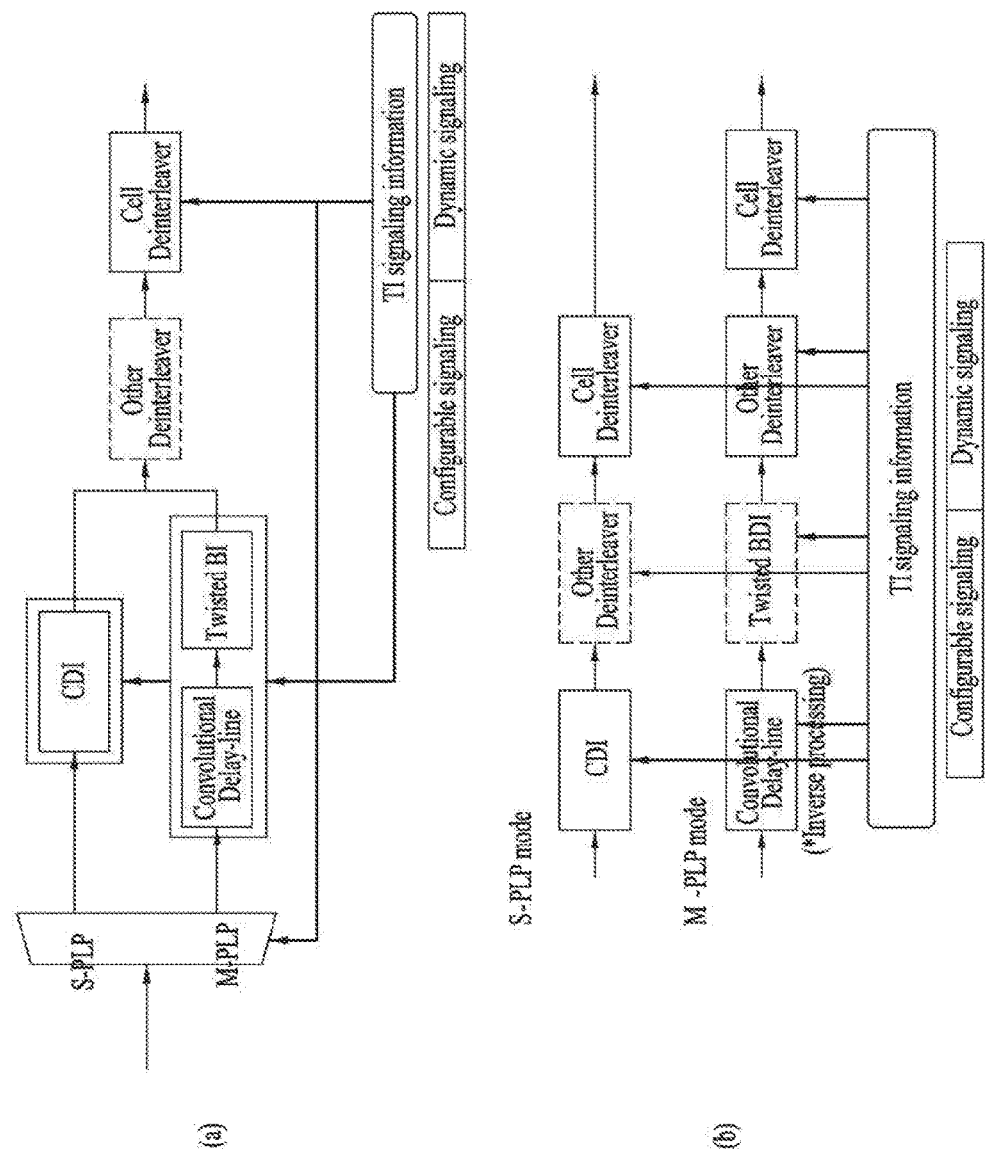

FIG. 139 illustrates a time deinterleaver according to an embodiment of the present invention.

Figure 140:
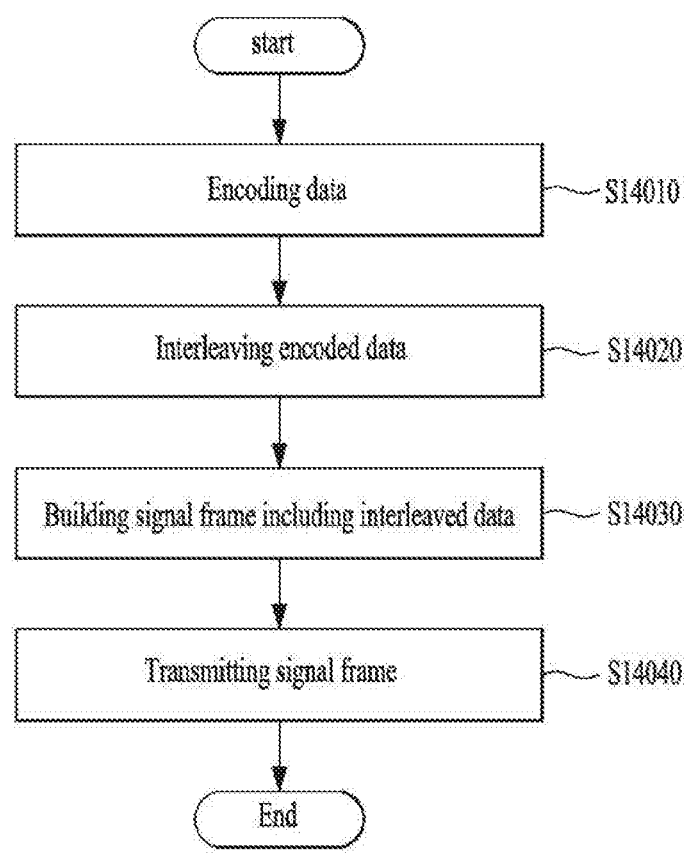

FIG. 140 illustrates an operation method of a broadcast signal transmission apparatus according to an embodiment of the present invention.

Figure 141:
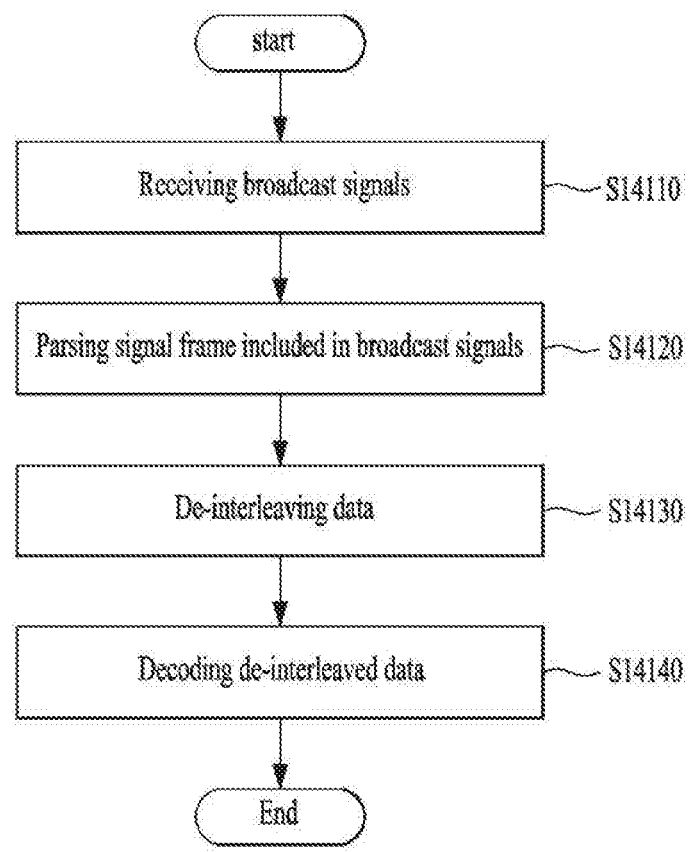

FIG. 141 illustrates an operation method of a broadcast signal reception apparatus according to an embodiment of the present invention.

DETAILED DESCRIPTION OF THE INVENTION

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| | |
|---|---|
| LDPC codeword length | 16K, 64K bits |
| Constellation size | 4~10 bpcu (bits per channel use) |
| Time de-interleaving memory size | ≤$2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| | |
|---|---|
| LDPC codeword length | 16K bits |
| Constellation size | 2~8 bpcu |
| Time de-interleaving memory size | ≤$2^{18}$ data cells |
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| | |
|---|---|
| LDPC codeword length | 16K, 64K bits |
| Constellation size | 8~12 bpcu |
| Time de-interleaving memory size | ≤$2^{19}$ data cells |
| Pilot patterns | Pilot pattern for fixed reception |
| FFT size | 16K, 32K points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of Kbch bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8-bit field identifies uniquely a DP within the system identified by the SYSTEM_ID dummy cell: cell carrying a pseudo-random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period Ts expressed in cycles of the elementary period T frame signaling symbol: OFDM symbol with higher pilot density used at the start of a frame in certain combinations of FFT size, guard interval and scattered pilot pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT-size.

reserved for future use: not defined by the present document but may be defined in future super-frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of Ncells cells carrying all the bits of one LDPC FECBLOCK

Figure 1:
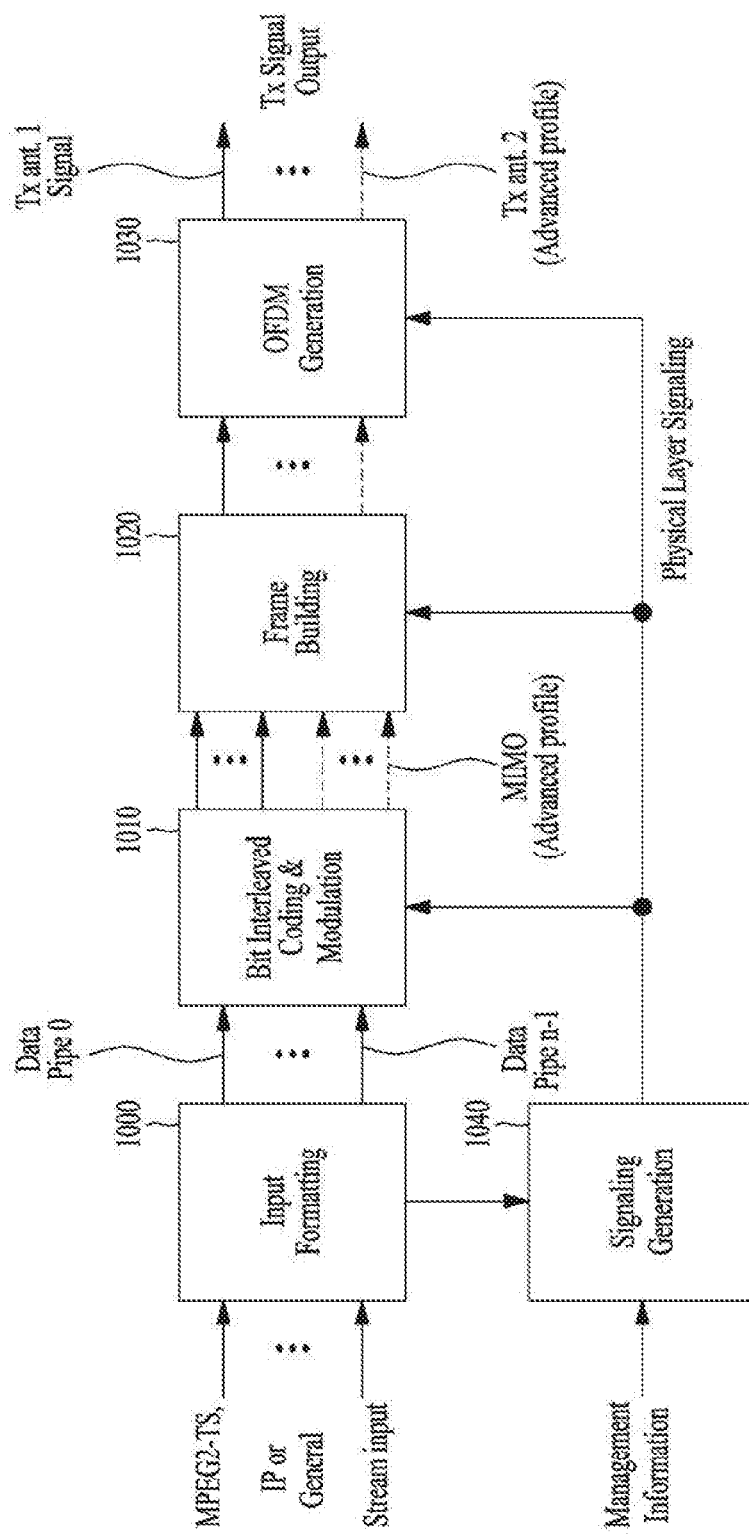
FIG. 1 illustrates a structure of an apparatus for transmitting broadcast signals for future broadcast services according to an embodiment of the present invention.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2:
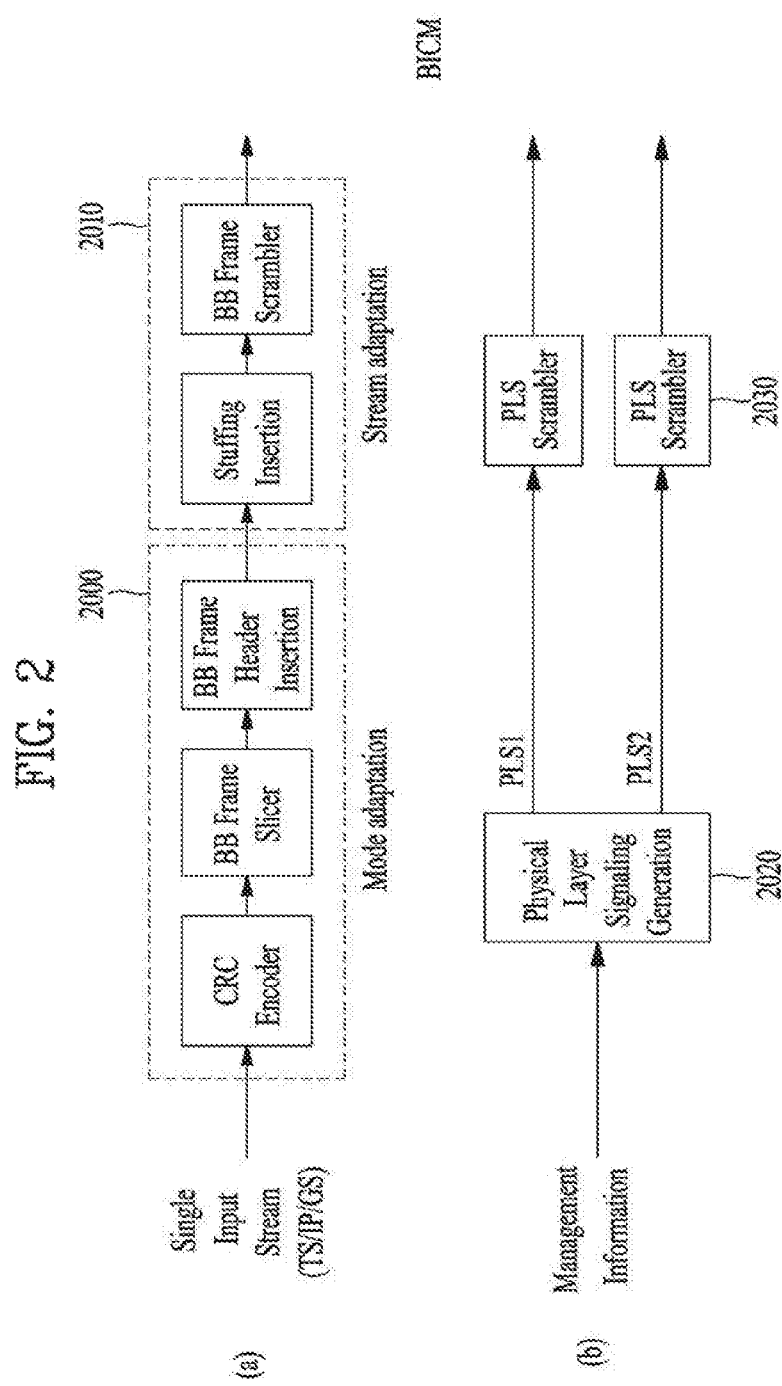
FIG. 2 illustrates an input formatting block according to one embodiment of the present invention.
Figure 3:
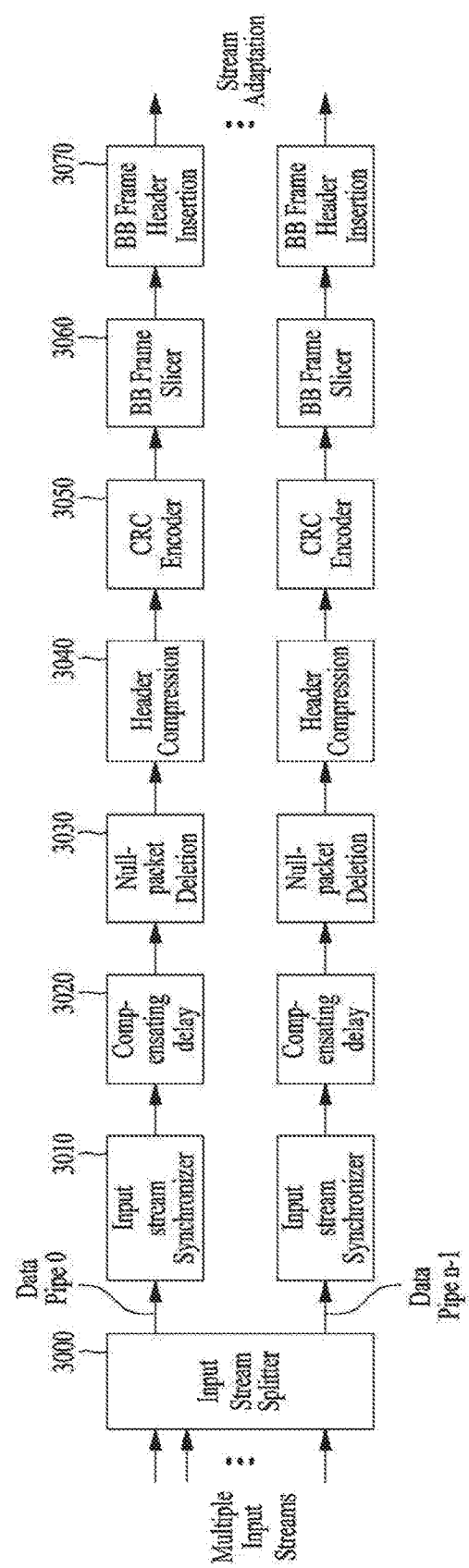
FIG. 3 illustrates an input formatting block according to another embodiment of the present invention.
Figure 4:
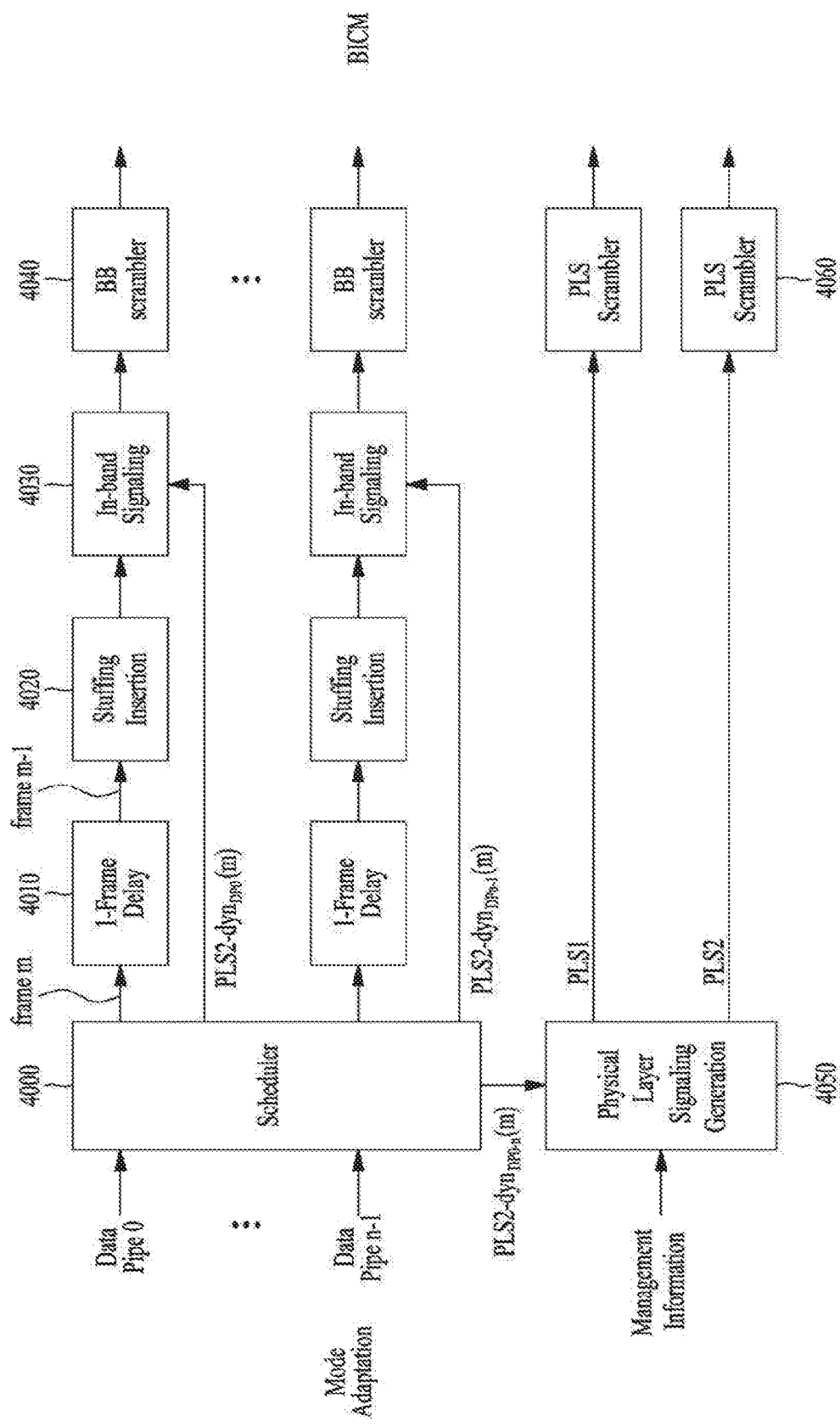
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feedback shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FEC-BLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5:
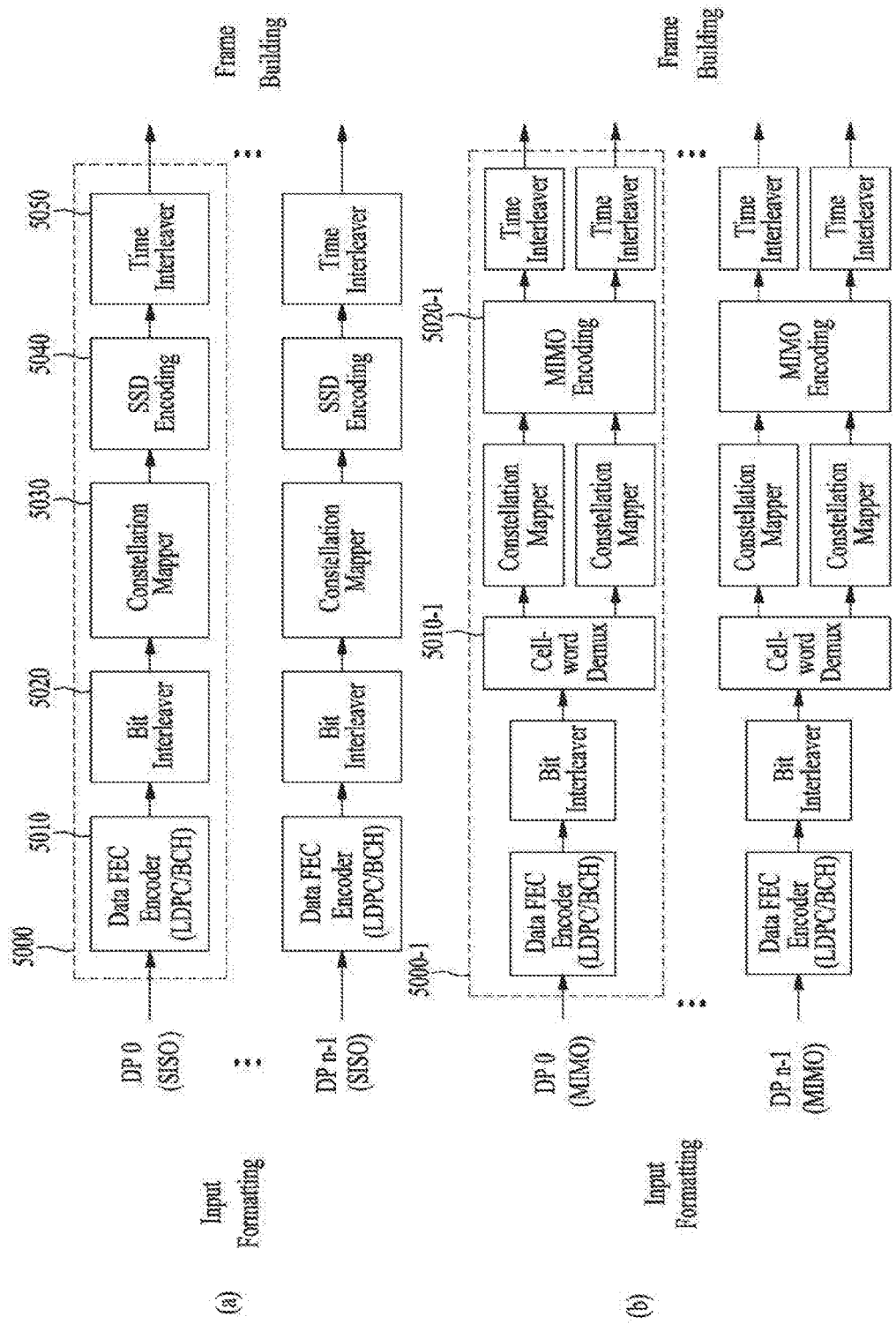
FIG. 5 illustrates a BICM block according to an embodiment of the present invention.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, el. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ (e1,i and e2,i) are fed to the input of the MIMO Encoder. Paired MIMO Encoder output (g1,i and g2,i) is transmitted by the same carrier k and OFDM symbol 1 of their respective TX antennas.

The above-described blocks may be omitted or replaced by blocks having similar or identical functions.

Figure 6:
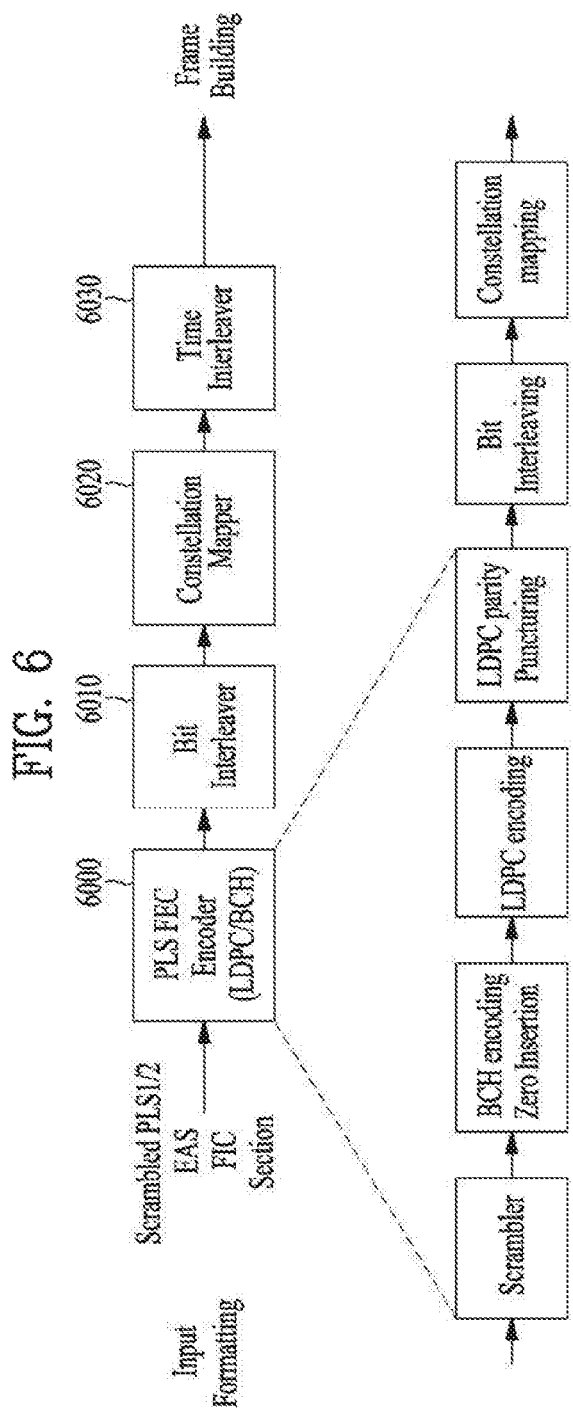
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010 and a constellation mapper 6020.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS 1/2 data, EAC and FIC section.

The scrambler can scramble PLS data and PLS2 data before BCH encoding and shortened and punctured LDPC encoding.

The BCH encoding/zero insertion block can perform outer encoding on the scrambled PLS 1/2 data using the shortened BCH code for PLS protection and insert zero bits after the BCH encoding. For PLS1 data only, the output bits of the zero insertion may be permitted before LDPC encoding.

The LDPC encoding block can encode the output of the BCH encoding/zero insertion block using LDPC code. To generate a complete coded block, Cldpc, parity bits, Pldpc are encoded systematically from each zero-inserted PLS information block, Ildpc and appended after it.

$$C_{ldpc} = [I_{ldpc}\ P_{ldpc}] = [i_0, i_1, \ldots, i_{K_{ldpc}-1}, p_0, p_1, \ldots, p_{N_{ldpc}-K_{ldpc}-1}]$$ [Math figure 1]

The LDPC code parameters for PLS1 and PLS2 are as following table 4.

TABLE 4

| Signaling Type | $K_{sig}$ | $K_{bch}$ | $N_{bch\_parity}$ | $K_{ldpc}$ $(=N_{bch})$ | $N_{ldpc}$ | $N_{ldpc\_parity}$ | code rate | $Q_{ldpc}$ |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The above-described blocks may be omitted or replaced by blocks having similar or identical functions.

Figure 7:
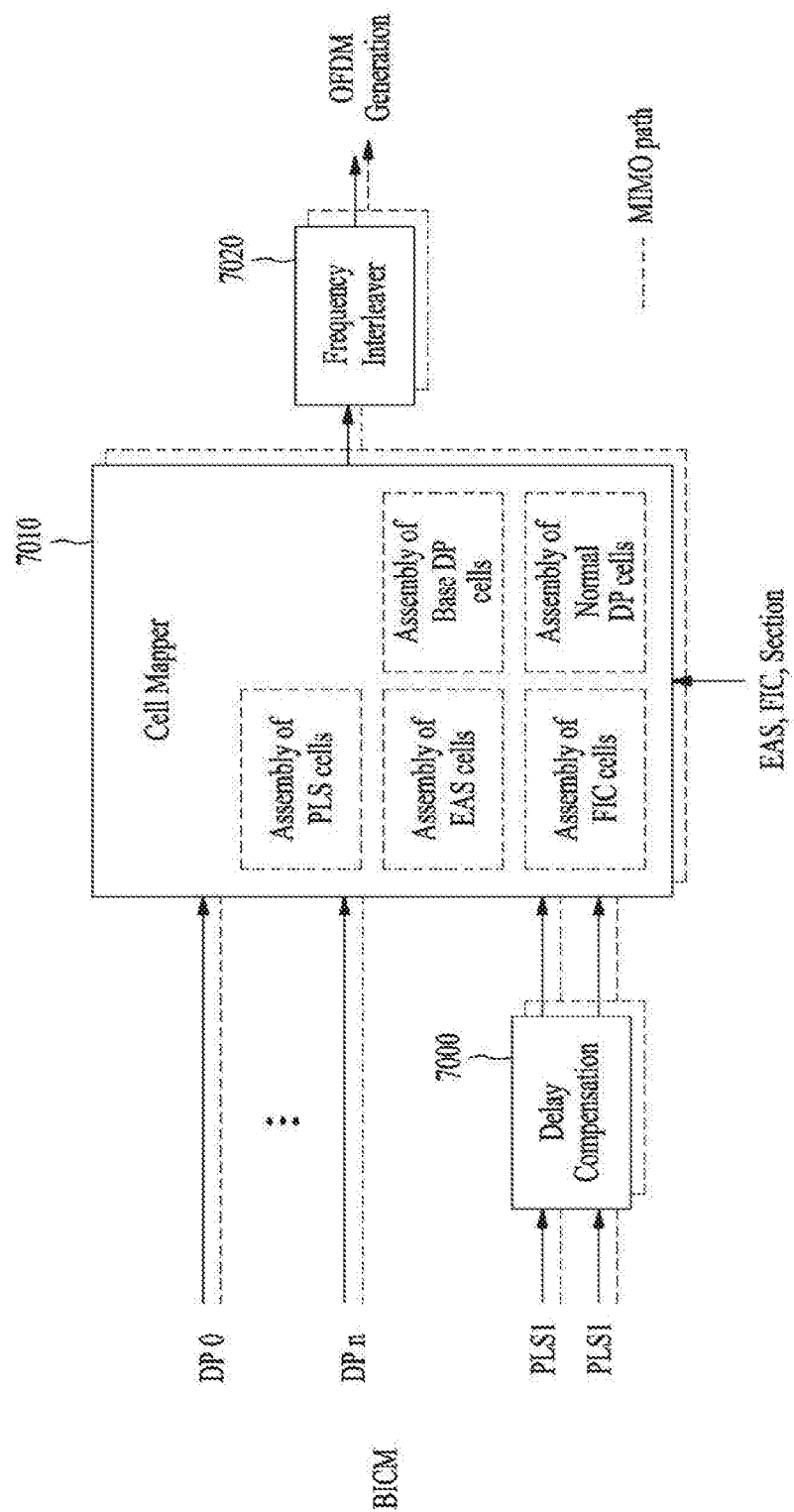
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver 5050. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI(program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame.

The above-described blocks may be omitted or replaced by blocks having similar or identical functions.

Figure 8:
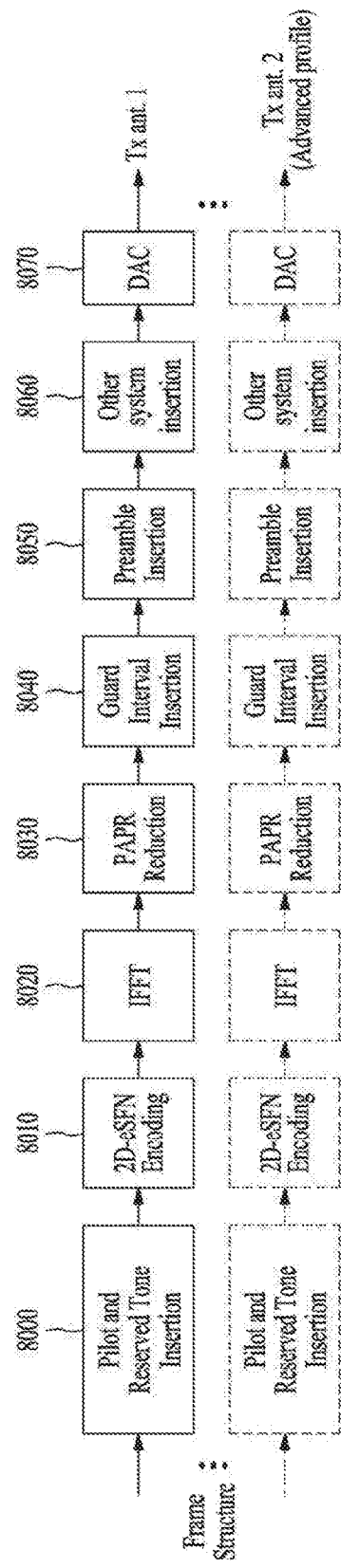
FIG. 8 illustrates an OFDM generation block according to an embodiment of the present invention.

FIG. 8 illustrates an OFDM generation block according to an embodiment of the present invention.

The OFDM generation block illustrated in FIG. 8 corresponds to an embodiment of the OFDM generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots, continual pilots, edge pilots, FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
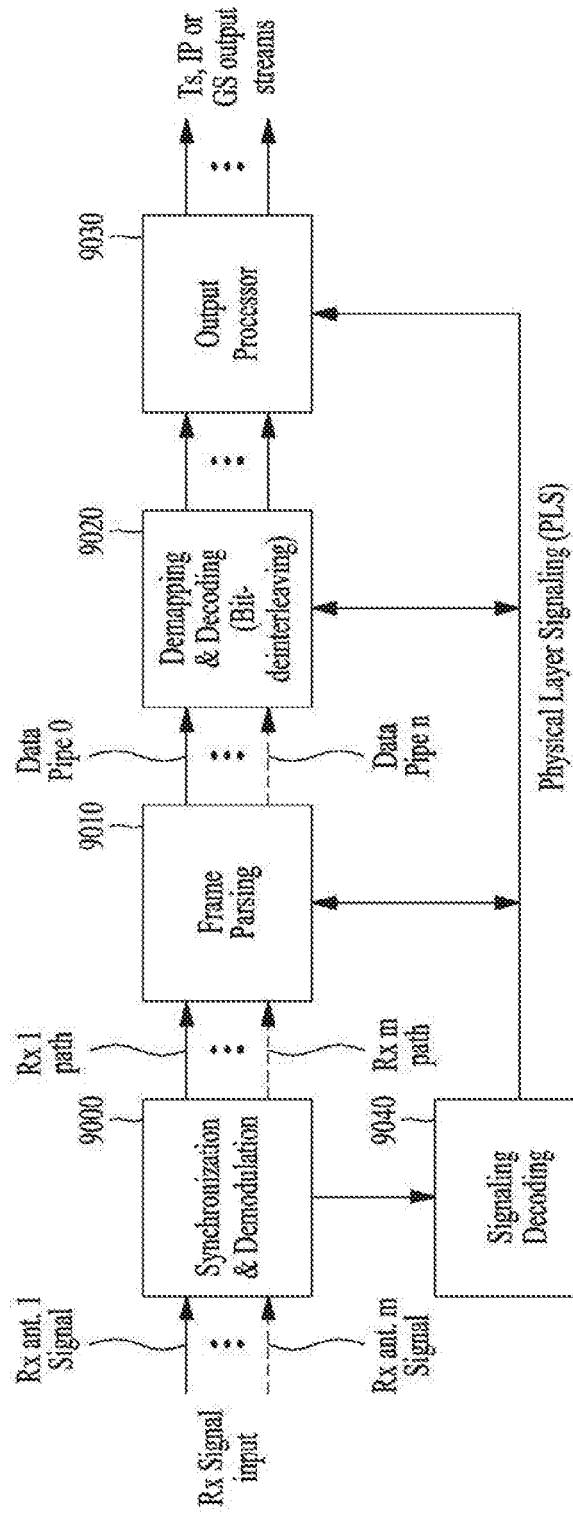
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9100 can parse input signal frames and extract data through which a service selected by a user is transmitted. If the apparatus for transmitting broadcast signals performs interleaving, the frame parsing module 9100 can carry out deinterleaving corresponding to a reverse procedure of interleaving. In this case, the positions of a signal and data that need to be extracted can be obtained by decoding data output from the signaling decoding module 9400 to restore scheduling information generated by the apparatus for transmitting broadcast signals.

The demapping & decoding module 9200 can convert the input signals into bit domain data and then deinterleave the same as necessary. The demapping & decoding module 9200 can perform demapping for mapping applied for transmission efficiency and correct an error generated on a transmission channel through decoding. In this case, the demapping & decoding module 9200 can obtain transmission parameters necessary for demapping and decoding by decoding the data output from the signaling decoding module 9400.

The output processor 9300 can perform reverse procedures of various compression/signal processing procedures which are applied by the apparatus for transmitting broadcast signals to improve transmission efficiency. In this case, the output processor 9300 can acquire necessary control information from data output from the signaling decoding module 9400. The output of the output processor 8300 corresponds to a signal input to the apparatus for transmitting broadcast signals and may be MPEG-TSs, IP streams (v4 or v6) and generic streams.

The signaling decoding module 9400 can obtain PLS information from the signal demodulated by the synchronization & demodulation module 9000. As described above, the frame parsing module 9100, demapping & decoding module 9200 and output processor 9300 can execute functions thereof using the data output from the signaling decoding module 9400.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Futurecast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
| --- | --- |
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
| --- | --- |
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
| --- | --- |
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the (i+1)th (i is the loop index) frame of the associated FRU. This field uses the same signaling format as shown in the table 8.

FRU_FRAME_LENGTH: This 2-bit field indicates the length of the (i+1)th frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the (i+1)th frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Content | PLS2 FEC type |
|---|---|
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
|---|---|
| 000 | BPSK |
| 001 | QPSK |
| 010 | QAM-16 |
| 011 | NUQ-64 |
| 100~111 | Reserved |

PLS2_SIZE_CELL: This 15-bit field indicates Ctotal_partial_block, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates Ctotal_partial_block, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates Ctotal_full_block, The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
|---|---|
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
|---|---|
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
|---|---|
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
|---|---|
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
|---|---|
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates PI, the number of the frames to which each TI group is mapped, and there is one TI-block per TI group (NTI=1). The allowed PI values with 2-bit field are defined in the below table 18.

If the DP_TI_TYPE is set to the value '0', this field indicates the number of TI-blocks NTI per TI group, and there is one TI group per frame (PI=1). The allowed PI values with 2-bit field are defined in the below table 18.

TABLE 18

| 2-bit field | $P_I$ | $N_{TI}$ |
|---|---|---|
| 00 | 1 | 1 |
| 01 | 2 | 2 |
| 10 | 4 | 3 |
| 11 | 8 | 4 |

DP_FRAME_INTERVAL: This 2-bit field indicates the frame interval (IJUMP) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver 5050. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
|---|---|
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
|---|---|
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
|---|---|---|---|
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
|---|---|
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
|---|---|
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
|---|---|
| 00 | Not used |
| 01 | ISSY-UP |

TABLE 24-continued

| Value | ISSY mode |
|---|---|
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
|---|---|
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
|---|---|
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

Figures 15, 16:
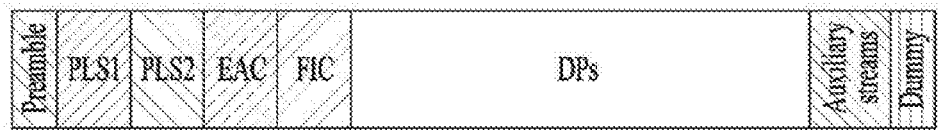
FIG. 15 illustrates PLS2 data according to another embodiment of the present invention.
FIG. 16 illustrates a logical structure of a frame according to an embodiment of the present invention.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| PHY profile | DP_START field size | |
|---|---|---|
| | 64K | 16K |
| Base | 13 bit | 15 bit |
| Handheld | — | 13 bit |
| Advanced | 13 bit | 15 bit |

DP_NUM_BLOCK: This 10-bit field indicates the number of FEC blocks in the current TI group for the current DP. The value of DP_NUM_BLOCK ranges from 0 to 1023

RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

Figure 17:
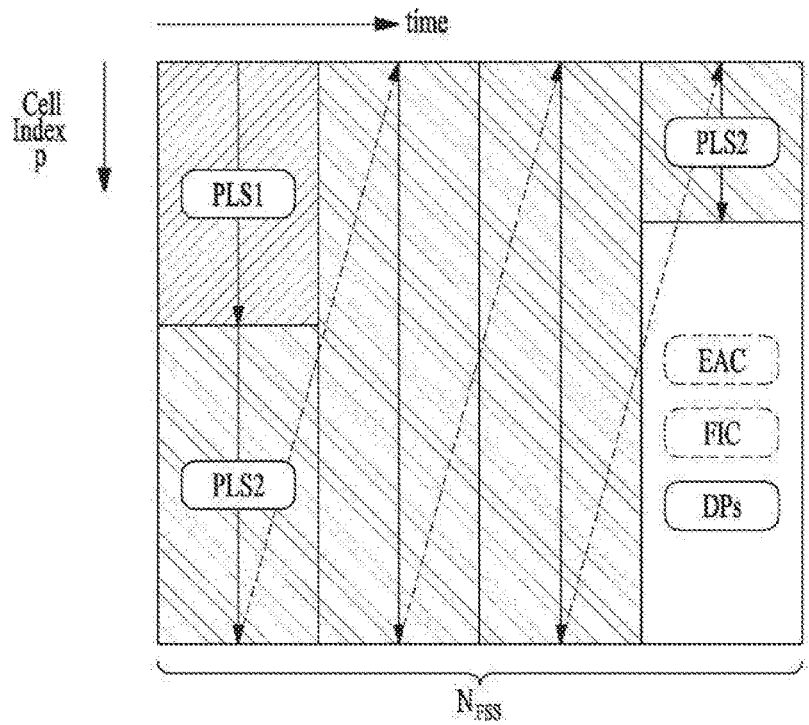
FIG. 17 illustrates PLS mapping according to an embodiment of the present invention.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) NFSS is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the NFSS FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

Figure 18:
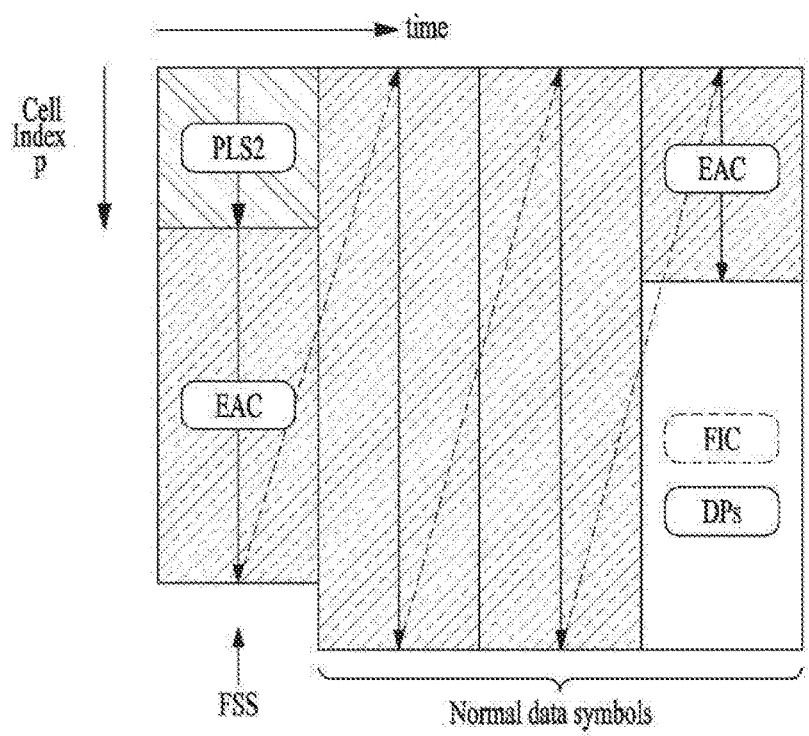
FIG. 18 illustrates EAC mapping according to an embodiment of the present invention.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19:
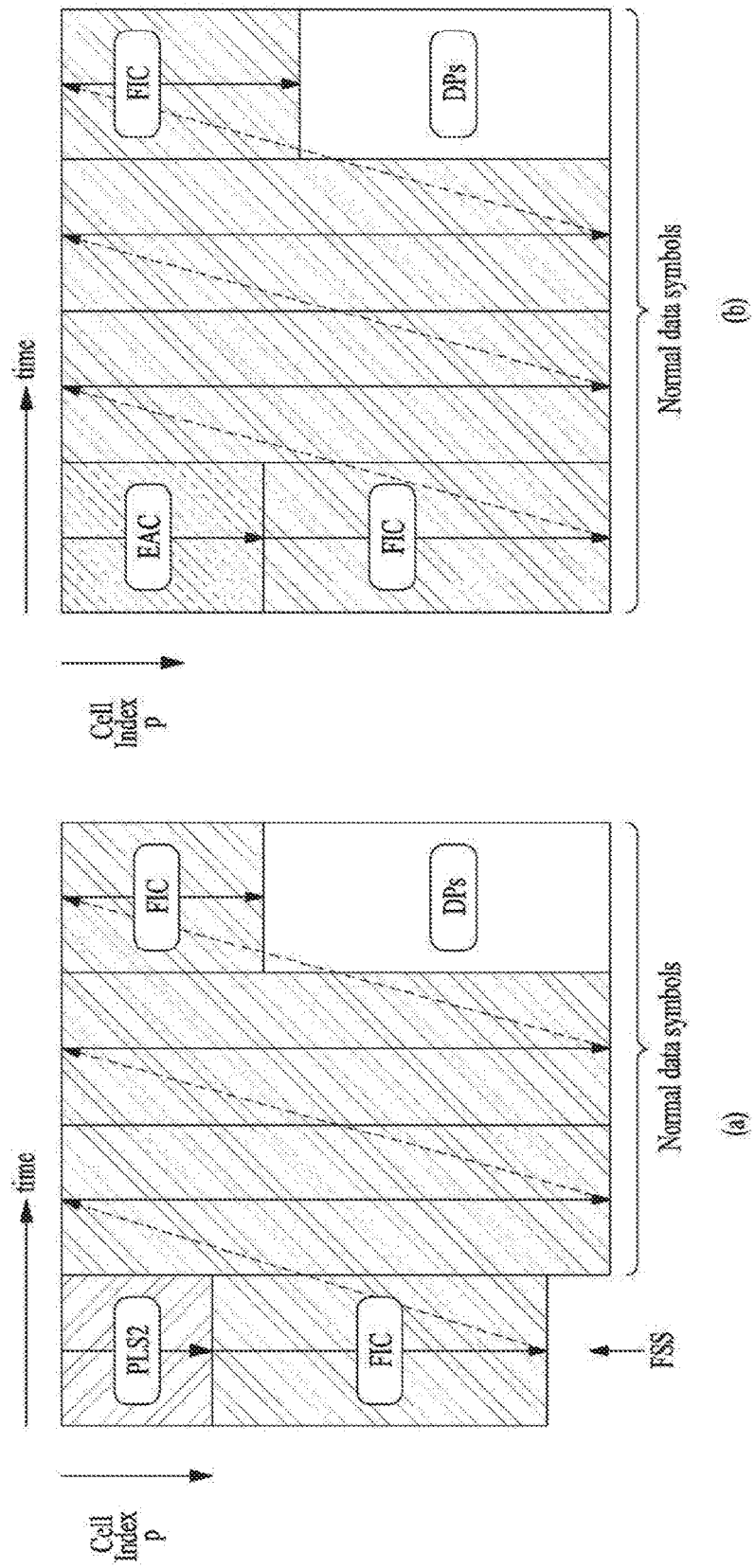
FIG. 19 illustrates FIC mapping according to an embodiment of the present invention.

FIG. 19 illustrates FIC mapping according to an embodiment of the present invention.

shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20:
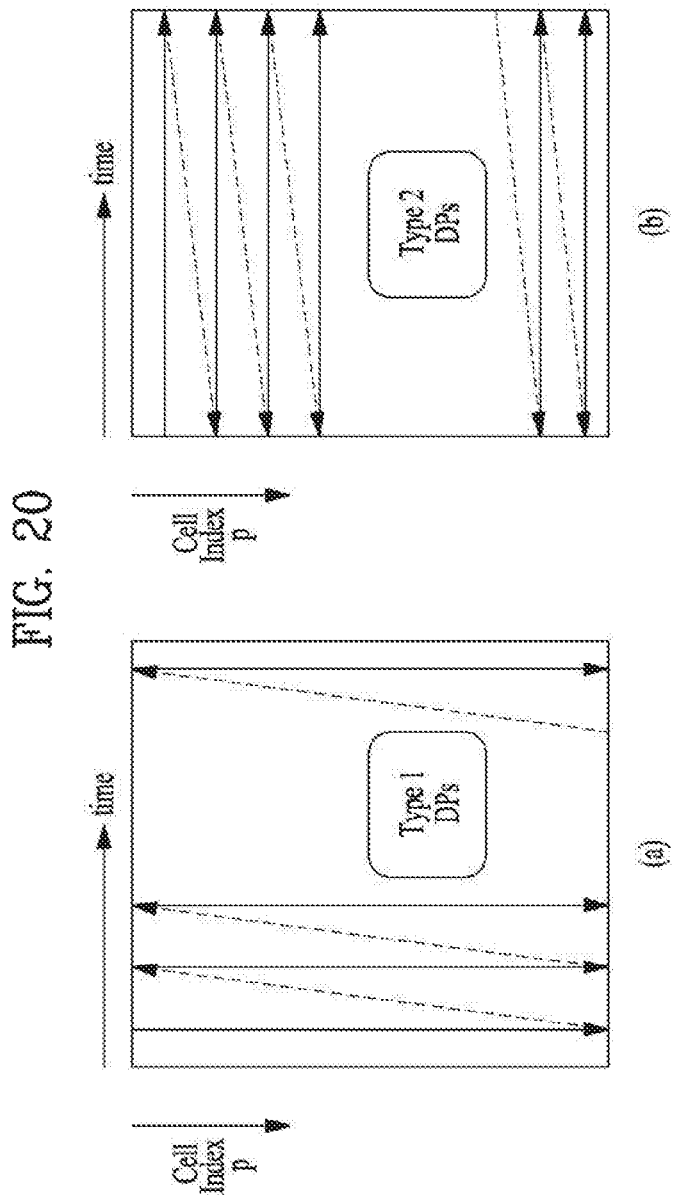
FIG. 20 illustrates a type of DP according to an embodiment of the present invention.

FIG. 20 illustrates a type of DP according to an embodiment of the present invention.

shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP} \quad \text{[Math figure 2]}$$

where DDP1 is the number of OFDM cells occupied by Type 1 DPs, DDP2 is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

Figure 21:
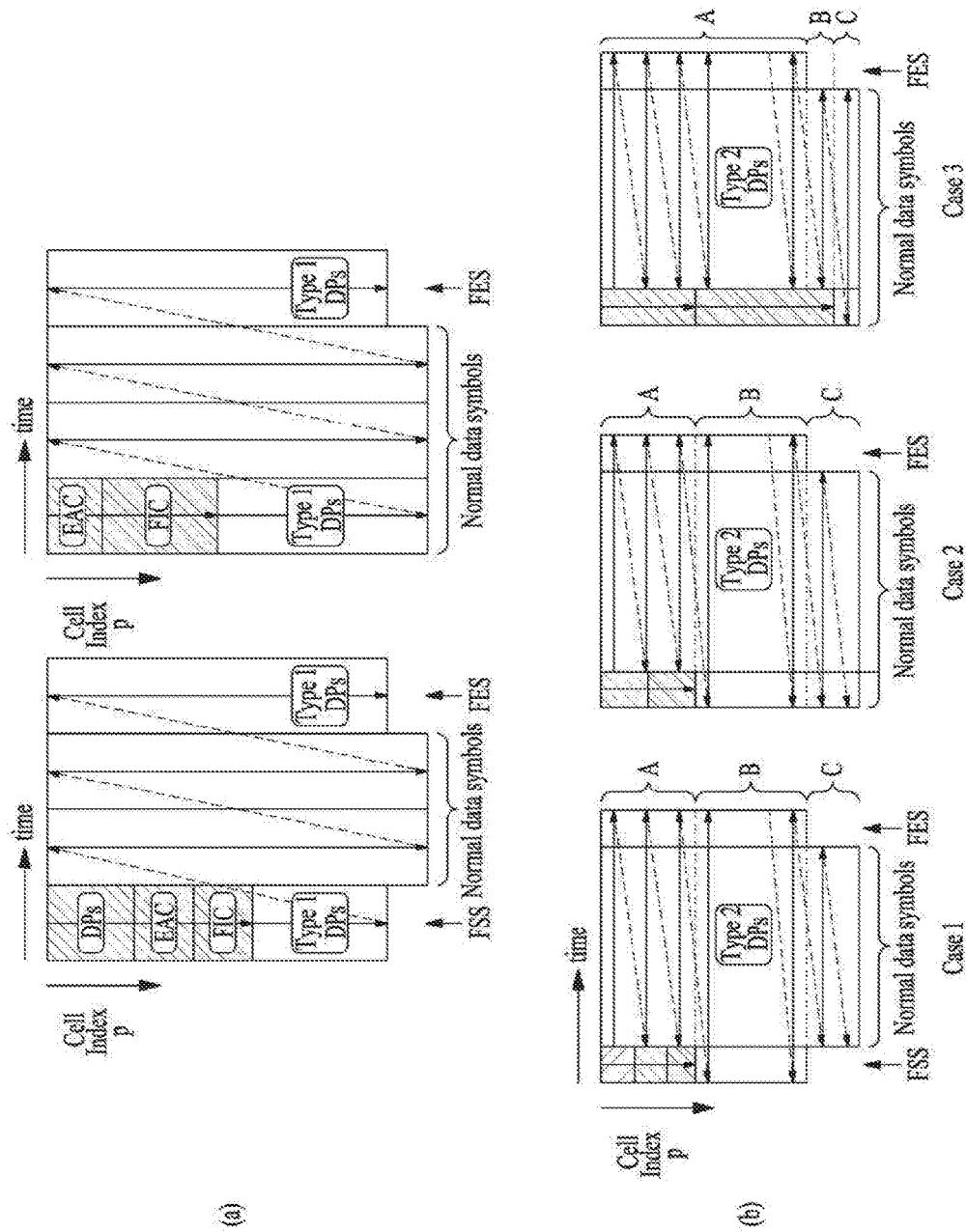
FIG. 21 illustrates DP mapping according to an embodiment of the present invention.

FIG. 21 illustrates DP mapping according to an embodiment of the present invention.

shows an addressing of OFDM cells for mapping type 1 DPs and (b) shows an an addressing of OFDM cells for mapping for type 2 DPs.

Addressing of OFDM cells for mapping Type 1 DPs (0, . . . , DDP1-1) is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs (0, . . . , DDP2-1) is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than CFSS. The third case, shown on the right side in (b), is the same as the second case except that the number of FIC cells mapped on that symbol exceeds CFSS.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, Ncells, is dependent on the FECBLOCK size, Nldpc, and the number of transmitted bits per constellation symbol. A DPU is defined as the greatest common divisor of all possible values of the number of cells in a XFECBLOCK, Ncells, supported in a given PHY profile. The length of a DPU in cells is defined as LDPU. Since each PHY profile supports different combinations of FECBLOCK size and a different number of bits per constellation symbol, LDPU is defined on a PHY profile basis.

Figure 22:
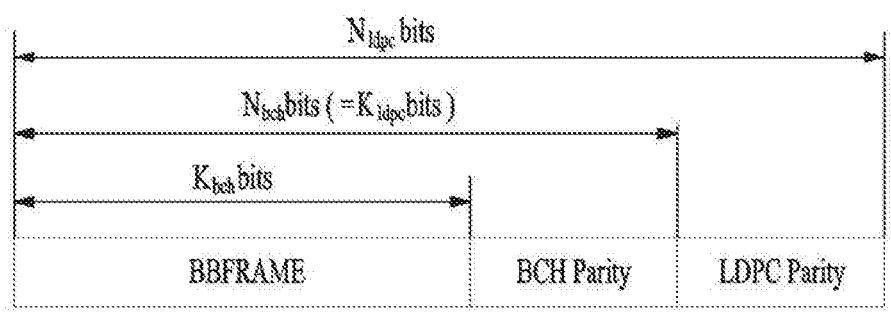
FIG. 22 illustrates an FEC structure according to an embodiment of the present invention.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF (Kbch bits), and then LDPC encoding is applied to BCH-encoded BBF (Kldpc bits=Nbch bits) as illustrated in FIG. 22.

The value of Nldpc is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 29

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |
| 10/15 | | 10800 | 10632 | | |
| 11/15 | | 11880 | 11712 | | |
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed Bldpc (FECBLOCK), Pldpc (parity bits) is encoded systematically from each Ildpc (BCH-encoded BBF), and appended to Ildpc. The completed Bldpc (FECBLOCK) are expressed as follow Math figure.

$$B_{ldpc} = [I_{ldpc}\ P_{ldpc}] = [i_0, i_1, \ldots, i_{K_{ldpc}-1}, p_0, p_1, \ldots, p_{N_{ldpc}-K_{ldpc}-1}]$$ [Math figure 3]

The parameters for long FECBLOCK and short FECBLOCK are given in the above table 28 and 29, respectively.

The detailed procedure to calculate Nldpc–Kldpc parity bits for long FECBLOCK, is as follows:

1) Initialize the parity bits, $$p_0 = p_1 = p_2 = \cdots = p_{N_{ldpc}-K_{ldpc}-1} = 0$$ [Math figure 4]

2) Accumulate the first information bit–i0, at parity bit addresses specified in the first row of an addresses of parity check matrix. The details of addresses of parity check matrix will be described later. For example, for rate 13/15:

$$p_{983} = p_{983} \oplus i_0\ p_{2815} = p_{2815} \oplus i_0$$

$$p_{4837} = p_{4837} \oplus i_0\ p_{4989} = p_{4989} \oplus i_0$$

$$p_{6138} = p_{6138} \oplus i_0\ p_{6458} = p_{6458} \oplus i_0$$

$$p_{6921} = p_{6921} \oplus i_0\ p_{6974} = p_{6974} \oplus i_0$$

$$p_{7572} = p_{7572} \oplus i_0\ p_{8260} = p_{8260} \oplus i_0$$

$$p_{8496} = p_{8496} \oplus i_0$$ [Math figure 5]

3) For the next 359 information bits, is, s=1, 2, . . . , 359 accumulate is at parity bit addresses using following Math figure.

$$\{x + (s\ \mathrm{mod}\ 360) \times Q_{ldpc}\}\ \mathrm{mod}(N_{ldpc} - K_{ldpc})$$ [Math figure 6]

where x denotes the address of the parity bit accumulator corresponding to the first bit i0, and Qldpc is a code rate dependent constant specified in the addresses of parity check matrix. Continuing with the example, Qldpc=24 for rate 13/15, so for information bit i1, the following operations are performed:

$$p_{1007} = p_{1007} \oplus i_1\ p_{2839} = p_{2839} \oplus i_1$$

$$p_{4861} = p_{4861} \oplus i_1\ p_{5013} = p_{5013} \oplus i_1$$

$$p_{6162} = p_{6162} \oplus i_1\ p_{6482} = p_{6482} \oplus i_1$$

$$p_{6945} = p_{6945} \oplus i_1\ p_{6998} = p_{6998} \oplus i_1$$

$$p_{7596} = p_{7596} \oplus i_1\ p_{8284} = p_{8284} \oplus i_1$$

$$p_{8520} = p_{852} \oplus i_1$$ [Math figure 7]

4) For the 361st information bit i360, the addresses of the parity bit accumulators are given in the second row of the addresses of parity check matrix. In a similar manner the addresses of the parity bit accumulators for the following 359 information bits is, s=361, 362, . . . , 719 are obtained using the Math figure 6, where x denotes the address of the parity bit accumulator corresponding to the information bit i360, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i = p_i \oplus p_{i-1}, i=1,2,\ldots,N_{ldpc}-K_{ldpc}-1 \quad \text{[Math figure 8]}$$

where final content of pi, i=0, 1, ... Nldpc−Kldpc−1 is equal to the parity bit pi.

TABLE 30

| Code Rate | $Q_{ldpc}$ |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | $Q_{ldpc}$ |
|---|---|
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
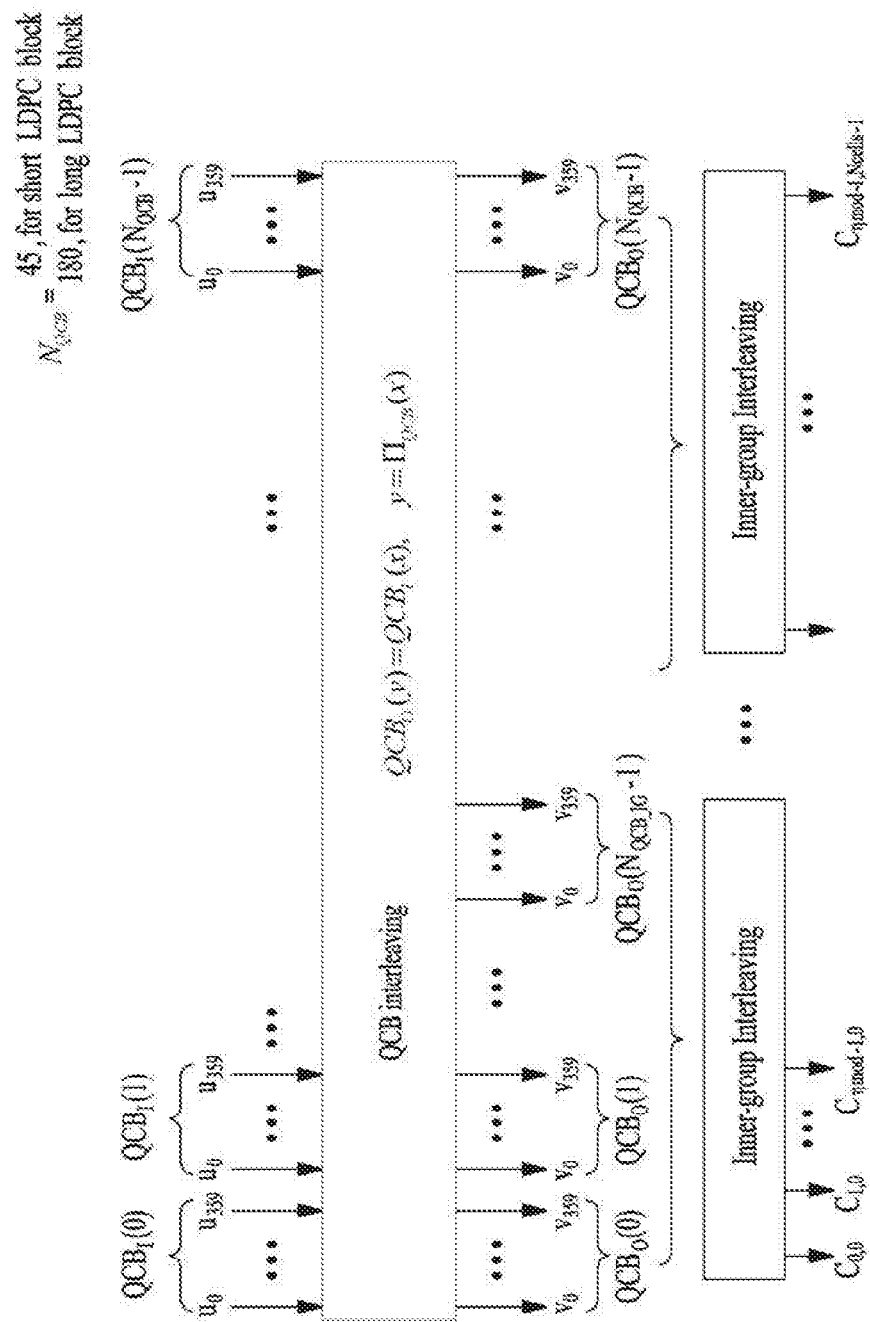
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where Ncells=64800/η mod or 16200/η mod according to the FECBLOCK length. The QCB interleaving pattern is unique to each combination of modulation type and LDPC code rate.

After QCB interleaving, inner-group interleaving is performed according to modulation type and order (η mod) which is defined in the below table 32. The number of QC blocks for one inner-group, NQCB_IG, is also defined.

TABLE 32

| Modulation type | $\eta_{mod}$ | $N_{QCB\_IG}$ |
|---|---|---|
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |
| NUQ-1024 | 10 | 5 |
| NUC-1024 | 10 | 10 |

The inner-group interleaving process is performed with NQCB_IG QC blocks of the QCB interleaving output. Inner-group interleaving has a process of writing and reading the bits of the inner-group using 360 columns and NQCB_IG rows. In the write operation, the bits from the QCB interleaving output are written row-wise. The read operation is performed column-wise to read out m bits from each row, where m is equal to 1 for NUC and 2 for NUQ.

Figure 24:
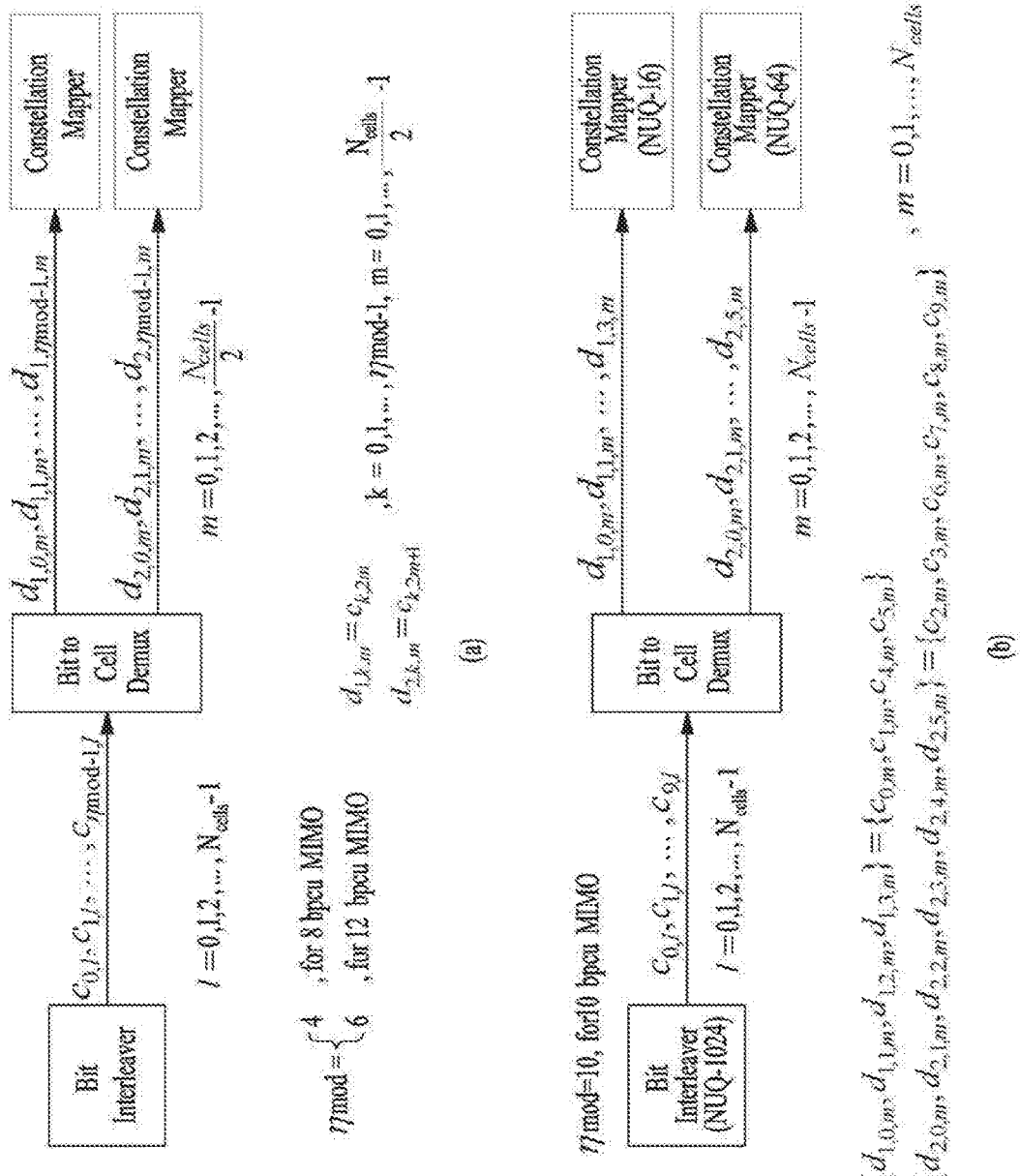
FIG. 24 illustrates a cell-word demultiplexing according to an embodiment of the present invention.

FIG. 24 illustrates a cell-word demultiplexing according to an embodiment of the present invention.

FIG. 24 shows a cell-word demultiplexing for 8 and 12 bpcu MIMO and (b) shows a cell-word demultiplexing for 10 bpcu MIMO.

Each cell word (c0,1, c1,1, ... , cη mod-1,1) of the bit interleaving output is demultiplexed into (d1,0,m, d1, 1,m ... , d1,η mod-1,m) and (d2,0,m, d2,1,m ... , d2,η mod-1,m) as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word (c0,1, c1,1, ... , c9,1) of the Bit Interleaver output is demultiplexed into (d1,0,m, d1, 1,m ... , d1,3,m) and (d2,0,m, d2,1,m ... , d2,5,m), as shown in (b).

Figure 25:
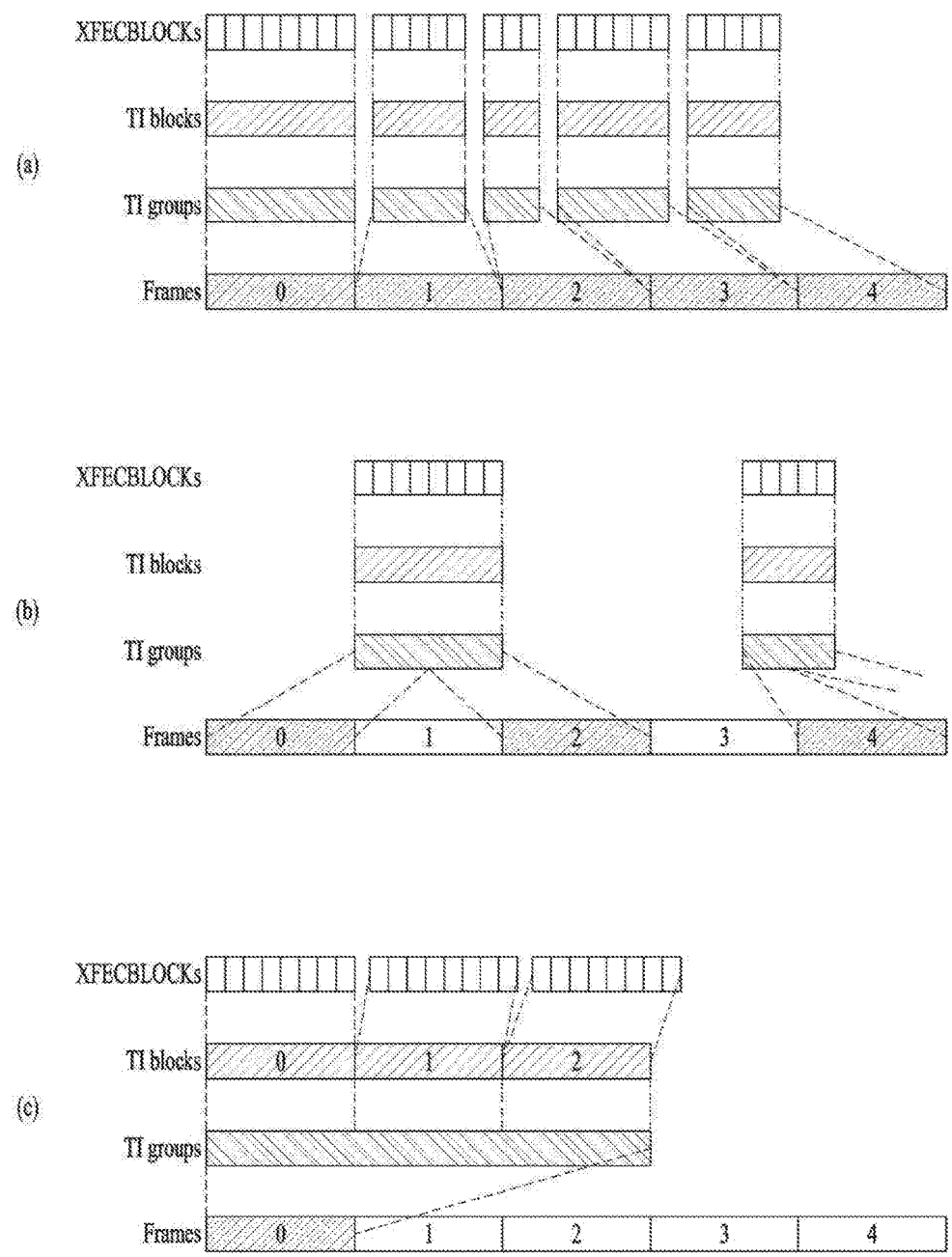
FIG. 25 illustrates a time interleaving according to an embodiment of the present invention.

FIG. 25 illustrates a time interleaving according to an embodiment of the present invention.

to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks NTI per TI group. For DP_TI_TYPE='1', this parameter is the number of frames PI spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames IJUMP between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFEC-BLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by NxBLOCK_Group (n) and is signaled as DP_NUM_BLOCK in the PLS2-DYN data. Note that NxBLOCK_Group(n) may vary from the minimum value of 0 to the maximum value NxBLOCK_Group_MAX (corresponding to DP_NUM_BLOCK_MAX) of which the largest value is 1023.

Each TI group is either mapped directly onto one frame or spread over PI frames. Each TI group is also divided into more than one TI blocks(NTI), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Modes | Descriptions |
|---|---|
| Option-1 | Each TI group contains one TI block and is mapped directly to one frame as shown in (a). This option is signaled in the PLS2-STAT by DP_TI_TYPE = '0' and DP_TI_LENGTH = '1'($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = $N_{TI}$, while $P_I$ = 1. |

In each DP, the TI memory stores the input XFECBLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1},$$
$$\ldots, d_{n,s,N_{xBlock\_Ti}(n,s)-1,0}, \ldots, d_{n,s,N_{xBlock\_Ti}(n,s)-1,N_{cells}-1}),$$

where $d_{n,s,r,q}$ is the qth cell of the rth XFECBLOCK in the sth TI block of the nth TI group and represents the outputs of SSD and MIMO encodings as follows $$d_{n,s,r,q} = \begin{cases} f_{n,s,r,q}, & \text{the output of } SSD \ldots \text{encoding} \\ g_{n,s,r,q}, & \text{the output of } MIMO \text{ encoding} \end{cases}.$$

In addition, assume that output XFECBLOCKs from the time interleaver 5050 are defined as $$(h_{n,s,0}, h_{n,s,1}, \ldots, h_{n,s,i}, \ldots, h_{n,s,N_{xBlock\_Ti}(n,s) \times N_{cells}-1}),$$

where $h_{n,s,j}$ is the ith output cell (for i=0, . . . , $N_{xBLOCK\_TI}$(n,s)×$N_{cells}$−1) in the sth TI block of the nth TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the sth TI block of the nth TI group, the number of rows $N_r$ of a TI memory is equal to the number of cells $N_{cells}$, i.e., $N_r = N_{cells}$ while the number of columns $N_c$ is equal to the number $N_{xBLOCK\_TI}$(n,s).

Figure 26:
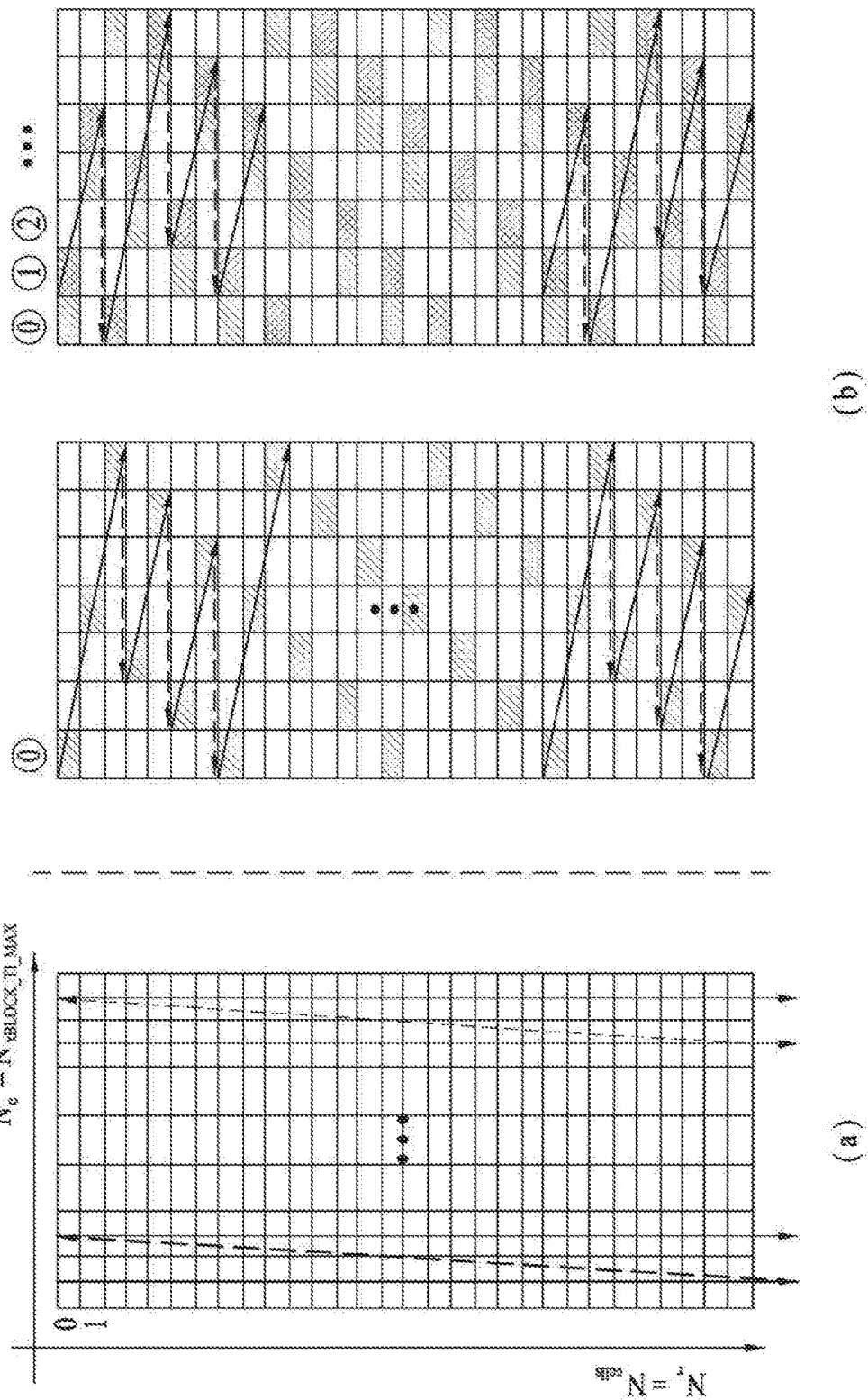
FIG. 26 illustrates the basic operation of a twisted row-column block interleaver according to an embodiment of the present invention.

FIG. 26 illustrates the basic operation of a twisted row-column block interleaver according to an embodiment of the present invention.

FIG. 26 (a) shows a writing operation in the time interleaver and FIG. 26(b) shows a reading operation in the time interleaver The first XFECBLOCK is written column-wise into the first column of the TI memory, and the second XFECBLOCK is written into the next column, and so on as shown in (a). Then, in the interleaving array, cells are read out diagonal-wise. During diagonal-wise reading from the first row (rightwards along the row beginning with the left-most column) to the last row, $N_r$ cells are read out as shown in (b). In detail, assuming $z_{n,s,l}$ (l=0, . . . , $N_rN_c$) as the TI memory cell position to be read sequentially, the reading process in such an interleaving array is performed by calculating the row index $R_{n,s,i}$, the column index $C_{n,s,i}$, and the associated twisting parameter $T_{n,s,i}$ as follows expression.

[Math Figure 9]

GENERATE ($R_{n,s,i}$, $C_{n,s,i}$) =
{
$R_{n,s,i}$ = mod (i, $N_r$)
$T_{n,s,i}$ = mod($S_{shift} \times R_{n,s,i}$, $N_c$),
$C_{n,s,i}$ = mod$\left(T_{n,s,i} + \left\lfloor \dfrac{i}{N_r} \right\rfloor, N_c\right)$
} where $S_{shift}$ is a common shift value for the diagonal-wise reading process regardless of $N_{xBLOCK\_TI}$(n,s), and it is determined by $N_{xBLOCK\_TI\_MAX}$ given in the PLS2-STAT as follows expression.

$$\text{for} \begin{cases} N'_{xBLOCK\_TI\_MAX} = N_{xBLOCK\_TI\_MAX} + 1, & \text{if } N_{xBLOCK\_TI\_MAX} \bmod 2 = 0 \\ N'_{xBLOCK\_TI\_MAX} = N_{xBLOCK\_TI\_MAX}, & \text{if } N_{xBLOCK\_TI\_MAX} \bmod 2 = 1 \end{cases},$$

[Math FIG. 10]

$$S_{shift} = \dfrac{N'_{xBLOCK\_TI\_MAX} - 1}{2}$$

As a result, the cell positions to be read are calculated by a coordinate as $z_{n,s,i} = N_r C_{n,s,i} + R_{n,s,i}$.

Figure 27:
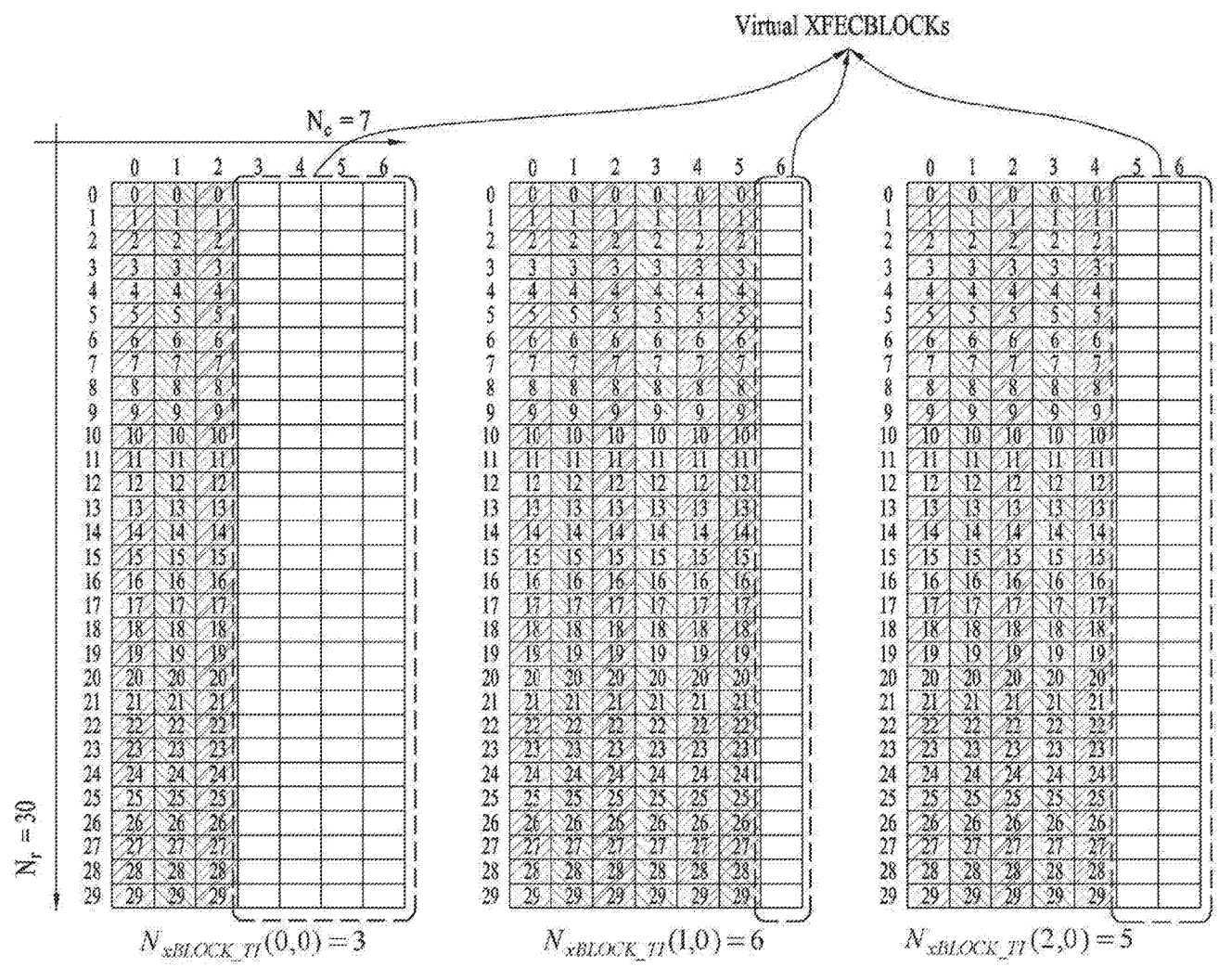

FIG. 27 illustrates an operation of a twisted row-column block interleaver according to another embodiment of the present invention.

More specifically, FIG. 27 illustrates the interleaving array in the TI memory for each TI group, including virtual XFECBLOCKs when $N_{xBLOCK\_TI}(0,0)=3$, $N_{xBLOCK\_TI}(1,0)=6$, $N_{xBLOCK\_TI}(2,0)=5$.

The variable number $N_{xBLOCK\_TI}(n,s)=N$, will be less than or equal to $N'_{xBLOCK\_TI\_MAX}$. Thus, in order to achieve a single-memory deinterleaving at the receiver side, regardless of $N_{xBLOCK\_TI}(n,s)$, the interleaving array for use in a twisted row-column block interleaver is set to the size of $N_r \times N_c = N_{cells} \times N'_{xBLOCK\_TI\_MAX}$ by inserting the virtual XFECBLOCKs into the TI memory and the reading process is accomplished as follow expression.

[Math FIG. 11]

p = 0;
for i = 0;i < $N_{cells} N_{xBLOCK\_TI\_MAX}$;i = i + 1
{GENERATE ($R_{n,s,i}$, $C_{n,s,i}$);
$V_i = N_r C_{n,s,j} + R_{n,s,j}$
  if $V_i$ < $N_{cells} N_{xBLOCK\_TI}$(n,s)
  {
    $Z_{n,s,p} = V_i$; p = p + 1;
  }
}

The number of TI groups is set to 3. The option of time interleaver is signaled in the PLS2-STAT data by DP_TI_TYPE='0', DP_FRAME_INTERVAL='1', and DP_TI_LENGTH='1', i.e., NTI=1, IJUMP=1, and PI=1. The number of XFECBLOCKs, each of which has Ncells=30 cells, per TI group is signaled in the PLS2-DYN data by NxBLOCK_TI(0,0)=3, NxBLOCK_TI(1,0)=6, and NxBLOCK_TI(2,0)=5, respectively. The maximum number of XFECBLOCK is signaled in the PLS2-STAT data by NxBLOCK_Group_MAX, which leads to $\lfloor N_{xBLOCK\_Group\_MAX}/N_{TI} \rfloor = N_{xBLOCK\_TI\_MAX} = 6$.

Figure 28:
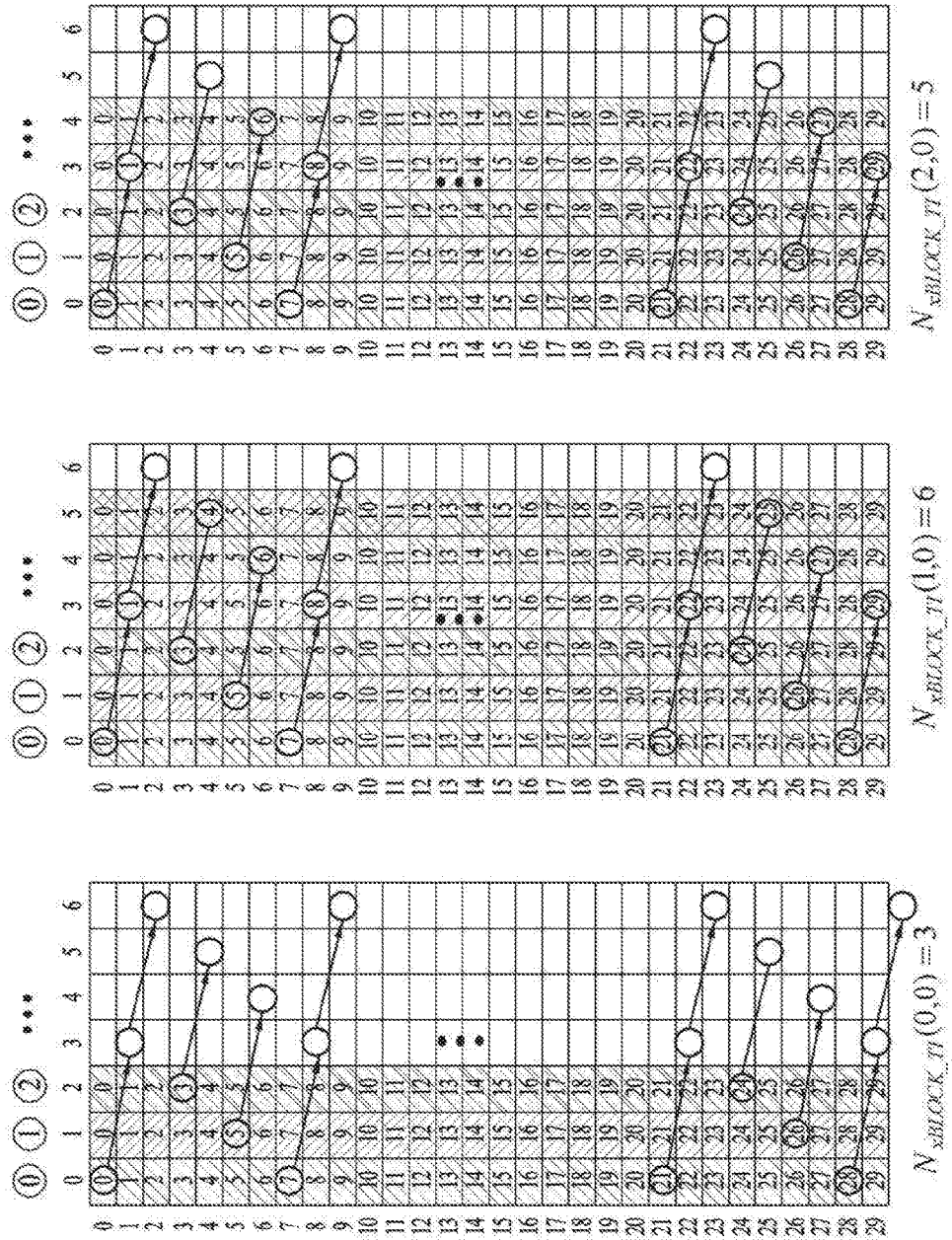
FIG. 28 illustrates a diagonal-wise reading pattern of a twisted row-column block interleaver according to an embodiment of the present invention.

FIG. 28 illustrates a diagonal-wise reading pattern of a twisted row-column block interleaver according to an embodiment of the present invention.

More specifically FIG. 28 shows a diagonal-wise reading pattern from each interleaving array with parameters of $N'_{xBLOCK\_TI\_MAX}=7$ and Sshift=(7−1)/2=3. Note that in the reading process shown as pseudocode above, if $V_i \geq N_{cells} N_{xBLOCK\_TI}(n,s)$, the value of Vi is skipped and the next calculated value of Vi is used.

Figure 29:
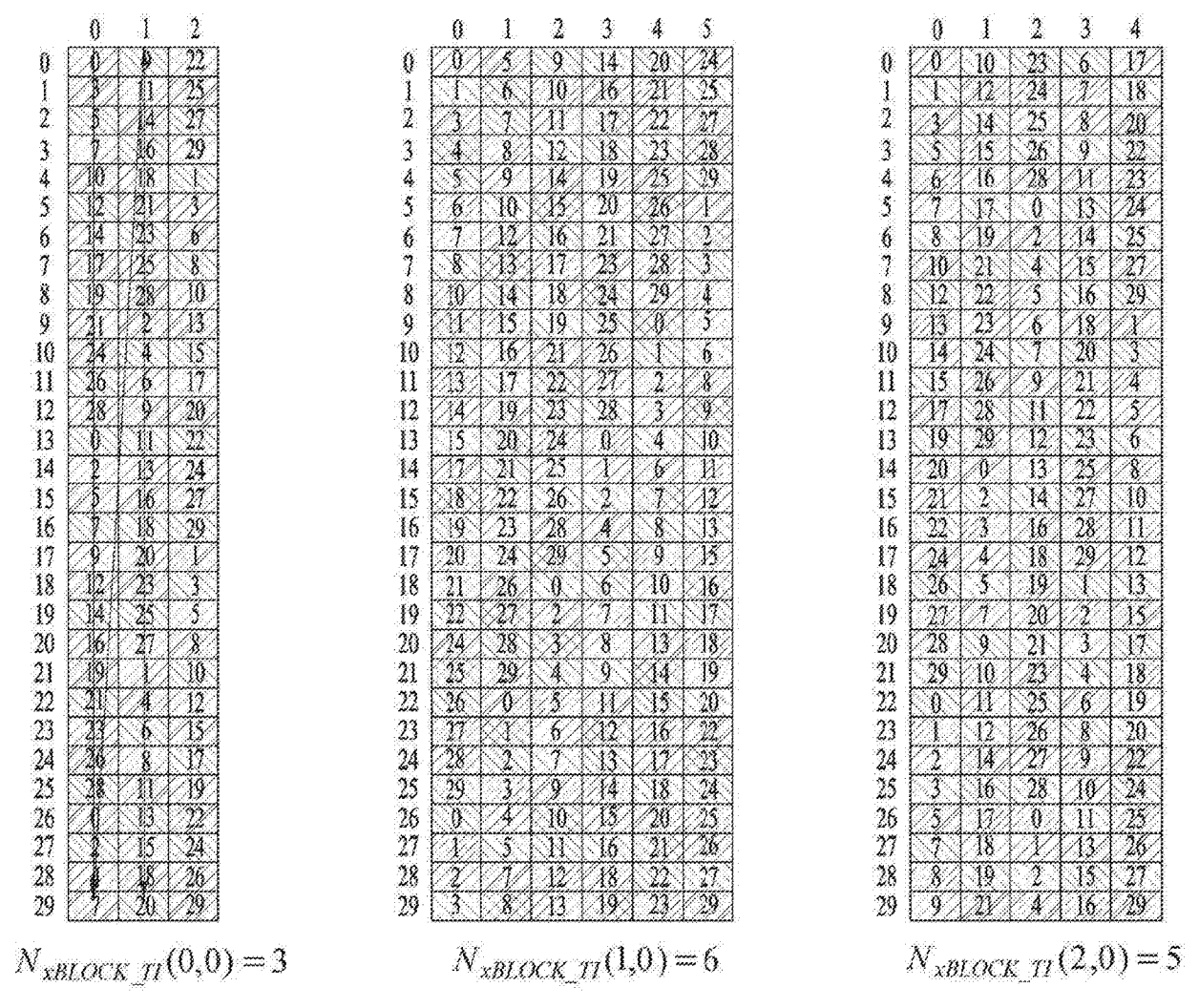

FIG. 29 illustrates interleaved XFECBLOCKs from each interleaving array according to an embodiment of the present invention.

FIG. 29 illustrates the interleaved XFECBLOCKs from each interleaving array with parameters of $N'_{xBLOCK\_TI\_MAX}=7$ and Sshift=3.

Figure 30:
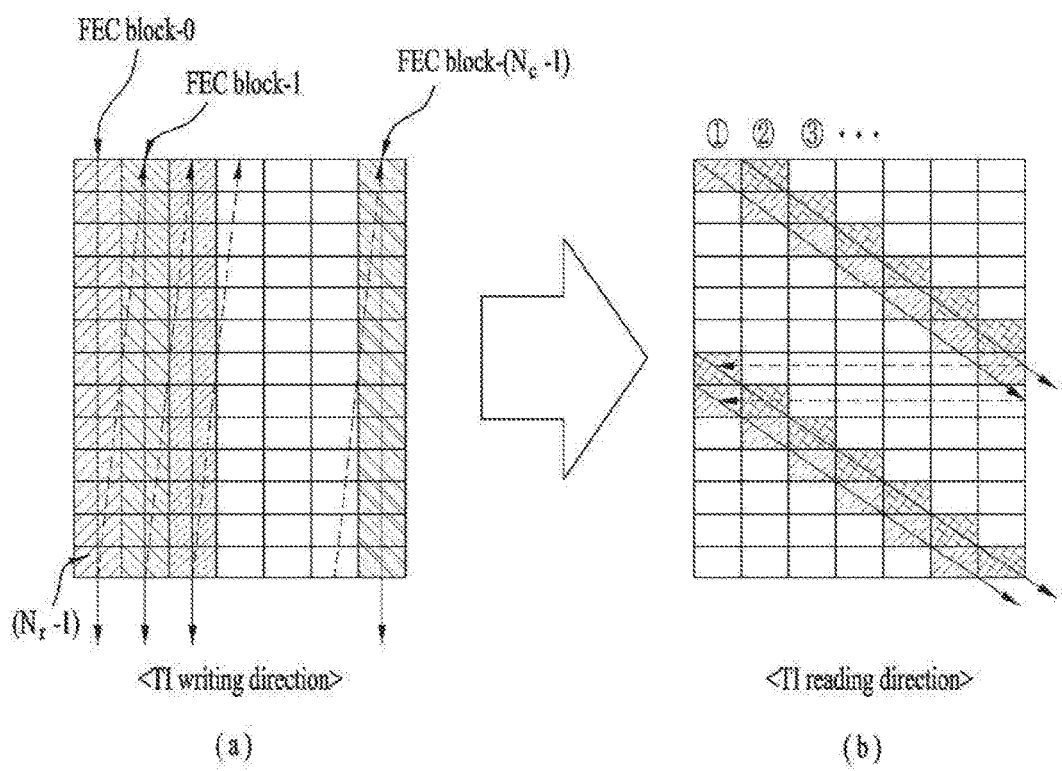
FIG. 30 illustrates a time interleaving process according to an embodiment of the present invention.

FIG. 30 illustrates a time interleaving process according to an embodiment of the present invention.

As described above, a timer interleaver (or time interleaver block) included in a broadcast signal transmitter according to an embodiment of the present invention interleaves cells belonging to a plurality of FEC blocks in the time domain and outputs the interleaved cells.

TI group is a unit over which dynamic capacity allocation for a particular DP is carried out, made up of an integer, dynamically varying number of FEC blocks. Time interleaving block (TI block) is a set of cells within which time interleaving is carried out, corresponding to one use of the time interleaver memory. FEC block may be a set of encoded bits of a DP data or a set of number of cells carrying all the encoded bits.

Each TI group is either mapped directly onto one frame or spread over multiple frames. Each TI group is also divided into more than one TI blocks, where each TI block corresponds to one usage of time interleaver memory. The TI blocks within the TI group may contain slightly different numbers of FECBLOCKs.

The cells of the FEC blocks are transmitted being distributed in a specific period corresponding to a time interleaving depth through time interleaving, and thus diversity gain can be obtained. The time interleaver according to an embodiment of the present invention operates at the DP level.

In addition, the time interleaver according to an embodiment of the present invention can perform time interleaving including a writing operation of sequentially arranging different input FEC blocks in a predetermined memory and a diagonal reading operation of interleaving the FEC blocks in a diagonal direction. Time interleaving according to an embodiment of the present invention may be referred to as diagonal-type time interleaving or diagonal-type TI.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The name of a device which performs time interleaving or the location or function of the device may be changed according to designer.

A TI block according to an embodiment may be composed of Nc FEC blocks and the length of an FEC block may be assumed to be Nr×1. Accordingly, a TI memory according to an embodiment of the present invention can have a size corresponding to an Nr×Nc matrix. In addition, the depth of time interleaving according to an embodiment of the present invention corresponds to the FEC block length. FIG. 30(a) shows a writing direction of time interleaving according to an embodiment of the present invention and FIG. 30(b) shows a reading direction of time interleaving according to an embodiment of the present invention.

Specifically, the broadcast signal transmitter according to an embodiment of the present invention can sequentially write input FEC blocks column-wise in a TI memory having a size of Nr×Nc (column-wise writing), as shown in FIG. 30(a). The first FECBLOCK 0 is written column-wise into the first column of the TI memory, and the second FECBLOCK 1 is written in the next column, and so on.

The broadcast signal transmitter according to an embodiment of the present invention can read the FEC blocks written column-wise in a diagonal direction, as shown in FIG. 30(b). In this case, the broadcast signal transmitter according to an embodiment of the present invention can perform diagonal reading for one period.

That is, during diagonal-wise reading from the first row (rightwards along the row beginning with the left-most column) to the last row, cells are read out as shown in FIG. 30(b).

Particularly, since the diagonal reading process of the first period starts at (0,0) of the memory matrix and is performed until the cell of the lowest row is read, cells within different FEC blocks can be uniformly interleaved. Diagonal reading of the next periods can be performed in order of ①, ② and ③ in FIG. 30 (b).

Figure 31:
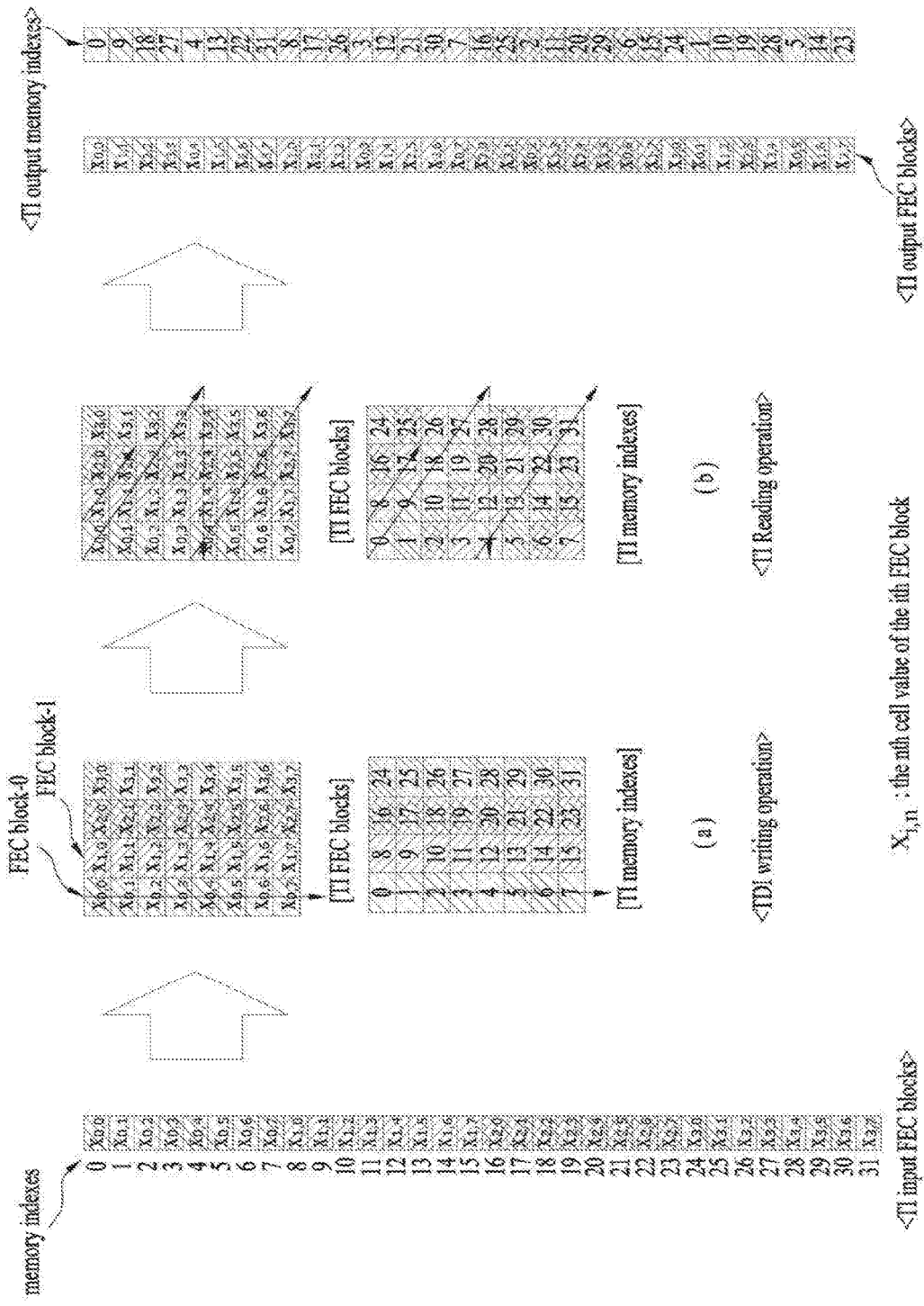
FIG. 31 illustrates a time interleaving process according to another embodiment of the present invention.

FIG. 31 illustrates a time interleaving process according to another embodiment of the present invention.

FIG. 31 shows another embodiment of the aforementioned writing operation and reading operation of the diagonal-type TI.

One TI block according to an embodiment of the present invention includes 4 FEC blocks each of which may be composed of 8 cells. Accordingly, the TI memory has a size corresponding to an 8×4 (or 32×1) matrix and the column length and row length of the TI memory respectively correspond to the FEC block length (or time interleaving depth) and the number of FECs.

TI input FEC blocks shown in the left part of FIG. 31 are FEC blocks sequentially input to the time interleaver.

TI FEC blocks shown in the middle of FIG. 31 show n-th cell values of an i-th FEC block stored in the TI memory and TI memory indexes indicate the order of cells of FEC blocks stored in the TI memory.

FIG. 31($a$) illustrates TI writing operation. As described above, sequentially input FEC blocks can be sequentially written column-wise into the TI memory. Accordingly, cells of the FEC blocks are sequentially stored and written with TI memory indexes.

FIG. 31($b$) illustrates TI reading operation. As shown in FIG. 31($b$), cell values stored in the TI memory can be diagonally read and output in the order of memory indexes 0, 9, 18, 27, . . . . Moreover a position of cell to start diagonal-wise reading or diagonal-wise reading pattern may be be changed according to designer.

TI output FEC blocks shown in the right part of FIG. 31 sequentially indicate cell values output through diagonal-type TI according to an embodiment of the present invention. TI output memory indexes correspond to the cell values output through diagonal-type TI.

Consequently, the time interleaver according to an embodiment of the present invention can perform diagonal-type TI by sequentially generating TI output memory indexes for sequentially input FEC blocks.

Figure 32:
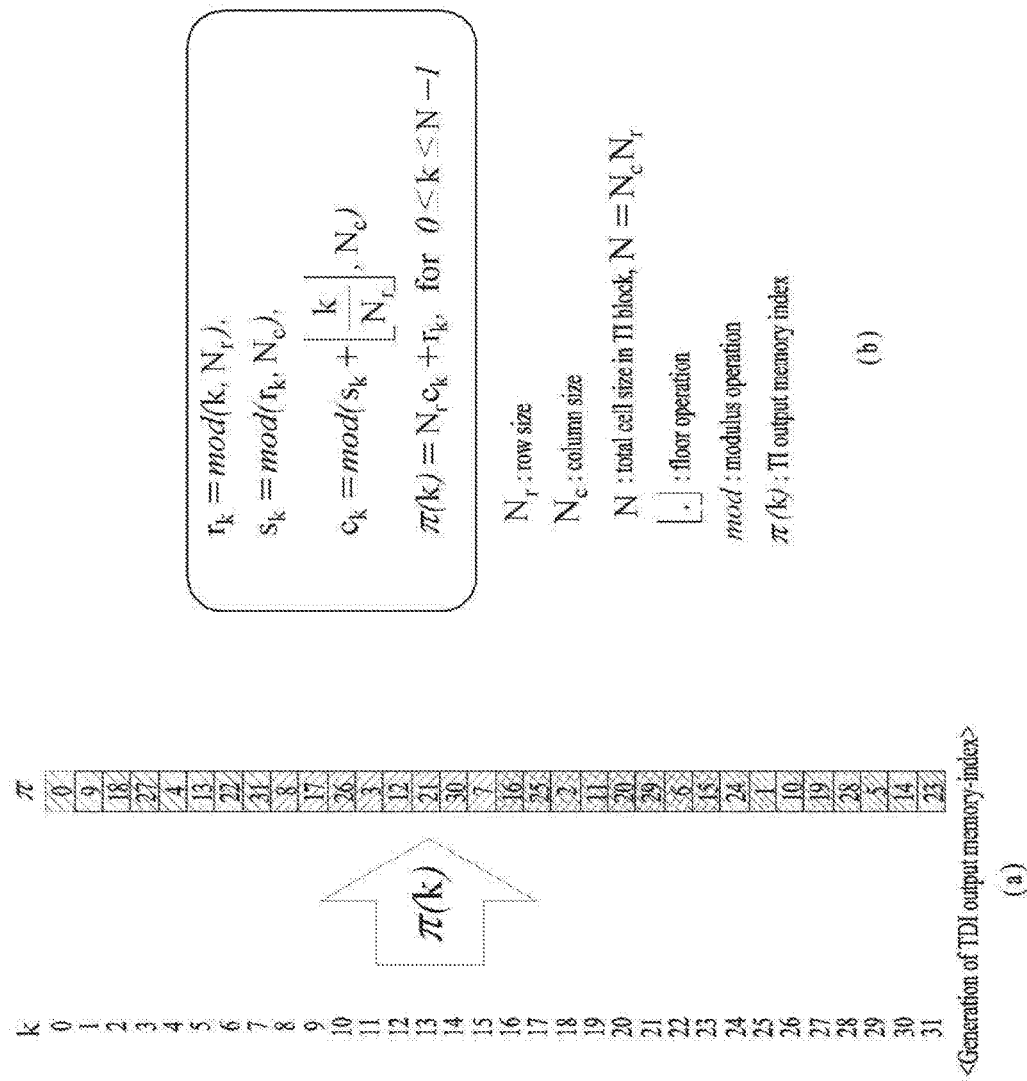
FIG. 32 illustrates a process of generating TI output memory indexes according to an embodiment of the present invention.

FIG. 32 illustrates a process of generating TI output memory indexes according to an embodiment of the present invention.

As described above, the time interleaver according to an embodiment of the present invention can perform diagonal-type TI by sequentially generating TI output memory index values for sequentially input FEC blocks.

FIG. 32 ($a$) illustrates a process of generating diagonal-type TI memory indexes for the above-described sequentially input FEC blocks and FIG. 32 ($b$) shows equations representing the memory index generation process.

A time deinterleaver (or time deinterleaver block) included in a broadcast signal receiver according to an embodiment of the present invention can perform inverse processing of the aforementioned diagonal-type TI. That is, the time deinterleaver according to an embodiment of the present invention can perform time deinterleaving by receiving FEC blocks on which diagonal-type TI has been performed, writing the FEC blocks diagonal-wise in a TI memory and then sequentially reading the FEC blocks. Time deinterleaving according to an embodiment of the present invention may be referred to as diagonal-type TDI or diagonal-type time deinterleaving. The name of a device performing time deinterleaving or the location or function of the device may be changed according to designer.

Figure 33:
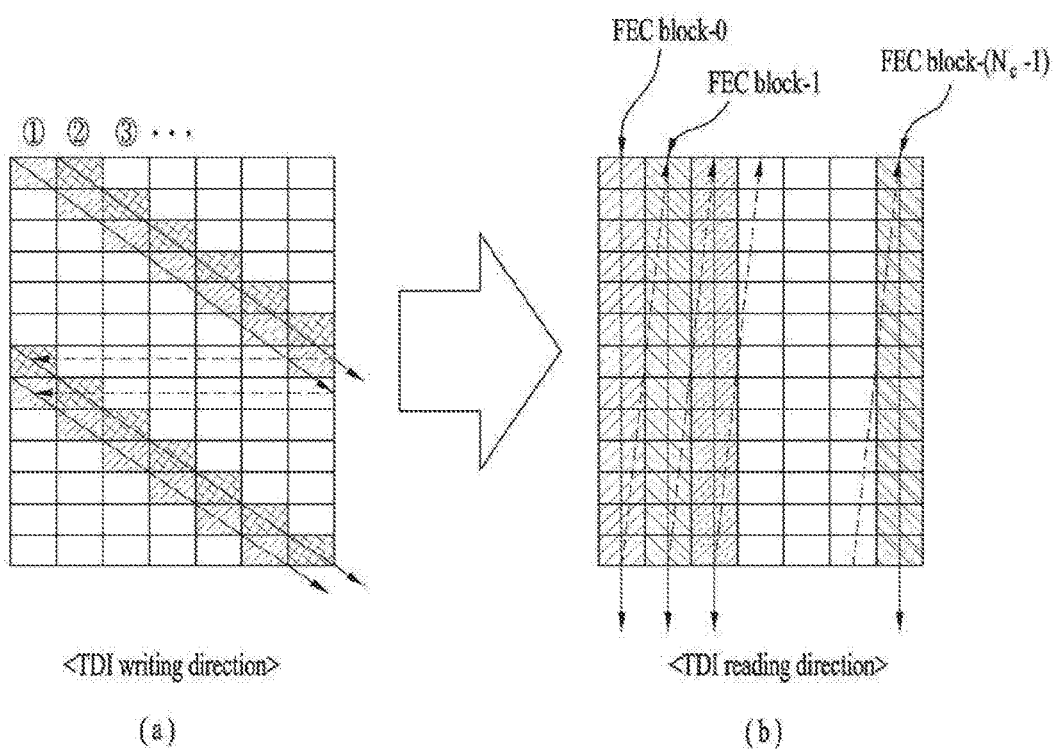
FIG. 33 illustrates a time deinterleaving process according to an embodiment of the present invention.

FIG. 33 illustrates a time deinterleaving process according to an embodiment of the present invention.

The time deinterleaving process shown in FIG. 33 corresponds to inverse processing of the time interleaving process shown in FIG. 30.

FIG. 33 ($a$) shows a writing direction of time deinterleaving according to an embodiment of the present invention and FIG. 33 ($b$) shows a reading direction of time deinterleaving according to an embodiment of the present invention.

Specifically, the time deinterleaver according to an embodiment of the present invention can receive FEC blocks on which diagonal-type TI has been performed from a transmitter and diagonally write the FEC blocks into a TDI (time deinterleaver) memory (diagonal-wise writing).

In this case, the time deinterleaver according to an embodiment of the present invention can perform diagonal writing for one period.

Particularly, diagonal reading of the first period starts at (0,0) of the memory matrix and is performed until the cell of the lowest row is read. Diagonal writing of respective periods can be performed in order of ①, ② and ③ in FIG. 33 ($b$).

As shown in FIG. 33 ($b$), the time deinterleaver according to an embodiment of the present invention can sequentially read diagonally written FEC blocks column-wise (column-wise reading).

Figure 34:
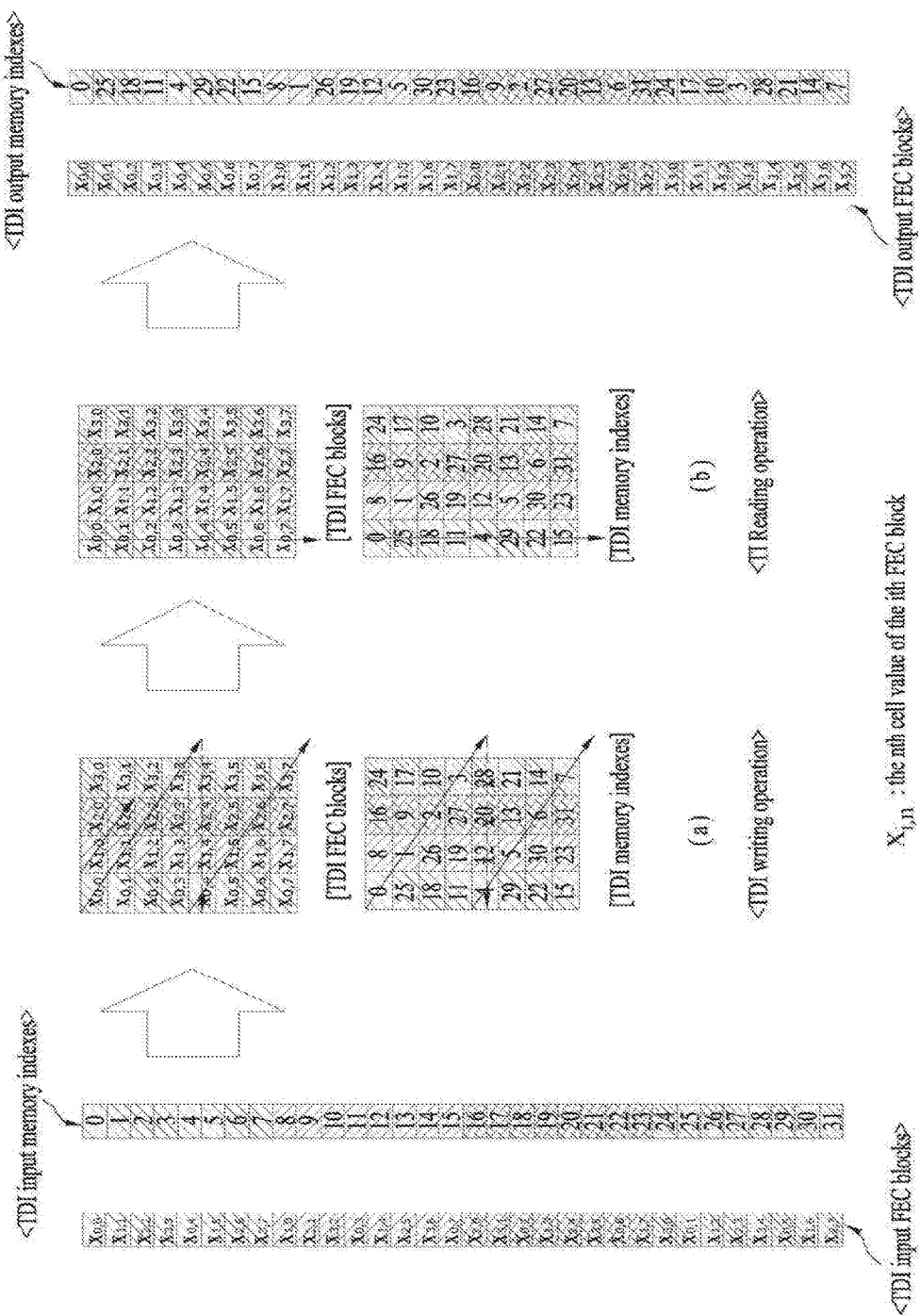
FIG. 34 illustrates a time deinterleaving process according to another embodiment of the present invention.

FIG. 34 illustrates a time deinterleaving process according to another embodiment of the present invention.

The time deinterleaving process shown in FIG. 34 is the inverse of the time interleaving process shown in FIG. 31.

One TI block according to an embodiment of the present invention includes 4 FEC blocks each of which may be composed of 8 cells. Accordingly, the TI memory has a size corresponding to an 8×4 (or 32×1) matrix and the column length and row length of the TI memory respectively correspond to the FEC block length (or time interleaving depth) and the number of FECs.

TDI input FEC blocks shown in the left part of FIG. 34 represent cells of FEC blocks sequentially input to the time deinterleaver and TDI input memory indexes correspond to the cells of the sequentially input FEC blocks.

TDI FEC blocks shown in the middle of FIG. 34 show n-th cell values of an i-th FEC block stored in the TDI memory and TDI memory indexes indicate the order of cells of FEC blocks stored in the TDI memory.

FIG. 34 ($a$) illustrates TDI writing operation. As described above, sequentially input FEC blocks can be sequentially written to the TDI memory diagonal-wise. Accordingly, the cells of the input FEC blocks are sequentially stored and written with TDI memory indexes.

FIG. 34 ($b$) illustrates TDI reading operation. As shown in FIG. 34 ($b$), cell values stored in the TDI memory can be column-wise read and output in the order of memory indexes 0, 1, 2, 3, . . . .

TDI output FEC blocks shown in the right part of FIG. 34 sequentially indicate cell values output through time deinterleaving according to an embodiment of the present invention. TDI output memory indexes correspond to the cell values output through time deinterleaving according to an embodiment of the present invention.

Consequently, the time deinterleaver according to an embodiment of the present invention can perform diagonal-type TDI by sequentially generating TDI output memory index values for sequentially input FEC blocks.

Figure 35:
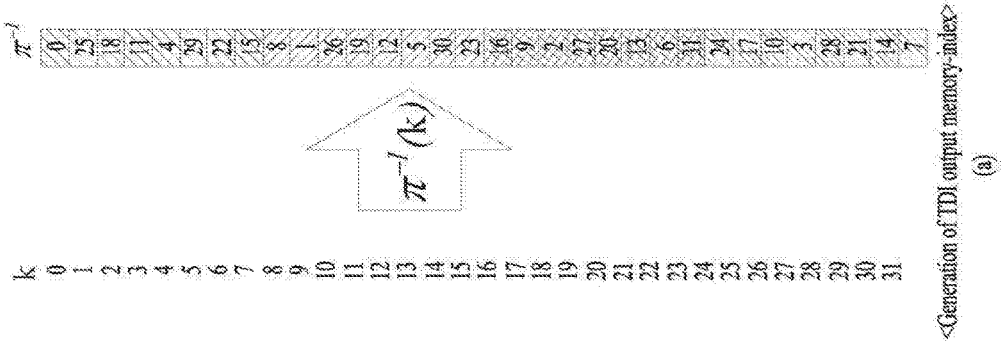
FIG. 35 illustrates a process of generating TDI output memory indexes according to an embodiment of the present invention.

FIG. 35 illustrates a process of generating TDI output memory indexes according to an embodiment of the present invention.

As described above, the time deinterleaver according to an embodiment of the present invention can perform diagonal-type TDI by sequentially generating TDI output memory index values for sequentially input FEC blocks.

FIG. 35 (a) illustrates a process of generating diagonal-type TDI memory indexes for the above-described sequentially input FEC blocks and FIG. 32 (b) shows equations representing the memory index generation process.

The broadcast signal transmitter according to an embodiment of the present invention may be a variable data-rate system in which a plurality of FEC blocks is packed and configured as a plurality of TI blocks and transmitted. In this case, TI blocks may have different numbers of FEC blocks included therein.

Figure 36:
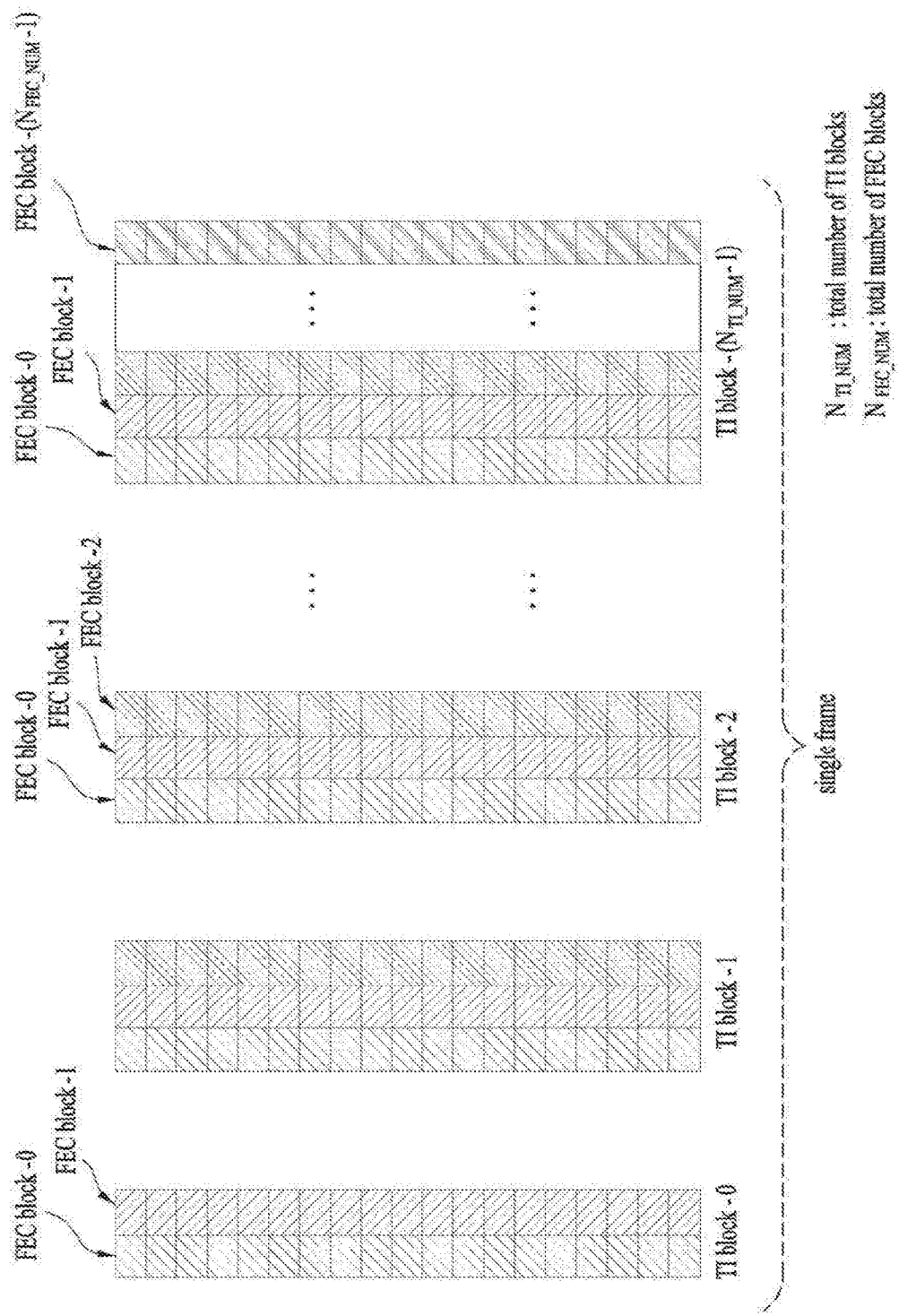
FIG. 36 is a conceptual diagram illustrating a variable data-rate system according to an embodiment of the present invention.

FIG. 36 is a conceptual diagram illustrating a variable data-rate system according to an embodiment of the present invention.

FIG. 36 shows TI blocks mapped to one signal frame.

As described above, the variable data-rate system as a broadcast signal transmitter according to an embodiment of the present invention can pack a plurality of FEC blocks as a plurality of TI blocks and transmit the TI blocks. In this case, the TI blocks may have different numbers of FEC blocks included therein.

That is, one signal frame may include NTI_NUM TI blocks each of which may include NFEC_NUM FEC blocks. In this case, the respective TI blocks may have different numbers of FEC blocks included therein.

A description will be given of time interleaving which can be performed in the aforementioned variable data-rate system. This time interleaving process is another embodiment of the above-described time interleaving process and has the advantage that the time interleaving process is applicable to a case in which the broadcast signal receiver has a single memory. Time interleaving according to another embodiment of the present invention may be referred to as the aforementioned diagonal-type TI and may be performed in the time interleaver included in the broadcast signal transmitter according to an embodiment of the present invention. As the inverse process of time interleaving, time deinterleaving may be referred to as diagonal-type TDI and may be performed in the time deinterleaver in the broadcast signal receiver according to an embodiment of the present invention. The name of a device which performs time interleaving or time deinterleaving or the location or function of the device may be changed according to designer. A description will be given of detailed time interleaving and time deinterleaving operations.

When TI blocks have different numbers of FEC blocks included therein, as described above, different diagonal-type TI methods need to be applied to the respective TI blocks. However, this scheme has a problem that deinterleaving corresponding to the different diagonal-type TI methods cannot be performed when the broadcast signal receiver uses a single memory.

Accordingly, the broadcast signal transmitter according to the present invention determines a single diagonal-type TI method and equally applies the determined diagonal-type TI method to all TI blocks according to an embodiment of the present invention. In addition, the broadcast signal transmitter according to an embodiment of the present invention can sequentially deinterleave a plurality of TI blocks using a single memory.

In this case, the broadcast signal transmitter according to an embodiment of the present invention can determine the diagonal-type TI method applied to all TI blocks on the basis of a TI block including a maximum number of FEC blocks within one signal frame.

Moreover, the broadcast signal transmitter according to an embodiment of the present invention can determine the diagonal-type TI method applied to all TI blocks on the basis of a TI block including a medium number of FEC blocks within one signal frame or an arbitrary TI block within one signal frame. It can be determined according to designer.

Here, how the diagonal-type TI method is applied to a TI block including a smaller number of FEC blocks, compared to the TI block including the maximum number of FEC blocks, may become a problem.

Accordingly, the broadcast signal transmitter may monitor generated memory indexes and determine whether to apply the memory indexes according to an embodiment of the present invention.

Specifically, when the number of generated TI memory indexes exceeds the number of cells in an arbitrary TI block, the broadcast signal transmitter ignores TI memory indexes greater than the number of cells according to an embodiment of the present invention. When the number of generated TI memory indexes exceeds the number of cells, virtual FEC blocks can be added (zero padding) and diagonal-type TI can be performed. Furthermore, in application of the aforementioned diagonal-type TI method to different TI blocks, the broadcast signal transmitter may sequentially apply the diagonal-type TI method to TI blocks from a TI block including a small number of FEC blocks in order of the number of FEC blocks according to an embodiment of the present invention. Accordingly, the broadcast signal receiver according to an embodiment of the present invention can simply operate the single memory, which will be described in detail later.

The following equation represents the aforementioned process of determining a diagonal-type TI method applied to all TI blocks.

$$\text{for } 0 \leq j \leq \text{TI\_NUM} - 1 \quad \text{[Equation 12]}$$

$$N_r = \max\begin{pmatrix} N_{FEC\_Size,0}, N_{FEC\_Size,0} \cdots , \\ N_{FEC\_Size,TI\_NUM-1} \end{pmatrix}$$

$$= \max_j (N_{FEC\_Size,j})$$

$$N_c = \max\begin{pmatrix} N_{FEC\_NUM,0}, N_{FEC\_NUM,0} \cdots , \\ N_{FEC\_NUM,TI\_NUM-1} \end{pmatrix}$$

$$= \max_j (N_{FEC\_NUM,j})$$

TI_NUM −
 1: Total number of *TI* blocks in a single frame $N_{FEC\_Size,j}$: FEC block size in the *j*th *TI* block $N_{FEC\_NUM,j}$: Total number
 of FEC blocks in the *j*th *TI* block FIG. 37 illustrates a time interleaving process according to another embodiment of the present invention.

Figure 37:
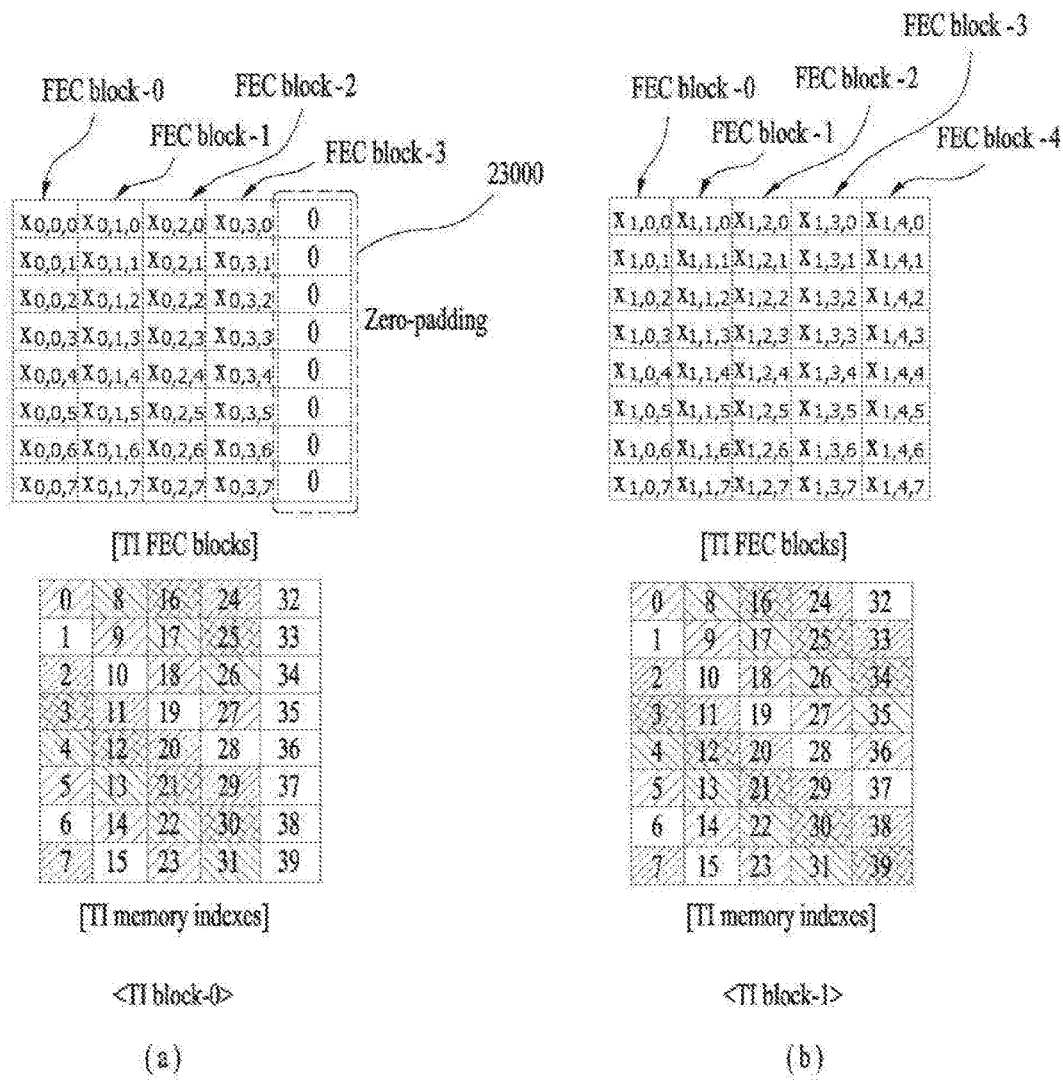
FIG. 37 illustrates a time interleaving process according to another embodiment of the present invention.

FIG. 37 shows an embodiment of applying diagonal-type TI in a variable data-rate system.

FIG. 37(a) illustrates a process of applying diagonal-type TI to TI block 0 including 4 FEC blocks and FIG. 37(b) illustrates a process of applying diagonal-type TI to TI block 1 including 5 FEC blocks.

TI FEC blocks represent FEC blocks included in each TI block and cell values corresponding to the FEC blocks. TI memory indexes indicate memory indexes corresponding to cell values included in TI blocks.

The TI blocks are included in one signal frame and each FEC block may include 8 cells.

The broadcast signal transmitter according to an embodiment of the present invention can determine a diagonal-type TI method which is equally applied to two TI blocks. Since the diagonal-type TI method according to an embodiment of the present invention is determined on the basis of a TI block including a maximum number of FEC blocks within one frame, as described above, diagonal-type TI is determined based on TI block 1 in the case of FIG. 37. Accordingly, the TI memory can have a size corresponding to an 8×5 (40×1) matrix.

As shown in the upper part of FIG. 37 (a), the number of FEC blocks included in TI block 0 is 4 which is less than the number of FEC blocks included in TI block 1. Accordingly, the broadcast signal transmitter according to an embodiment of the present invention can add (pad) a virtual FEC block 23000 having a value of 0 to TI block 0 and column-wise write cells corresponding to the virtual FEC block 23000 into the TI memory. The position to which the virtual FEC block is added can be determined according to designer.

As shown in the low part of FIG. 37 (a), the broadcast signal transmitter according to an embodiment of the present invention can diagonally read cells written in the TI memory. In this case, since the last column corresponds to the virtual FEC block, it is possible to perform reading operation while ignoring the cells corresponding to the virtual FEC block.

The broadcast signal transmitter according to an embodiment of the present invention can perform column-wise writing and diagonal reading for TI block 1 according to the aforementioned method, as shown in FIG. 37 (b).

As described above, since diagonal-type TI according to an embodiment of the present invention is preferentially applied to a TI block including a smaller number of FEC blocks, diagonal-type TI can be applied to TI block 1 first in the case of FIG. 37.

Figure 38:
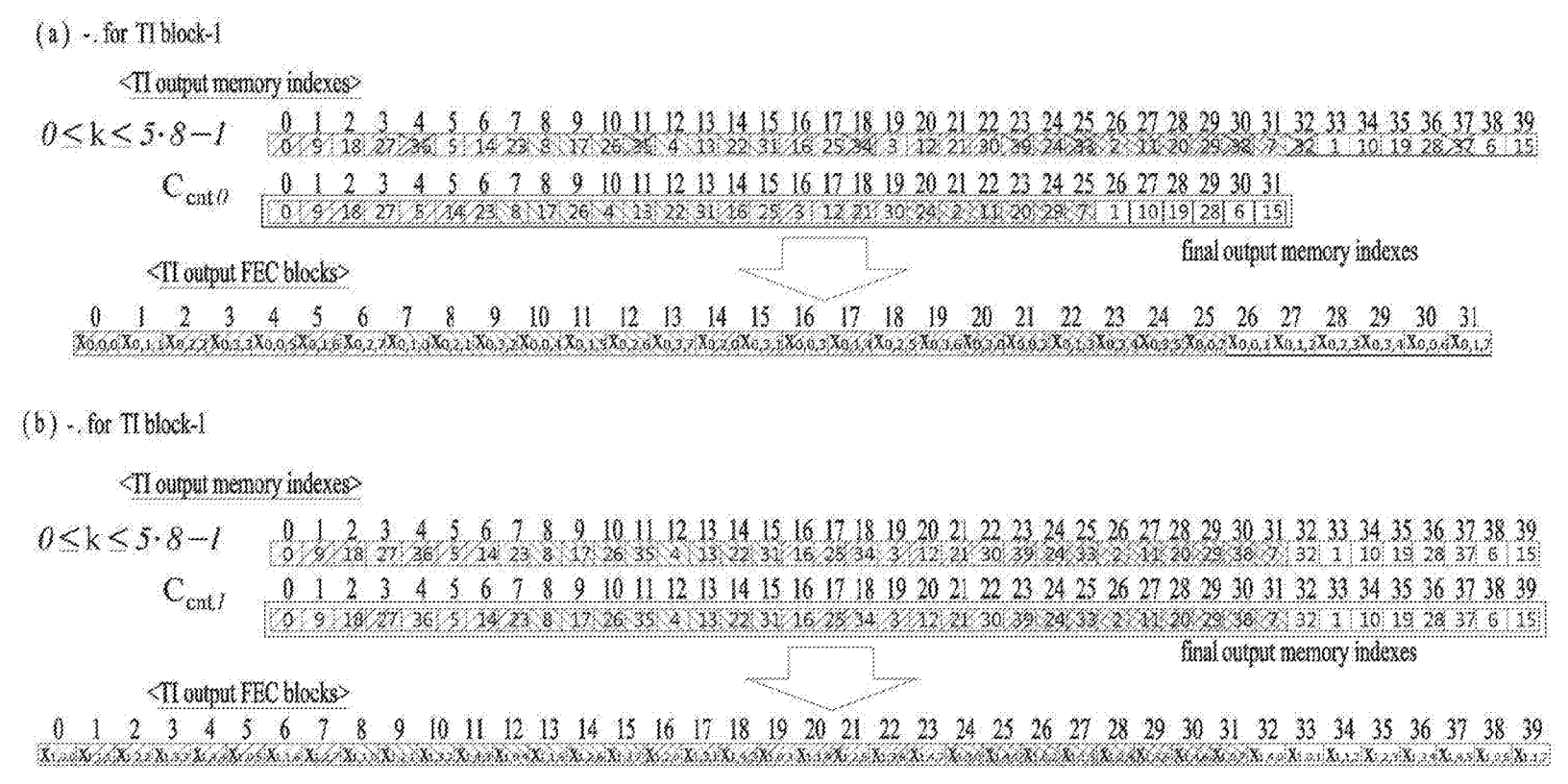

FIG. 38 illustrates a process of generating TI output memory indexes according to another embodiment of the present invention.

FIG. 38 shows a process of generating TI output memory indexes for the above-described two TI blocks (TI block 0 and TI block 1) and TI output FEC blocks corresponding to TI output memory indexes.

Blocks corresponding to TI output memory indexes represent a process of generating TI output memory indexes and TI output FEC blocks represent cell values of FEC blocks corresponding to the generated TI output memory indexes.

FIG. 38 (a) illustrates a process of generating TI output memory indexes of TI block 0. As shown in the upper part of FIG. 38 (a), when the number of TI memory indexes exceeds the number of cells of TI block 0, the broadcast signal transmitter according to an embodiment of the present invention can ignore TI memory indexes 32 to 39 corresponding to cells included in a virtual FEC block. This operation may be referred to as skip operation. Consequently, final output memory indexes for which reading can be performed, except for the skipped TI memory indexes, are generated as shown in FIG. 38 (a). Cell values of output FEC blocks corresponding to the final output memory indexes are shown in the lower part of FIG. 38 (a).

FIG. 38 (b) illustrates a process of generating TI output memory indexes of TI block 1. In the case of TI block 1, skip operation is not applied. The process corresponds to the aforementioned process.

The following equation represents the output memory index generation process for performing diagonal-type TI applicable in the aforementioned variable data-rate system.

$$\text{for } 0 \leq j \leq \text{TI\_NUM} - 1, \, 0 \leq k \leq N_r N_c - 1 \quad \text{[Equation 13]}$$
$$C_{cnt,j} = 0$$
$$r_{j,k} = \text{mod}(k, N_r).$$
$$s_{j,k} = \text{mod}(r_{j,k}, N_c).$$
$$c_{j,k} = \text{mod}\left(s_{j,k} + \left\lfloor \frac{k}{N_r} \right\rfloor, N_c\right)$$
$$\theta_j(k) = N_r c_{j,k} + r_{j,k}$$
$$\quad \text{if } \theta_j(k) \leq N_{FEC\_Size,j} N_{FEC\_NUM,j}$$
$$\quad\quad \pi_j(C_{cnt,j}) = \theta_j(k)$$
$$\quad\quad C_{cnt,j} = C_{cnt,j} + 1$$
$$\quad \text{end}$$
$$\text{end}$$

$C_{cnt,j}$: counter of actual TI output memory-index for the jth TI block
$\theta_j(k)$: temporal TI output memory-index for the jth TI block
$\pi_j(k)$: actual TI output memory-index for the jth TI block In the equation 13, the "if" statement represents the aforementioned skip operation.

Figure 39:
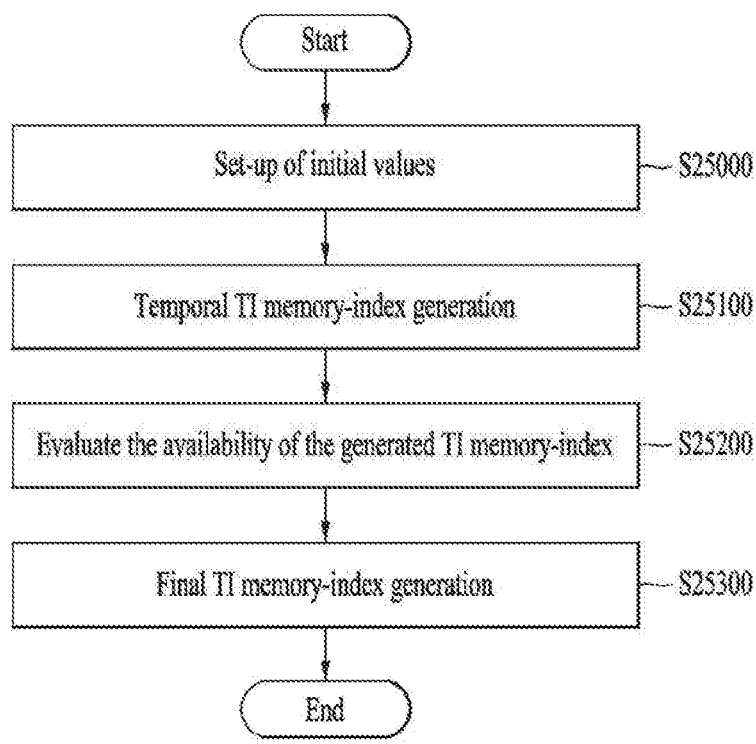
FIG. 39 is a flowchart illustrating a TI memory index generation process according to an embodiment of the present invention.

FIG. 39 is a flowchart illustrating a TI memory index generation process according to an embodiment of the present invention.

As described above, the time interleaver according to an embodiment of the present invention can perform diagonal-type TI by sequentially generating TI output memory indexes for sequentially input FEC blocks.

Referring to FIG. 39, the broadcast signal transmitter according to an embodiment of the present invention may set initial values (S25000). That is, the broadcast signal transmitter according to an embodiment of the present invention can determine a diagonal-type TI method applied to all TI blocks on the basis of a TI block including a maximum number of FEC blocks.

Then, the broadcast signal transmitter according to an embodiment of the present invention may generate temporal TI memory indexes (S25100). That is, the broadcast signal transmitter according to an embodiment of the present invention can add (pad) a virtual FEC block to TI blocks having numbers of FEC blocks less than a predetermined TI memory index and write cells corresponding to TI blocks into a TI memory.

The broadcast signal transmitter according to an embodiment of the present invention may evaluate availability of the generated TI memory indexes (S25200). That is, the broadcast signal transmitter according to an embodiment of the present invention can diagonally read the cells written in the TI memory. In this case, cells corresponding to the virtual FEC block can be skipped and reading can be performed.

Then, broadcast signal transmitter according to an embodiment of the present invention may generate final TI memory indexes (S25300).

The flowchart of FIG. 39 corresponds to the process of generating TI output memory indexes, described with reference to FIGS. 36, 37 and 38, and may be modified according to designer.

Figure 40:
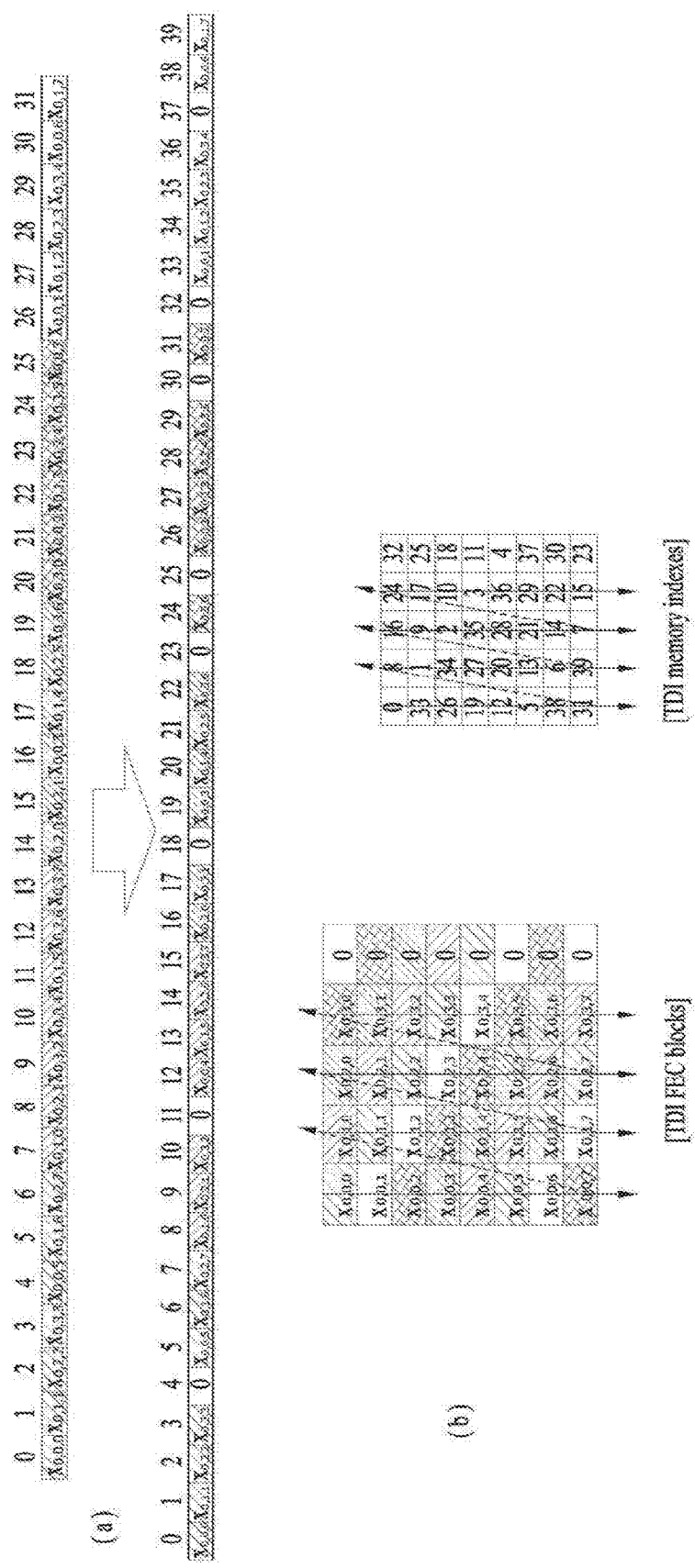
FIG. 40 illustrates a time deinterleaving process according to another embodiment of the present invention.

FIG. 40 illustrates a time deinterleaving process according to another embodiment of the present invention.

The time deinterleaving process shown in FIG. 40 is the inverse of the time interleaving process described with reference to FIGS. 23, 24 and 25.

Particularly, time deinterleaving according to another embodiment of the present invention can be applied to a case in which the broadcast signal receiver uses a single memory.

To achieve such a single-memory approach, the reading and writing operations for the interleaved TI blocks should be accomplished simultaneously. The TDI procedure can be expressed as a closed-form, which leads to the efficient TDI implementation.

Time deinterleaving according to another embodiment of the present invention may be performed through four steps.

FIG. 40 (a) illustrates the first step (step 1) of time deinterleaving. Before TDI processing for TI block 0, using TI rule, the cell value corresponding to a memory index ignored during TI processing is set to zero (or an identification value). That is, the blocks shown in the upper part of FIG. 40 (a) represent cell values of output FEC blocks corresponding to final output memory indexes of TI block 0 and the blocks shown in the lower part of FIG. 40 (a) represent cell values of FEC blocks, which are generated by setting cell values corresponding to memory indexes skipped in skip operation to zero.

In the second step (step 2), after step 1, output of step1 is written to the single-memory of size 8×5. The writing direction is identical to the reading direction in TI processing. The broadcast signal receiver according to an embodiment of the present invention can perform diagonal writing operation as the first inverse process of TI of the transmitter for the first input TI block. That is, diagonal writing can be performed in a direction opposite to the direction of diagonal reading performed by the transmitter.

FIG. 40 (b) illustrates the third step (step 3) of time deinterleaving.

Blocks corresponding to TDI FEC blocks represent cell values of input FEC blocks. Blocks corresponding to TDI memory indexes represent TDI memory indexes corresponding to cell values of FEC blocks.

After step 2, column-wise reading operation is performed in the same direction as the writing direction in TI processing. At this time, if the reading value is zero (or an identification value), it is ignored (skip operation). This skip operation corresponds to the aforementioned skip operation performed in the broadcast signal transmitter.

The following equation represents the aforementioned TDI memory index generation process.

[Equation 14]
$$\text{for } 0 \leq k \leq N_rN_c - 1, 0 \leq j \leq \text{TI\_NUM} - 1$$
$$C_{cnt,j} = 0$$
$$t_j = \text{mod}(N_cN_r - (j+1)N_r + 1, N_cN_r),$$
$$v_j = t_j \text{ mod}(k, N_r),$$
$$\theta_j^{-1}(k) = \text{mod}\left(N_r\left\lfloor \frac{k}{N_r} \right\rfloor + \text{mod}(v_j, N_cN_r), N_cN_r\right),$$
$$\text{if } M(\theta_j^{-1}(k)) \neq 0 \text{ (a value)}$$
$$\pi_j^{-1}(C_{cnt,j}) = \theta_j^{-1}(k)$$
$$C_{cnt,j} = C_{cnt,j} + 1$$
$$\text{end}$$
$$\text{end}$$

$C_{cnt,j}$: counter of actual TDI output memory-index for the jth TI block
$\theta_j^{-1}(k)$: temporal TDI output memory-index for the jth TI block
$M(\theta_j^{-1}(k))$: the reversed cell value at $\theta_j^{-1}(k)$
$\pi_j^{-1}(k)$: actual TDI output memory-index for the jth TI block The "if" statement in the above equation represents the aforementioned skip operation, that is, the process of ignoring indexes when the indexes corresponding cell values stored in the TDI output memory are 0 (or an arbitrary value indicating that the indexes are forcibly inserted).

Figure 41:
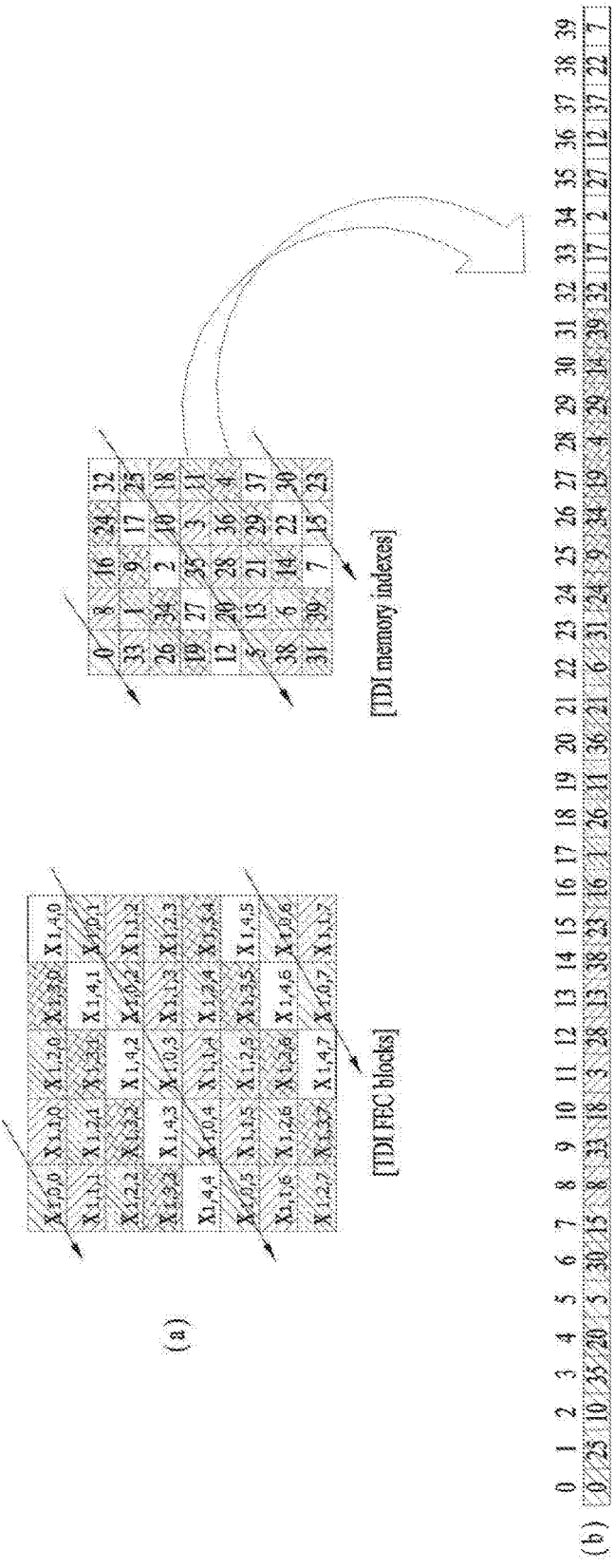
FIG. 41 illustrates a time deinterleaving process according to another embodiment of the present invention.

FIG. 41 illustrates a time deinterleaving process according to another embodiment of the present invention.

As described above, the broadcast signal receiver according to an embodiment of the present invention can perform time deinterleaving using a single memory. Accordingly, the broadcast signal receiver according to an embodiment of the present invention can read TI block 0 and write TI block 1 simultaneously in the fourth step (step 4).

FIG. 41 (a) shows TDI FEC blocks of TI block 1 written simultaneously with reading of TI block 0 and TDI memory indexes. The writing operation can be performed in a direction opposite to the direction of diagonal reading performed in the broadcast signal receiver, as described above.

FIG. 41 (b) shows output TDI memory indexes according to writing of TI block 1. In this case, arrangement of the stored FEC blocks within TI block 1 may differ from arrangement of the FEC blocks stored in the TI memory of the broadcast signal transmitter. That is, inverse processes of the writing and reading operations performed in the broadcast signal transmitter may not be equally applied in case of a single memory.

Figure 42:
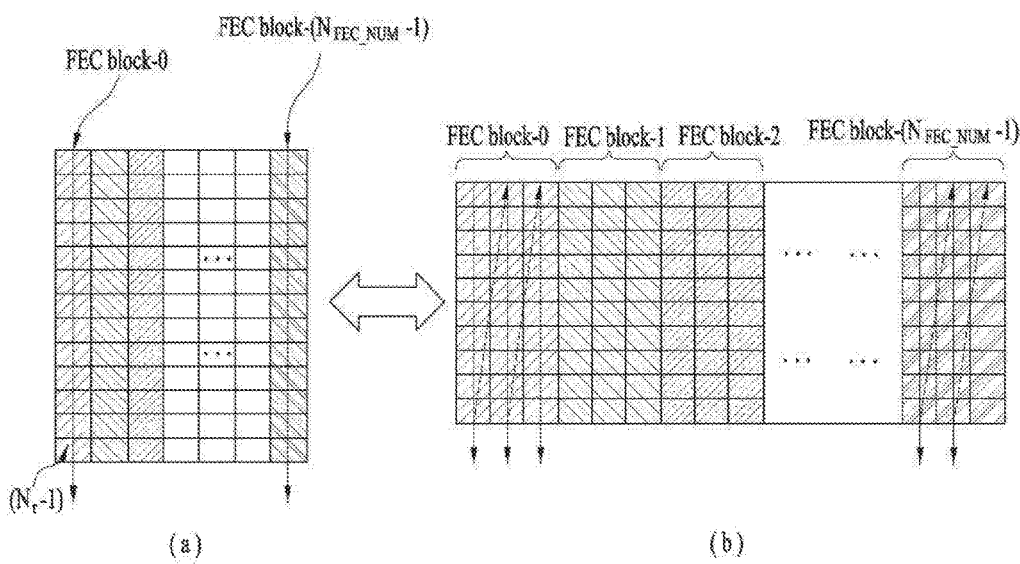
FIG. 42 illustrates a writing method according to an embodiment of the present invention.

FIG. 42 illustrates a writing method according to an embodiment of the present invention.

To prevent a case in which the inverse processes of the writing and reading operations performed in the broadcast signal transmitter cannot be equally applied in case of a single memory, as described above, the present invention provides a method of writing FEC blocks into a TI memory in a matrix form.

The writing method illustrated in FIG. 42 can be equally applied to the aforementioned time interleaving and time deinterleaving processes according to an embodiment of the present invention.

FIG. 42 (a) illustrates a case in which cells of FEC blocks are written to the memory in a vector form, which corresponds to the aforementioned writing method.

FIG. 42 (b) illustrates a case in which cells of FEC blocks are written to the memory in a matrix form. That is, the FEC blocks can be written in the form of an m×n matrix.

In this case, the matrix size can be changed according to designer and the inverse processes of the writing and reading processes performed in the broadcast signal transmitter can be equally applied to a case in which the broadcast signal receiver uses a single memory.

Figure 43:
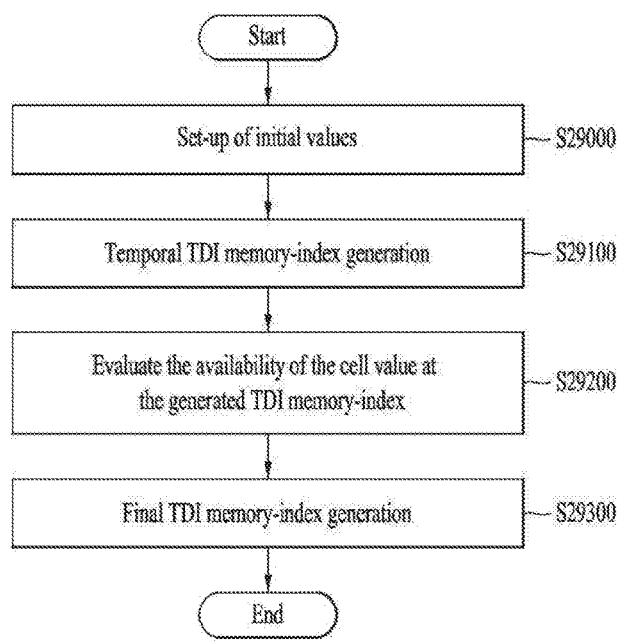
FIG. 43 is a flowchart illustrating a process of generating TDI memory indexes according to an embodiment of the present invention.

FIG. 43 is a flowchart illustrating a process of generating TDI memory indexes according to an embodiment of the present invention.

As described above, the time deinterleaver according to an embodiment of the present invention can perform diagonal-type TI by sequentially generating TI output memory indexes for sequentially input FEC blocks.

As shown in FIG. 43, the broadcast signal receiver according to an embodiment of the present invention may set initial values (S29000). That is, in the broadcast signal receiver according to an embodiment of the present invention, the cell value corresponding to a memory index ignored during TI processing is set to zero (or an identification value) using TI rue before TDI processing for the first TI block.

Subsequently, the broadcast signal receiver according to an embodiment of the present invention may generate temporal TI memory indexes (S29100). The broadcast signal receiver according to an embodiment of the present invention may perform diagonal writing operation as the first inverse process of TI of the transmitter for the first input TI block. Then, the broadcast signal transmitter according to an embodiment of the present invention may evaluate the generated TI memory indexes (S29200). The broadcast signal transmitter according to an embodiment of the present invention may generate final TI memory indexes (S29300).

The flowchart shown in FIG. 43 corresponds to the process of generating TDI output memory indexes, described with reference to FIGS. 30, 31 and 32, and may be changed according to designer.

Figure 44:
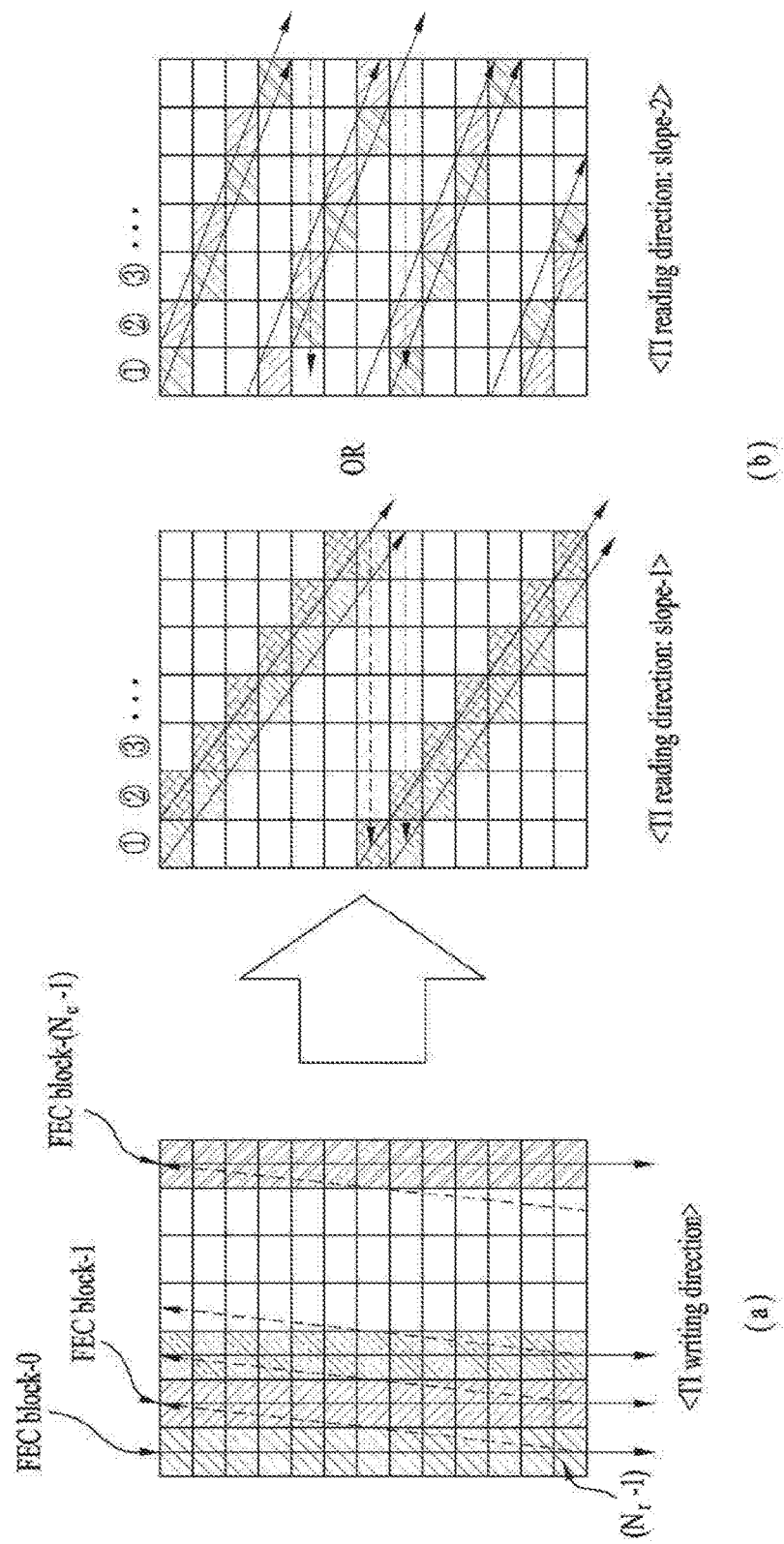
FIG. 44 illustrates a time interleaving process according to another embodiment of the present invention.

FIG. 44 illustrates a time interleaving process according to another embodiment of the present invention.

As described above, a timer interleaver (or time interleaver block) included in a broadcast signal transmitter according to an embodiment of the present invention interleaves cells belonging to a plurality of FEC blocks in the time domain and outputs the interleaved cells.

In addition, the time interleaver according to another embodiment of the present invention can perform time interleaving including a writing operation of sequentially arranging different input FEC blocks in a predetermined memory and a diagonal reading operation of interleaving the FEC blocks in a diagonal direction. In particular, the time interleaver according to an embodiment of the present invention can change the size of a diagonal slope of a reading direction and perform time interleaving while reading different FEC blocks in a diagonal direction. That is, the time interleaver according to an embodiment of the present invention can change a TI reading pattern. Time interleaving according to an embodiment of the present invention may be referred to as diagonal-type time interleaving or diagonal-type TI or flexible diagonal-type time interleaving or flexible diagonal-type TI.

FIG. 44(a) shows a writing direction of time interleaving according to an embodiment of the present invention and FIG. 44(b) shows a reading direction of time interleaving according to an embodiment of the present invention.

Specifically, the broadcast signal transmitter according to an embodiment of the present invention can sequentially write input FEC blocks column-wise in a TI memory having a size of Nr×Nc (column-wise writing), as shown in FIG. 44(a). The details are same as described in FIG. 30. The broadcast signal transmitter according to an embodiment of the present invention can read the FEC blocks written column-wise in a diagonal direction, as shown in FIG. 44(b). In this case, the broadcast signal transmitter according to an embodiment of the present invention can perform diagonal reading for one period. In particular, in this case, as shown in FIG. 44(b), the diagonal slope of the TI reading direction may be differently set for respective TI blocks or super frame units.

That is, during diagonal-wise reading from the first row (rightwards along the row beginning with the left-most column) to the last row, $N_r$ cells are read out as shown in FIG. 44(b).

In particular, in this case, as shown in FIG. 44(b), the diagonal slope of the TI reading direction may be differently set for respective TI blocks or super frame units. FIG. 44 illustrates the case in which the diagonal slope of the TDI writing direction is a diagonal slope-1 or a diagonal slope-2.

When the diagonal slope of the TI reading direction is a diagonal slope-1, since the diagonal reading process of the first period starts at (0,0) of the memory matrix and is performed until the cell of the lowest row is read, cells within different FEC blocks can be uniformly interleaved. Diagonal reading of the next periods can be performed in order of ①, ② and ③ in FIG. 44(b).

In addition, when the diagonal slope of the TI reading direction is the slope-2, the TI diagonal reading can be performed from a memory matrix (0,0) for a first period according to the diagonal slope of the TI reading direction until cells contained in a specific FEC block are read according to a specific shifting value. This can be changed according to intention of the designer.

Figure 45:
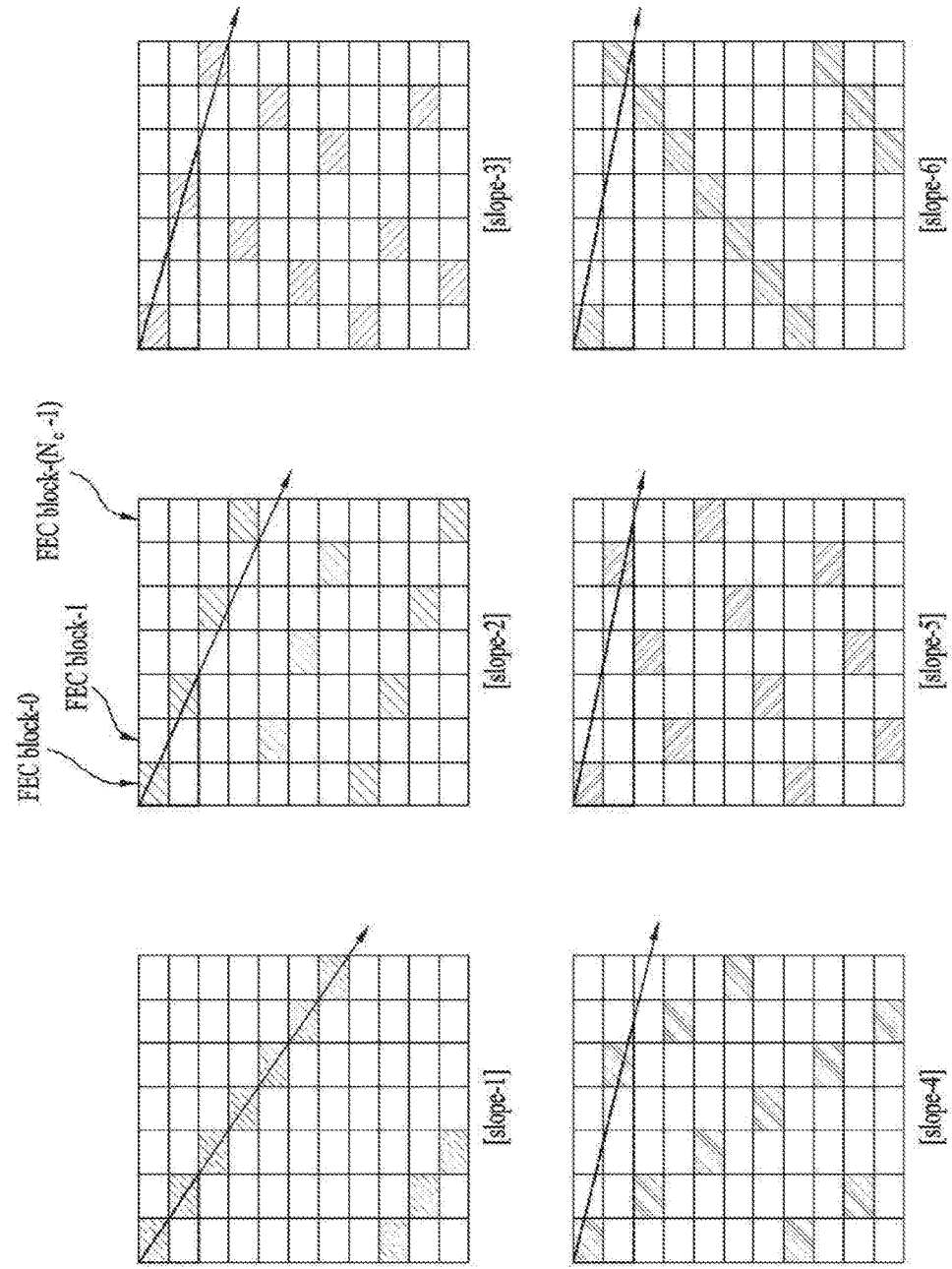
FIG. 45 illustrates diagonal slopes according to an embodiment of the present invention.

FIG. 45 illustrates diagonal slopes according to an embodiment of the present invention.

FIG. 45 illustrates a diagonal slope-1 to a diagonal slope-6 when the size of Nc of a TI block is 7 and the size of Nr is 11 according to an embodiment of the present invention. The size of the diagonal slope according to an embodiment of the present invention can be changed according to intention of the designer.

The t time interleaver according to an embodiment of the present invention can change the size of the diagonal slope of the TI reading according to the size of a maximum TI memory size and change a TI reading pattern. The TI reading pattern can be changed in a superframe unit as a set of signal frames that are consecutively transmitted in a time axis and information about the TI reading pattern may be transmitted through the aforementioned static PLS signaling data.

The time interleaving process described above with reference to FIG. 31 and the TI output memory index generation process described with reference to FIG. 32 can be equally applied to diagonal-type TI using diagonal slopes of TI reading shown in FIG. 45.

That is, the time interleaver according to an embodiment of the present invention can perform diagonal-type TI by sequentially generating TI output memory index values for sequentially input FEC blocks, as described above with reference to FIG. 31.

Equation 15 below represents a process for generation of a memory index for the diagonal-type TI when the slope values of the various TI readings described with reference to FIG. 45 are set.

[Equation 15]
$$r_k = \text{mod}(k, N_r),$$
$$t_k = \text{mod}(S_T \times r_k, N_c), 1 \leq S_T < N_c$$
$$c_k = \text{mod}\left(t_k + \left\lfloor \frac{k}{N_r} \right\rfloor, N_c\right)$$
$$\pi(k) = N_r c_k + r_k, \text{ for } 0 \leq k \leq N - 1$$

$S_T$: diagonal slope for use in interleaving (constant value)
$N_r$: row size
$N_c$: column size
N: total cell size in TI block, $N = N_c N_r$
$\lfloor \cdot \rfloor$: floor operatyion
mod: modulo operation
$\pi(k)$: TI output memory index A time deinterleaver (or time deinterleaver block) included in a broadcast signal receiver according to an embodiment of the present invention can perform inverse processing of the aforementioned diagonal-type TI. That is, the time deinterleaver according to an embodiment of the present invention can perform time deinterleaving by receiving FEC blocks on which diagonal-type TI has been performed, writing the FEC blocks diagonal-wise in a TI memory and then sequentially reading the FEC blocks. Time deinterleaving according to an embodiment of the present invention may be referred to as diagonal-type TDI or diagonal-type time deinterleaving or flexible diagonal-type time deinterleaving or flexible diagonal-type TDI. The name of a device performing time deinterleaving or the location or function of the device may be changed according to designer.

Figure 46:
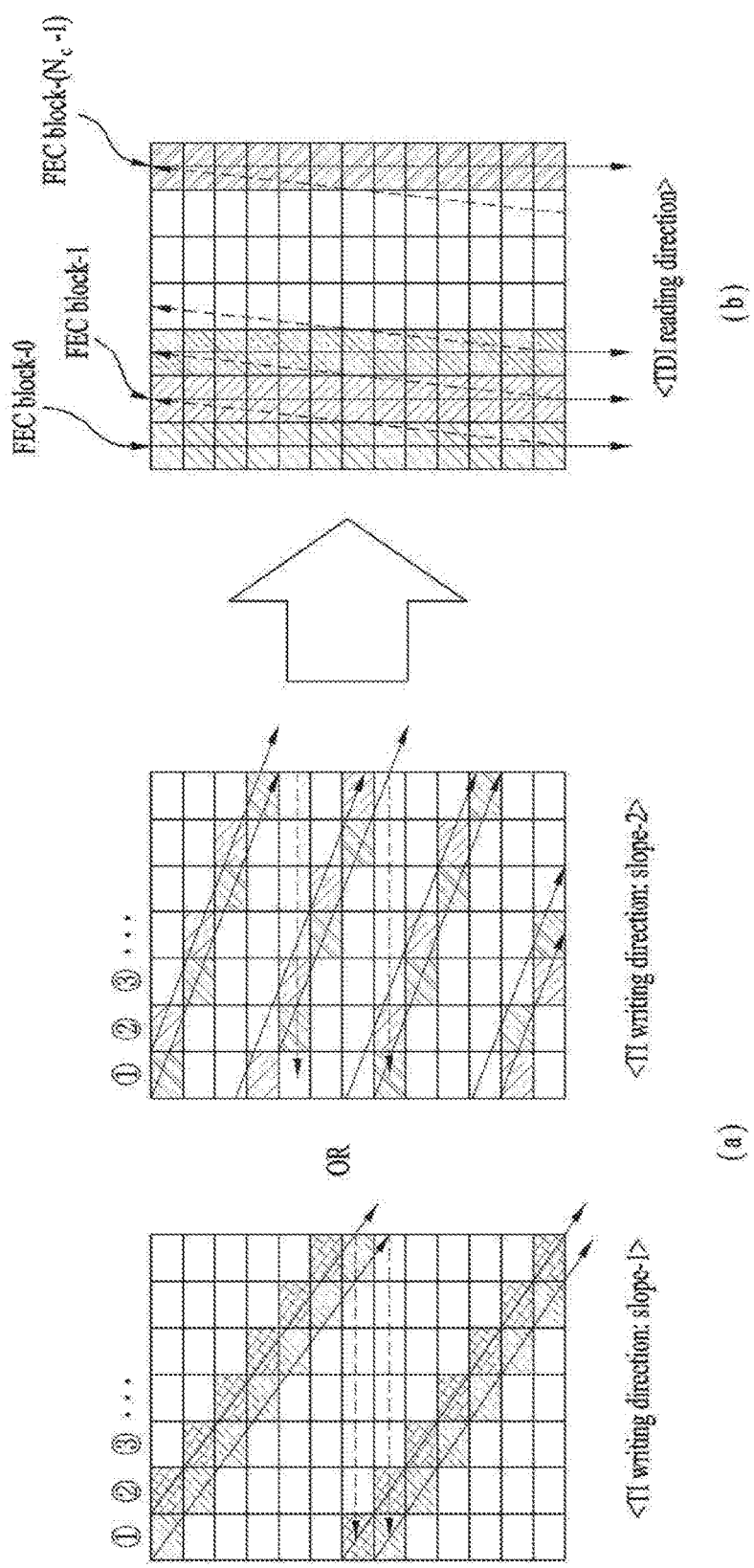
FIG. 46 illustrates a time deinterleaving process according to an embodiment of the present invention.

FIG. 46 illustrates a time deinterleaving process according to an embodiment of the present invention.

The time deinterleaving process shown in FIG. 46 corresponds to inverse processing of the time interleaving process shown in FIG. 44.

FIG. 46 (a) shows a writing direction of time deinterleaving according to an embodiment of the present invention and FIG. 46 (b) shows a reading direction of time deinterleaving according to an embodiment of the present invention.

Specifically, the time deinterleaver according to an embodiment of the present invention can receive FEC blocks on which diagonal-type TI has been performed from a transmitter and diagonally write the FEC blocks into a TDI (time deinterleaver) memory (diagonal-wise writing).

In this case, the time deinterleaver according to an embodiment of the present invention can perform diagonal writing for one period. In particular, in this case, as shown in FIG. 46(a), diagonal slope values of a TDI writing direction may be differently set for respective TDI block and super frame unit. FIG. 46 illustrates the case in which the diagonal slope of the TDI writing direction is a diagonal slope-1 or a diagonal slope-2.

When the diagonal slope of the TDI writing direction is a diagonal slope-1, diagonal reading of the first period starts at (0,0) of the memory matrix and is performed until the cell of the lowest row is read. Diagonal writing of respective periods can be performed in order of ①, ② and ③ in FIG. 46(b).

In addition, when the diagonal slope of the TDI writing direction is a diagonal slope-2, the TDI diagonal writing can be performed from a memory matrix (0,0) for a first period until cells contained in a specific FEC block are read according to a specific shifting value. This can be changed according to intention of the designer.

As shown in FIG. 46(b), the time deinterleaver according to an embodiment of the present invention can sequentially read diagonally written FEC blocks column-wise (column-wise reading).

The time deinterleaving process described above with reference to FIG. 46 can be equally applied to diagonal-type TI using the diagonal slopes of TI reading shown in FIG. 45.

That is, the time deinterleaver according to an embodiment of the present invention can perform diagonal-type TDI by sequentially generating TDI output memory index values for sequentially input FEC blocks.

Figure 47:
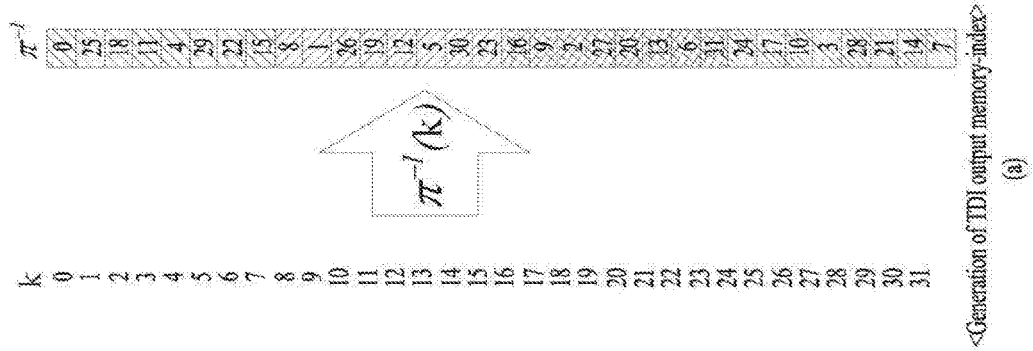
FIG. 47 illustrates a process of generating TDI output memory indexes according to an embodiment of the present invention.

FIG. 47 illustrates a process of generating TDI output memory indexes according to an embodiment of the present invention.

As described above, the time deinterleaver according to an embodiment of the present invention can perform diagonal-type TDI by sequentially generating TDI output memory index values for sequentially input FEC blocks.

FIG. 47(a) illustrates a process of generating diagonal-type TDI memory indexes for the above-described sequentially input FEC blocks and FIG. 47(b) shows equations representing the memory index generation process.

Equation 16 below represents a process for generation of a TDI output memory index for the diagonal-type TDI when diagonal slope values of the various TI readings described with reference to FIG. 45 are set.

$$S_R = N_c - S_T,$$ [Equation 16]

$$1 \leq S_R < N_c$$

$$r_k = \mod(k, N_r),$$

$$t_k = \mod(S_R \times r_k, N_c),$$

$$c_k = \mod\left(t_k + \left\lfloor \frac{k}{N_r} \right\rfloor, N_c\right)$$

$$\pi^{-1}(k) = N_r c_k + r_k,$$

for $$0 \leq k \leq N - 1$$

$S_T$: diagonal slope for use in interleaving(constant value)

$S_R$: diagonal slope for use in deinterleaving(constant value)

$N_r$: row size $N_c$: column size $N$: total cell size TI block, $N = N_c N_r$ $\lfloor \cdot \rfloor$: floor operation mod: modulo operation $\pi^{-1}(k)$: TDI output memory index The broadcast signal transmitter according to an embodiment of the present invention may be a variable data-rate system in which a plurality of FEC blocks is packed and configured as a plurality of TI blocks and transmitted. In this case, TI blocks may have different numbers of FEC blocks included therein.

Figure 48:
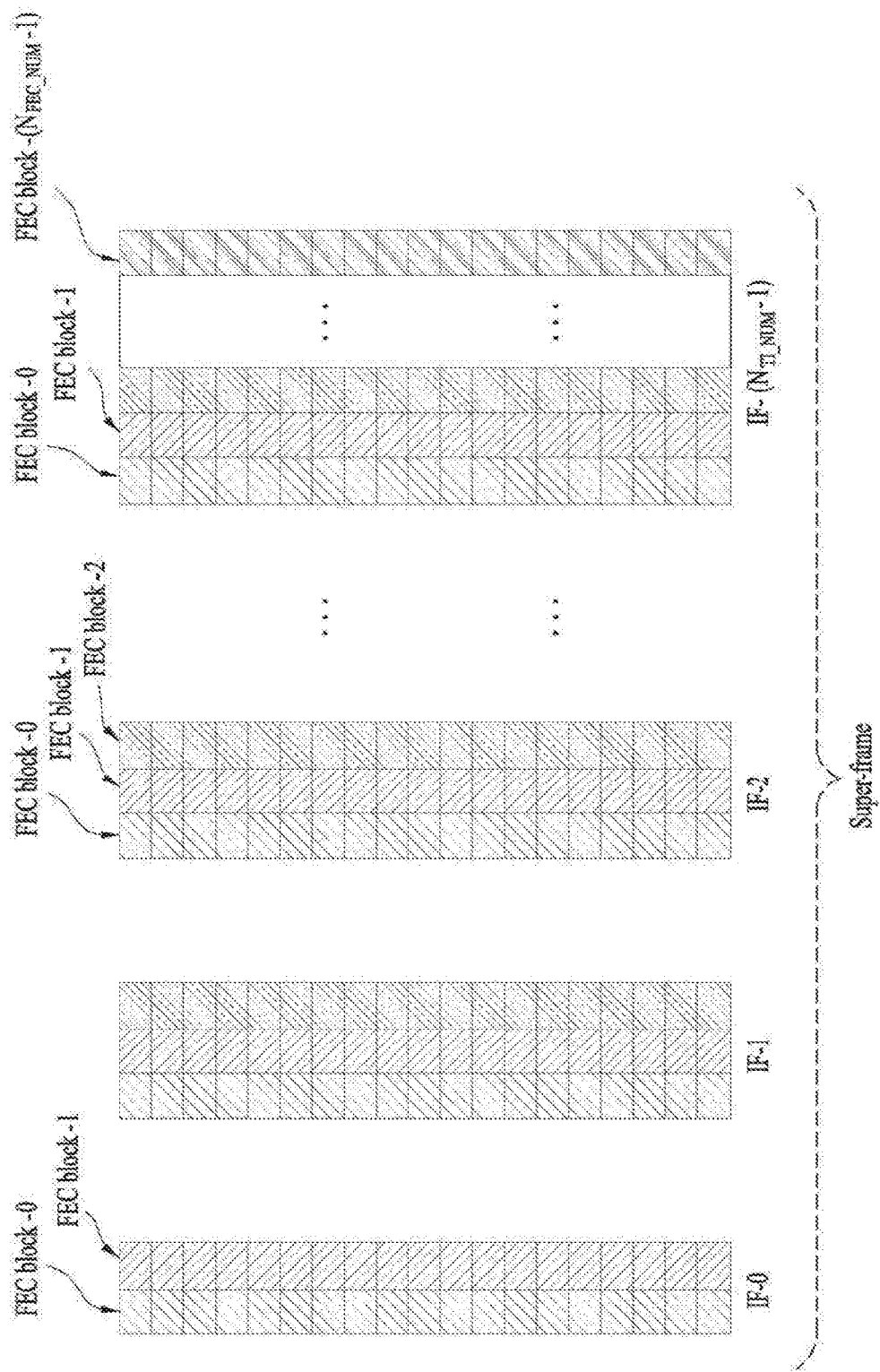
FIG. 48 is a conceptual diagram illustrating a variable data-rate system according to an embodiment of the present invention.

FIG. 48 is a conceptual diagram illustrating a variable data-rate system according to an embodiment of the present invention.

One transmission superframe may include NIF_NUM interleaving frames (IFs) and each IF may include NFEC_NUM FEC blocks. In this case, the number of FEC blocks included in each IF may be varied. An IF according to an embodiment of the present invention may be defined as a block for timing interleaving and may be referred to as the aforementioned TI block.

The details are same as described in FIG. 36.

As described above, when the number of generated TI memory indexes exceeds the number of cells in an arbitrary IF, the broadcast signal transmitter virtual FEC blocks can be added (zero padding) and diagonal-type TI can be performed. Since the added virtual FEC blocks include cells having zero value, the broadcast signal transmitter according to the present invention may skip or ignore the added virtual FEC blocks. This operation may be referred to as skip operation. The skip operation will be described in detail later.

The following equations represent the aforementioned process of determining a diagonal-type TI method applied to all IFs. Specifically, the following equation represents a process of determining the sizes of a column and a row with respect to IF including a maximum number of FEC blocks in one superframe in determination of a diagonal-type TI method.

$$\text{for } 0 \leq j \leq N_{IF\_NUM} - 1 \quad \text{[Equation 17]}$$

$$N_r = \max\begin{pmatrix} N_{FEC\_Size,0}, N_{FEC\_Size,0} \cdots, \\ N_{FEC\_Size,TI\_NUM-1} \end{pmatrix}$$

$$= \max_j(N_{FEC\_Size,j})$$

$$N_c = \max\begin{pmatrix} N_{FEC\_NUM,0}, N_{FEC\_NUM,0} \cdots, \\ N_{FEC\_NUM,TI\_NUM-1} \end{pmatrix}$$

$$= \max_j(N_{FEC\_NUM,j})$$

$N_{IF\_NUM}$: Total number of *IFs* in a single super-frame $N_{FEC\_NUM,j}$: Total number of *FEC* blocks in the *jth IF*

$N_{Fec\_Size,j}$: *FEC* block size in the *jth IF*,

Further, an embodiment to which diagonal-type TI is applied in the variable data-rate system described with reference to FIG. 37 can be equally applied to an IF including a plurality of FEC blocks.

The IFs are included in one super frame.

Therefore, time deinterleaving corresponding to the diagonal-type TI method can be applied to a case in which the broadcast signal receiver uses a single memory.

In addition, the process of generating a TI output memory index, described with reference to FIG. 38, can be equally applied to an IF including a plurality of FEC blocks.

The following equations represent the output memory index generation process for performing diagonal-type TI applicable in the aforementioned variable data-rate system.

$$\text{[Equation 18]}$$
$$\text{for } 0 \leq j \leq N_{IF\_NUM} - 1, 0 \leq k \leq N_r N_c - 1$$
$$C_{cnt,j} = 0$$
$$r_{j,k} = \mod(k, N_r),$$
$$t_{j,k} = \mod(S_T \times r_{j,k}, N_r), 1 \leq S_T < N_c$$
$$c_{j,k} = \mod\left(t_{j,k} + \left\lfloor \frac{k}{N_r} \right\rfloor, N_c\right)$$
$$\theta_j(k) = N_r c_{j,k} + r_{j,k}$$
$$\quad \text{if } \theta_j(k) \leq N_{FEC\_Size,j} N_{FEC\_NUM,j}$$
$$\quad \pi_j(C_{cnt,j}) = \theta_j(k)$$
$$\quad C_{cnt,j} = C_{cnt,j} + 1$$
$$\quad \text{end}$$
$$\text{end}$$

$S_T$: diagonal slope for use in interleaving (constant value)
$C_{cnt,j}$: counter of actual TI output memory-index for the jth TI block
$\theta_j(k)$: temporal TI output memory-index for the jth TI block
$\pi_j(k)$: actual TI output memory-index for the jth TI block In Equation 18, the "if" statement represents the aforementioned skip operation. In addition, Equation 18 above represents a process for generation of an output memory index for the aforementioned diagonal type TI of the diagonal slope. Accordingly, a diagonal slope value is defined as one variable.

In addition, the flowchart of FIG. 39 can be equally applied to an IF including a plurality of FEC blocks.

Furthermore, the time deinterleaving process according to another embodiment of the present invention, described with reference to FIGS. 40 and 41, can be equally applied to the IF including a plurality of FEC blocks.

The following equations represent the TDI memory index generation process which is applied to IF including a plurality of FEC blocks.

$$\text{[Equation 19]}$$
$$\text{for } 0 \leq k \leq N_r N_c - 1, 0 \leq j \leq IF\_NUM - 1$$
$$C_{cnt,j} = 0$$
$$S_{R,k} = \mod(S_{R,j-1} - S_T, N_c), \text{ where } S_{R,0} = N_c - S_T,$$
$$r_{j,k} = \mod(k, N_r),$$
$$t_{j,k} = \mod(S_{k,j} \times r_{j,k}, N_c),$$
$$c_{j,k} = \mod\left(t_{j,k} + \left\lfloor \frac{k}{N_r} \right\rfloor, N_c\right)$$
$$\theta_j^{-1}(k) = N_r c_{j,k} + r_{j,k},$$
$$\quad \text{if } M(\theta_j^{-1}(k)) \neq 0 \text{ (a value)}$$
$$\quad \pi_j^{-1}(C_{cnt,j}) = \theta_j^{-1}(k)$$
$$\quad C_{cnt,j} = C_{cnt,j} + 1$$
$$\quad \text{end}$$
$$\text{end}$$

$C_{cnt,j}$: counter of actual TDI output memory-index for the jth IF
$\theta_j^{-1}(k)$: the reversed cell value at $\theta_j^{-1}(k)$
$M(\theta_j^{-1}(k))$: temporal TDI output memory-index for the jth IF
$\pi_j^{-1}(k)$: actual TDI output memory-index for the jth IF The "if" statement in the above equation represents the aforementioned skip operation, that is, the process of ignoring indexes when the indexes corresponding cell values stored in the TDI output memory are 0 (or an arbitrary value indicating that the indexes are forcibly inserted). In addition, Equation 19 above represents a process of generation of a TDI memory index for time interleaving corresponding to the aforementioned diagonal type TI according to a diagonal slope.

The writing method according to an embodiment of the present invention, described with reference to FIG. 42, can be equally applied an IF including a plurality of FEC blocks.

Figure 49:
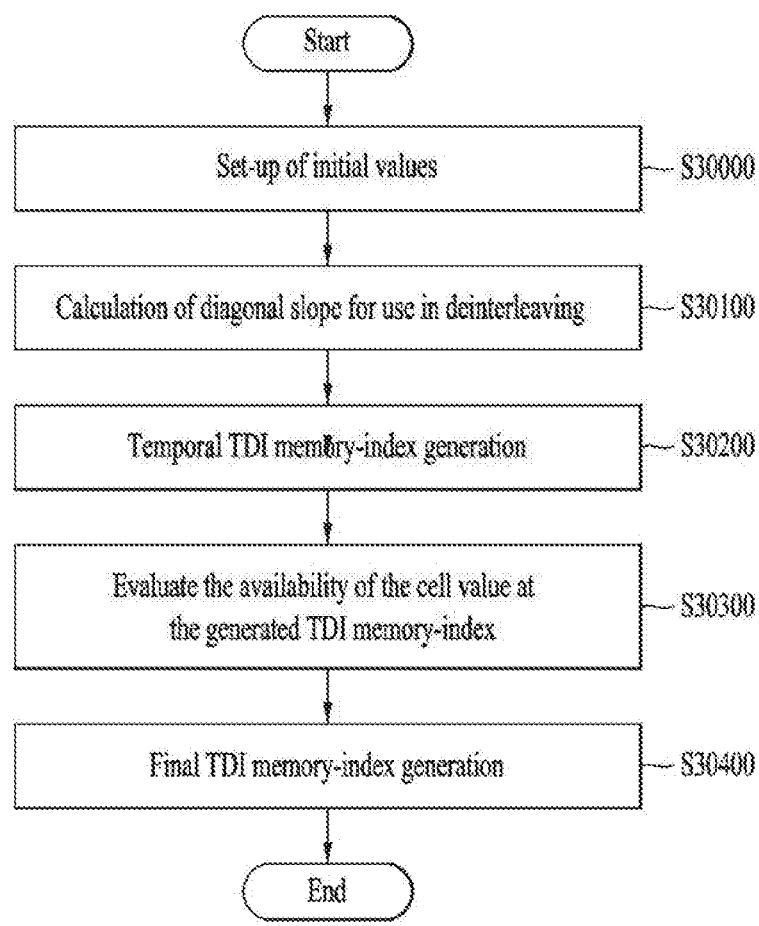
FIG. 49 is a flowchart illustrating a process of generating TDI memory indexes according to an embodiment of the present invention.

FIG. 49 is a flowchart illustrating a process of generating TDI memory indexes according to an embodiment of the present invention.

As described above, the time deinterleaver according to an embodiment of the present invention can perform diagonal-type TI by sequentially generating TI output memory indexes for sequentially input FEC blocks.

As shown in FIG. 49, the broadcast signal receiver according to an embodiment of the present invention may set initial values (S30000). That is, in the broadcast signal receiver according to an embodiment of the present invention, the cell value corresponding to a memory index ignored during TI processing is set to zero (or an identification value) using TI rue before TDI processing for the first IF.

Then the broadcast signal receiver according to an embodiment of the present invention may calculate a diagonal slope to be used for TDI processing (S30100).

Subsequently, the broadcast signal receiver according to an embodiment of the present invention may generate temporal TI memory indexes (S30200). The broadcast signal receiver according to an embodiment of the present invention may perform diagonal writing operation as the first inverse process of TI of the transmitter for the first input IF. Then, the broadcast signal transmitter according to an embodiment of the present invention may evaluate the generated TI memory indexes (S30300). The broadcast signal transmitter according to an embodiment of the present invention may generate final TI memory indexes (S30400).

The flowchart shown in FIG. 49 corresponds to the process of generating TDI output memory indexes, described with reference to FIGS. 27, 28 and 29, and may be changed according to designer.

Figure 50:
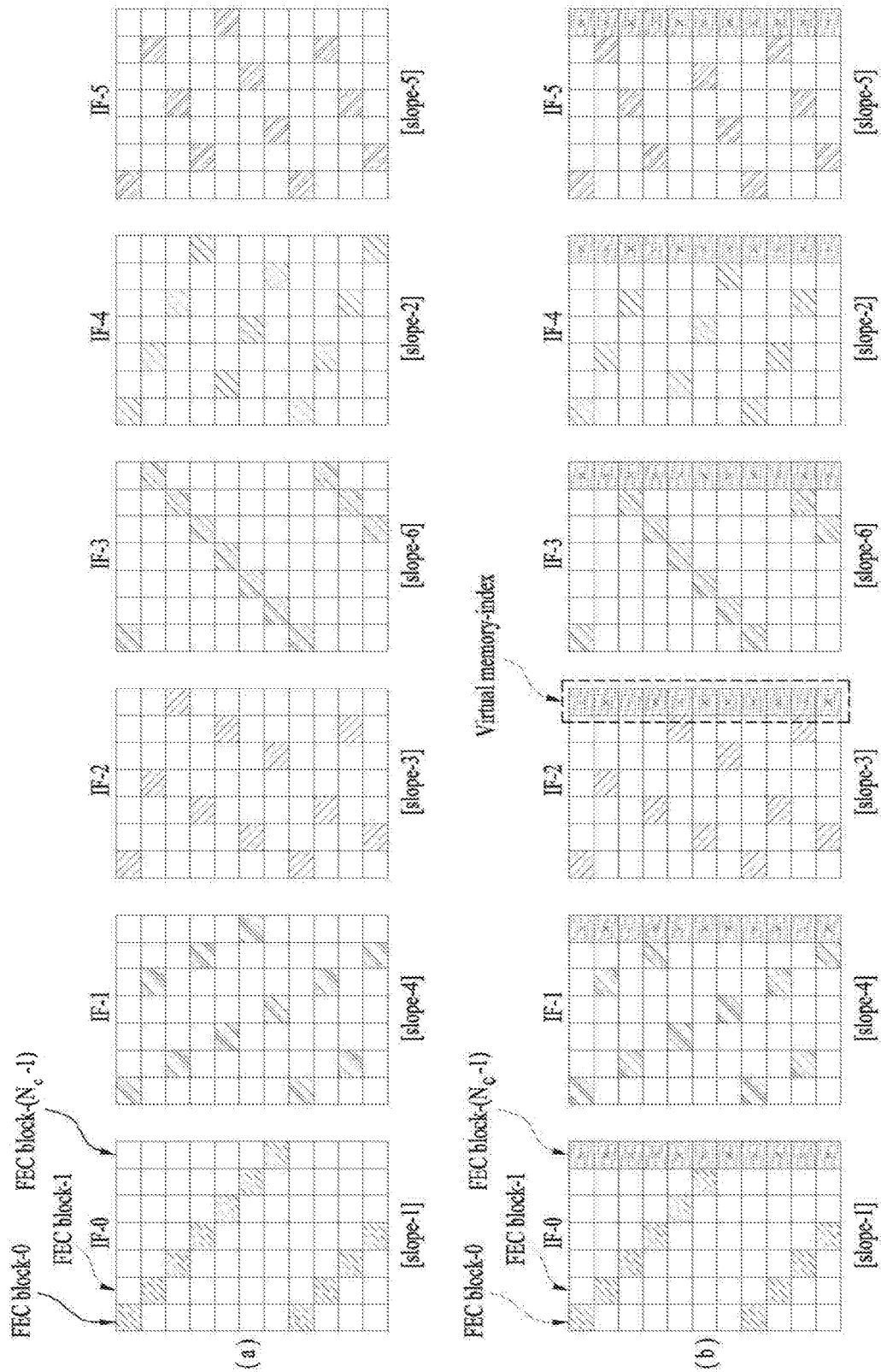
FIG. 50 illustrates IF-by-IF TI pattern variation according to an embodiment of the present invention.

FIG. 50 illustrates IF-by-IF TI pattern variation according to an embodiment of the present invention.

As described above, the broadcast signal transmitter (or a time interleaver) according to an embodiment of the present invention may differently apply a diagonal slope in superframe units or IF units.

FIG. 50 illustrates an embodiment in which diagonal slopes are differently applied to respective IFs and TI patterns are changed and, that is, an embodiment in which the diagonal slopes are differently applied to the respective IFs according to the cases in which the number of FEC blocks contained in an IF is an even number and an odd number. This is because, when the number of the FEC blocks is an even number, a diagonal slope for reducing an interleaving depth may be present.

FIG. 50 illustrates an embodiment in which the number of IFs included in one superframe is 6 and the length of an FEC block included in each IF, Nr is 11 and, that is, an embodiment in which a diagonal slope is determined to be applied when the number of FEC blocks is 7.

FIG. 50(*a*) illustrates an embodiment in which the number of FEC blocks included in each IF is an odd number, that is, 7. In this case, the time interleaver according to an embodiment of the present invention may randomly select the diagonal slopes (in an order of diagonal slopes 1, 4, 3, 6, 2, and 5) and apply to 6 IFs so as not to repeat the diagonal slopes described with reference to FIG. 45. FIG. 50(*b*) illustrates an embodiment in which the number of FEC blocks included in each IF is an even number, that is, 6 and, that is, an embodiment in which the diagonal slope values described with reference to FIG. 45 is set to be applied to the case in which the number of FEC blocks is 7. In this case, the time interleaver according to an embodiment of the present invention may assume that each IF includes 7 FEC blocks and, that is, add the aforementioned virtual FEC block and apply a random diagonal slope to perform diagonal reading (in an order of diagonal slopes 1, 4, 3, 6, 2, and 5). In this case, as described above, cells of the virtual FEC may be disregarded via a skip operation.

The broadcast signal transmitter according to an embodiment of the present invention may select an IF having a largest number of FEC blocks in one superframe and determine Nc. A process for determination of Nc is the same as in Equation 17 above.

Then the broadcast signal transmitter according to an embodiment of the present invention determines whether the determined Nc is an even or odd number. When the determined Nc is an even number, the broadcast signal transmitter may add the virtual FEC block as described above. Equation 20 below represents a process of achieving an odd number by adding the virtual FEC block when Nc is an even number.

if mod($N_c$,2)=0

$N_c=N_c+1$ else if mod($N_c$,2)=1

$N_c=N_c$     [Equation 20]

Then the broadcast signal transmitter according to an embodiment of the present invention may sequentially or randomly generate diagonal slopes using various methods. Equation 21 below represents a process of generation of a diagonal slope to be used in each IF using a quadratic polynomial (QP) scheme.

[Equation 21]

$$H_j = \left(\gamma + q \times \frac{(j+1)(j+2)}{2}\right) \mod N_{Div}, \text{ for } j = 0, \ldots, N_{IP\_NUM} - 1$$

if $1 \leq H_j < N_c - 1$
    $S_{T,j} = H_j$
else
    $S_{T,j} = \mod(H_j, N_c - 1)$
end $N_{Div}$: division value of QP, $N_{Div} = 2^n$, where $\lceil \log_2(N_c/2) \rceil < n \leq \lceil \log_2(N_c) \rceil$
q: is relative prime value to $N_{Div}$
γ: an offset value of a QP
$\lceil \cdot \rceil$: cell operation The QP scheme may correspond to an embodiment of the present invention and may be replaced with a primitive polynomial (PP) scheme. This can be changed according to intention of the designer.

Equation 22 below represents a process of sequentially generating a diagonal slope.

$S_{r,j}=\mod(j,N_c-1)+1, \text{for } j=0,\ldots,N_{IF\_NUM}-1$     [Equation 22]

Then the broadcast signal transmitter according to an embodiment of the present invention may perform time interleaving in consideration of variables generated via the processes of Equations 20 to 22 above. In this case, a process of generation of a TI output memory output memory index of the broadcast signal transmitter according to an embodiment of the present invention may be represented according to Equation 18 above. Equation 21 above may include the diagonal slope generated according to Equations 21 and 22 above as a main variable. In addition, the skip operation described with reference to Equation 21 above can be applied irrespective of whether the length of Nc is an even or odd number.

The broadcast signal receiver according to an embodiment of the present invention can perform time interleaving so as to correspond to the aforementioned broadcast signal transmitter. In this case, a process of generation of a TDI output memory index of the broadcast signal receiver according to an embodiment of the present invention can be represented according to Equation 19 above. Equation 19 above may include the diagonal slope generated via the generating processes represented according to Equations 21 to 22 as a main variable. In addition, the skip operation described with reference to Equation 19 above can be applied irrespective of whether the length of Nc is an even or odd number.

As described above, the information associated with the TI pattern may be transmitted via the aforementioned static PLS signaling data. Information indicating whether the TI pattern is changed may be represented as TI_Var and may have a one bit size. When TI_Var has a value 0, this means that the TI pattern is not changed. Accordingly, the broadcast signal receiver according to an embodiment of the present invention may determine a variable ST as 1 that is a default value. When TI_Var has a value 1, this means that the TI pattern is changed. In this case, the broadcast signal receiver according to an embodiment of the present invention may determine the variable ST as $ST_j$.

The following equations is another embodiment of the equation 18 and represent the output memory index generation process for performing diagonal-type TI applicable in the aforementioned variable data-rate system.

[Equation 23]
$$\begin{aligned}
&\text{for } 0 \leq j \leq N_{IF\_NUM} - 1, \; 0 \leq k \leq N_r N_c - 1 \\
&\quad C_{cnt,j} = 0, \quad 1 \leq S_{T,j} < N_c \\
&\quad r_{j,k} = \mathrm{mod}(k, N_r). \\
&\quad s_{j,k} = \mathrm{mod}(r_{j,k}, N_c). \\
&\quad c_{j,k} = \mathrm{mod}\!\left(S_{T,j} \times t_{j,k} + \left\lfloor \frac{k}{N_r} \right\rfloor, N_c\right) \\
&\quad \theta_j(k) = N_r c_{j,k} + r_{j,k} \\
&\quad\quad \text{if } \theta_j(k) \leq N_{FEC\_Size,j} N_{FEC\_NUM,j} \\
&\quad\quad\quad \pi_j(C_{cnt,j}) = \theta_j(k) \\
&\quad\quad\quad C_{cnt,j} = C_{cnt,j} + 1 \\
&\quad\quad \text{end} \\
&\text{end}
\end{aligned}$$

$S_{T,j}$: diagonal slope for use in the jth interleaving frame (constant value)
$C_{cnt,j}$: counter of actual TI output memory-index for the jth IF
$\theta_j(k)$: temporal TI output memory-index for the jth IF
$\pi_j(k)$: actual TI output memory-index for the jth IF The following equations is another embodiment of the equation 19 represent the TDI memory index generation process which is applied to IF including a plurality of FEC blocks.

[Equation 24]
$$\begin{aligned}
&\text{for } 0 \leq k \leq N_c N_r - 1, \; 0 \leq j \leq N_{IF\_NUM} - 1 \\
&\quad C_{cnt,j} = 0 \\
&\quad S_{R,j} = \mathrm{mod}(S_{R,j-1} - S_{T,j}, N_c), \text{ where } S_{R,0} = N_c - S_{T,0}. \\
&\quad r_{j,k} = \mathrm{mod}(k, N_r), \\
&\quad t_{j,k} = \mathrm{mod}(SR_j \times r_{j,k}, N_c), \\
&\quad c_{j,k} = \mathrm{mod}\!\left(t_{j,k} + \left\lfloor \frac{k}{N_r} \right\rfloor, N_c\right) \\
&\quad \theta_j^{-1}(k) = N_r c_{j,k} + r_{j,k}, \\
&\quad\quad \text{if } M(\theta_j^{-1}(k)) \neq 0 \text{ (a value)} \\
&\quad\quad\quad \pi_j^{-1}(C_{cnt,j}) = \theta_j^{-1}(k) \\
&\quad\quad\quad C_{cnt,j} = C_{cnt,j} + 1 \\
&\quad\quad \text{end} \\
&\text{end}
\end{aligned}$$

$C_{cnt,j}$: counter of actual TDI output memory-index for the jth IF
$\theta_j^{-1}(k)$: temporal TDI output memory-index for the jth IF
$M(\theta_j^{-1}(k))$: the reversed cell value at $\theta_j^{-1}(k)$
$\pi_j^{-1}(k)$: actual TDI output memory-index for the jth IF The below equation represents a processing of calculating an optimum shift value to provide the maximum performance in a burst channel. The shift value according to an embodiment of the present invention is used to determine a TI pattern of reading operation and can be equal to a value of the diagonal slope.

[Equation 25]
$$S_T = \frac{N_c' - 1}{2}$$

$$\text{for } \begin{cases} N_c' = N_c + 1, & \text{if } N_c \bmod 2 = 0 \\ N_c' = N_c, & \text{if } N_c \bmod 2 = 1 \end{cases}$$

$N_c$: column size

When a number of IF is 2, the size of FEC block in two Ifs is equal to 8 and a number of FECblocks in the first IF is 4 and a number of FECblocks in the second IF is 5, then the maximum value of row for TI may be 8 and the maximum number of column for TI may be 5. In this case, using the equation 25, the optimum shift value can be 2.

The below equation represents a processing of calculating an optimum shift value to provide the maximum performance in a burst channel.

[Equation 26]
$$S_T = \frac{N_c' - 1}{2} + 1$$

$$\text{for } \begin{cases} N_c' = N_c + 1, & \text{if } N_c \bmod 2 = 0 \\ N_c' = N_c, & \text{if } N_c \bmod 2 = 1 \end{cases}$$

$N_c$: column size

When a number of IF is 2, the size of FEC block in two Ifs is equal to 8 and a number of FEC blocks in the first IF is 4 and a number of FEC blocks in the second IF is 5, then the maximum value of row for TI may be 8 and the maximum number of column for TI may be 5. In this case, using the equation 26, the optimum shift value can be 3.

Figure 51:
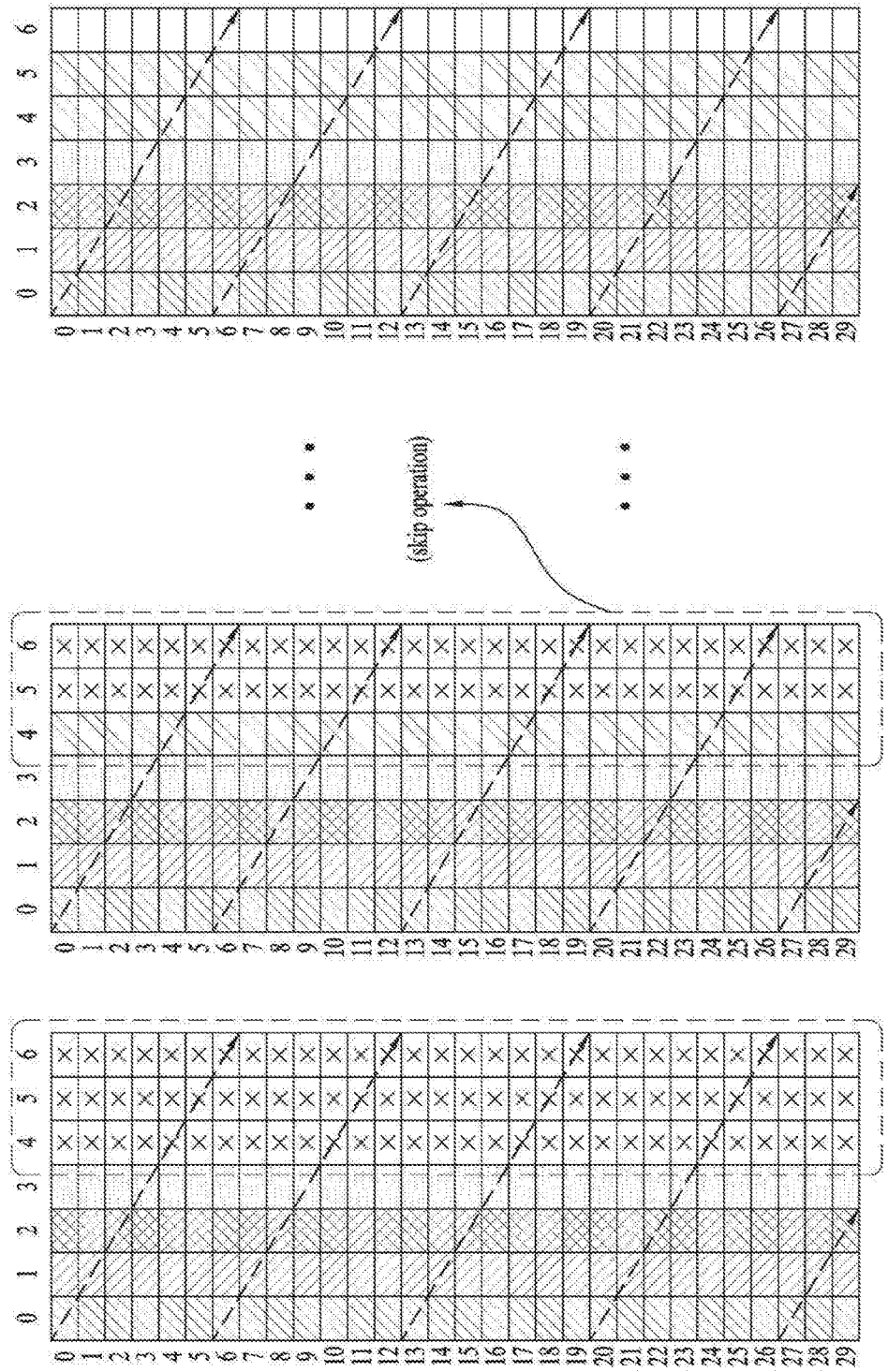
FIG. 51 illustrates IF interleaving according to an embodiment of the present invention.

FIG. 51 illustrates IF interleaving according to an embodiment of the present invention.

IF interleaving according to an embodiment of the present invention is for a variable data-rate transmission system, and maintains the same pattern for the aforementioned diagonal-wise reading and performs a skip operation for virtual FEC blocks in an embodiment.

When IFs include different number of FEC blocks, as shown in the figure, the same IF interleaving (or twisted block interleaving) can be determined and applied.

Accordingly, the receiver can perform IF deinterleaving using a single memory.

Hereinafter, a time interleaver according another embodiment of the present invention will be described. The time interleaver according another embodiment of the present invention may include a convolutional interleaver and a block interleaver. The convolutional interleaver according to an embodiment of the present invention can perform inter-frame interleaving which is applied to between different TI blocks. The block interleaver according to an embodiment of the present invention can perform intra-frame interleaving which is applied in a TI block. Also, The block interleaver according to an embodiment of the present invention can perform an interleaving described in FIG. 30-FIG. 50.

The time interleaver according another embodiment of the present invention can increase time diversity by using the concatenated inter-frame interleaving and intar-frame intereavling. The details will be described.

A description will be given of convolutional interleaving (CI) as an embodiment of inter-frame interleaving.

CI according to an embodiment of the present invention can be defined as interleaving of IFs. Each IF can be divided into interleaving units (IUs).

For virtual IUs from among output IFs of CI according to an embodiment of the present invention, start-skip operation and stop-skip operation can be applied.

Figure 52:
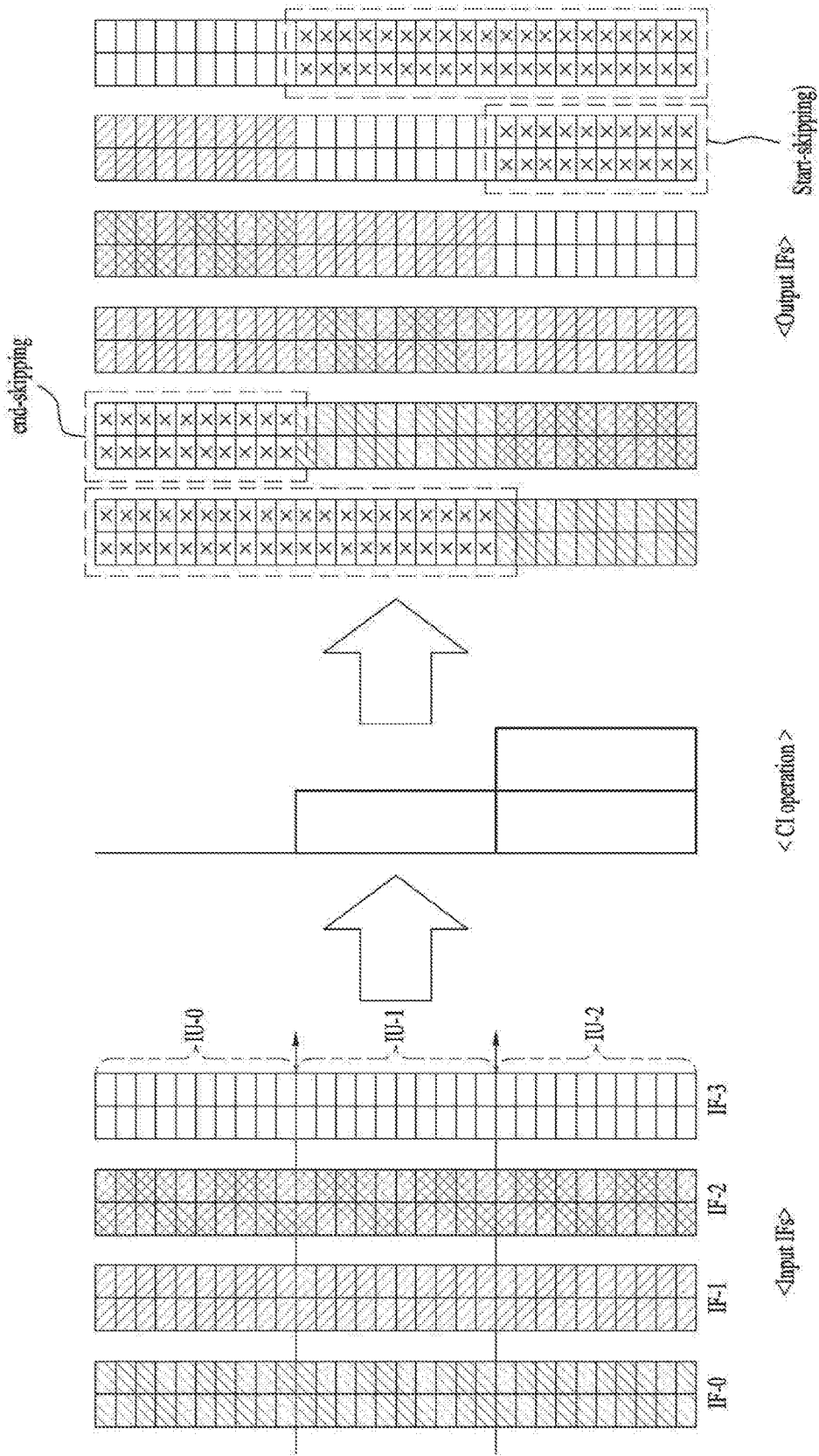
FIG. 52 illustrates CI according to an embodiment of the present invention.

FIG. 52 illustrates CI according to an embodiment of the present invention.

FIG. 52 shows CI in consideration of constant data-rate transmission.

Blocks shown in the left part of the figure indicate IFs corresponding to CI input. The figure shows an embodiment in which 4 IFs are present.

A block shown in the middle part of the figure indicates a register block in a convolutional interleaver for performing CI. The size of the register block according to an embodiment of the present invention can be determined using the aforementioned IU as a basic unit. The figure shows the register block when the number of IUs is 3.

Blocks shown in the right part of the figure indicate IFs corresponding to CI output. In initial operation of CI, some IUs in the register block are not completely filled, and thus a dummy IU may be output. For this dummy IU, the aforementioned start-skip operation can be performed. A dummy IU according to an embodiment of the present invention may be referred to as a virtual IU.

In final operation of CI, since some IUs in the register block is not fully filled, a dummy IU may be output. For this dummy IU, end-skip operation can be performed.

Figure 53:
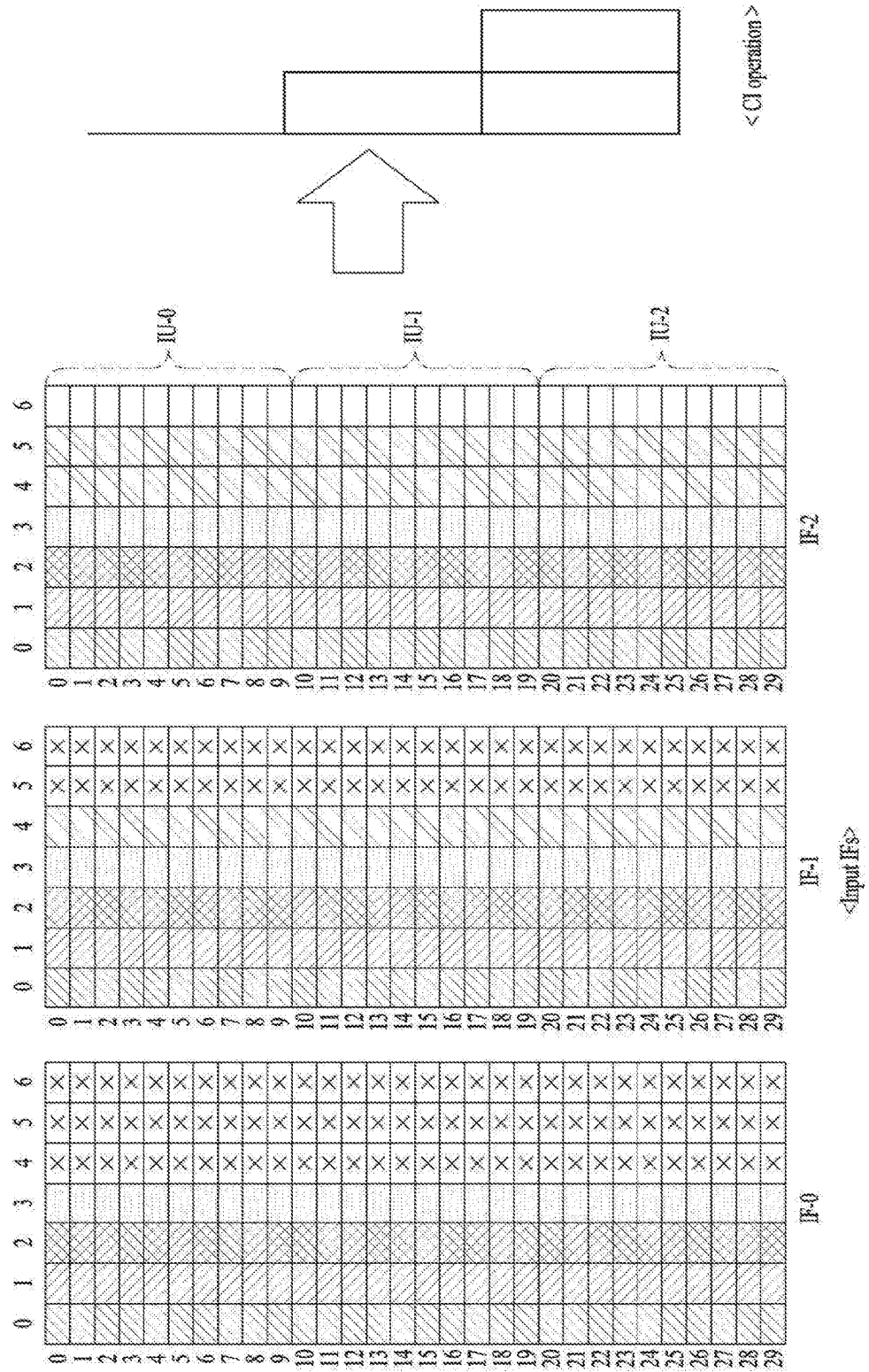
FIG. 53 illustrates CI according to another embodiment of the present invention.

FIG. 53 illustrates CI according to another embodiment of the present invention.

FIG. 53 shows CI considering variable data-rate transmission.

Blocks shown in the left of the figure indicate IFs corresponding to CI input. The figure illustrates an embodiment in which the number of IFs is 3.

An IF size according to an embodiment of the present invention is determined by a maximum IF size, and the determined IF size can be maintained in an embodiment. Further, a memory of CI can be determined according to the IU size.

The right of the figure shows a register block in a convolutional interleaver for performing CI.

The size of the register block for CI can be determined on the basis of a largest IU from among IUs obtained when each IF block is divided into IUs. This figure shows a case in which the number of IUs is 3.

In initial CI operation, some IUs in the register block are not fully filled, and thus a dummy IU may be output. For this dummy IU, the aforementioned start-skip operation can be performed.

In final operation of CI, since some IUs in the register block are not completely filled, a dummy IU may be output. For this dummy IU, end-skip operation can be performed.

Figure 54:
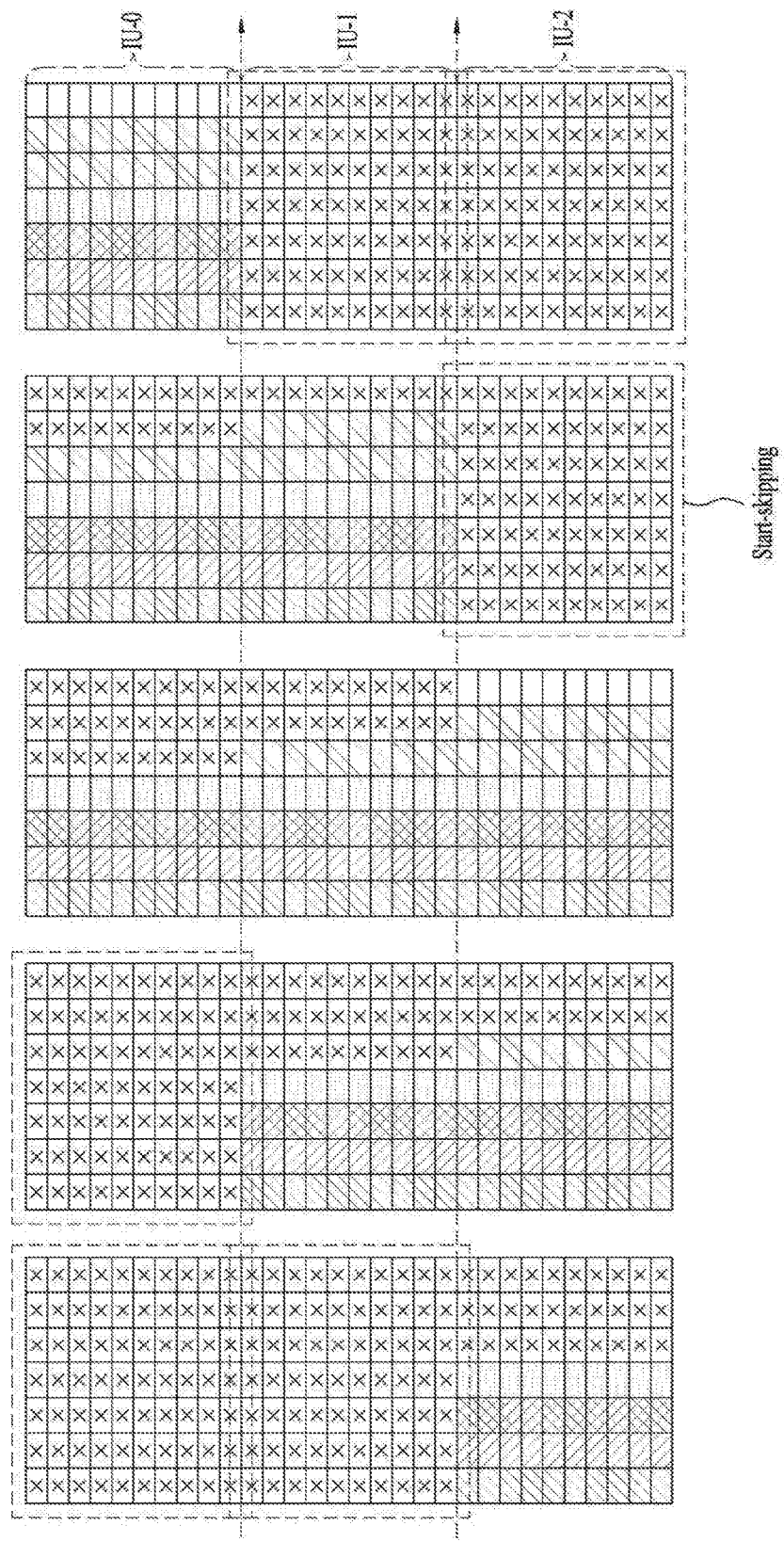
FIG. 54 illustrates output IFs of CI according to an embodiment of the present invention.

FIG. 54 illustrates output IFs of CI according to an embodiment of the present invention.

FIG. 54 shows IFs corresponding to output of CI described with reference to FIG. 53. Blocks indicated by x in IUs are virtual IUs and can be ignored by the aforementioned start-skip operation and end-skip operation.

Figure 55:
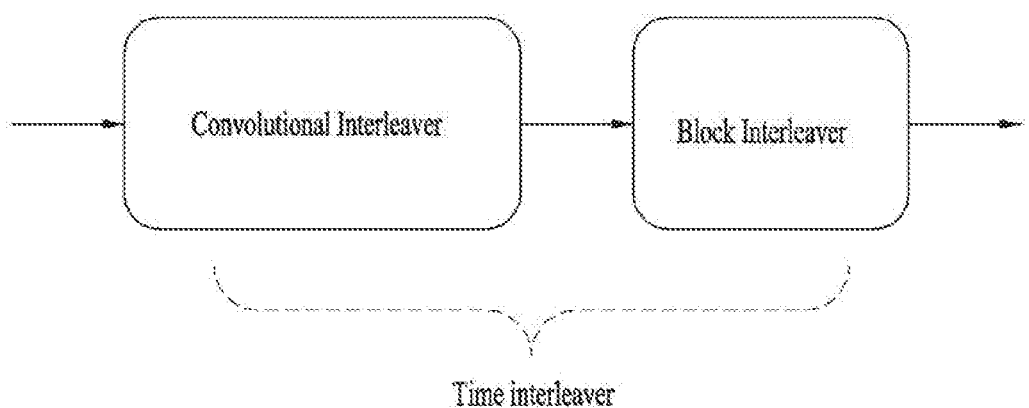
FIG. 55 illustrates a time interleaver according to another embodiment of the present invention.

FIG. 55 illustrates a time interleaver according to another embodiment of the present invention.

As above described, the time interleaver according to another embodiment of the present invention may include a convolutional interleaver and a block interleaver. The convolutional interleaver according to an embodiment of the present invention can perform CI described above with reference to FIGS. 51, 52 and 53 and the block interleaver according to an embodiment of the present invention can perform interleaving, described with reference to FIGS. 26 to 50, on IFs output from the convolutional interleaver. The block interleaver according to an embodiment of the present invention may be referred to as a twisted block interleaver.

The positions and names of the convolutional interleaver and the block interleaver may be changed according to intention of the designer.

Figure 56:
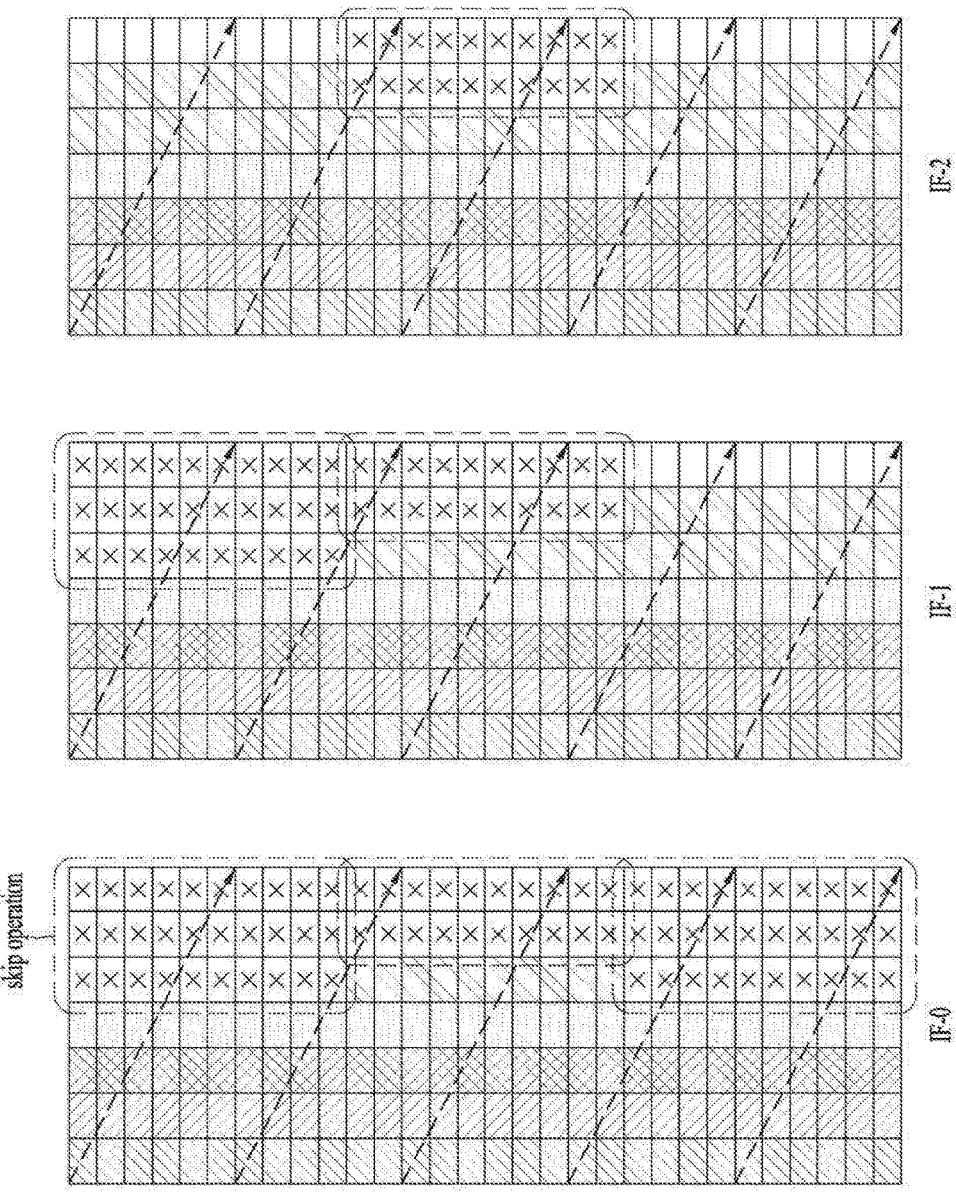
FIG. 56 illustrates operation of the block interleaver according to an embodiment of the present invention.

FIG. 56 illustrates operation of the block interleaver according to an embodiment of the present invention.

The block interleaver according to an embodiment of the present invention can perform interleaving, described above with reference to FIGS. 26 to 50, on IFs output from the convolutional interleaver.

The block interleaver according to an embodiment of the present invention can perform start-skip operation and end-skip operation on CI output and continuously stack data in IUs in the vertical direction so as to obtain IF blocks. The present figure shows a case in which 3 IFs are acquired. Subsequently, the block interleaver can perform the aforementioned diagonal reading of the IF blocks. As described above, cells of a virtual FEC block in the IF blocks can be ignored by skip operation.

FIG. 57 illustrates operation of the block interleaver according to another embodiment of the present invention.

The block interleaver according to an embodiment of the present invention can perform start-skip operation and end-skip operation on CI output and continuously stack data in IUs in the horizontal direction so as to obtain IF blocks. Subsequently, the block interleaver can perform diagonal reading of the IF blocks. As described above, cells of a virtual FEC block in the IF blocks can be ignored by skip operation.

Figure 58:
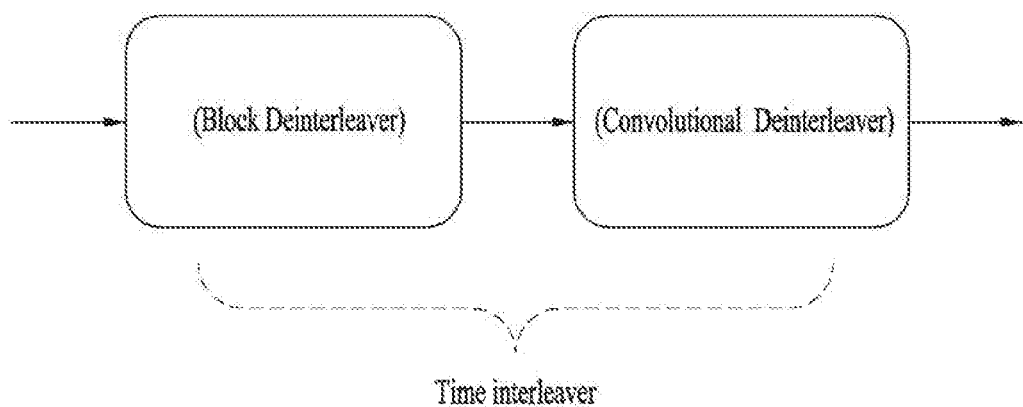
FIG. 58 illustrates a time deinterleaver according to another embodiment of the present invention.

FIG. 58 illustrates a time deinterleaver according to another embodiment of the present invention.

The time deinterleaver according to another embodiment of the present invention may include a block deinterleaver and a convolutional deinterleaver. The time deinterleaver according to another embodiment of the present invention can perform operation corresponding to a reverse of operation of the time interleaver described above with reference to FIG. 56. That is, the block deinterleaver according to an embodiment of the present invention can perform a reverse of interleaving described above with reference to FIGS. 26 to 50 and the convolutional deinterleaver according to an embodiment of the present invention can perform a reverse of CI described above with reference to FIGS. 51, 52 and 53. The block deinterleaver according to an embodiment of the present invention may be referred to as a twisted block deinterleaver.

The positions and names of the block deinterleaver and the convolutional deinterleaver may be changed according to intention of the designer.

Input/output operations of the convolutional interleaver according to an embodiment of the present invention can be performed on the basis of the aforementioned IF. Each IF can be divided into IUs and input to the convolutional interleaver. In this case, the size of an FEC block of the IF can be assigned corresponding to an integer multiple of the number of IUs. Such assignment process can effectively reduce burden of processing necessary for deinterleaving of the receiver.

Figure 59:
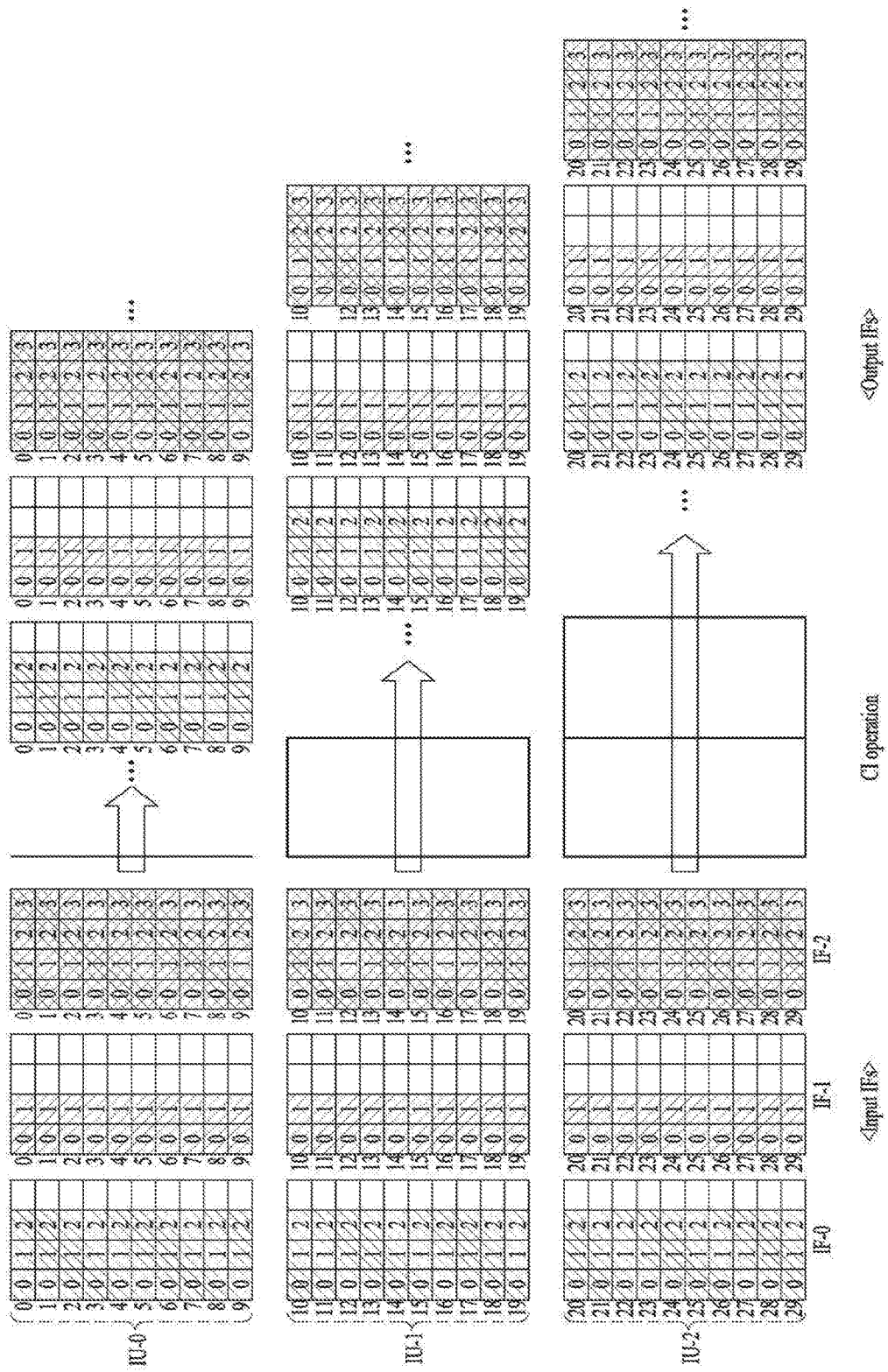
FIG. 59 illustrates CI according to another embodiment of the present invention.

FIG. 59 illustrates CI according to another embodiment of the present invention.

Blocks shown in the left part of the figure indicate IFs corresponding to CI input. The figure shows an embodiment in which 3 IFs are present.

A block shown in the middle part of the figure indicates a register block in a convolutional interleaver for performing CI. The size of the register block according to an embodiment of the present invention can be determined using the aforementioned IU as a basic unit. The figure shows the register block when the number of IUs is 3.

Blocks shown in the right part of the figure indicate IFs corresponding to CI output.

Figure 60:
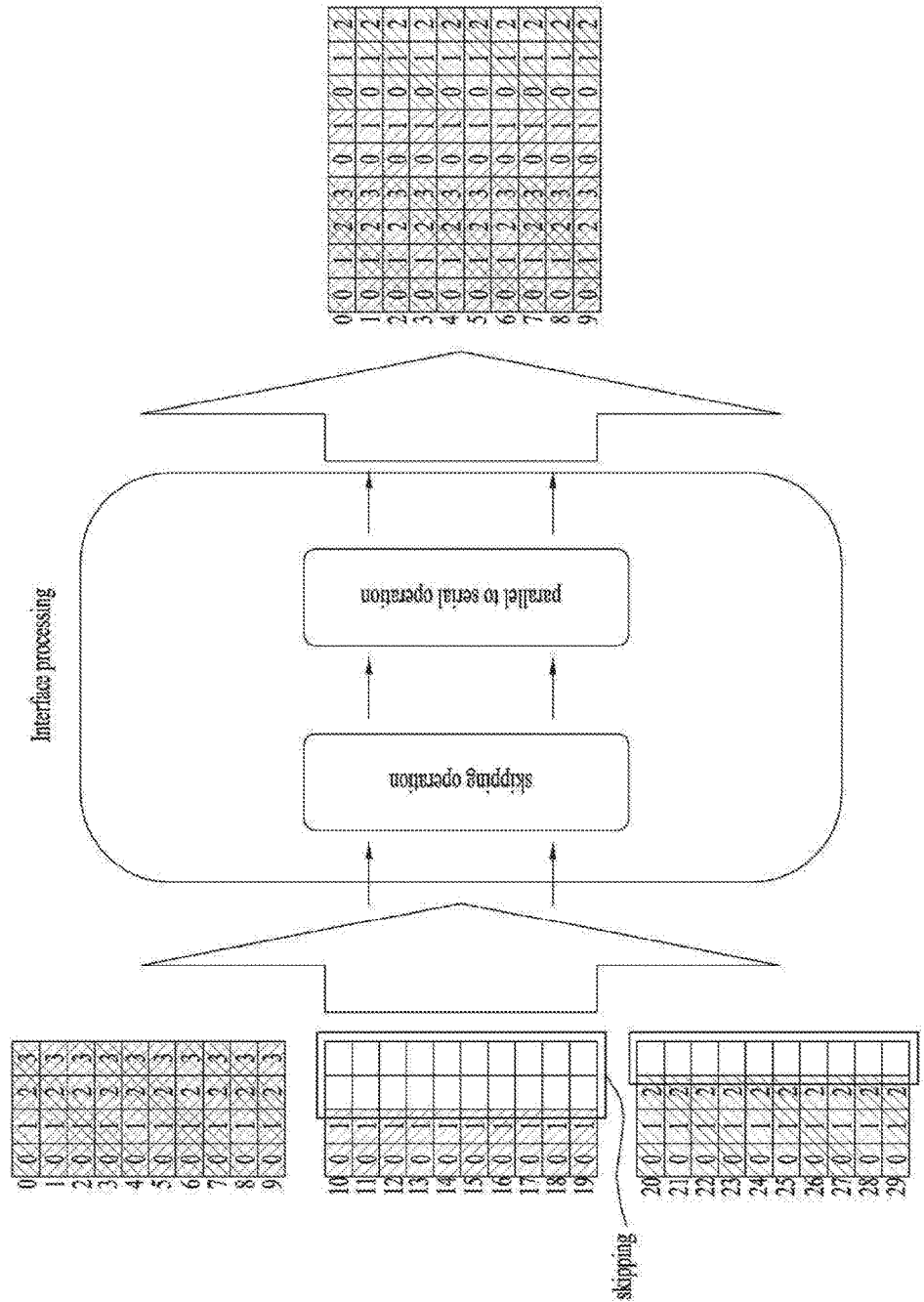
FIG. 60 illustrates interface processing between the convolutional interleaver and the block interleaver according to an embodiment of the present invention.

FIG. 60 illustrates interface processing between the convolutional interleaver and the block interleaver according to an embodiment of the present invention.

As shown in the figure, interface processing corresponds to post-processing of CI and pre-processing of block interleaving.

Interface processing according to an embodiment of the present invention can be composed of skip operation and parallel-to-serial operation. Skip operation can be performed on virtual FEC blocks in IFs corresponding to output of the convolutional interleaver and parallel-to-serial operation can be performed on FEC blocks on which skip operation has been performed. Particularly, skip operation can effectively reduce burden of processing necessary for deinterleaving of the receiver.

Figure 61:
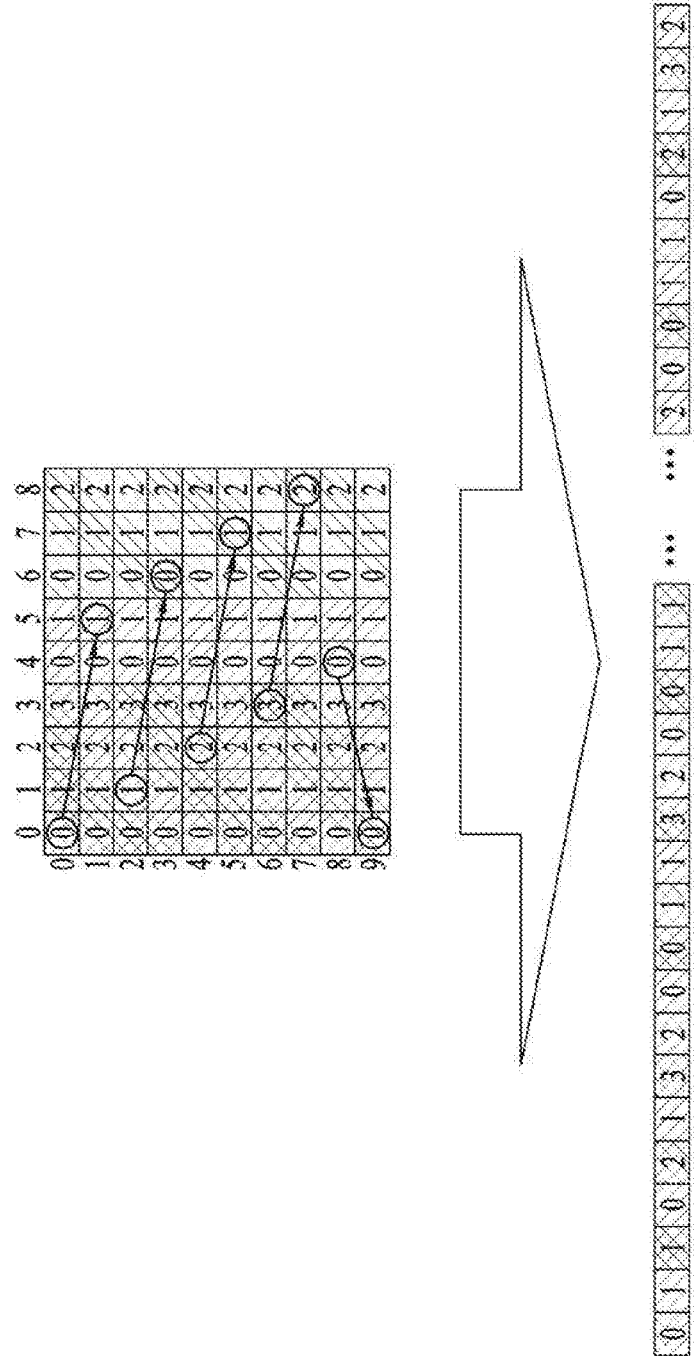
FIG. 61 illustrates block interleaving according to another embodiment of the present invention.

FIG. 61 illustrates block interleaving according to another embodiment of the present invention.

Block interleaving can be performed on output data of the aforementioned interface processing. Specifically, block interleaving is performed as described above with reference to FIGS. 26 to 50.

Figure 62:
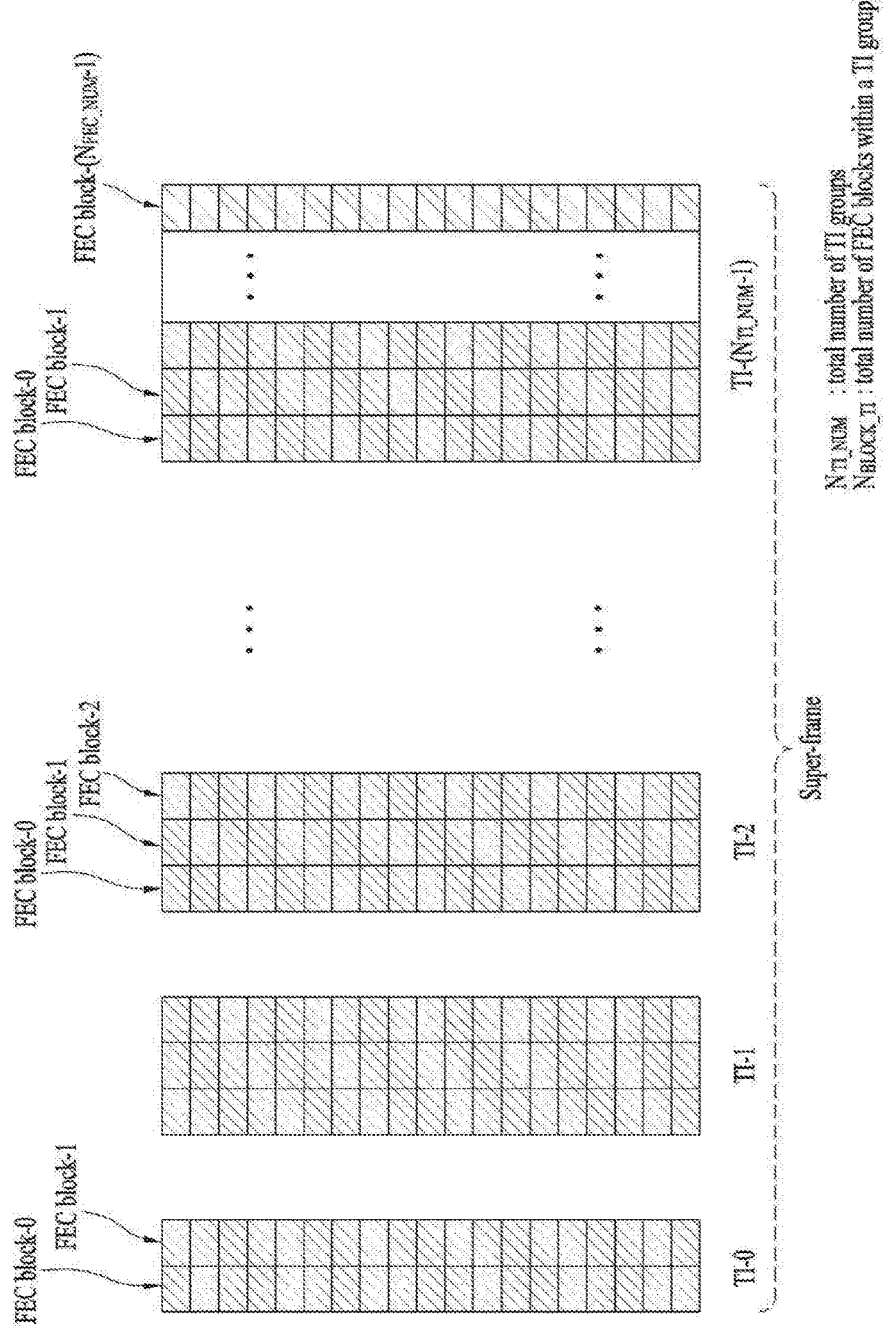
FIG. 62 illustrates the concept of a variable bit-rate system according to an embodiment of the present invention.

FIG. 62 illustrates the concept of a variable bit-rate system according to an embodiment of the present invention.

The variable bit-rate system according to an embodiment of the present invention is another embodiment of the aforementioned variable data-rate system.

Specifically, a transport superframe, shown in FIG. 62, is composed of NTI_NUM TI groups and each TI group can include N BLOCK_TI FEC blocks.

In this case, TI groups may respectively include different numbers of FEC blocks. The TI group according to an embodiment of the present invention can be defined as a block for performing time interleaving and can be used in the same meaning as the aforementioned TI block or IF. That is, one IF can include at least one TI block and the number of FEC blocks in the TI block is variable.

Details are as described with reference to FIGS. 36 and 48.

When TI groups include different numbers of FEC blocks, the present invention performs interleaving on the TI groups using one twisted row-column block interleaving rule in an embodiment. Accordingly, the receiver can perform deinterleaving using a single memory.

A description will be given of an input FEC block memory arrangement method and reading operation of the time interleaver in consideration of variable bit-rate (VBR) transmission in which the number of FEC blocks can be changed per TI group.

Figure 63:
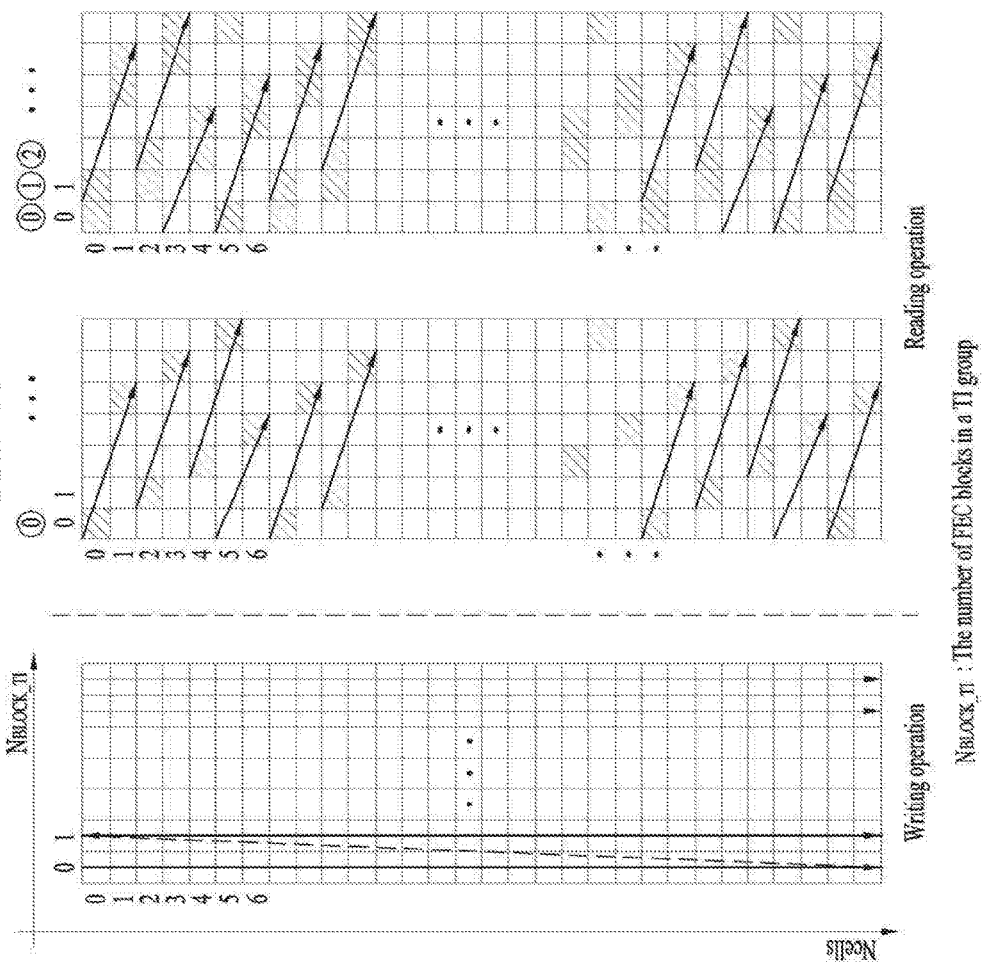
FIG. 63 illustrates writing and reading operations of block interleaving according to an embodiment of the present invention.

FIG. 63 illustrates writing and reading operations of block interleaving according to an embodiment of the present invention.

FIG. 63 corresponds to another embodiment of the operation shown in FIG. 26 and thus detailed description thereof is omitted.

FIG. 64 shows equations representing block interleaving according to an embodiment of the present invention.

The equations shown in the figure represent block interleaving applied per TI group. As expressed by the equations, shift values can be respectively calculated in a case in which the number of FEC blocks included in a TI group is an odd number and a case in which the number of FEC blocks included in a TI group is an even number. That is, block interleaving according to an embodiment of the present invention can calculate a shift value after making the number of FEC blocks be an odd-number.

A time interleaver according to an embodiment of the present invention can determine parameters related to interleaving on the basis of a TI group having a maximum number of FEC blocks in the corresponding superframe. Accordingly, the receiver can perform deinterleaving using a single memory.

Here, for a TI group having a smaller number of FEC blocks than the maximum number of FEC blocks, virtual FEC blocks corresponding to a difference between the number of FEC blocks and the maximum number of FEC blocks can be added.

Virtual FEC blocks according to an embodiment of the present invention can be inserted before actual FEC blocks.

Subsequently, the time interleaver according to an embodiment of the present invention can perform interleaving on the TI groups using one twisted row-column block interleaving rule in consideration of the virtual FEC blocks. In addition, the time interleaver according to an embodiment of the present invention can perform the aforementioned skip operation when a memory-index corresponding to virtual FEC blocks is generated during reading operation. In the following writing operation, the number of FEC blocks of input TI groups is matched to the number of FEC blocks of output TI groups. Consequently, according to time interleaving according to an embodiment of the present invention, loss of data rate of data actually transmitted may be prevented through skip operation even if virtual FEC blocks are inserted in order to perform efficient single-memory deinterleaving in the receiver.

FIG. 65 illustrates virtual FEC blocks according to an embodiment of the present invention.

The left side of the figure shows parameters indicating a maximum number of FEC blocks in a TI group, the actual number of FEC blocks included in a TI group and a difference between the maximum number of FEC blocks and the actual number of FEC blocks, and equations for deriving the number of virtual FEC blocks.

The right side of the figure shows an embodiment of inserting virtual FEC blocks into a TI group. In this case, the virtual FEC blocks can be inserted before actual FEC blocks, as described above.

FIG. 66 shows equations representing reading operation after insertion of virtual FEC blocks according to an embodiment of the present invention.

Skip operation illustrated in the figure can skip virtual FEC blocks in reading operation.

FIG. 67 is a flowchart illustrating a time interleaving process according to an embodiment of the present invention.

A time interleaver according to an embodiment of the present invention can setup initial values (S67000).

Then, the time interleaver according to an embodiment of the present invention can perform writing operation on actual FEC blocks in consideration of virtual FEC blocks (S67100).

The time interleaver according to an embodiment of the present invention can generate a temporal TI address (S67200).

Subsequently, the time interleaver according to an embodiment of the present invention can evaluate the availability of the generated TI reading address (S67300). Then, the time interleaver according to an embodiment of the present invention can generate a final TI reading address (S67400).

The time interleaver according to an embodiment of the present invention can read the actual FEC blocks (S67500).

Figure 68:
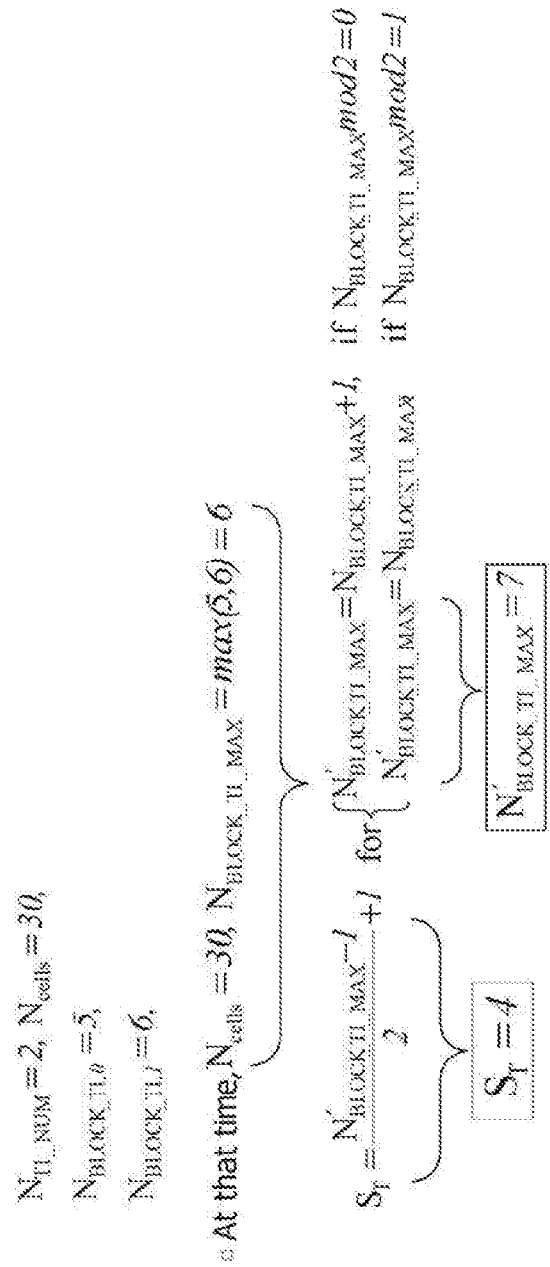
FIG. 68 shows equations representing a process of determining a shift value and a maximum TI block size according to an embodiment of the present invention.

FIG. 68 shows equations representing a process of determining a shift value and a maximum TI block size according to an embodiment of the present invention.

The figure shows an embodiment in which the number of TI groups is 2, the number of cells in a TI group is 30, the number of FEC blocks included in the first TI group is 5 and the number of FEC blocks included in the second TI block is 6. While a maximum number of FEC blocks is 6, 6 is an even number. Accordingly, a maximum number of FEC blocks, which is adjusted in order to obtain the shift value, can be 7 and the shift value can be calculated as 4.

Figure 69:
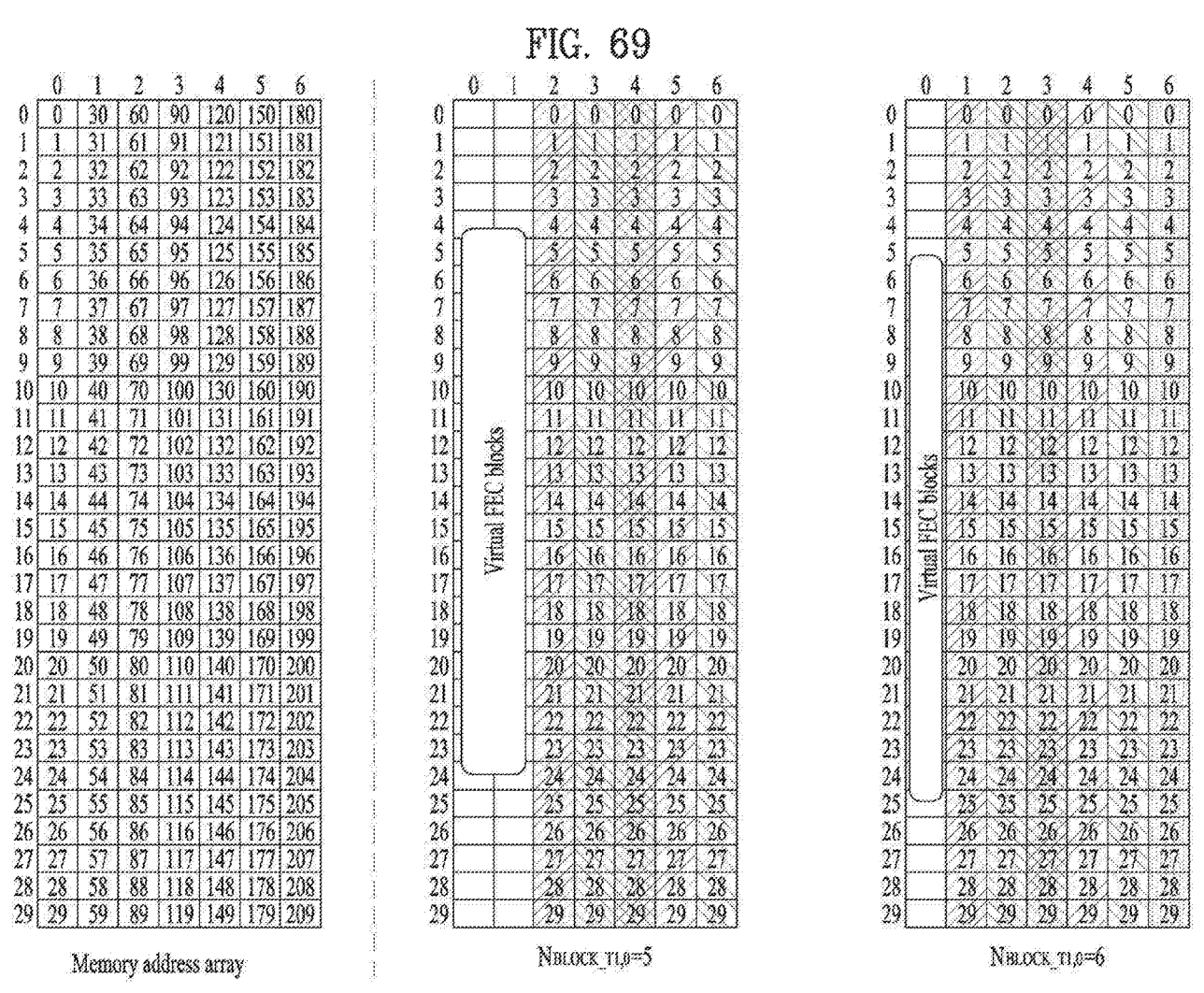
Figure 70:
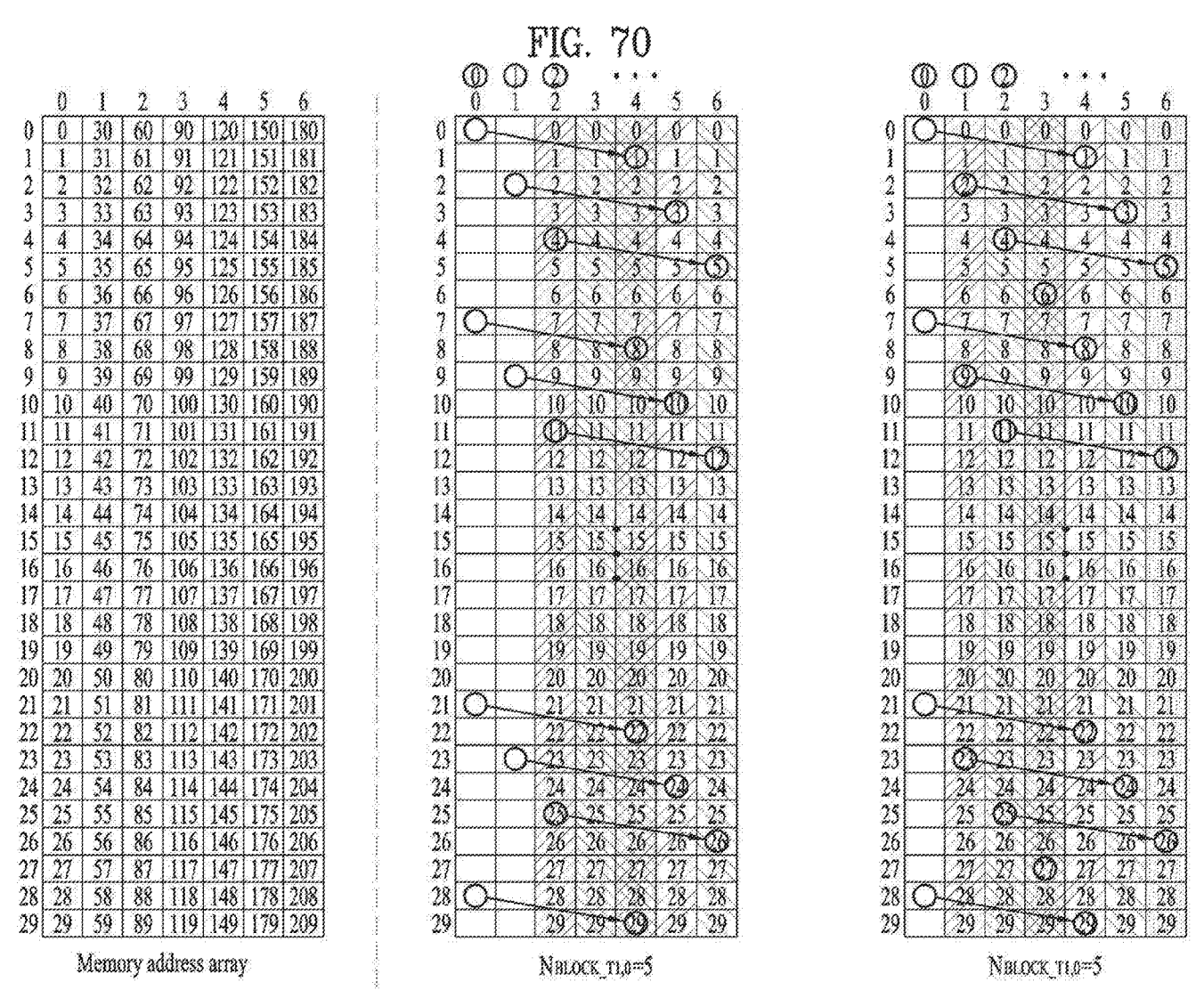
Figure 71:
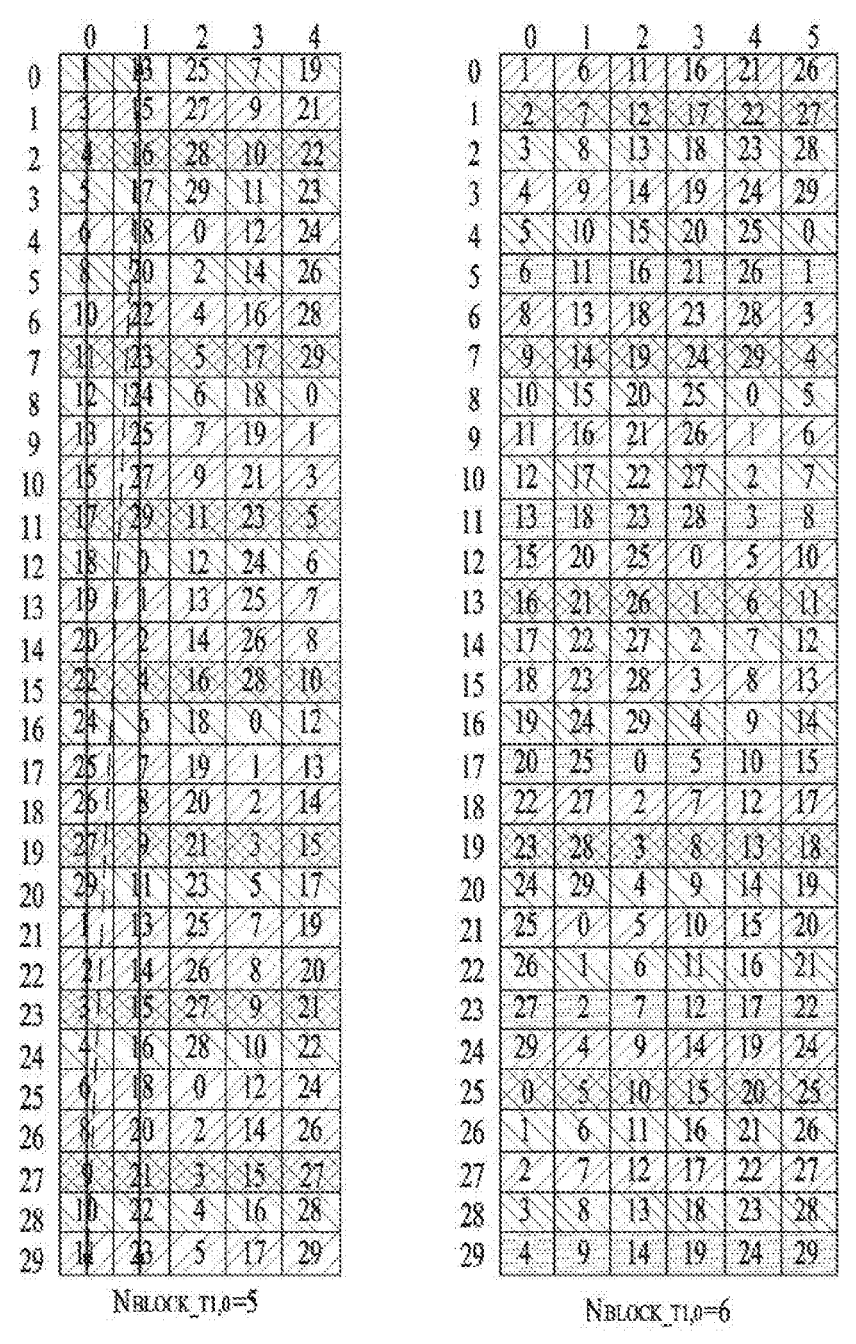

FIGS. 69, 70 and 71 illustrate a TI process of the embodiment shown in FIG. 68.

FIG. 69 illustrates writing operation according to an embodiment of the present invention.

FIG. 69 shows writing operation for the two TI groups described with reference to FIG. 68.

A block shown in the left side of the figure represents a TI memory address array and blocks shown in the right side of the figure illustrate writing operation when two virtual FEC blocks and one virtual FEC block are respectively inserted into two continuous TI groups. Since the adjusted maximum number of FEC blocks is 7, as described above, two virtual FEC blocks are inserted into the first TI group and one virtual FEC block is inserted into the second TI group.

FIG. 70 illustrates reading operation according to an embodiment of the present invention.

A block shown in the left side of the figure represents a TI memory address array and blocks shown in the right side of the figure illustrate reading operation when two virtual FEC blocks and one virtual FEC block are respectively inserted into two continuous TI groups. In this case, reading operation can be performed on the virtual FEC blocks in the same manner as the reading operation performed on actual FEC blocks.

FIG. 71 illustrates a result of skip operation in reading operation according to an embodiment of the present invention.

As shown in the figure, virtual FEC blocks can be skipped in two TI groups.

Figure 72:
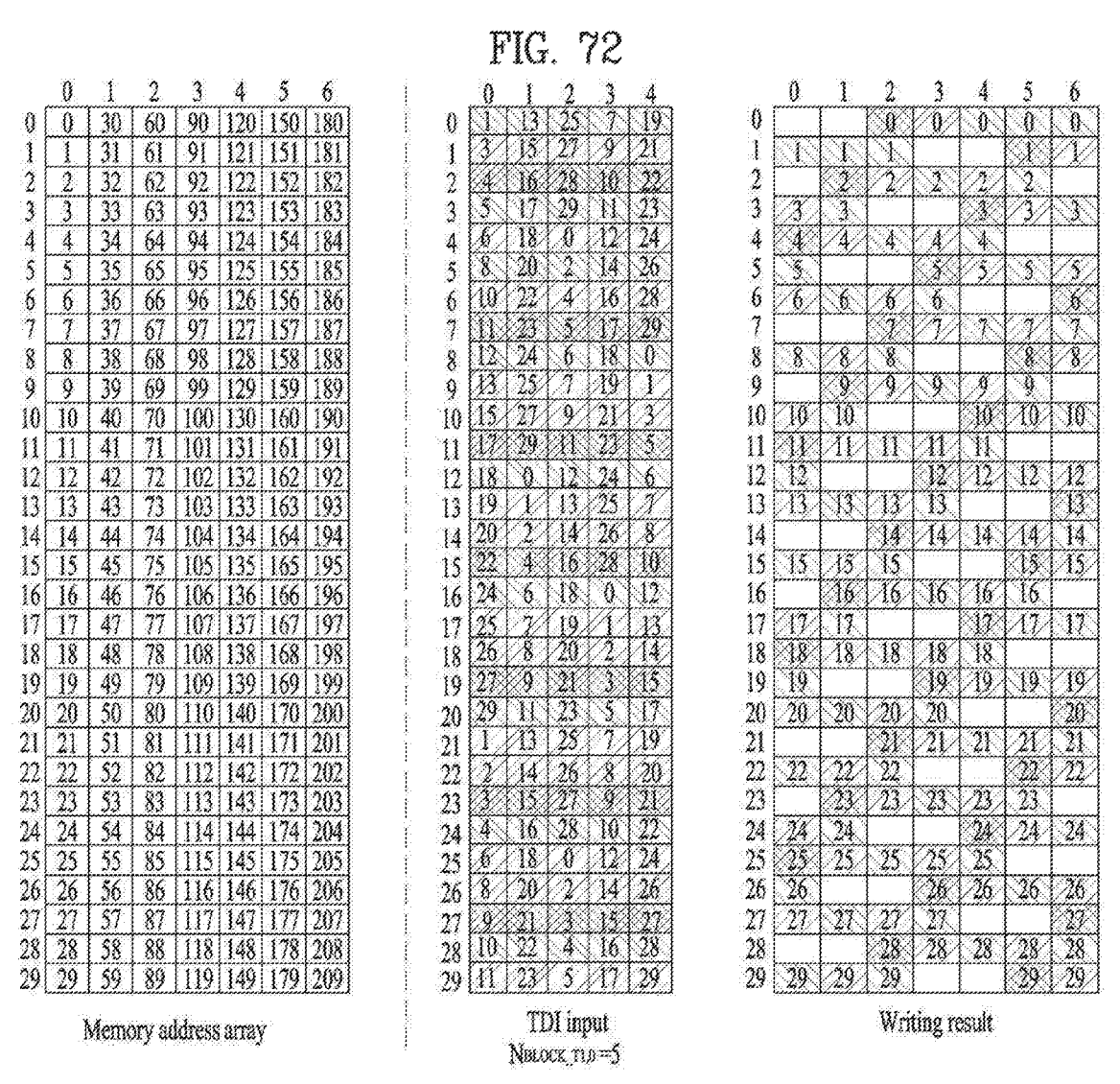
Figure 73:
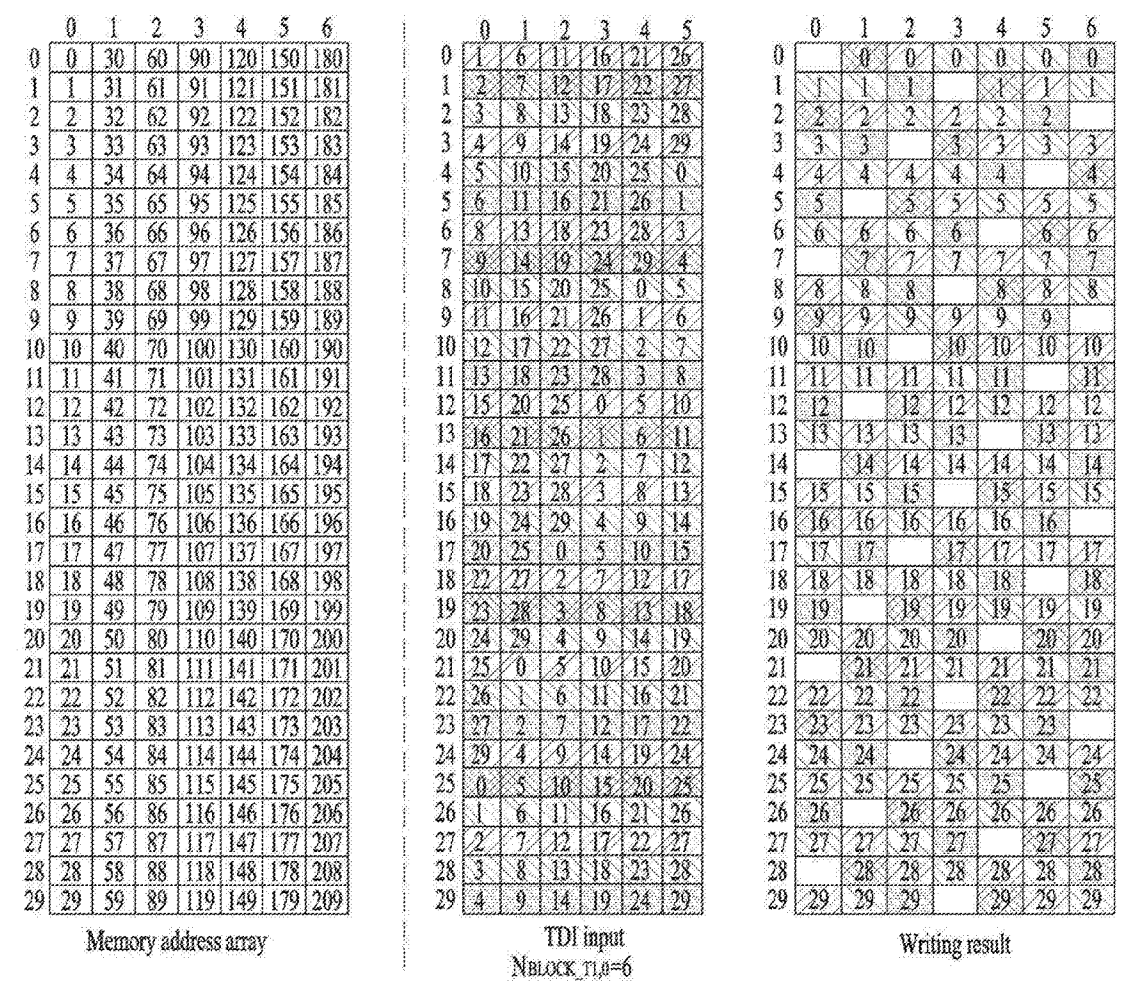

FIGS. 72 and 73 illustrate time deinterleaving corresponding to a reverse of TI described with reference to FIGS. 68 to 71. Specifically, FIG. 72 illustrates time deinterieaving for the first TI group and FIG. 73 illustrates time deinterleaving for the second TI group.

FIG. 72 shows a writing process of time deinterleaving according to an embodiment of the present invention.

In this case, the parameters described with reference to FIG. 68 can be equally applied.

A left block in the figure shows a TI memory address array, a middle block shows the first TI group input to a time deinterleaver and a right block shows a writing process performed in consideration of virtual FEC blocks that are skipped with respect to the first TI group.

As shown in the figure, two virtual FEC blocks skipped during TI can be restored for correct reading operation in the writing process. In this case, the positions and quantity of the skipped two virtual FEC blocks can be estimated through an arbitrary algorithm.

FIG. 73 illustrates a writing process of time deinterleaving according to another embodiment of the present invention.

A left block in the figure shows a TI memory address array, a middle block shows the second TI group input to the time deinterleaver and a right block shows a writing process performed in consideration of virtual FEC blocks that are skipped with respect to the second TI group.

As shown in the figure, one virtual FEC block skipped during TI can be restored for correct reading operation in the writing process. In this case, the position and quantity of the skipped one virtual FEC block can be estimated through an arbitrary algorithm.

FIG. 74 shows equations representing reading operation of time deinterleaving according to another embodiment of the present invention.

A TDI shift value used in the receiver can be determined by a shift value used in the transmitter, and skip operation can skip virtual FEC blocks in reading operation, similarly to skip operation performed in the transmitter.

Figure 75:
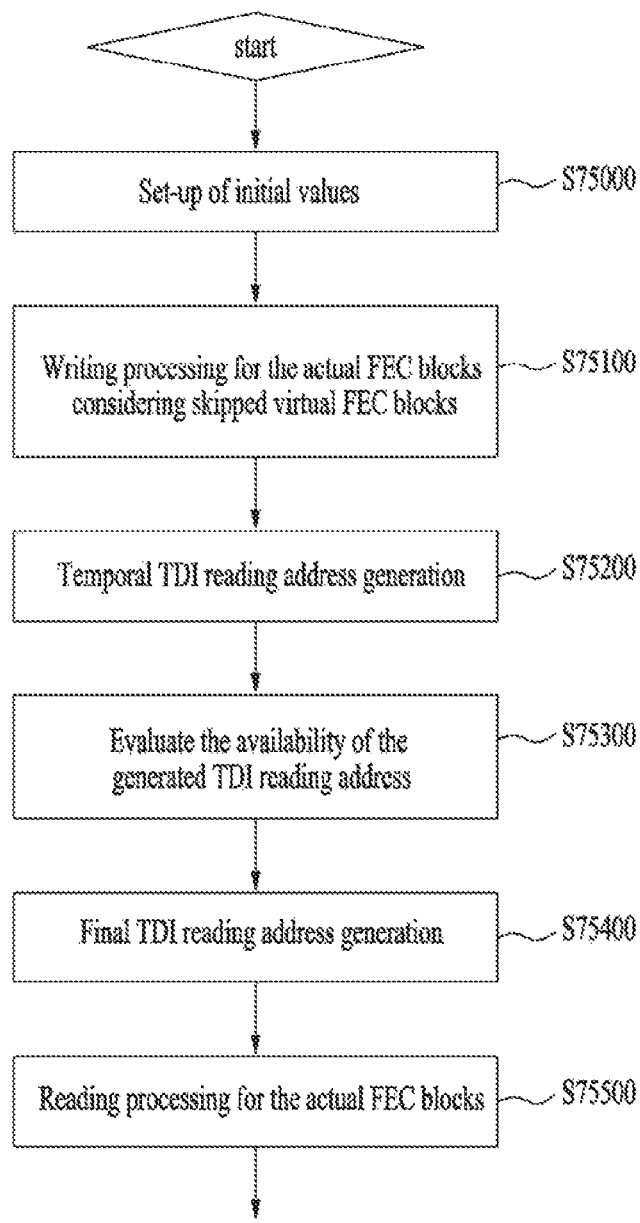
FIG. 75 is a flowchart illustrating a time deinterleaving process according to an embodiment of the present invention.

FIG. 75 is a flowchart illustrating a time deinterleaving process according to an embodiment of the present invention.

A time deinterleaver according to an embodiment of the present invention can setup initial values (S75000).

Then, the time deinterleaver according to an embodiment of the present invention can perform writing operation on actual FEC blocks in consideration of virtual FEC blocks (S75100).

Subsequently, the time deinterleaver according to an embodiment of the present invention can generate a temporal TDI reading address (S75200).

The time deinterleaver according to an embodiment of the present invention can evaluate the availability of the generated TDI reading address (S75300). Then, the time deinterleaver according to an embodiment of the present invention can generate a final TDI reading address (S75400).

Subsequently, the time deinterleaver according to an embodiment of the present invention can read the actual FEC blocks (S75500).

Figure 76:
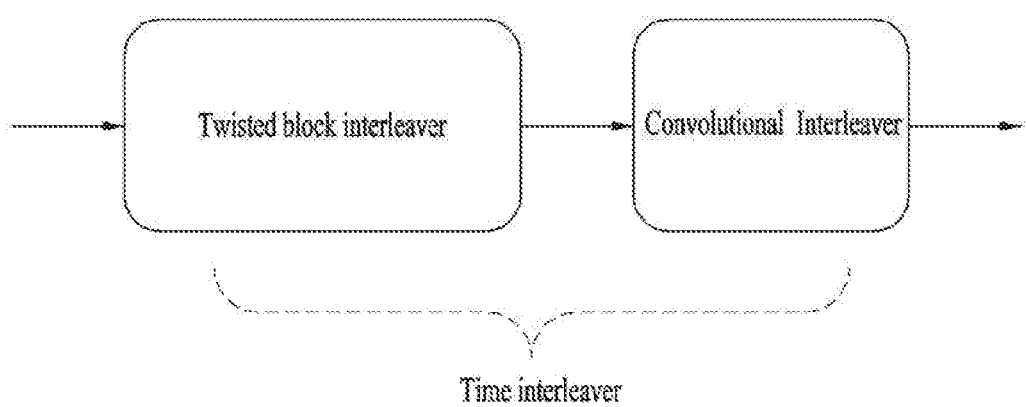
FIG. 76 is a block diagram of a time interleaver according to another embodiment of the present invention.

FIG. 76 is a block diagram of a time interleaver according to another embodiment of the present invention.

Specifically, the time interleaver according to an embodiment of the present invention may include a twisted block interleaver and a convolutional interleaver.

The time interleaver according to an embodiment of the present invention may perform a block interleaving (or twisted block interleaving) operation, and then perform a convolutional interleaving operation.

In addition, the time interleaver according to an embodiment of the present invention is applicable not only to a constant bit rate (CBR) system having a constant number of FEC blocks in an interleaving frame (IF) but also to a variable bit rate (VBR) system having a variable number of FEC blocks in an IF. The VBR system according to an embodiment of the present invention may be used in the same meaning as the above-described variable data rate (VDR) system.

Specifically, the time interleaver or the twisted block interleaver according to an embodiment of the present invention may operate based on IFs. In this case, each IF may be divided into interleaving units (IUs) and input to the convolutional interleaver. As described above, an IF may be used in the same concept as a TI block. That is, one IF may include one or more TI blocks, and the number of FEC blocks included in the TI block is variable.

A description is now given of a CBR system having a FEC block size of 30 and an IU size of 3, as an embodiment of operation of the time interleaver.

Figure 77:
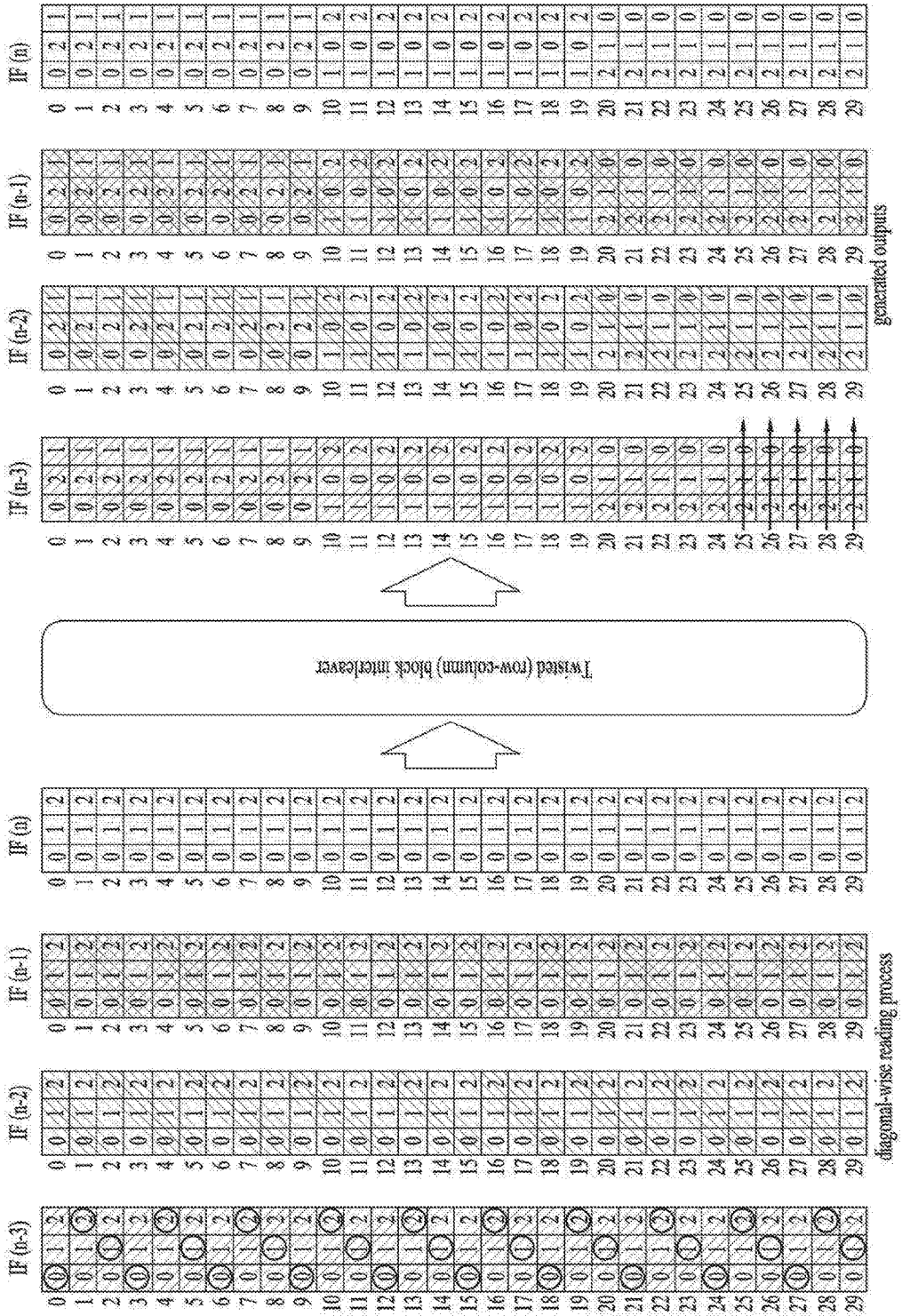
FIG. 77 is a view illustrating a twisted block interleaving operation.
Figure 78:
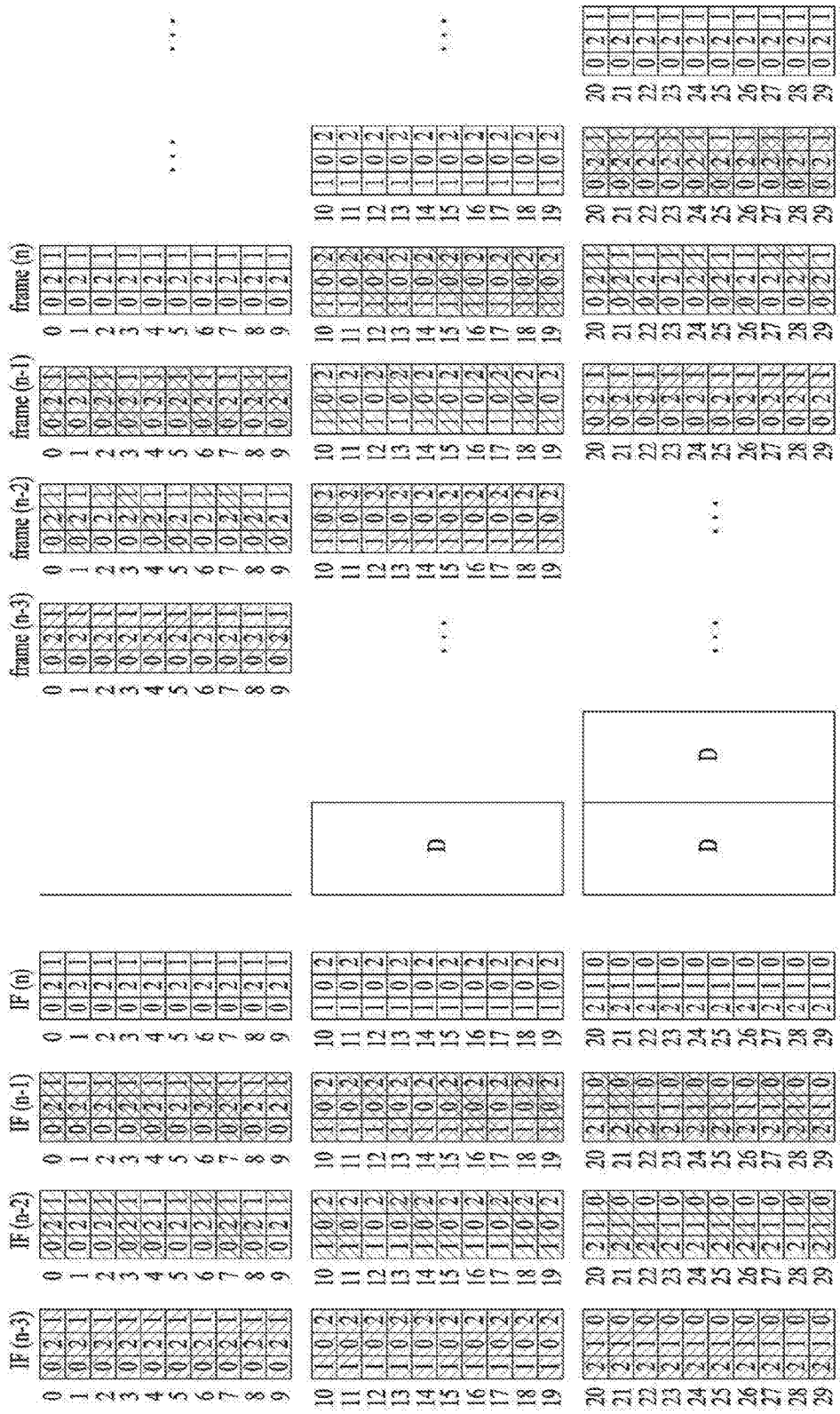
FIG. 78 illustrates a convolutional interleaving operation.
Figure 79:
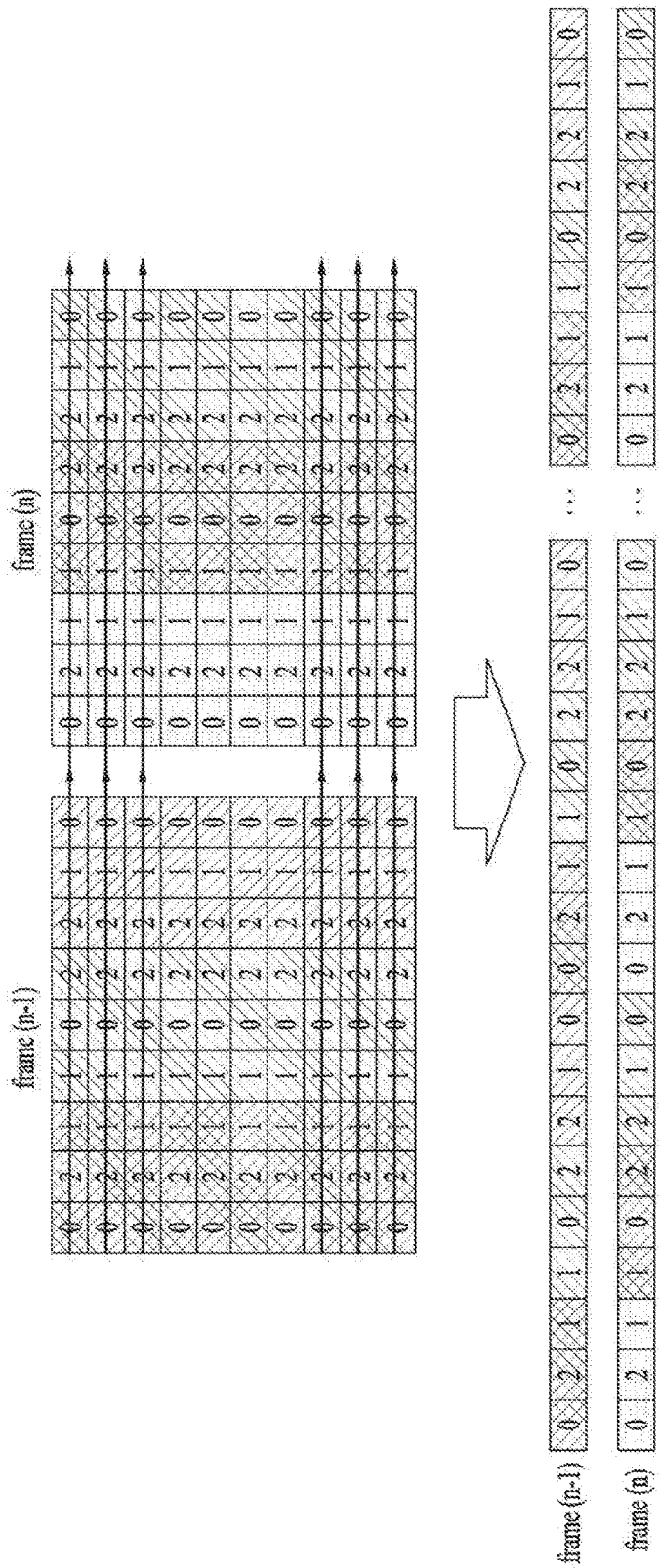
FIG. 79 illustrates output frames based on a reading operation of a convolutional interleaver.

FIGS. 77 to 79 are views illustrating a twisted block interleaving operation and a convolutional interleaving operation according to an embodiment of the present invention.

Specifically, FIG. 77 is a view illustrating a twisted block interleaving operation. As described above, the interleaving operation according to an embodiment of the present invention may be performed based on IFs. The left part of the figure illustrates a diagonal-wise reading process applied to each IF. The right part of the figure illustrates a diagonal-wise writing process applied to output IFs of the twisted block interleaver according to an embodiment of the present invention. A twisted block interleaving operation applied to each IF is the same as that described above in relation to FIGS. 30 to 59, and thus a detailed description thereof is omitted here.

FIGS. 78 and 79 are views illustrating a convolutional interleaving operation.

Specifically, FIG. 78 illustrates a convolutional interleaving operation, and FIG. 79 illustrates output frames based on a reading operation of a convolutional interleaver. The convolutional interleaving operation illustrated in these figures may be performed based on IFs, and the reading operation of the convolutional interleaver may be performed based on frames. A detailed description of these operations is the same as that given above.

Figure 80:
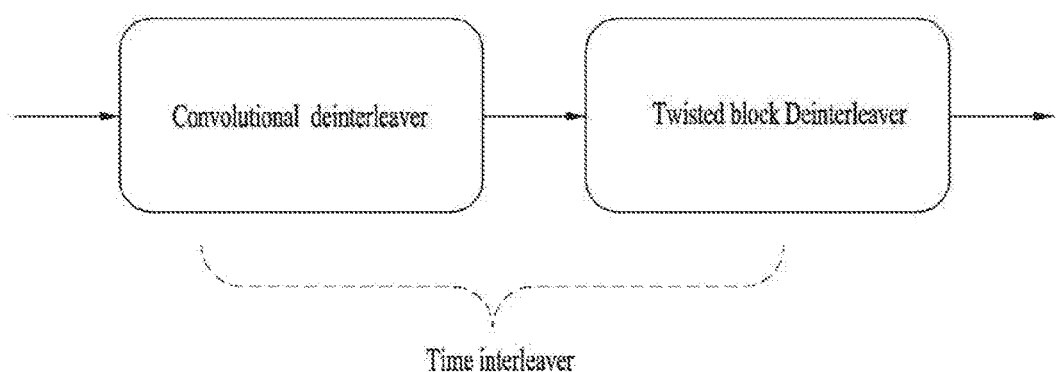
FIG. 80 is a block diagram of a time deinterleaver according to an embodiment of the present invention.

FIG. 80 is a block diagram of a time deinterleaver according to an embodiment of the present invention.

Specifically, the time deinterleaver according to an embodiment of the present invention may perform a process inversely corresponding to the process performed by the time interleaver according to an embodiment of the present invention, which is described above in relation to FIGS. 76 to 79. The time deinterleaver according to an embodiment of the present invention may include a convolutional deinterleaver and a twisted block deinterleaver. Accordingly, the time deinterleaver according to an embodiment of the present invention may perform convolutional deinterleaving on input data, and then perform twisted block deinterleaving.

Figure 81:
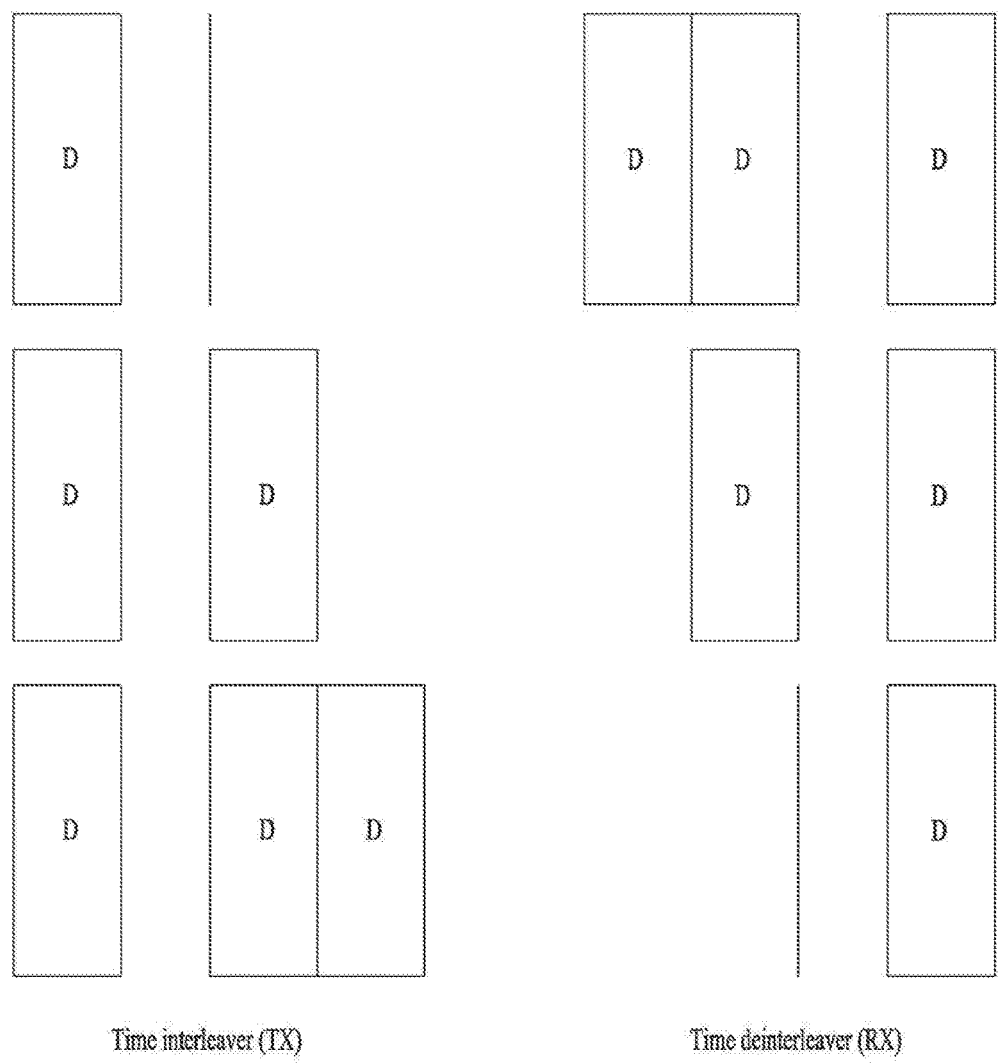
FIG. 81 is a view illustrating memory configurations of a time interleaver and a time deinterleaver.

FIG. 81 is a view illustrating memory configurations of a time interleaver and a time deinterleaver. The left part of the figure illustrates memory configuration of the time interleaver of the transmitter, and the right part of the figure illustrates memory configuration of the time deinterleaver of the receiver.

The memory configuration of the time deinterleaver of the receiver may be designed inversely from the memory configuration of the time interleaver of the transmitter. Specifically, the memory configuration of the time deinterleaver of the receiver may be designed in consideration of the convolutional interleaving operation of the transmitter which is illustrated in FIG. 78.

FIG. 82 is a view illustrating a time deinterleaving operation according to an embodiment of the present invention. Specifically, FIG. 82 illustrates a time deinterleaving operation inversely corresponding to the time interleaving operation described above in relation to FIGS. 76 to 79. Accordingly, the time deinterleaver according to an embodiment of the present invention may perform convolutional deinterleaving on a plurality of signal frames including a plurality of TI blocks (or IF blocks) which are spread over the signal frames through time interleaving of the transmitter, and then perform twisted block deinterleaving to output complete IFs.

Figure 83:
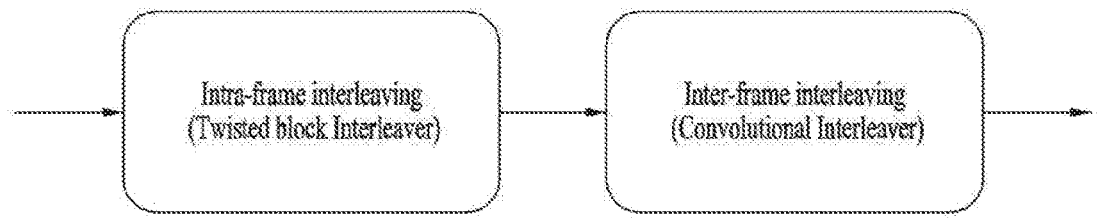
FIG. 83 is a view illustrating the structure of a time interleaver according to an embodiment of the present invention.

FIG. 83 is a view illustrating the structure of a time interleaver according to an embodiment of the present invention. The time interleaver according to an embodiment of the present invention may be called a hybrid time interleaver, and may include the above-described twisted block interleaver and the convolutional interleaver.

As illustrated in FIG. 83, the time interleaver according to an embodiment of the present invention may perform intra frame interleaving and inter frame interleaving. Specifically, the above-described twisted block interleaver may perform intra frame interleaving, and the above-described convolutional interleaver may perform inter frame interleaving.

Intra frame interleaving according to an embodiment of the present invention refers to interleaving performed only within one signal frame or one TI block (IF, TI group), and inter frame interleaving according to an embodiment of the present invention refers to interleaving between signal frames or interleaving between TI blocks. Although intra frame interleaving can be performed by only the twisted block interleaver, inter frame interleaving may be performed by both of the twisted block interleaver and the convolutional interleaver. This is variable depending on a designer's intention.

Operations of the twisted block interleaver and the convolutional interleaver are the same as those described above, and thus a detailed description thereof is omitted here.

Figure 84:
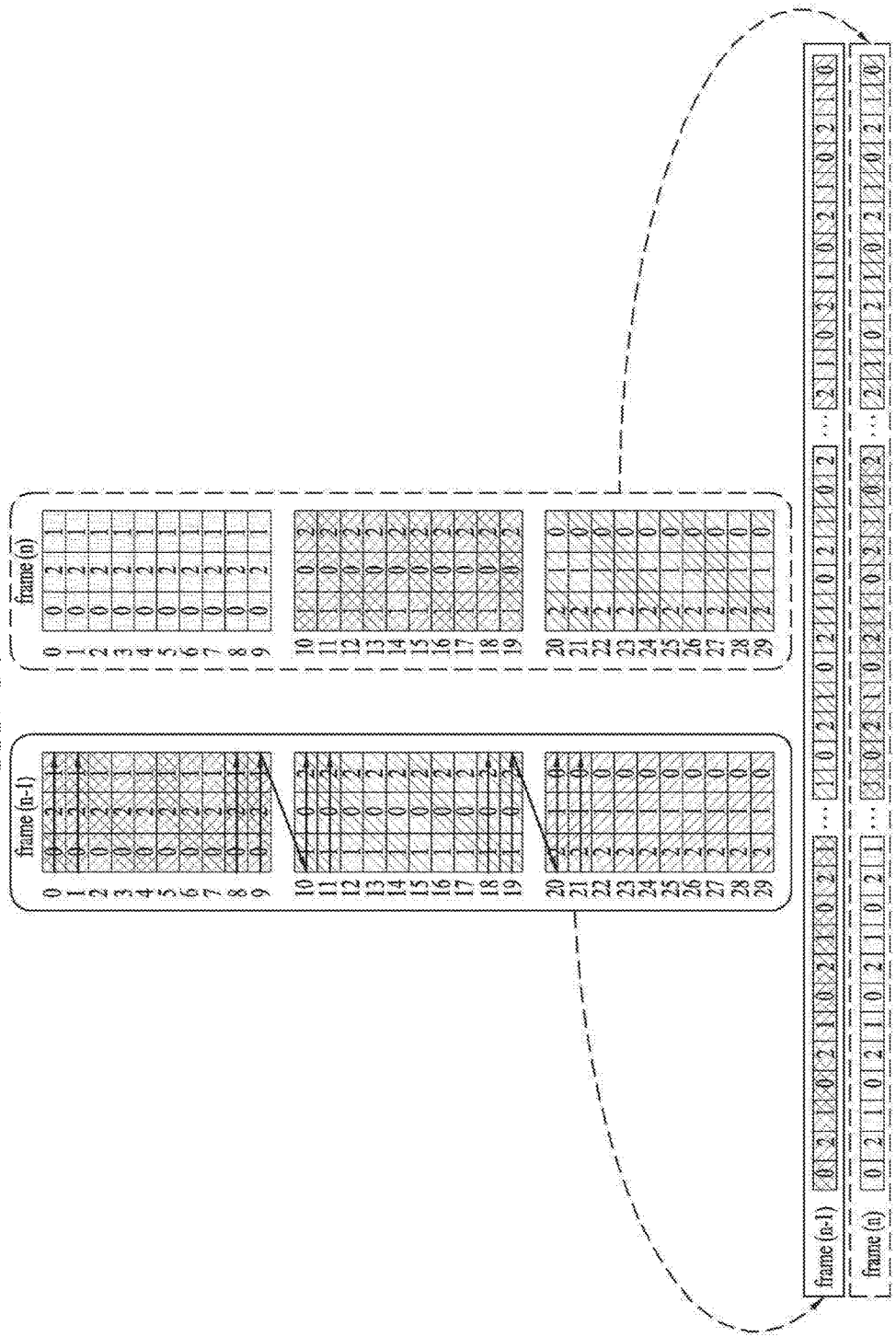
FIG. 84 is a view illustrating a reading operation performed after convolutional interleaving.

FIG. 84 is a view illustrating a reading operation performed after convolutional interleaving. Specifically, FIG. 84 illustrates a reading operation of the convolutional interleaver and output of the reading operation. A description is now given of a detailed reading operation of a CBR system having a FEC block size of 30 and an IU size of 3. A reading operation of the convolutional interleaver according to an embodiment of the present invention may be performed based on IFs. That is, as illustrated in the figure, the convolutional interleaver according to an embodiment of the present invention may sequentially read IFs included in the same frame in a row-wise manner among IFs spread over a plurality of signal frames.

Figure 85:
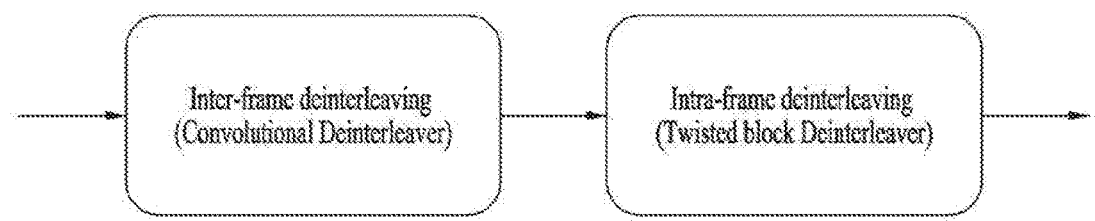
FIG. 85 is a view illustrating the structure of a time deinterleaver according to an embodiment of the present invention.

FIG. 85 is a view illustrating the structure of a time deinterleaver according to an embodiment of the present invention. The time deinterleaver according to an embodiment of the present invention may perform a process inversely corresponding to the process performed by the hybrid time interleaver, which is described above in relation to FIG. 50. Accordingly, the time deinterleaver according to an embodiment of the present invention may be called a hybrid time deinterleaver, and may include the above-described convolutional deinterleaver and the twisted block deinterleaver.

As illustrated in FIG. 85, the hybrid time deinterleaver according to an embodiment of the present invention may perform inter frame deinterleaving and intra frame deinterleaving. Specifically, the above-described convolutional deinterleaver may perform inter frame deinterleaving, and the twisted block deinterleaver may perform intra frame deinterleaving.

Figure 86:
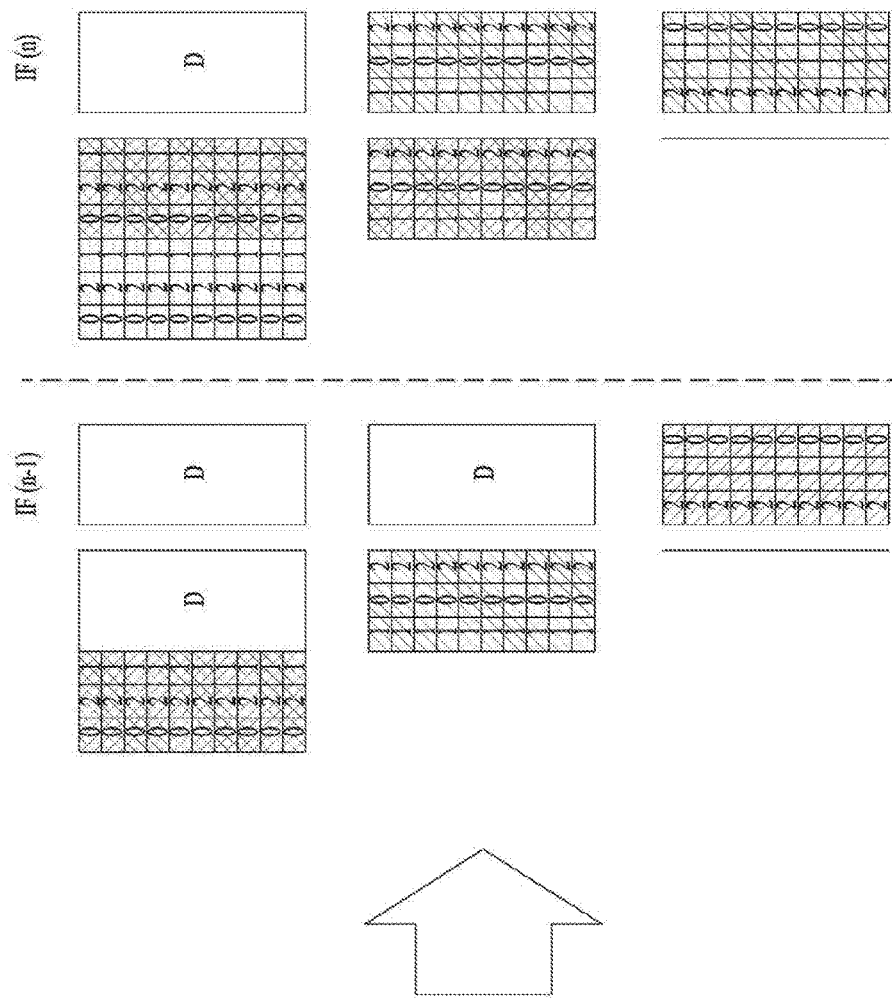
FIG. 86 is a view illustrating a convolutional deinterleaving operation according to an embodiment of the present invention.
Figure 87:
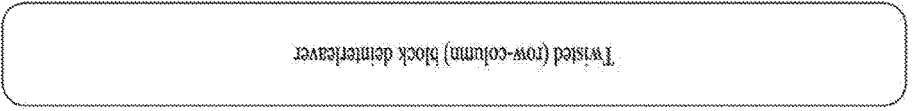
FIG. 87 is a view illustrating a twisted deinterleaving operation according to an embodiment of the present invention.

FIGS. 86 and 87 are views illustrating a time deinterleaving operation according to an embodiment of the present invention.

FIG. 86 is a view illustrating a convolutional deinterleaving operation according to an embodiment of the present invention. The convolutional deinterleaving operation illustrated in FIG. 86 may inversely correspond to the convolutional interleaving operation described above in relation to FIG. 78. Specifically, FIG. 86 is a view illustrating a detailed operation of a time deinterleaver having the memory configuration of the time deinterleaver described above in relation to FIG. 81. The left part of FIG. 86 is a view illustrating IFs inputs to the time deinterleaver.

The convolutional deinterleaving operation of FIG. 86 according to an embodiment of the present invention is performed between signal frames. Accordingly, the convolutional deinterleaver according to an embodiment of the present invention may perform convolutional deinterleaving on a plurality of input signal frames to output complete IFs.

FIG. 87 is a view illustrating a twisted deinterleaving operation according to an embodiment of the present invention.

The twisted deinterleaving operation illustrated in FIG. 87 may inversely correspond to the twisted interleaving operation described above in relation to FIG. 77. The left part of FIG. 87 illustrates output IFs of the convolutional deinterleaver. The right part of FIG. 87 illustrates output IFs of the twisted block deinterleaver. Specifically, the twisted block deinterleaver according to an embodiment of the present invention may sequentially perform a diagonal-wise reading process and a diagonal-wise writing process. As a result, the twisted block deinterleaver may output IFs equal to the input IFs illustrated in FIG. 64.

A description is now given of a time interleaver structure and a time interleaving method selectively or simultaneously using a convolutional interleaver (CI) and a block interleaver (BI) based on a physical layer pipe (PLP) mode. The PLP according to an embodiment of the present invention is a physical path used in the same concepts as the above-described DP, and the name thereof is variable depending on a designer's intention.

The PLP mode according to an embodiment of the present invention may include a single PLP mode or a multiple PLP mode based on the number of PLPs processed by a broadcast signal transmitter. The single PLP mode refers to a case in which the number of PLPs processed by the broadcast signal transmitter is one. The single PLP mode may also be called a single PLP.

The multiple PLP mode refers to a case in which the number of PLPs processed by the broadcast signal transmitter is two or more, and may also be called multiple PLPs.

In the present invention, time interleaving for applying different time interleaving methods based on PLP modes may be called hybrid time interleaving. Hybrid time interleaving according to an embodiment of the present invention is applied per PLP (or at PLP level) in the case of the multiple PLP mode.

Figures 88, 89:
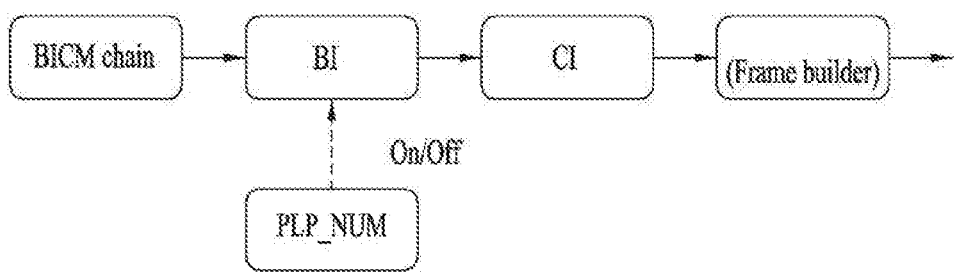
FIG. 88 is a table showing an interleaving type applied based on the number of PLPs.
FIG. 89 is a block diagram including a first embodiment of the above-described hybrid time interleaver structure.

FIG. 88 is a table showing an interleaving type applied based on the number of PLPs. The time interleaver according to an embodiment of the present invention may determine an interleaving type thereof based on the value of PLP_NUM. PLP_NUM is a signaling field indicating a PLP mode. When the value of PLP_NUM is 1, the PLP mode is the single PLP mode. The single PLP mode according to an embodiment of the present invention may be applied to only the convolutional interleaver.

When the value of PLP_NUM is greater than 1, the PLP mode is the multiple PLP mode. The multiple PLP mode according to an embodiment of the present invention may be applied to the convolutional interleaver and the block interleave. In this case, the convolutional interleaver may perform inter frame interleaving, and the block interleaver may perform intra frame interleaving. A detailed description of inter frame interleaving and intra frame interleaving is the same as that given above.

FIG. 89 is a block diagram including a first embodiment of the above-described hybrid time interleaver structure. The hybrid time interleaver according to the first embodiment may include a block interleaver (BI) and a convolutional interleaver (CI). The time interleaver according to the present invention may be located between a BICM chain block and a frame builder. The BICM chain block illustrated in FIGS. 89 and 90 may include the processing blocks 5000 of the BICM block illustrated in FIG. 5, excluding the time interleaver 5050. The frame builder illustrated in FIGS. 89 and 90 may perform function the same as that of the frame building block 1020 of FIG. 1.

As described above, whether to apply the block interleaver of the hybrid time interleaver structure according to the first embodiment may be determined based on the value of PLP_NUM. That is, when PLP_NUM=1, the block interleaver is not applied (block interleaver off) and only the convolutional interleaver is applied. When PLP_NUM>1, both of the block interleaver and the convolutional interleaver may be applied (block interleaver on). The structure and operation of the convolutional interleaver applied when PLP_NUM>1 may be the same as or similar to those of the convolutional interleaver applied when PLP_NUM=1.

Figure 90:
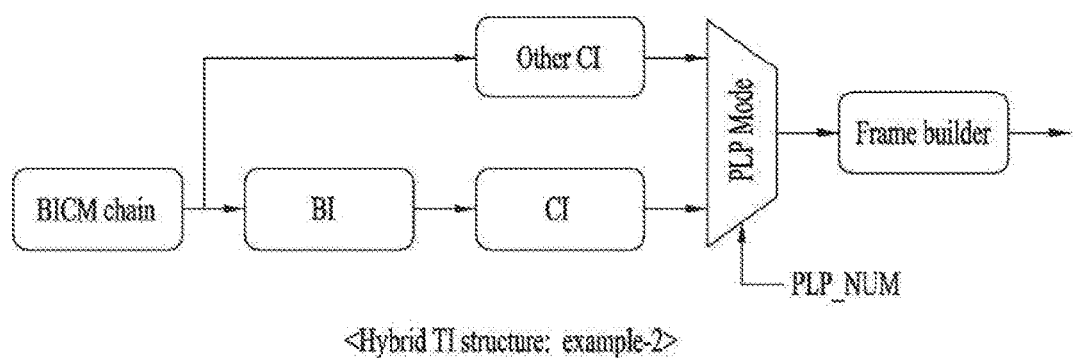
FIG. 90 is a block diagram including a second embodiment of the above-described hybrid time interleaver structure.

FIG. 90 is a block diagram including a second embodiment of the above-described hybrid time interleaver structure.

Operations of blocks included in the hybrid time interleaver structure according to the second embodiment are the same as those described above in relation to FIG. 89. Whether to apply the block interleaver of the hybrid time interleaver structure according to the second embodiment may be determined based on the value of PLP_NUM. The blocks of the hybrid time interleaver according to the second embodiment may perform operations according to embodiments of the present invention. In this case, the structure and operation of a convolutional interleaver applied when PLP_NUM=1 may differ from those of a convolutional interleaver applied when PLP_NUM>1.

Figure 91:
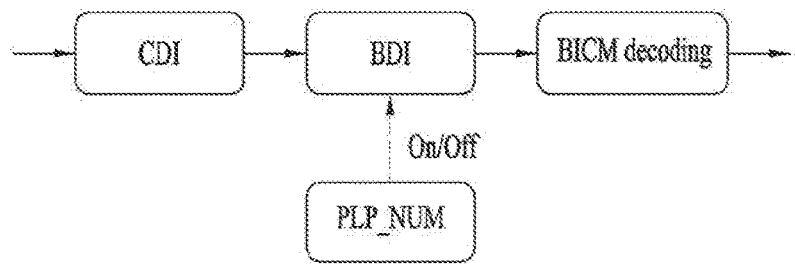
FIG. 91 is a block diagram including a first embodiment of the hybrid time deinterleaver structure.

FIG. 91 is a block diagram including a first embodiment of the hybrid time deinterleaver structure.

The hybrid time deinterleaver according to the first embodiment may perform operation inversely corresponding to the operation performed by the above-described hybrid time interleaver according to the first embodiment. Accordingly, the hybrid time deinterleaver of FIG. 91 according to the first embodiment may include a convolutional deinterleaver (CDI) and a block deinterleaver (BDI).

The structure and operation of the convolutional deinterleaver applied when PLP_NUM>1 may be the same as or similar to those of the convolutional deinterleaver applied when PLP_NUM=1.

Whether to apply the block deinterleaver of the hybrid time deinterleaver structure according to the first embodiment may be determined based on the value of PLP_NUM. That is, when PLP_NUM=1, the block deinterleaver is not applied (block deinterleaver off) and only the convolutional deinterleaver is applied.

The convolutional deinterleaver of the hybrid time deinterleaver may perform inter frame deinterleaving, and the block deinterleaver may perform intra frame deinterleaving. A detailed description of inter frame deinterleaving and intra frame deinterleaving is the same as that given above.

Figure 92:
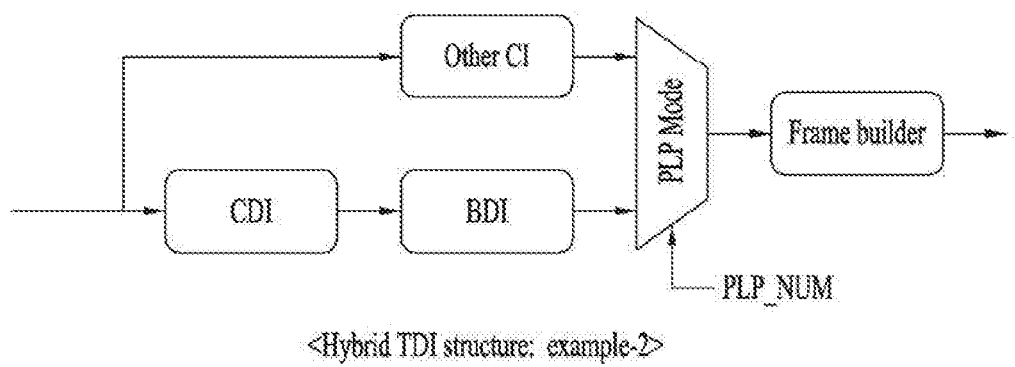
FIG. 92 is a block diagram including a second embodiment of the hybrid time deinterleaver structure.

A BICM decoding block illustrated in FIGS. 91 and 92 may perform operation inversely corresponding to the operation performed by the BICM chain block of FIGS. 89 and 90.

FIG. 92 is a block diagram including a second embodiment of the hybrid time deinterleaver structure.

The hybrid time deinterleaver according to the second embodiment may perform operation inversely corresponding to the operation performed by the above-described hybrid time interleaver according to the second embodiment. Operations of blocks included in the hybrid time deinterleaver structure according to the second embodiment are the same as those described above in relation to FIG. 91.

Whether to apply the block deinterleaver of the hybrid time deinterleaver structure according to the second embodiment may be determined based on the value of PLP_NUM. Blocks of the hybrid time deinterleaver according to the second embodiment may perform operations according to embodiments of the present invention. In this case, the structure and operation of a convolutional deinterleaver applied when PLP_NUM=1 may differ from those of a convolutional deinterleaver applied when PLP_NUM>1.

Hereinafter, a description will be given of a time interleaver according to another embodiment of the present invention. The time interleaver according to the present embodiment may perform cell interleaving, block interleaving, and convolutional interleaving according to a PLP mode. An interleaver according to an embodiment of the present invention may be referred to as a time interleaver or a hybrid interleaver, and include a cell interleaver, a block interleaver, and a convolutional interleaver.

The block interleaver and the convolutional interleaver may be referred to as a hybrid time interleaver. The hybrid time interleaver described below corresponds to another example of the hybrid time interleaver described with reference to FIGS. 88 to 92, and may operate according to the PLP mode.

A name, a location, etc. of each apparatus may be changed by a designer.

Figure 93:
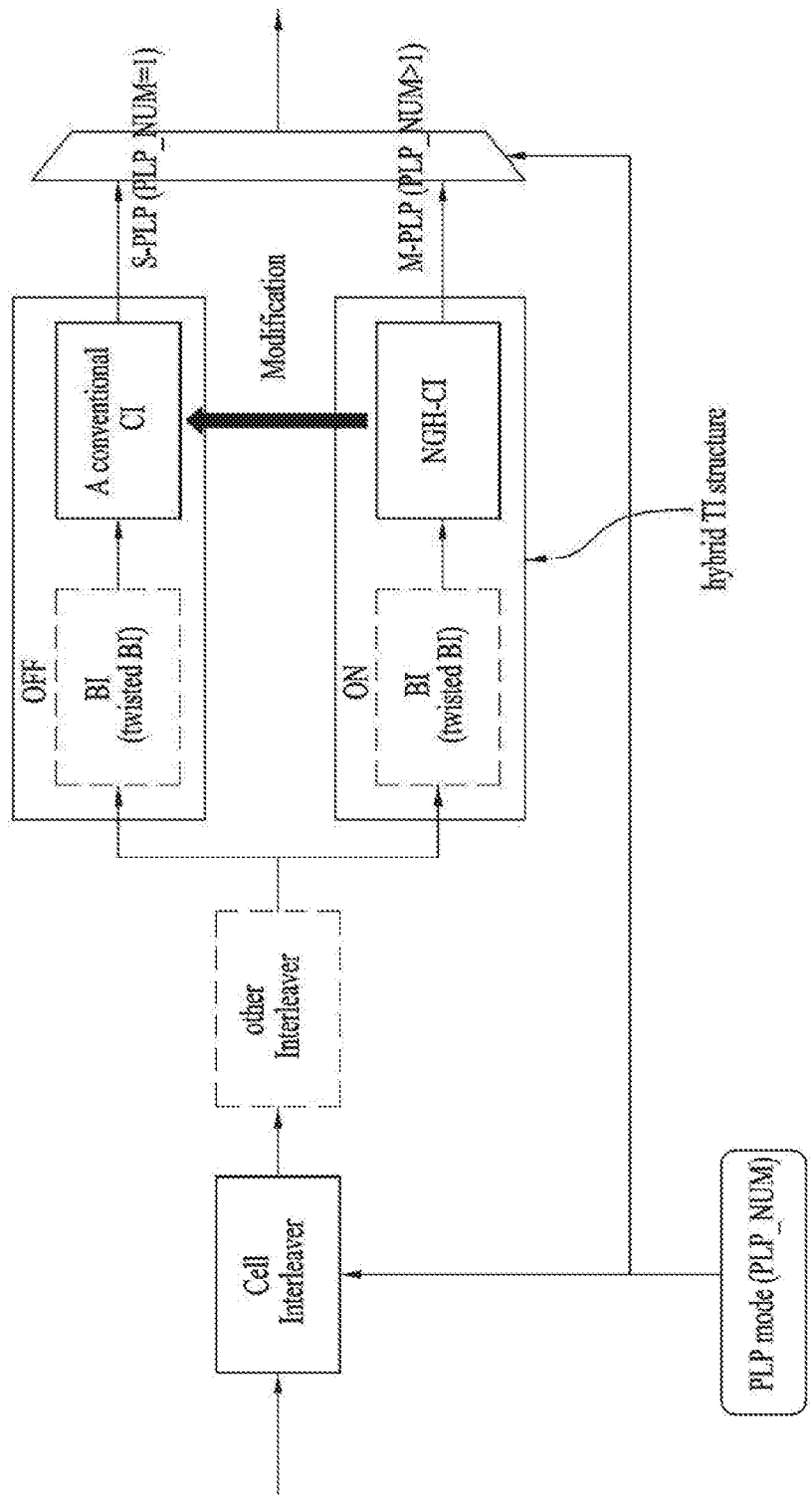
FIG. 93 illustrates a structure of an interleaver according to an embodiment of the present invention.

FIG. 93 illustrates a structure of an interleaver according to an embodiment of the present invention. As illustrated in the figure, the interleaver according to the present embodiment may include a cell interleaver and a hybrid time interleaver. The interleaver according to the present embodiment may further include other interleavers than the cell interleaver and the hybrid time interleaver. The other interleavers may perform interleaving of various schemes according to intention of a designer.

In addition, in the present invention, multiple PLPs may be expressed by M-PLP or PLP_NUM>1, and a single PLP may be expressed by S-PLP or PLP_NUM=1. Information about the PLP mode may be transmitted through a PLP_NUM signaling field within a signal frame, and a value of PLP_NUM may be input to a multiplexer positioned after the cell interleaver and/or the hybrid time interleaver.

PLP_NUM according to an embodiment in the present invention may be included in preamble in signal frame or preamble symbol. Preamble or preamble symbol according to an embodiment in the present invention may include L1 signaling field, and PLP_NUM field as above described may be included in L1 signaling field. PLP_NUM field may represent same concept with NUM_DP field as above described in FIGS. 14 and 15. A name of each signaling filed may be changed by a designer.

The cell interleaver according to an embodiment in the present invention may operate according to the PLP mode, and a cell deinterleaver of a receiver corresponding to the cell interleaver may operate without a memory. The cell interleaver according to an embodiment in the present invention may be referred to as a modified cell interleaver. Specifically, the cell interleaver according to the present embodiment may be omitted according to the PLP mode, or an operation of the cell interleaver according to the present embodiment may be changed according to the PLP mode. A specific operation of the cell interleaver will be described below.

After cell interleaving, the hybrid time interleaver according to the present embodiment may perform hybrid time interleaving according to the PLP mode. Specifically, when the PLP mode corresponds to the multiple PLPs, the hybrid time interleaver according to the present embodiment may perform twisted block interleaving and convolutional interleaving. In this case, convolutional interleaving may correspond to conventional convolutional interleaving system such as a DVB-NGH system, which may be referred to as NGH-CI. A convolutional interleaving scheme may be changed by a designer.

When the PLP mode corresponds to the single PLP, the hybrid time interleaver according to the present embodiment may only perform arbitrary convolutional interleaving without performing twisted block interleaving. Arbitrary convolutional interleaving may refer to convolutional interleaving rather than conventional CI or NGH-CI described above. This may be changed by a designer.

As illustrated in the figure, when the PLP mode corresponds to the multiple PLPs, the hybrid time interleaver may include a twisted block interleaver and a convolutional interleaver. In this case, a state of the twisted block interleaver may be expressed as an ON state.

When the PLP mode corresponds to the single PLP, the hybrid time interleaver may only include the convolutional interleaver. Therefore, the twisted block interleaver may correspond to an OFF state.

The status of block interleaver according to the present invention may be changed based on PLP_NUM field as above described.

Figure 94:
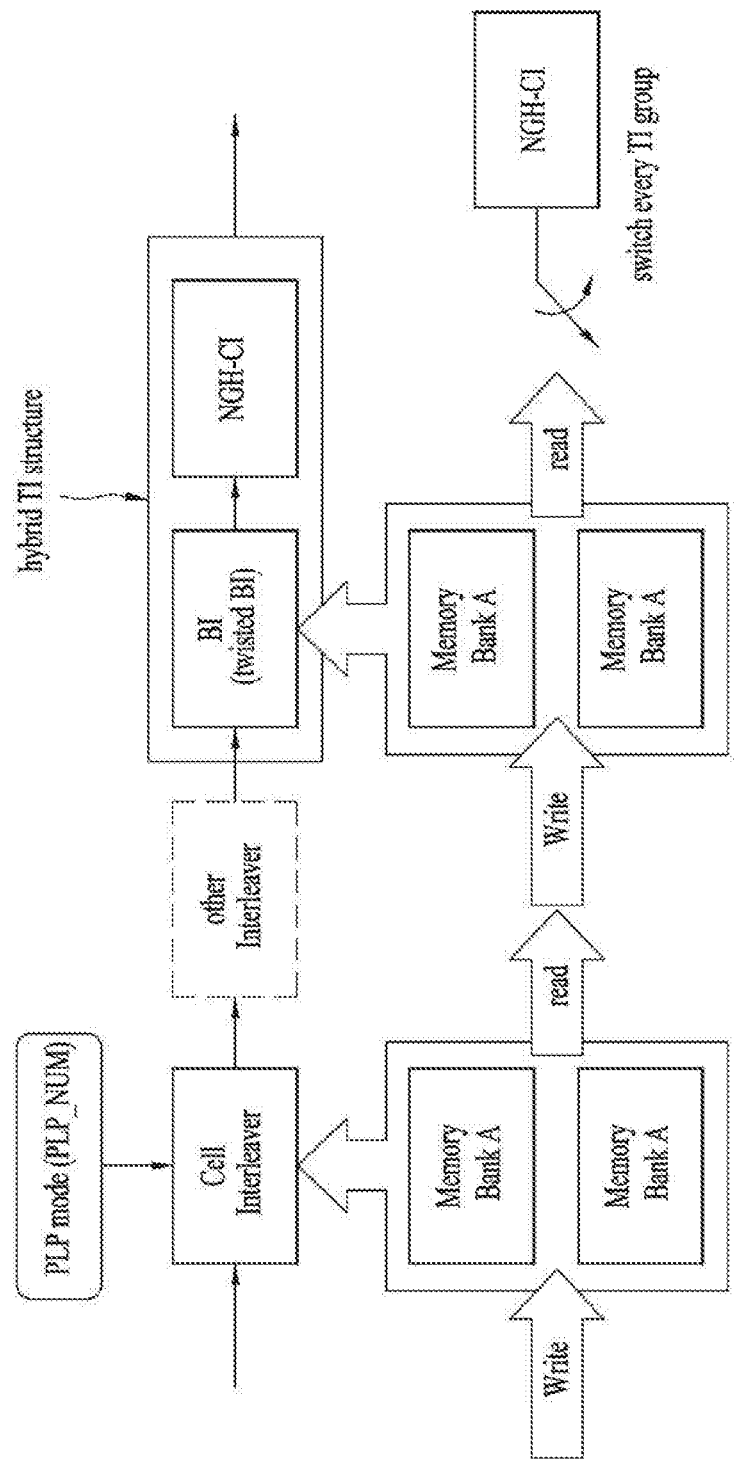
FIG. 94 illustrates a structure of an interleaver according to an embodiment of the present invention when the PLP mode corresponds to M-PLP.

FIG. 94 illustrates a structure of an interleaver according to an embodiment of the present invention when the PLP mode corresponds to M-PLP.

Specifically, FIG. 94 illustrates a structure of a memory of the interleaver when the PLP mode corresponds to M-PLP. The structure and an order of the interleaver are the same as those described with reference to FIG. 93 and thus will be omitted.

As illustrated in FIG. 94, each of the cell interleaver which is included in the time interleaver according to the present embodiment and the twisted block interleaver which is included in the hybrid time interleaver may operate based on two memories. Specifically, the two memories include a memory bank A and a memory bank B. TI blocks are successively input and written to the memory bank A, and are read from the memory bank B.

To build a broadcast signal frame composed of multiple PLPs, the interleaver on each PLP acts as a buffer prior to the process of frame building. This can be achieved by means of the memory to be used for the twisted block interleaver (TBI) and convolutional interleaver (CI) as shown in FIG. 94. For each PLP, the first TI-block is written to the first memory for the TBI. The second TI-block is written to the second memory for TBI while the first memory is being read. Simultaneously, the read-out TI-block (intra-frame interleaved TI-block) from the first memory is delivered to the memory for the CI through a first-in-first-out shift register (FIFO) process and so on. For intra-frame interleaving only the TBI is used, while for inter-frame interleaving both the TBI and the CI are operated jointly. The total memory of the twisted block, convolutional and cell interleaver must not exceed the total memory allocated to that PLP, and the total memory for each group must not exceed the maximum memory. The size of the maximum memory may be change according to designer.

When the cell interleaver is positioned after the time interleaver, a time deinterleaver may be positioned after a cell deinterleaver at a receiving end as a reverse process of a transmitting end. In this case, frame builder, 1020, or frame parser, 9010, according to the present embodiment may process frame building or frame parsing based on TI block (or interleaving frame, interleaving unit). Thereafter, cell deinterleaver according to the present embodiment may perform cell interleaving based on cell unit, and time deinterleaver may perform time deinterleaving based on TI block(or interleaving frame, or interleaving unit). At this time, as processing unit of data is change from TI block unit(or interleaving frame, or interleaving unit) to cell unit, and cell unit to TI block unit(or interleaving frame, or interleaving unit), the additional mapping information is needed, and thus complexity of the receiving end may increase. The additional mapping information may be transmitted in L1 signaling field. Accordingly, size of L1 signaling information may be increase, and the complexity of data processing may be increase at the receiver side. Therefore, when the cell interleaver is positioned before the time interleaver as in the interleaver according to the present embodiment, additional mapping information may not be used in a deinterleaving process of the broadcast signal reception apparatus, and thus there is an advantage of decreasing complexity that may be incurred.

Figure 95:
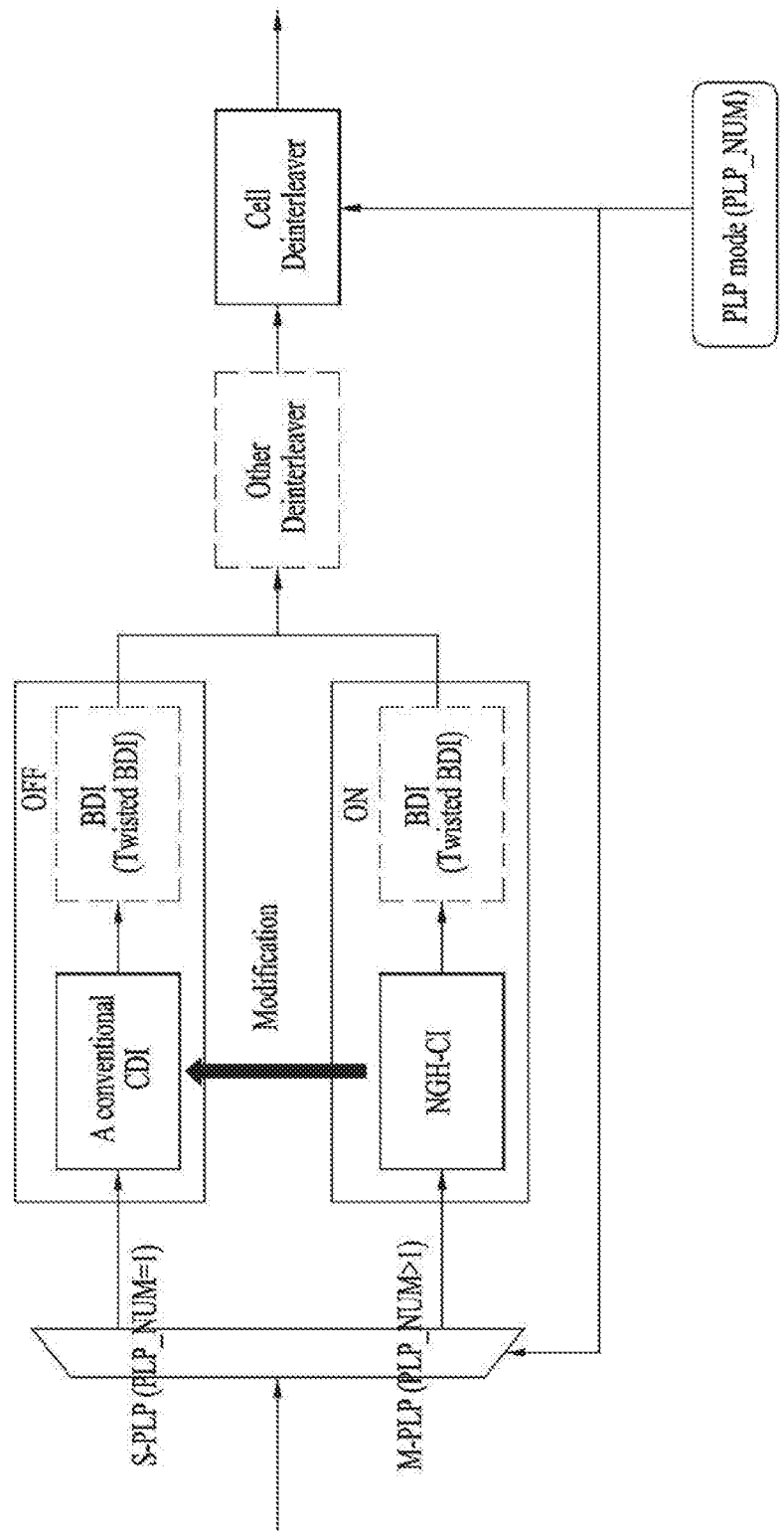
FIG. 95 illustrates a structure of a deinterleaver corresponding to the operation of the interleaver described with reference to FIGS. 93 and 94.

FIG. 95 illustrates a structure of a deinterleaver corresponding to the operation of the interleaver described with reference to FIGS. 93 and 94. An operation of the deinterleaver according to the present embodiment may be performed in a reverse order of the operation of the interleaver described above. Therefore, the deinterleaver according to the present embodiment may perform hybrid time deinterleaving, other deinterleaving, and cell deinterleaving. In this case, similarly to the interleaver, a value of PLP_NUM may be input to a multiplexer and/or a cell deinterleaver positioned before a hybrid time deinterleaver.

In addition, according to a PLP mode indicated by a PLP_NUM field, the hybrid time deinterleaver according to the present embodiment may perform convolutional deinterleaving, and then perform (twisted) block deinterleaving (twisted block deinterleaver is turned ON) or not perform (twisted) block deinterleaving (twisted block deinterleaver is turned OFF).

PLP_NUM according to the present embodiment may be included in preamble in signal frame or preamble symbol as described in FIG. 93. The preamble or preamble symbol may include L1 signaling field, PLP_NUM field as above described may be included in L1 signaling field. Therefore, the apparatus for receiving broadcast signal according to the present embodiment may perform time deinterleaving by obtaining value of PLP_NUM field included in L1 signaling field.

Hereinafter, a description will be given of a detailed operation of the cell interleaver or the modified cell interleaver according to the present embodiment.

FIG. 96 shows equations that express a read-write operation of the cell interleaver. A detailed description of the equations according to the present embodiment is the same as that described in the figure. A permutation function or random generator $L_{r(q)}$ according to an embodiment of the present invention may correspond to an arbitrary pseudo-random binary sequence (PRBS). In addition, the arbitrary PRBS according to the present embodiment may include a PRBS used during an operation of a cell interleaver or a frequency interleaver of DVB-T2 (or DVB-NGH).

The permutation function according to the present embodiment may be referred to as an interleaving sequence.

FIG. 97 shows a shift value applicable to the cell interleaver according to the present embodiment and the interleaving sequence according to the shift value expressed as an equation. The shift value applicable to the cell interleaver according to the present embodiment may vary with the PLP mode. In S-PLP, the shift value may be fixed to P(0). Alternatively, in S-PLP, the broadcast signal reception apparatus according to the present embodiment may omit an operation of the cell interleaver and only perform an operation of the time interleaver. On the other hand, in M-PLP, the shift value may correspond to P(r) which varies with a value r.

$L_{r(q)}$ indicates the permutation function or the interleaving sequence. $L_{0(q)}$ denotes a basic permutation function.

Therefore, the permutation function may be fixed or varied depending on whether the shift value is a fixed value or a variable.

A block interleaver positioned after the cell interleaver according to the present embodiment may correspond to the twisted block interleaver or an arbitrary block interleaver. Hereinafter, a description will be given of an operation of the twisted block interleaver according to the present embodiment with reference to FIGS. 98 to 103. The block interleaver according to the present embodiment may operate after the cell interleaver as described above.

Figure 98:
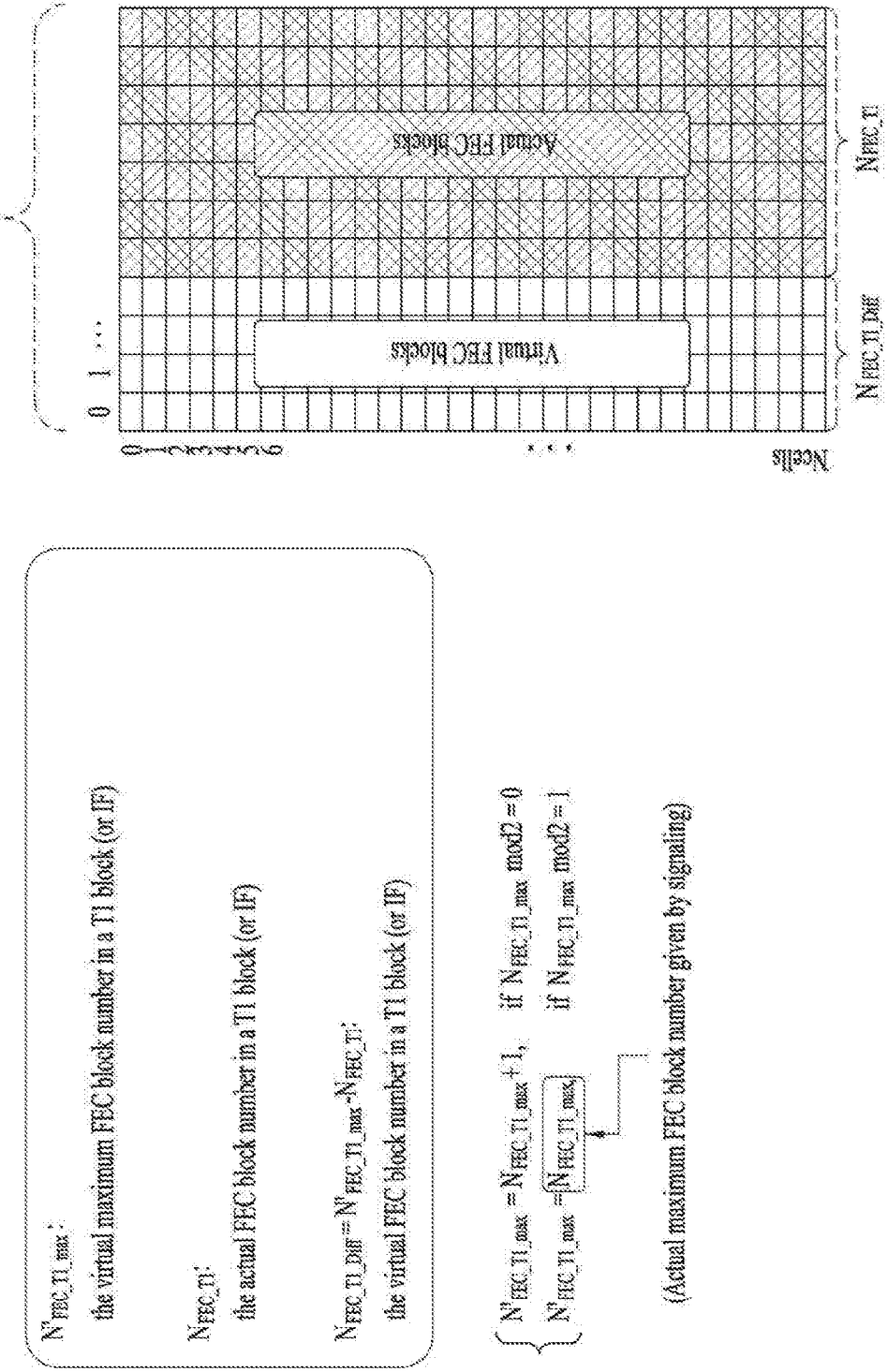
FIG. 98 defines associated parameters necessary for a twisted read operation in a variable bit rate (VBR) system, and illustrates virtual FEC blocks.

FIG. 98 defines associated parameters necessary for a twisted read operation in a variable bit rate (VBR) system, and illustrates virtual FEC blocks.

A left side of the figure shows parameters indicating the maximum number of virtual FEC blocks, the maximum number of actual FEC blocks included in a TI block (or IF), and a difference between the maximum number of FEC blocks and the number of actual FEC blocks, and an equation for deriving the maximum number of virtual FEC blocks.

When inserting the virtual FEC blocks according to the present embodiment, the time interleaver according to the present embodiment may perform interleaving on TI groups in view of the virtual FEC blocks. Also, the time interleaver according to an embodiment of the present invention may perform skip operation as above described when memory indice corresponding the virtual FEC blocks are generated in reading process. Thereafter, the time interleaver may match number of FEC blocks in input TI group in writing process and number of FEC blocks in output TI group in reading process. Consequently, when time interleaving according to an embodiment of the present invention performed at the transmitter side, there are no loss of data rate by skip operation, if virtual FEC blocks inserted in actual FEC blocks for performing effective single memory deinterleaving at the receiver side.

The maximum number of virtual FEC blocks is determined based on the maximum number of actual FEC blocks, and the maximum number of actual FEC blocks has a fixed value by signaling.

The number of actual FEC blocks may be transmitted in L1 signaling (L1 dynamic field) or may be fixed known data in the transmitter. The number of actural FEC blocks can be changed according to the designer's intention.

A right side of the figure illustrates an example in which the virtual FEC blocks are inserted into a TI group. In this case, as described in the foregoing, the virtual FEC blocks may be inserted in front of the actual FEC blocks.

FIG. 99 shows an equation indicating the twisted read operation performed after the virtual FEC blocks are inserted according to an embodiment of the present invention.

A location of inserting the virtual FEC blocks according to an embodiment of the present invention may be inserted prior to the actual FEC blocks or followed by the actual FEC blocks.

The equation shown in the figure indicates twisted block interleaving applied using each TI block as a unit. As shown in the equation, a shift value may be calculated based on the maximum number of virtual FEC blocks included in the TI block.

Parameters used for an operation of the hybrid time interleaver according to the present embodiment are determined based on a TI block having the maximum number of virtual FEC blocks in a superframe.

In this instance, virtual FEC blocks corresponding to the deficient number of FEC blocks may be added to a TI block having FEC blocks, the number of which is less than the number of FEC blocks of a TI block including the greatest number of determined virtual FEC blocks.

There are TI block having a small number of FEC block than FEC block TI block containing the determined virtual Maximum FEC block may be the most. In this case, the plurality of virtual FEC blocks corresponding to lack of FEC blocks may be inserted in corresponding to the TI block.

The virtual FEC blocks according to the present embodiment may be inserted in front of the actual FEC blocks. Thereafter, the time interleaver according to the present embodiment may interleave TI groups using one twisted row-column block interleaving rule based on the virtual FEC blocks. In addition, when a memory index corresponding to the virtual FEC blocks is generated in a read operation, the hybrid time interleaver according to the present embodiment may perform the above-described skip operation. Thereafter, the number of FEC blocks of a TI group input during a write operation is made equal to the number of FEC blocks of a TI group output during a read operation. Consequently, according to time interleaving of the present embodiment, an actual data rate may not be decreased through the skip operation even when virtual FEC blocks are inserted to efficiently perform single-memory deinterleaving by the receiver.

Figure 100:
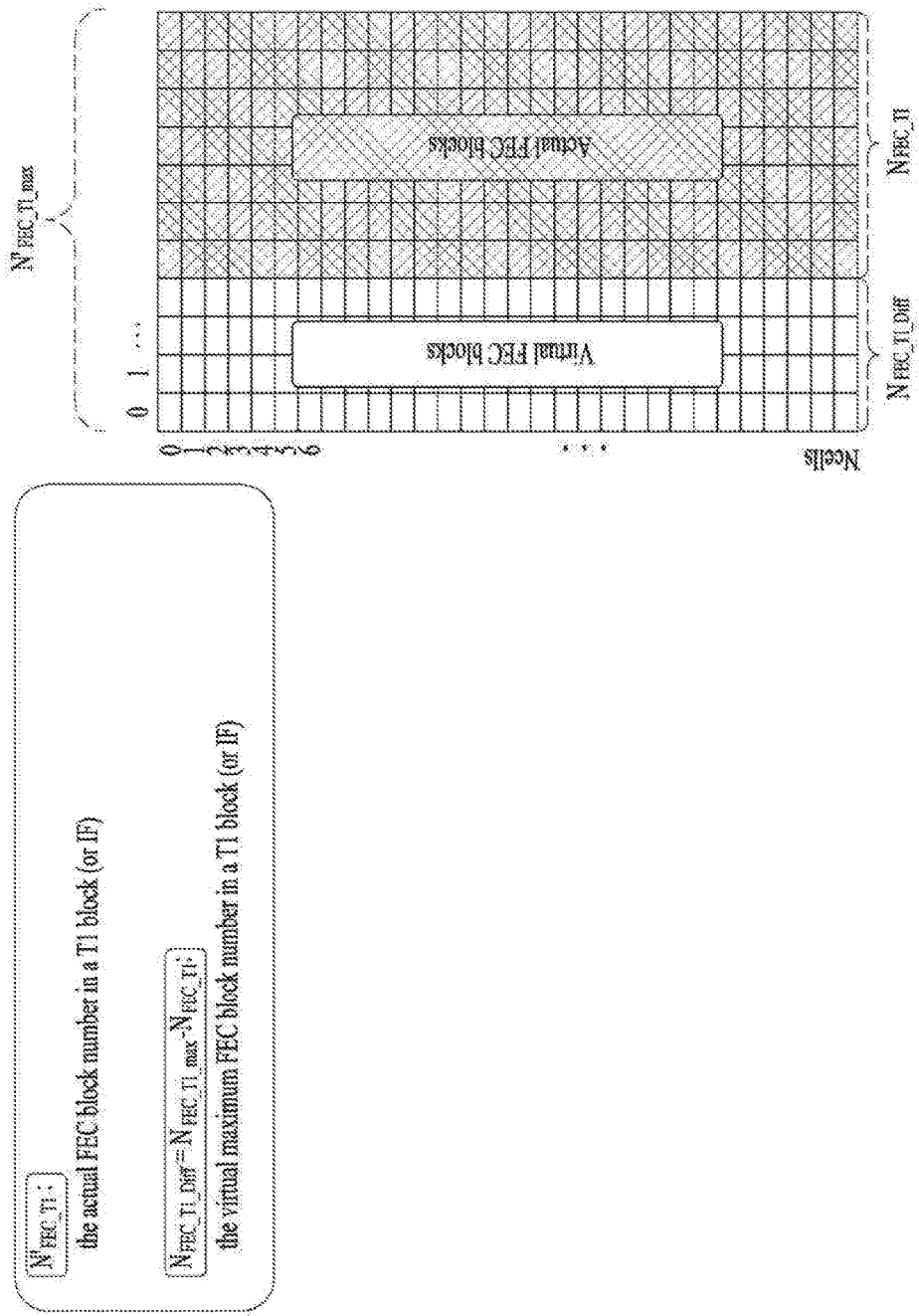
FIG. 100 defines associated parameters necessary for a twisted read operation when a shift value $S_T$ is fixed to 1 in the VBR system, and illustrates virtual FEC blocks.

FIG. 100 defines associated parameters necessary for a twisted read operation when a shift value $S_T$ is fixed to 1 in the VBR system, and illustrates virtual FEC blocks.

An example in which virtual FEC blocks are inserted into a TI group shown on a right side of the figure is the same as that of FIG. 98. When the shift value is fixed to 1, the maximum number ($N'_{FEC\_TI\_max}$) of virtual FEC blocks is not needed.

Figure 101:
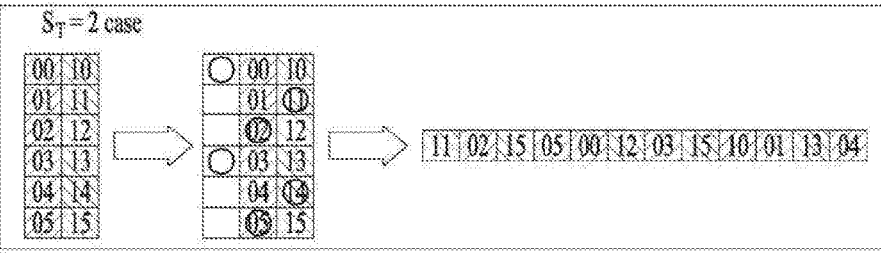
FIG. 101 shows an equation that indicates a twisted read operation performed after virtual FEC blocks according to the present embodiment are inserted when the shift value $S_T$ is fixed to 1.

FIG. 101 shows an equation that indicates a twisted read operation performed after virtual FEC blocks according to the present embodiment are inserted when the shift value $S_T$ is fixed to 1.

When the shift value ST is fixed to 1, the maximum number ($N'_{FEC\_TI\_max}$) of virtual FEC blocks is not needed. Therefore, it can be understood that the twisted read operation according to the present embodiment is performed based on the number ($N_{FEC\_TI}$) of actual FEC blocks when the shift value $S_T$ is fixed to 1.

As described in the foregoing, a skip operation shown in the figure may skip virtual FEC blocks in the twisted read operation.

Figure 102:
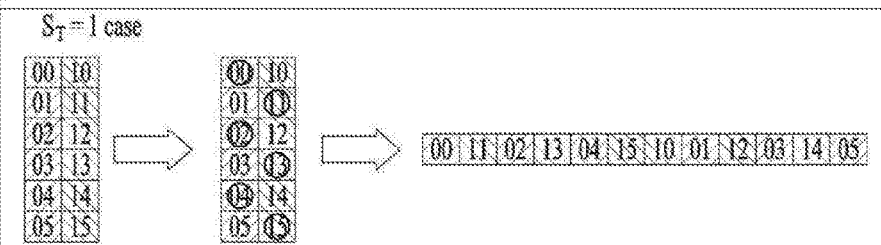
FIG. 102 illustrates a twisted read operation according to an embodiment of the present invention depending on shift values $S_T$.

FIG. 102 illustrates a twisted read operation according to an embodiment of the present invention depending on shift values $S_T$.

Specifically, FIG. 102 illustrates a twisted read operation according to an embodiment of the present invention when $NFEC_{FEC\_TI\_max}=2$, $N_{FEC\_TI}=2$, and $N_{cells}=6$. Values of parameters necessary for the twisted read operation and shift values are shown at the top of FIG. 102.

The twisted read operation corresponding to a case in which the shift value is 2 ($S_T=2$) is specifically illustrated in the middle of FIG. 102. The twisted read operation is based on the parameters and the equation necessary for the twisted read operation described with reference to FIGS. 98 and 99.

The twisted read operation corresponding to a case in which the shift value is 1 ($S_T=1$) is specifically illustrated at the bottom of FIG. 102. The twisted read operation is based on the parameters and the equation necessary for the twisted read operation described with reference to FIGS. 100 and 101.

The twisted read operation described in FIG. 102 may refer to a different embodiment of a twisted block interleaving described in FIG. 77. As described in FIG. 102, the twisted read operation according to an embodiment of the present invention may skip to row direction according to shift value corresponding to the TI block. After that, the TI block may be read to diagonal-wise.

Figure 103:
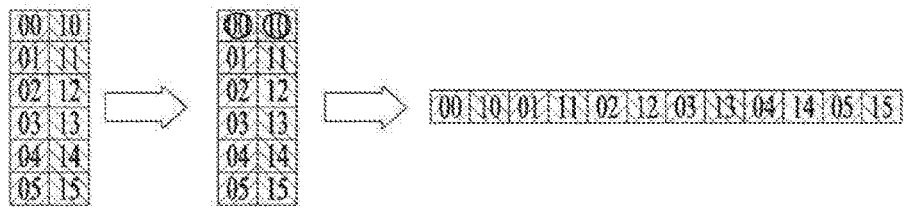
FIG. 103 illustrates an example of a read operation of a conventional block interleaver.

FIG. 103 illustrates an example of a read operation of a conventional block interleaver. As described in the foregoing, the hybrid time interleaver according to the present embodiment may perform block interleaving using another scheme in addition to twisted block interleaving. Here, the other scheme may include a previously known block interleaving scheme.

Hereinafter, a description will be given of an operation of the convolution interleaver included in the hybrid time interleaver according to the present embodiment. The operation of the convolution interleaver described below is performed after an operation of the twisted block interleaver or the block interleaver for multiple PLPs.

Figure 104:
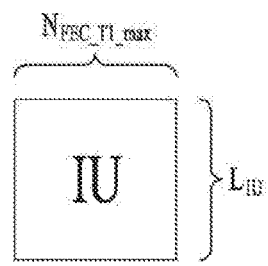
FIG. 104 shows parameters necessary for the operation of the convolution interleaver according to the present embodiment.

FIG. 104 shows parameters necessary for the operation of the convolution interleaver according to the present embodiment. The convolution interleaver according to the present embodiment may correspond to a convolution interleaver described in the DVB-NGH standard. Hereinafter, the convolution interleaver may be referred to as an NGH-CI in the specification and the drawings. The convolution interleaver according to the present embodiment may operate based on an interleaving unit. In this case, each TI block or IF may be divided into interleaving units and input to the convolution interleaver.

Interleaving frame (IF) according to an embodiment of the present invention may be applied to not CBR (Constant bit rate) system which include constant number of FEC blocks but VBR (Variable bit rate) system which include variable number of FEC blocks. Therefore, interleaving unit split from the interleaving frame may include one or more FEC blocks. The number of FEC blocks included in one interleaving unit may be changed according to the designer's intention.

A description will be given of information indicated by each parameter shown in the figure.

As described in the foregoing, $N_{FEC\_TI\_max}$ is a parameter indicating the maximum number of FEC blocks that can be included in one TI block. $N_{IU}$ is a parameter that indicates the number of interleaving units (IUs). $L_{IU}$ is a parameter that indicates a row size (or a length) of an IU. $L_{IU,min}$ is a parameter that indicates a length of an IU, that is, a minimum length of $L_{IU}$.

A size of one IU is schematized and illustrated at the bottom of FIG. 104. As illustrated in the figure, the IU has a horizontal length of $N_{FEC\_TI\_max}$ and a vertical length of $L_{IU}$.

FIG. 105 illustrates a structure of the NGH-CI according to the present embodiment. The NGH-CI according to the present embodiment may be positioned after the cell interleaver and the block interleaver (twisted block interleaver or arbitrary block interleaver).

The NGH-CI according to the present embodiment may include $N_{IU}$ branches. Content (or data) of the IF (or TI block) may be separately processed based on each branch.

In the HTI (Hybrid Time Interleaver) for M-PLP, to achieve inter-frame interleaving, a convolutional interleaver spreads FEC-blocks over multiple broadcast signal frames. The block diagram is shown FIG. 105. The delay-line consists of NIU $N_{IU}$ branches, which split a TI-block into Nm interleaving units and spread these interleaving units over as many broadcast signal frames. To this end, each branch is connected to a sequence of FIFO registers acting as delay elements. The number of MUs, which a FIFO register maximally can store, is denoted as Mi,j $M_{i,j}$. The top branch does not contain any FIFO register; each lower branch adds an additional FIFO register.

The FIFO register sizes are obtained as follows:

We define the variable LIU=floor(Nr/NIU), where floor (x) is the largest integer ≤x.

The FIFO registers connected to the first Nlarge= NrmodNIU $N_{large}=N_r$ mod $N_{IU}$ delay branches contain Mi,j=(LIU+1)·NFEC_TI_MAX $M_{i,j}=(L_{IU}+1)\cdot N_{FEC\_TI\_MAX}$ MUs. Here mod represents the modulo-operation.

The FIFO registers connected to the following Nsmall= NIU−Nlarge $N_{small}=N_{IU}-N_{large}$ branches contain Mi,j= LIU·NFEC_TI_MAX $M_{i,j}=(L_{IU}+1)\cdot N_{FEC\_TI\_MAX}$ $M_{i,j}=L_{IU}\cdot N_{FEC\_TI\_MAX}$ MUs.

Observe that all FIFO registers contain exactly LIU·NFEC_TI_MAX $M_{i,j}=(L_{IU}+1)\cdot N_{FEC\_TI\_MAX}$ $M_{i,j}=L_{IU}\cdot N_{FEC\_TI\_MAX}$ $L_{IU}\cdot N_{FEC\_TI\_MAX}$ MUs for the case when Nr is an integer multiple of NIU such that Nlarge=0. Observe that the number of columns in the block interleaver, NFEC_TI (n,s), may change between TI-blocks.

The switches s0 and s1, which connect the TBI and the CI, move from the upper branches to the lower branches after a number of NFEC_TI_MAX $M_{i,j}=(L_{IU}+1)\cdot N_{FEC\_TI\_MAX}$ $M_{i,j}=L_{IU}\cdot N_{FEC\_TI\_MAX}$ MUs have been passed. From the last branch the switches move back to the first branch. Virtual MUs occur when NFEC_TI(n,s) $M_{i,j}=(L_{IU}+1)\cdot N_{FEC\_TI\_MAX}$ $M_{i,j}=L_{IU}\cdot N_{FEC\_TI\_MAX}<NFEC\_TI\_MAX$ $M_{i,j}=(L_{IU}+1)\cdot N_{FEC\_TI\_MAX}$ $M_{i,j}=L_{IU}\cdot N_{FEC\_TI\_MAX}$ $N_{FEC\_TI}(n,s)<N_{FEC\_TI\_MAX}$. Virtual MUs are not written to the HTI output, neither from the TBI nor from the CI. Virtual MUs are only written from the TBI to the CI.

Observe that NFEC_TI_MAX corresponds to the maximum number of columns of the block-interleaver. Hence, the switches s0 and s1 change their position every time a row from the block interleaver has been read.

The TBI can be configured to output cells on integer multiples, IJUMP, of frames. In this case, a TI-block is spread over (PI-1)·IJUMP+1 the broadcast signal frames.

If inter-frame interleaving is not used, only the TBI is needed (NIU=PI=1) and it has NFEC_TI_MAX columns and Nr rows.

For more than one TI-block per interleaving frame (NTI>1), the TBI is sequentially used several times for each broadcast signal frame. Note that TI-block index s is always 0 in this case.

The NGH-CI may operate based on information described in the NGH standard.

Hereinafter, a description will be given of an operation of a deinterleaver according to the present embodiment. The deinterleaver according to the present embodiment may include a cell deinterleaver (or modified cell deinterleaver) and a time deinterleaver. A structure of the deinterleaver according to the present embodiment may be the same as that illustrated in FIG. 95. Therefore, the deinterleaver according to the present embodiment may operate in a reverse order of the operation of the interleaver according to the embodiment of the present invention described with reference to FIGS. 96 to 105. A cell deinterleaver of the broadcast signal reception device according to the present embodiment may operate without an additional buffer or additional memory. This effect results from a twisted write operation performed by a twisted block interleaver of the broadcast signal reception device according to the present embodiment.

A specific operation of the deinterleaver according to the present embodiment is the same as that described with reference to FIG. 95.

FIG. 106 shows an equation that indicates twisted block deinterleaving of the hybrid time deinterleaver according to the present embodiment. Specifically, FIG. 106 shows an equation that indicates a twisted read operation of the twisted block deinterleaver according to the present embodiment. The equation of FIG. 106 corresponds to the equation that indicates the twisted read operation of the twisted block interleaver described with reference to FIG. 99. The shift value Sa used for the twisted read operation of the twisted block deinterleaver according to the present embodiment may be calculated based on the equation described at the bottom of FIG. 106.

The twisted block deinterleaver according to the present embodiment may perform single-memory deinterleaving.

FIG. 107 shows an equation that indicates twisted block deinterleaving of the hybrid time deinterleaver according to the present embodiment. Specifically, FIG. 107 shows an equation that indicates a twisted read operation of the twisted block deinterleaver according to the present embodiment when the shift value $S_R$ is fixed to 1. The equation of FIG. 107 corresponds to the equation that indicates the twisted read operation of the twisted block interleaver described with reference to FIG. 101. The shift value Sa used for the twisted read operation of the twisted block deinterleaver according to the present embodiment may be calculated based on the equation described at the bottom of FIG. 107.

Similarly, the twisted block deinterleaver according to the present embodiment may perform single-memory deinterleaving.

FIG. 108 illustrates a structure of an NGH-CDI according to an embodiment of the present invention. The NGH-CDI according to the present embodiment may operate in a reverse order of the operation of the NGH-CI described with reference to FIG. 105. The NGH-CDI according to the present embodiment may include $N_{IU}$ branches. Content (or data) of an IF (or TI block) may be separately processed based on each branch. The NGH-CDI may operate based on information described in the NGH standard, and thus details will be omitted.

Hereinafter, a description will be given of a detailed operation of the hybrid time interleaver/hybrid time deinterleaver according to an embodiment of the present invention with reference to FIGS. 109 to 112. In this embodiment, the operation of the hybrid time interleaver/hybrid time deinterleaver of FIGS. 109 to 112 is performed based on the same parameter value.

Figure 109:
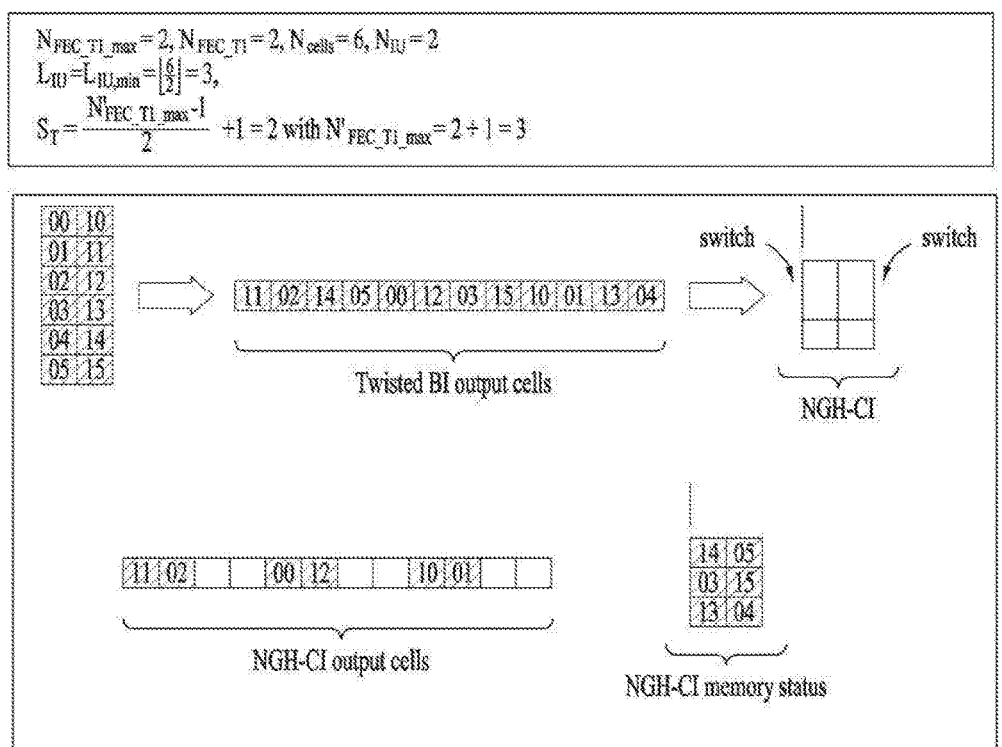
FIG. 109 illustrates an operation of the hybrid time interleaver according to an embodiment of the present invention.

FIG. 109 illustrates an operation of the hybrid time interleaver according to an embodiment of the present invention. Specifically, FIG. 109 illustrates an operation of a hybrid time interleaver according to an embodiment of the present invention including a twisted block interleaver and an NGH-CI.

Specifically, specific values of parameters necessary for the operation of the hybrid time interleaver are shown at the top of FIG. 109. The specific values of parameters are described at the top of FIG. 109.

The operation of the hybrid time interleaver in response to an input of a first TI block (or first IF) is illustrated at the bottom of FIG. 109. The hybrid time interleaver at the bottom of FIG. 109 operates based on the parameter values described at the top of FIG. 109. The operation of the hybrid time interleaver illustrated at the bottom of FIG. 109 is premised on the assumption that the shift value $S_T$ is a variable. The first TI block input to the twisted block interleaver is subjected to twisted block interleaving, and then output as twisted BI output cells. The twisted BI output cells output by setting the shift value $S_T$ to 2 are as illustrated in the figure. Thereafter, the twisted BI output cells are input to the NGH-CI. As described in the foregoing, an operation of the NGH-CI is the same as that described in the NGH standard, and thus will not be further described. NGH-CI output cells and a status of an NGH-CI memory are illustrated at the bottom of FIG. 109.

The hybrid time interleaver according to the present embodiment may operate similarly to the operation illustrated at the bottom of FIG. 109 even when the shift value $S_T$ is fixed to 1. In addition, the operation may not be changed even when the hybrid time interleaver according to the present embodiment includes a normal BI.

Figure 110:
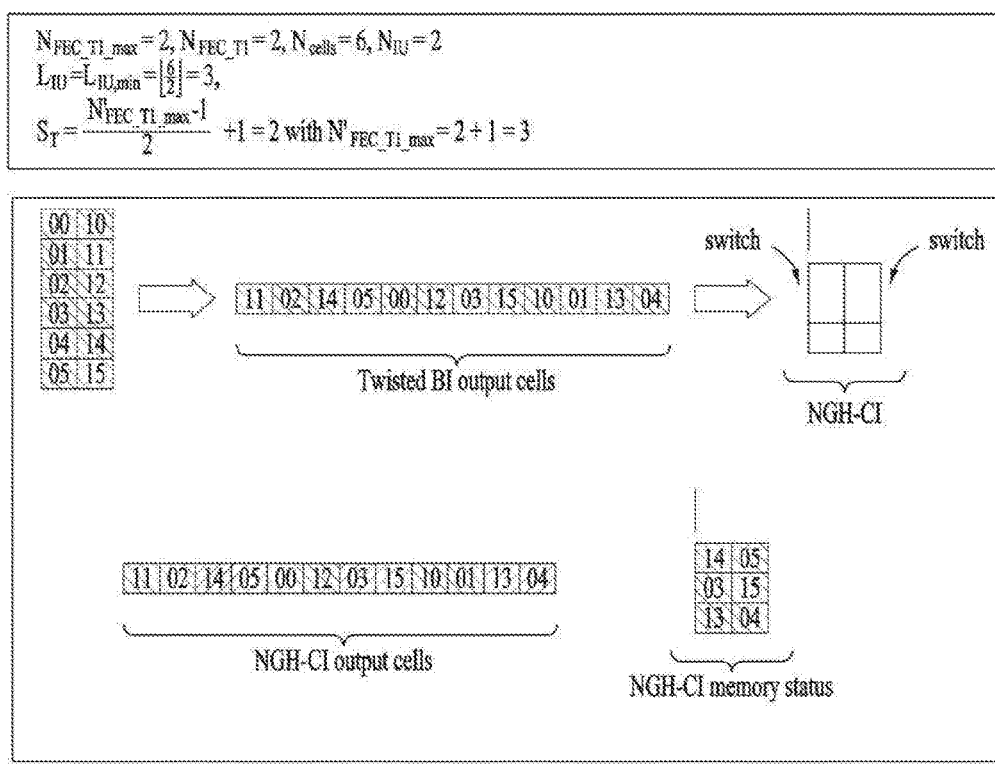
FIG. 110 illustrates an operation of the hybrid time interleaver according to an embodiment of the present invention.

FIG. 110 illustrates an operation of the hybrid time interleaver according to an embodiment of the present invention. Specific values of parameters necessary for the operation of the hybrid time interleaver are shown at the top of FIG. 110. The specific values of parameters are as described at the top of FIG. 109.

Specifically, the operation of the hybrid time interleaver in response to an input of a second TI block (or second IF) is illustrated at the bottom of FIG. 110. A specific operation is the same as that described in FIG. 109, and it can be understood that the NGH-CI output cells include cells stored in the NGH-CI memory among cells of the first TI block.

Figure 111:
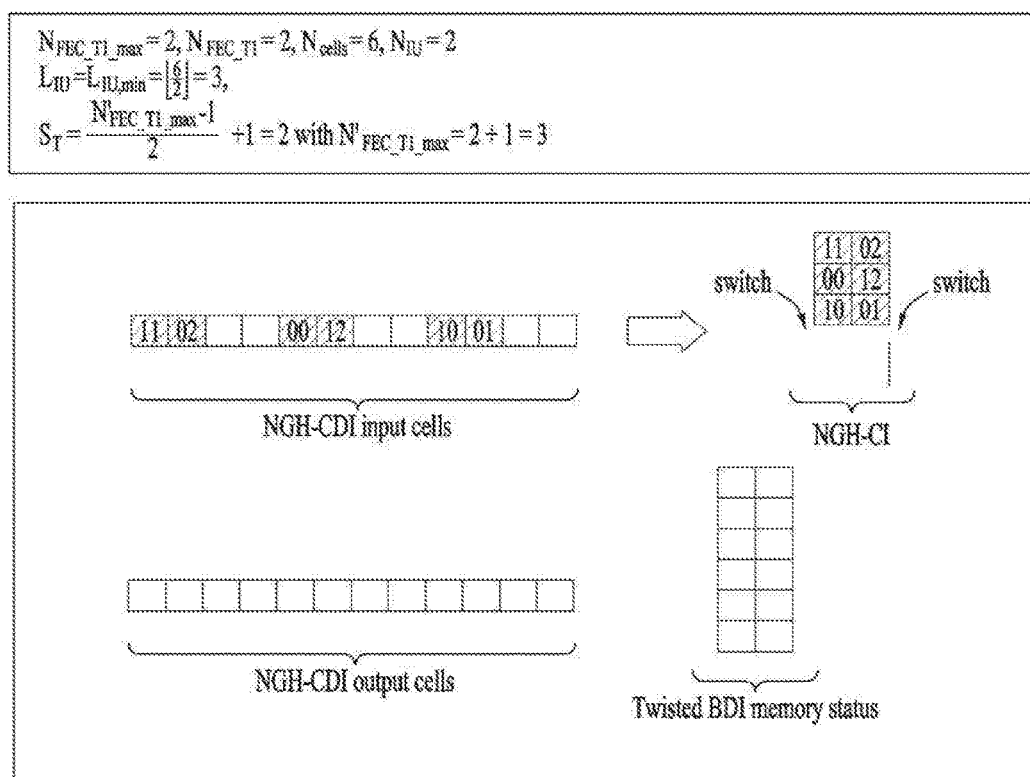
FIG. 111 illustrates an operation of the hybrid time deinterleaver according to an embodiment of the present invention.

FIG. 111 illustrates an operation of the hybrid time deinterleaver according to an embodiment of the present invention. Specifically, specific values of parameters necessary for the operation of the hybrid time deinterleaver are shown at the top of FIG. 111. The specific values of parameters are as described at the top of FIG. 109.

The hybrid time deinterleaver according to the present embodiment may operate in a reverse order of the operation of the hybrid time interleaver.

The operation of the hybrid time deinterleaver in response to an input of a first TI block (or first IF) is illustrated at the bottom of FIG. 111. As illustrated at the bottom of FIG. 111, first NGH-CDI input cells are the same as the NGH-CI output cells of FIG. 109.

Specific operations of the NGH-CDI and a twisted BDI are as illustrated at the bottom of FIG. 111.

Figure 112:
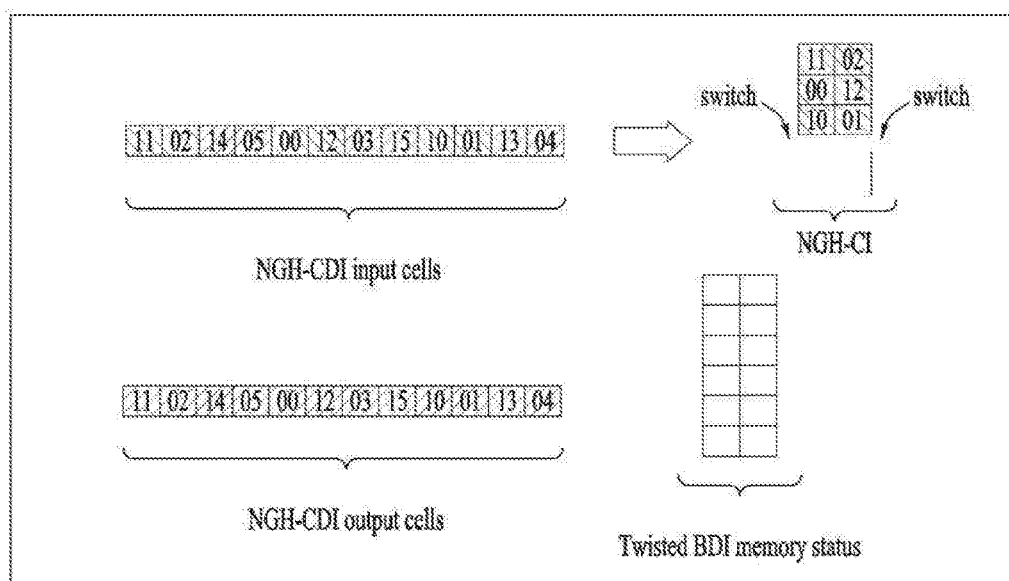
FIG. 112 illustrates an operation of the hybrid time deinterleaver according to an embodiment of the present invention.

FIG. 112 illustrates an operation of the hybrid time deinterleaver according to an embodiment of the present invention. Specific values of parameters necessary for the operation of the hybrid time deinterleaver are shown at the top of FIG. 112. The specific values of parameters are as described at the top of FIG. 109.

As illustrated at the bottom of FIG. 112, second NGH-CDI input cells are the same as the NGH-CI output cells of FIG. 110.

Specific operations of the NGH-CDI and the twisted BDI are as illustrated at the bottom of FIG. 112.

The NGH-CI described in the above figures may be referred to as a convolutional delay line. Hereinafter, the convolutional delay line will be described. In addition, the convolutional delay line may be referred to as a convolutional interleaver in the present specification. Here, convolutional interleaver that refers to the convolutional delay line may be another convolutional interleaver distinguished from a convolutional interleaver used in an S-PLP mode to be described below. In addition, the NGH-CDI described above with reference to figures may be referred to as inverse processing of the convolutional delay line. Hereinafter, a description will be given of inverse processing of the convolutional delay line.

Hereinafter, a description will be given of a time interleaver according to another embodiment of the present invention. The time interleaver according to the present embodiment may perform cell interleaving, block interleaving, convolutional delay line according to a PLP mode. An interleaver according to an embodiment of the present invention may be referred to as a time interleaver or a hybrid interleaver, and include a cell interleaver, a block interleaver, and a convolutional delay line.

The block interleaver and the convolutional delay line may be referred to as a hybrid time interleaver. The hybrid time interleaver to be described below corresponds to another example of the above-described hybrid time interleaver, and may operate according to a PLP mode.

Names, locations, etc. of respective devices may be changed by a designer.

Figure 113:
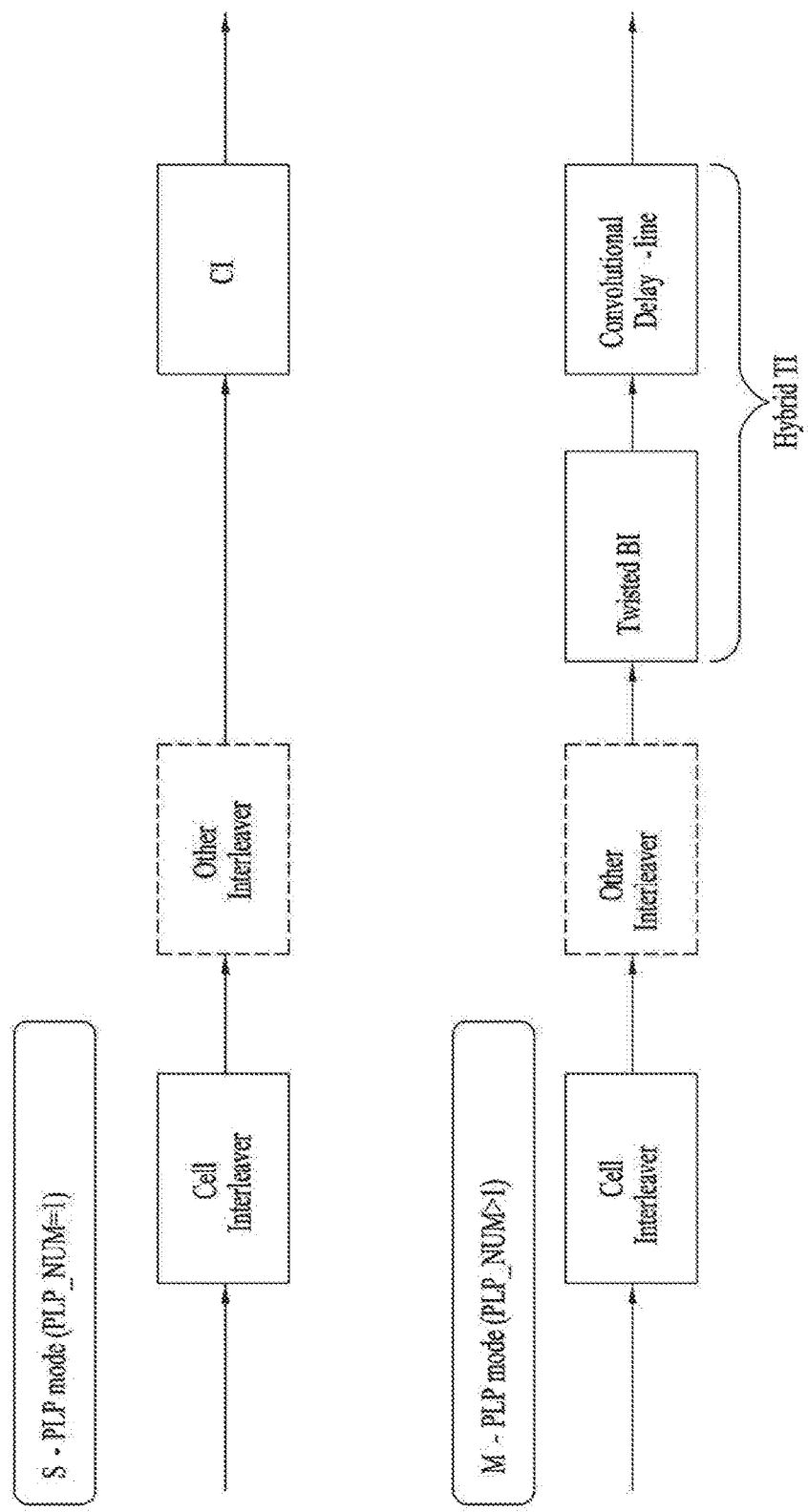
FIG. 113 is a diagram illustrating a configuration of an interleaver according to an embodiment of the present invention.

FIG. 113 is a diagram illustrating a configuration of an interleaver according to an embodiment of the present invention. The interleaver according to the present invention may be differently configured according to a PLP mode. In other words, an interleaver of an S-PLP mode may include a cell interleaver and a convolutional interleaver. According to a given embodiment, the interleaver of the S-PLP mode may further include another interleaver between the cell interleaver and the convolutional interleaver. In addition, an interleaver of an M-PLP mode may include a cell interleaver and a hybrid time interleaver. Here, the hybrid time interleaver may include a twisted block interleaver and a convolutional delay line. As described above, the convolutional delay line may be referred to as a convolutional interleaver. According to a given embodiment, the interleaver of the M-PLP mode may further include another interleaver between the cell interleaver and the hybrid interleaver. The other interleaver may perform interleaving in various schemes according to intent of a designer.

In addition, in the present invention, multiple PLPs may be expressed by M-PLP or PLP_NUM>1, and a single PLP may be expressed by S-PLP or PLP_NUM=1. Information about a PLP mode may be transmitted through a signaling field PLP_NUM in a signal frame.

PLP_NUM according to an embodiment of the present invention may be included in a preamble or a preamble symbol in a signal frame. The preamble or the preamble symbol according to the present embodiment may include an L1 signaling field, and the above-described field PLP_NUM may be included in the L1 signaling field. A concept of the field PLP_NUM is the same as that of the field NUM_DP described with reference to FIGS. 14 and 15, and a name thereof may be changed by a designer.

A cell interleaver according to an embodiment of the present invention may operate according to a PLP mode, and a cell deinterleaver of a receiver corresponding to the cell interleaver may operate without a memory. The cell interleaver according to the present embodiment may be referred to as a modified cell interleaver. The modified cell interleaver may be used when the PLP mode is either the S-PLP mode or the M-PLP mode. Specifically, the cell interleaver according to the present embodiment may be omitted according to a given PLP mode, and an operation of the cell interleaver according to the present embodiment may be changed according to a given PLP mode. The modified cell interleaver according to the present embodiment may perform a linear write operation to a buffer, and a random read operation from the buffer. The modified cell interleaver may change an interleaving pattern for every FEC block or for every FEC block pair in the M-PLP mode. In addition, the modified cell interleaver may change an interleaving pattern for every FEC block or for every FEC block pair in the S-PLP mode. In addition, according to a given embodiment, the modified cell interleaver may use one interleaving pattern in the S-PLP mode, and not change a pattern. A specific operation of the cell interleaver will be described below.

After cell interleaving, the time interleaver according to the present embodiment may perform time interleaving according to a PLP mode. Specifically, when the PLP mode corresponds to multiple PLPs, the time interleaver according to the present embodiment may perform twisted block interleaving and convolutional delay line using the hybrid time interleaver.

When the PLP mode corresponds to a single PLP, the time interleaver according to the present embodiment may perform only arbitrary convolutional interleaving after cell interleaving. The arbitrary convolutional interleaving may refer to a conventional convolutional interleaver other than the above-described convolutional delay line, which may be changed by a designer.

As illustrated in the figure, when the PLP mode corresponds to the multiple PLPs, the hybrid time interleaver may include a twisted block interleaver and a convolutional delay line. In this case, a state of the twisted block interleaver may be expressed by an ON state.

When the PLP mode corresponds to the single PLP, the hybrid time interleaver may only include an arbitrary convolutional interleaver other than the twisted block interleaver. In other words, when one time interleaver is used in the S-PLP mode and the M-PLP mode, the time interleaver may include the hybrid time interleaver. Here, the twisted block interleaver included in the hybrid time interleaver may not be used in the single PLP mode. In addition, the hybrid time interleaver may operate as an arbitrary convolutional interleaver in the single PLP mode. In this instance, the twisted block interleaver may be expressed by an OFF state in the single PLP mode.

A state of the block interleaver according to an embodiment of the present invention may be changed based on the above-described field PLP_NUM.

Figure 114:
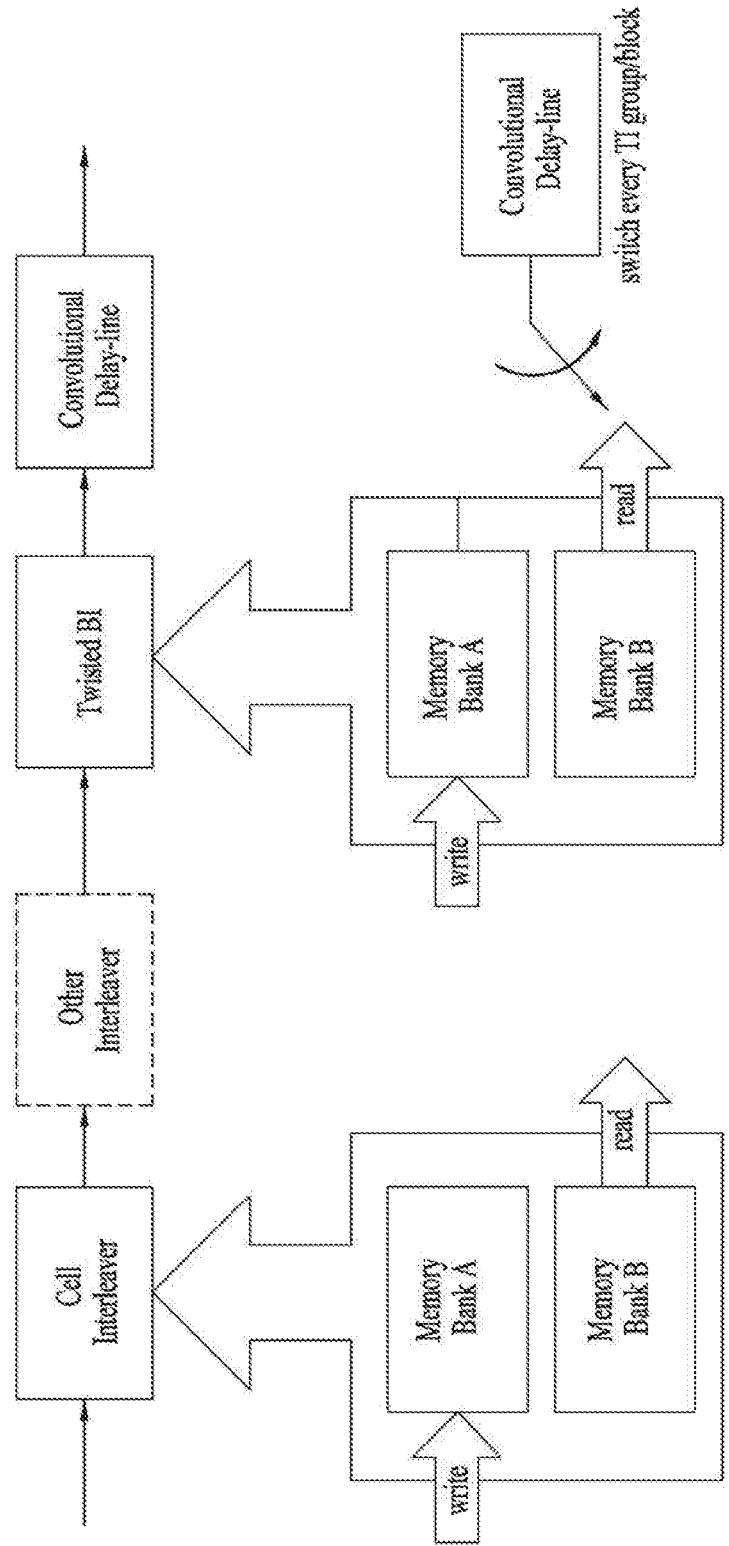
FIG. 114 illustrates a configuration of an interleaver according to an embodiment of the present invention when the PLP mode corresponds to M-PLP.

FIG. 114 illustrates a configuration of an interleaver according to an embodiment of the present invention when the PLP mode corresponds to M-PLP.

Specifically, FIG. 114 illustrates a memory structure of the interleaver in M-PLP. A configuration and an order of the interleaver are the same as those described with reference to FIG. 113, and thus will be omitted.

As illustrated in FIG. 114, a cell interleaver and a twisted block interleaver included in the time interleaver according to the present embodiment may operate based on double memories. Specifically, the double memories include a memory bank A and a memory bank B, and TI blocks may be successively input and written to the memory back A and read from the memory bank B.

Prior to a frame building operation, the interleaver may function as a buffer in each PLP processing to create a signal frame including multiple PLPs. Memories of a twisted block interleaver (TBI) and a convolutional delay line illustrated in FIG. 114 may perform a function of the above-described buffer. In each PLP, a first TI block may be written to a first memory of the TBI. Thereafter, a second TI block may be written to a second memory of the TBI, and the first memory of the TBI may read the first TI block at the same time. At the same time, a TI block (intra-frame interleaving TI block) read from the first memory is transmitted to the memory of the convolutional delay line. The TI block may be transmitted based on schemes such as first-in-first-out (FIFO), a shift register process, etc. An intra-frame interleaving operation may be performed by the TBI. On the other hand, an inter-frame interleaving operation may be performed by the TBI and the convolutional delay line. A total memory of a twisted block, a convolutional interleaver, and a cell interleaver do not exceed a total memory allocated to a PLP. In addition, a total memory of each TI block (group) does not exceed a maximum memory size. The maximum memory size may be changed by a designer.

Operation orders of the cell interleaver and the time interleaver in the interleaver described above do not require additional mapping information in a deinterleaving operation of a broadcast signal reception apparatus as described above with reference to FIG. 94, and thus possibly occurring complexity may be reduced.

Figure 115:
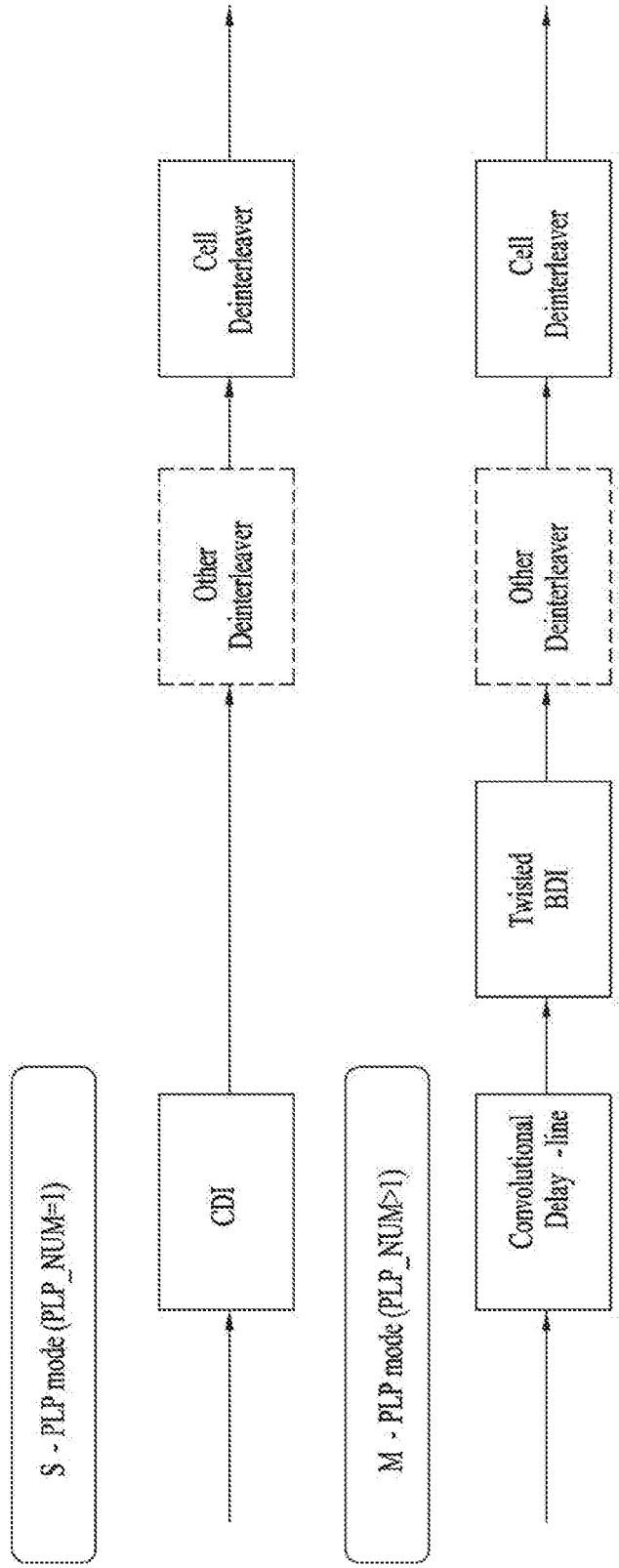
FIG. 115 illustrates a configuration of a deinterleaver corresponding to the operation of the interleaver described with reference to FIGS. 113 and 114.

FIG. 115 illustrates a configuration of a deinterleaver corresponding to the operation of the interleaver described with reference to FIGS. 113 and 114. An operation of the deinterleaver according to an embodiment of the present invention may be performed in a reverse order of the operation of the interleaver described above. The deinterleaver according to the present embodiment may be differently configured according to a given PLP mode. In other words, a deinterleaver of an S-PLP mode may include a convolutional deinterleaver and a cell deinterleaver. According to a given embodiment, the deinterleaver of the S-PLP mode may further include another interleaver between the convolutional deinterleaver and the cell deinterleaver. In addition, a deinterleaver of an M-PLP mode may include a convolutional delay line, a twisted block deinterleaver and a cell deinterleaver. According to a given embodiment, the deinterleaver of the M-PLP mode may further include another deinterleaver between the twisted block deinterleaver and the cell deinterleaver. The other deinterleaver may perform deinterleaving in various schemes according to intent of a designer.

In addition, a time deinterleaver according to an embodiment of the present invention may perform time deinterleaving according to a PLP mode indicated by a field PLP_NUM. In other words, convolutional deinterleaving and cell deinterleaving may be successively performed in the S-PLP mode. Here, another deinterleaving may be further performed between convolutional deinterleaving and cell deinterleaving. In addition, convolutional delay line, twisted block deinterleaving, and cell deinterleaving may be successively performed in the M-PLP mode. Here, another deinterleaving may be further performed between twisted block deinterleaving and cell deinterleaving. In other words, the time deinterleaver may perform twisted block deinterleaving (twisted block deinterleaver operates) or may not perform twisted block deinterleaving (twisted block deinterleaver does not operate) after performing convolutional deinterleaving and convolutional delay line.

As mentioned in FIG. 113, PLP_NUM according to an embodiment of the present invention may be included in a preamble or a preamble symbol in a signal frame. The preamble or the preamble symbol according to the present embodiment may include an L1 signaling field, and the above-described field PLP_NUM may be included in the L1 signaling field. Therefore, a broadcast signal reception apparatus according to an embodiment of the present invention may perform time deinterleaving by obtaining a value of the field PLP_NUM included in the L1 signaling field.

Hereinafter, a description will be given of a detailed operation of the cell interleaver or the modified cell interleaver according to an embodiment of the present invention.

FIG. 116 illustrates a shift value applicable to a cell interleaver according to another embodiment of the present invention and an interleaving sequent according to the shift value expressed as a mathematical expression. The cell interleaver according to the present invention may operate as described with reference to FIG. 96. Unlike description with reference to FIG. 97, a shift value of S-PLP applied to the cell interleaver according to the present embodiment may correspond to a fixed value or a variable. When the shift value of S-PLP applied to the cell interleaver according to the present embodiment corresponds to the variable, the value may be the same as a value of the variable interleaving sequence of M-PLP described with reference to FIG. 97. A shift value of M-PLP may be set to a variable similarly to description with reference to FIG. 97.

In S-PLP, a broadcast signal transmission apparatus according to an embodiment of the present invention may omit an operation of the cell interleaver, and only perform an operation of the time interleaver.

A block interleaver after the cell interleaver according to an embodiment of the present invention may correspond to a twisted block interleaver or an arbitrary block interleaver. Hereinafter, a description will be given of an operation of the twisted block interleaver according to an embodiment of the present invention with reference to FIGS. 117 and 118. The block interleaver according to the present embodiment may operate after the cell interleaver as described above.

FIG. 117 shows an equation indicating a twisted reading operation after virtual FEC blocks are inserted according to an embodiment of the present invention. The equation may be applied to the twisted reading operation illustrated in FIG. 98. The equation shown in the figure indicates twisted block interleaving applied using each TI block as a unit. As shown in the equation, the shift value may be calculated based on a maximum number of virtual FEC blocks included in a TI block. Parameters used for an operation of a hybrid time interleaver according to an embodiment of the present invention are determined based on a TI block having a maximum number of virtual FEC blocks in a super-frame. A TI block having a smaller number of FEC blocks than the number of FEC blocks of the TI having the maximum number of virtual FEC blocks may be present. In this case, virtual FEC blocks corresponding to the number of FEC blocks to be supplemented may be added to the corresponding TI block. Virtual FEC blocks according to an embodiment of the present invention may be inserted in front of actual FEC blocks. Thereafter, the time interleaver according to the present embodiment may interleave TI groups using one twisted row-column block interleaving rule based on virtual FEC blocks. In addition, the hybrid time interleaver according to the present embodiment may perform the above-described skip operation when a memory index corresponding to virtual FEC blocks is generated in a read operation. Thereafter, the number of FEC blocks of a TI group input during a write operation is made equal to the number of FEC blocks of a TI group output during a read operation. As a result, according to time interleaving of the present embodiment, even when a virtual FEC block is inserted to perform efficient single-memory deinterleaving in a receiver, loss of rate of actually transmitted data may not occur through a skip operation.

FIG. 118 shows an equation indicating a twisted read operation performed after virtual FEC blocks are inserted when a shift value is fixed to 1 according to an embodiment of the present invention. When the shift value is fixed to 1, a maximum number N'FEC_TI_max of virtual FEC blocks is not needed. Therefore, it can be understood that the twisted read operation according to the present embodiment is performed based on the number NFEC_TI of actual FEC blocks when the shift value is fixed to 1. As described in the foregoing, the skip operation indicated in the figure may skip virtual FEC blocks in the twisted read operation.

FIG. 119 shows an equation indicating twisted block deinterleaving of a hybrid time deinterleaver according to an embodiment of the present invention. Specifically, FIG. 119 shows an equation indicating a twisted read operation of the twisted block deinterleaver according to the present embodiment. The equation of FIG. 119 corresponds to the equation indicating the twisted read operation of the twisted block interleaver described with reference to FIG. 117. A shift value $SR,j$ used for the twisted read operation of the twisted block deinterleaver according to the present embodiment may be calculated based on an equation at the bottom of FIG. 119. The twisted block deinterleaver according to the present embodiment may perform single-memory deinterleaving.

FIG. 120 shows an equation indicating twisted block deinterleaving of a hybrid time deinterleaver according to an embodiment of the present invention. Specifically, FIG. 120 shows an equation indicating a twisted read operation of the twisted block deinterleaver according to the present embodiment when the shift value ST is fixed to 1. The equation of FIG. 120 corresponds to the equation indicating the twisted read operation of the twisted block interleaver described with reference to FIG. 118. A shift value $SR,j$ used for the twisted read operation of the twisted block deinterleaver according to the present embodiment may be calculated based on an equation at the bottom of FIG. 120. Likewise, the twisted block deinterleaver according to the present embodiment may perform single-memory deinterleaving.

Hereinafter, a description will be given of a detailed operation of the hybrid time interleaver/hybrid time deinterleaver according to an embodiment of the present invention with reference to FIGS. 121 to 125. The operation of the hybrid time interleaver/hybrid time deinterleaver of FIGS. 121 to 125 corresponds to an example of an operation based on the same parameter value.

FIG. 121 illustrates an operation of the hybrid time interleaver according to an embodiment of the present invention. Specifically, FIG. 121 illustrates an operation of the hybrid time interleaver including a twisted block interleaver and a convolutional delay line.

Specifically, specific values of parameters necessary for the operation of the hybrid time interleaver are indicated at the top of FIG. 121. The specific values of parameters are the same as those described at the top of FIG. 121.

An operation of the hybrid time interleaver performed when a first TI block (or a first IF) is input is illustrated at the bottom of FIG. 121. The hybrid time interleaver at the bottom of FIG. 121 operates based on the parameter values described at the top of FIG. 121. The operation of the hybrid time interleaver illustrated at the bottom of FIG. 121 may be applied when the shift value ST is variable, and similarly applied even when the shift value is fixed to 1. The first TI block input to the twisted block interleaver is subjected to twisted block interleaving, and then output as twisted BI output cells. The twisted BI output cells output by applying the shift value ST of 1 are as illustrated in the figure. Thereafter, the twisted BI output cells are input to the convolutional delay line. An operation of the convolutional delay line is as described above. Output cells of the convolutional delay line (convolutional delay line output cells) and a memory status of the convolutional delay line (convolutional delay line memory status) are illustrated at the bottom of FIG. 121. In other words, when the twisted BI output cells output from the twisted BI are input to the convolutional delay line, some cells may be output as output cells of the convolutional delay line and some other cells may be stored in a memory of the convolutional delay line and delayed as illustrated in the figure. The delayed cells may be output together with cells included in the second subsequent TI block.

FIG. 122 illustrates an operation of the hybrid time interleaver according to an embodiment of the present invention. When the second TI block is input to the twisted block interleaver subsequent to the first TI block, the TI block is subjected to interleaving and output as twisted BI output cells. Thereafter, the twisted BI output cells are input to the convolutional delay line. Output cells of the convolutional delay line (convolutional delay line output cells) and a memory status of the convolutional delay line (convolutional delay line memory status) are illustrated at the bottom of FIG. 122. In other words, when the twisted BI output cells with respect to the second TI block output from the twisted BI are input to the convolutional delay line, some cells may be output as output cells of the convolutional delay line and some other cells may be stored in a memory of the convolutional delay line and delayed as illustrated in the figure. Here, the output cells of the convolutional delay line may include some of the twisted BI output cells with respect to the second TI block and the twisted BI output cells with respect to the first TI block stored in the memory of the convolutional delay line.

FIG. 123 illustrates an operation of the hybrid time deinterleaver according to an embodiment of the present invention. Specifically, specific values of parameters necessary for the operation of the hybrid time deinterleaver are shown at the top of FIG. 123. The hybrid time deinterleaver according to the present embodiment may operate in reverse order of the operation of the hybrid time interleaver.

An operation of the hybrid time deinterleaver performed when first input cells are input to the convolutional delay line is illustrated at the bottom of FIG. 123. As illustrated in FIG. 123, the input cells of the convolutional delay line (convolutional delay line input cells) are the same as the output cells of the convolutional delay line of FIG. 121.

Specific operations of the convolutional delay line and the twisted block deinterleaver (BDI) are as illustrated in FIG. 123. In other words, when first input cells of the convolutional delay line are input to the convolutional delay line, some of input cells of the convolutional delay line may be output as output cells of the convolutional delay line, and some other input cells may be stored in a memory of the convolutional delay line and delayed. As illustrated in FIG. 123, output cells with respect to the first input cells of the convolutional delay line may not be output since the first input cells input to the convolutional delay line include black cells excluding data. When the output cells of the convolutional delay line are not output, input cells/output cells with respect to the twisted BDI may not be input/output. As a result, when the first TI block is input, an output cell of the time deinterleaver may not be output.

FIG. 124 illustrates an operation of the hybrid time deinterleaver according to an embodiment of the present invention. Specifically, specific values of parameters necessary for the operation of the hybrid time deinterleaver are indicated at the top of FIG. 124. FIG. 124 illustrates an operation of the hybrid time deinterleaver performed when second input cells are input to the convolutional delay line. As illustrated in FIG. 124, input cells of the convolutional delay line (convolutional delay line input cells) are the same as the output cells of the convolutional delay line of FIG. 122.

Specific operations of the convolutional delay line and the twisted BDI are as illustrated in FIG. 124. In other words, when the second input cells of the convolutional delay line are input to the convolutional delay line, some of input cells of the convolutional delay line may be output as output cells of the convolutional delay line, and some other input cells may be stored in a memory of the convolutional delay line and delayed. As illustrated in FIG. 124, the convolutional delay line may output some of the second input cells and the first input cells stored in the memory. In other words, the convolutional delay line may output cells included in the first TI block in the interleaving operation through the above described process. In addition, the convolutional delay line may store, in the memory, cells included in the second TI block in the interleaving operation among the second input cells. Output cells of the convolutional delay line may be input to the twisted BDI and stored in a memory of the twisted BDI. In this instance, output cells of the twisted BDI may not be output. As a result, even when the second TI block is input, an output cell of the time deinterleaver may not be output.

FIG. 125 illustrates an operation of the hybrid time deinterleaver according to an embodiment of the present invention. Specifically, specific values of parameters necessary for the operation of the hybrid time deinterleaver are shown at the top of FIG. 125. FIG. 125 illustrates an operation of the hybrid time deinterleaver performed when third input cells are input to the convolutional delay line. A specific operation of the twisted BID is as illustrated in FIG. 125. In other words, when it is presumed that the third input cells are input to the convolutional delay line, the twisted BDI may apply twisted block deinterleaving to cells stored in a memory of the twisted BDI. The twisted BDI may perform twisted block deinterleaving using a single memory, and output output cells of the twisted BDI as illustrated in FIG. 125. In other words, output cells of the time interleaver may be output. Here, it can be understood that the output cells of the twisted BDI are output similarly to the input cells input to the twisted BI in FIG. 121.

As described in the foregoing, the time interleaver according to the present invention may adaptively apply interleaving to a PLP mode, and operate as a hybrid time interleaver including a twisted block interleaver and a convolutional delay line.

An interleaver according to an embodiment of the present invention may be differently configured according to a PLP mode. As described in the foregoing, a time interleaver of an S-PLP mode may include a cell interleaver and/or a convolutional interleaver (CI). Here, the time interleaver of the S-PLP mode may only include the CI. Here, the CI may correspond to an arbitrary CI including a conventional CI. According to a given embodiment, the interleaver of the S-PLP mode may further include another interleaver between the cell interleaver and the convolutional interleaver. The other interleaver may perform interleaving in various schemes according to intent of a designer. Names, locations, etc. of respective devices may be changed by a designer. Hereinafter, a description will be given of a cell interleaver and a convolutional interleaver included in the time interleaver of the S-PLP mode. The cell interleaver included in the time interleaver of the S-PLP mode may be the same as the cell interleaver described with reference to FIG. 116, and a shift value of S-PLP may correspond to a fixed value or a variable.

FIG. 126 illustrates a configuration of the CI according to an embodiment of the present invention. An input signal of the CI may be expressed by input cells. As described in the foregoing, the time interleaver of the present invention may perform convolutional interleaving after performing cell interleaving in the S-PLP mode. In other words, an output signal or output cells of the cell interleaver may be defined as an input signal or input cells of the CI. The input cells of the CI may be subjected to FIFO processing. Here, a memory unit or an interleaving unit included in the CI may store one cell or two or more contiguous cells together. In other words, the memory unit or the interleaving unit included in the CI may store a pair of cells. In particular, the memory unit or the interleaving unit included in the CI may increase interleaving depth by storing two or more cells. Here, the two or more cells may be contiguous cells. In the figure, M denotes a memory included in the CI, and subscripts i and j may indicate an ith row and a jth column. In addition, the CI may include N_row rows and N_column columns. N_cell may denote the number of cells subjected to cell interleaving or a size of an FEC block. In the present specification, an FEC block used in the CI of the S-PLP mode may be referred to as an FEC frame.

FIG. 127 shows parameters used in a convolutional interleaver according to an embodiment of the present invention. A relation among parameters of N_cells, N_row, and N_column necessary for the configuration of the CI described above is as below. In Case-1 corresponding to a first case, N_column is defined as N_row-1 when N_row is given. In this instance, a value of N_row may be set to an integer multiple of N_cells. This parameter setting is advantageous in that a location of a first input cell in a memory of a convolutional deinterleaver (CDI) included in a broadcast signal reception apparatus can be fixed during an initial operation of the CDI. However, flexibility may be restricted when a parameter N_row is determined.

In Case-2 corresponding to a second case, N_column is defined as N_row-1 when N_row is given. In this instance, a value of N_row may be set to an arbitrary fixed value or a variable within a configured range of N_max_row. This parameter setting may not fix a location of a first input cell in the memory of the CDI during the initial operation of the CDI included in the broadcast signal reception apparatus. As a result, information about the location of the first input cell is needed. A broadcast signal transmission apparatus may inform the broadcast signal reception apparatus of the information using a signaling scheme including L1 signaling. Case-2 is effective in enhancing flexibility when determining the parameter N_row, and may cover a general case when compared to Case-1.

In Case-3 corresponding to a third case, a case in which N_column=N_row=0 indicates a case in which the CI is turned off. In other words, the time interleaver of the S-PLP mode according to the present embodiment may include the cell interleaver and the CI, and the CI may selectively operate or not operate according to signaled information according to a given embodiment. Hereinafter, a case in which the CI is not used for time interleaving may be expressed by a case in which the CI is turned OFF, and a case in which the CI is used for time interleaving may be expressed by a case in which the CI is turned ON.

According to the above-described cases, signaling information to be used for an operation the CDI corresponding to the CI may be defined as below. In other words, signaling information related to the CI/CDI may include maximum row size information, row size information, location information of a row to which a first cell is input, location information of an FEC block, and/or cell interleaving pattern information. The broadcast signal transmission apparatus may inform the broadcast signal reception apparatus of the information using a signaling scheme including L1 signaling.

The maximum row size information may be expressed by PLP_TI_NUM_ROW_MAX, and indicate maximum row size information of the CI/CDI used in a super-frame. The row size information may be expressed by PLP_TI_NUM_ROW, and indicate row size information of the CI/CDI used in a frame. The location information of the row to which the first cell is input may be expressed by PLP_TI_START_ROW, and indicate location information of the row to which the first cell is input during an operation of the CDI. In other words, PLP_TI_START_ROW may indicate a location of an interleaver selector at a start of each broadcast signal frame, and be indicated by LID_CI_start_row. The FEC block location information may be expressed by PLP_TI_FECBLOCK_START or L1D_CIC_fecframe_start, and indicate information about a location at which a first complete FEC block is started after the operation of the CDI. Here, the location information may refer to an index of a memory unit. Hereinafter, the first complete FEC block may be referred to as a first complete FEC frame. The equation shown in the figure may be used to obtain the FEC block location information. When PLP_TI_FECBLOCK_START is set to "don't care", a value thereof may be obtained by multiplying N_row by N_column. In other cases, PLP_TI_FECBLOCK_START may be obtained as in the shown equation using memory values based on PLP_TI_NUM_ROW, PLP_TI_START_ROW, N_cells and N_row-1, and N_column-1. The cell interleaving pattern information may be expressed by PLP_TI_CELLINV_START, and indicate information related to a pattern of cell interleaving applied to the first complete FEC block after the operation of the CDI. A scheme of obtaining related information may be different.

FIG. 128 illustrates a method of generating signaling information and a convolutional interleaver according to an embodiment of the present invention. FIG. 128 may illustrate a configuration of time interleaving prior to a description of an operation of a CL Referring to FIG. 128, it can be presumed that N_cells corresponding to a parameter related to a cell interleaver is set to 10, one TI group includes three FEC blocks, and a cell interleaving pattern used at this time is changed for every FEC block. In addition, it can be presumed that every frame includes 30 cells for a CI output signal. In the present specification, a time interleaving group may be referred to as a group of FEC frames.

FIG. 129 illustrates a method of acquiring signaling information related to interleaving by a broadcast signal transmission apparatus according to an embodiment of the present invention. The broadcast signal transmission apparatus may generate and transmit signaling information for initial synchronization of a CDI and a cell deinterleaver included in a broadcast signal reception apparatus. FIG. 129 illustrates a method of acquiring PLP_TI_CELLINV_START corresponding to cell interleaving pattern information and PLP_TI_FECBLOCK_START corresponding to FEC block location information. Hereinafter, it can be presumed that a scheduler included in the broadcast signal transmission apparatus has information about a cell interleaving pattern used for each cell-interleaved FEC block and an order of cells in the FEC block.

A number marked on each cell on the left side of FIG. 129 indicates an order of cell interleaving patterns used for a corresponding FEC block, and is ultimately intended for acquisition of information related to PLP_TI_CELLINV_START corresponding to cell interleaving pattern information. One cell interleaving pattern may be used for one FEC block. In other words, a cell interleaving pattern may be applied and changed using an FEC block as a unit. Therefore, each FEC block may have the same number. For example, a number "2" marked on a third FEC block of a first TI group may indicate that a second cell interleaving pattern is used. An order of cell interleaving patterns used in an actual system may be linked to an operation algorithm of a cell interleaver. In other words, the order may correspond to a factor "k" of symbol offset addition used in a DVB T2/NGH standard.

A number marked on each cell on the right side of FIG. 129 may indicate an order of cells in a corresponding FEC block, which is intended to acquire information related to PLP_TI_FECBLOCK_START corresponding to FEC block location information. For example, a number "9" marked on each FEC block of the first TI group may indicate a ninth cell of each FEC block.

In addition, signaling information such as PLP_TI_START_ROW, PLP_TI_NUM_ROW, etc. may be obtained through an operation of the CI.

FIG. 130 illustrates an operation of a convolutional interleaver according to an embodiment of the present invention. The operation may be applied to the first case and the second case of the relation among the parameters of N_cells, N_row, and N_column described above. Here, it can be presumed that the CI has a configuration in which N_row is 4 and N_column is 3.

A data cell-related CI operation is described at the top of FIG. 130. As illustrated in the figure, it is possible to show an example of acquiring three signaling information of PLP_TI_NUM_ROW_MAX, PLP_TI_NUM_ROW, PLP_TI_START_ROW, etc. in addition to data-cell interleaving.

An example of operating the CI by synchronizing a cell interleaving pattern used for every FEC block with a data cell in order to acquire signaling information related to PLP_TI_CELLINV_START is shown in the middle of FIG. 130. An example of a detailed operation and a method of acquiring information will be described below.

An example of operating the CI by synchronizing an order of cells in an FEC block with a data cell in order to acquire signaling information related to PLP_TI_FECBLOCK_START is shown at the bottom of FIG. 130. An example of a detailed operation and a method of acquiring information will be described below.

FIG. 131 illustrates a method of configuring a frame by a convolutional interleaver according to an embodiment of the present invention. In other words, a CI may configure a first frame using 30 cells after an initial operation. As illustrated in the figure, in the first frame, a first cell corresponds to a value of a memory when a switch of the CI is positioned at row 0, and a last cell corresponds to a value of the memory when the switch of the CI is positioned at row 1. In other words, in the first frame, the first cell corresponds to a value of a cell that corresponds to row 0 of FEC block 0 included in TI group 0 described above, and the last cell corresponds to a value of a cell that corresponds to row 5 of FEC block 2 included in TI group 0 described above. In this instance, in a configuration of the first frame, dummy cells of the memory may be regarded as data and included in the frame configuration rather than being discarded. Further, as illustrated in the figure, related signaling information necessary for a CDI may be defined by observing an initial CI memory status before interleaving. In other words, PLP_TI_NUM_ROW corresponding to row size information of the convolutional interleaver may be set to 4, and PLP_TI_START_ROW corresponding to location information of the row to which the first cell is input may be set to 0 as described above. In addition, PLP_TI_FECBLOCK_START corresponding to FEC block location information may be set to "don't care". In this instance, "don't care" may indicate N_row*N_column. In addition, PLP_TI_CELLINV_START corresponding to cell interleaving pattern information may set to 0 corresponding to a pattern applied to a cell that corresponds to row 0 of FEC block 0 included in TI group 0.

FIG. 132 illustrates a method of configuring a frame by a convolutional interleaver according to an embodiment of the present invention. In other words, a CI may configure a second frame using 30 different cells positioned after the 30 cells included in the first frame. As described above, related signaling information necessary for a CDI of a broadcast signal reception apparatus may be defined by observing a CI memory status before interleaving. In other words, PLP_TI_NUM_ROW corresponding to row size information of the convolutional interleaver may be set to 4. A first cell of the second frame may have a value subsequent to a row value of a switch with respect to the last cell of the first frame. In other words, a row value of a CI switch with respect to the last cell of the first frame is 1 in the above example, and thus a CI switch with respect to the first cell of the second frame may be positioned on row 2. Therefore, PLP_TI_START_ROW corresponding to location information of a row to which the first cell is input may be set to 2 with respect to the second frame.

In addition, PLP_TI_FECBLOCK_START corresponding to FEC block location information may be set to 2 using the above-described equation. In other words, 2 may be obtained from (4-2-1)+(10-9) based on the above-described equation. In this instance, 9 may indicate a cell order value of a memory of M_3,2.

In addition, PLP_TI_CELLINV_START corresponding to cell interleaving pattern information is acquired by being synchronized with information of PLP_TI_FECBLOCK_START. In other words, in the figure, information related to PLP_TI_CELLINV_START obtained at the same location as that of PLP_TI_FECBLOCK_START may indicate a pattern "1". In this instance, the information of PLP_TI_CELLINV_START may be mainly set to subsequent interleaving pattern order information "2" without using "1". In other words, cell interleaving pattern information may be set to subsequent interleaving pattern order information of pattern information obtained at the same location as that of the FEC block location information.

FIG. 133 illustrates a configuration of a CDI according to an embodiment of the present invention. A CDI included in a broadcast signal reception apparatus may operate in reverse order of a broadcast signal transmission apparatus. An output signal of the CDI may be expressed by output cells. As described in the foregoing, the time deinterleaver of the present invention may perform cell deinterleaving after performing convolutional deinterleaving in the S-PLP mode. In other words, an input signal or input cells of the cell deinterleaver may be defined as an output signal or output cells of the CDI. The CDI may perform FIFO processing on input cells. Here, a memory unit or a deinterleaving unit included in the CDI may store one cell or two or more contiguous cells together. In other words, the memory unit or the deinterleaving unit included in the CDI may store a pair of cells. Here, the two or more cells may be contiguous cells. In the figure, M_i,j denotes a memory included in the CDI, and subscripts i and j may indicate an ith row and a jth column. In addition, the CDI may include N_row rows and N_column columns. N_cell may denote the number of cells subjected to cell deinterleaving or a size of an FEC block.

FIG. 134 illustrates an operation method of a convolutional deinterleaver according to an embodiment of the present invention. Presumptions in the operation of the convolutional interleaver described above are similarly applied to the convolutional deinterleaver to be described below, and it can be presumed that frame synchronization is performed from a second frame and accurate signaling information is detected. As illustrated in the figure, the convolutional deinterleaver may receive and use signaling information corresponding to at least one of PLP_TI_NUM_ROW_MAX which is maximum row size information, PLP_TI_NUM_ROW which is row size information, PLP_TI_START_ROW which is location information of a row to which a first cell is input, PLP_TI_CELLINV_START which is cell interleaving pattern information, and/or PLP_TI_FECBLOCK_START which is FEC block location information. As illustrated in the figure, a broadcast signal reception apparatus may receive signaling information in which PLP_TI_NUM_ROW_MAX is set to 4, PLP_TI_NUM_ROW is set to 4, PLP_TI_START_ROW is set to 2, PLP_TI_CELLINV_START is set to 2, and PLP_TI_FECBLOCK_START is set to 2.

First, a configuration of the convolutional deinterleaver may use at least one of PLP_TI_NUM_ROW_MAX and/or PLP_TI_NUM_ROW. In other words, a value of PLP_TI_NUM_ROW_MAX and/or PLP_TI_NUM_ROW is set to 4, and thus N_row may be set to 4 and N_column may be set to 3 in the configuration of the convolutional deinterleaver since N_column may be obtained by N_row-1. A specific operation of the convolutional deinterleaver will be described with reference to a subsequent figure.

FIG. 135 illustrates an operation method of a convolutional deinterleaver according to an embodiment of the present invention. As described in the foregoing, it can be presumed that frame synchronization is performed from a second frame in the convolutional deinterleaver. A description will be given of the operation method of the convolutional deinterleaver using a second frame output to the above-described convolutional interleaver. As illustrated in the figure, the convolutional deinterleaver may operate using PLP_TI_START_ROW and PLP_TI_FECBLOCK_START. In other words, the convolutional deinterleaver may input a first cell to row 2 using information of PLP_TI_START_ROW=2. In addition, after interleaving, a first complete FEC block may start from a second cell with respect to a CDI output signal using information of PLP_TI_FECBLOCK_START=2. Thereafter, after interleaving, the cell deinterleaver may perform cell deinterleaving of the first complete FEC block using a second interleaving pattern based on information of PLP_TI_CELLINV_START.

Hereinafter, a description will be given of signaling information used for time interleaving according to another embodiment of the present invention. The signaling information used for time interleaving may be delivered from a broadcast signal transmission apparatus to a broadcast signal reception apparatus through L1 signaling. L1 signaling information included in L1 signaling may include static signaling and dynamic signaling. TI signaling information to be described below may be delivered to the broadcast signal reception apparatus through static signaling or dynamic signaling included in L1 signaling.

FIG. 136 illustrates a time interleaver according to an embodiment of the present invention. In other words, FIG. 136(a) illustrates a configuration of a time interleaver according to a PLP mode in a broadcast signal transmission system according to an embodiment of the present invention. As described in the foregoing, the time interleaver may include a twisted BI and a convolutional delay line in a multiple-PLP (M-PLP) mode. As described above, the convolutional delay line may be referred to as a convolutional interleaver. The time interleaving including the twisted BI and the convolutional delay line may be referred to as a hybrid TI. On the other hand, in a single-PLP (S-PLP) mode, only an arbitrary CI may be used.

A (modified) cell interleaver may be applied to both the S-PLP & M-PLP modes, and have the same operation and specific characteristic or a different operation and specific characteristic according to a given PLP mode.

Each block included in the TI may operate using TI signaling information. In other words, as illustrated in the figure, the cell interleaver, the twisted BI, the convolutional delay line, and the CI included in the TI may operate according to TI signaling information. The TI signaling information may include configurable signaling and dynamic signaling.

FIG. 136(b) is a block diagram equivalently illustrating a time interleaver according to an embodiment of the present invention. The time interleaver may have the same configuration as that of the above-described time interleaver. The time interleaver may include a twisted BI and a convolutional delay line in an M-PLP mode and include an arbitrary CI in an S-PLP mode. In addition, the TI may further include a cell interleaver in each PLP mode. As illustrated in the figure, TI signaling may deliver information related to operations of the cell interleaver, the twisted BI, the convolutional delay line, and the CI included in the TI, and may include configurable signaling and dynamic signaling. In addition, when the time interleaver includes another interleaver in each PLP mode, TI signaling information may be delivered to the corresponding interleaver.

The present invention may describe a definition of signaling information necessary for an operation of each block included in the TI.

FIG. 137 illustrates a portion of time interleaving signaling information according to an embodiment of the present invention. TI signaling information may include a configurable signaling field and a dynamic signaling field. Information included in the configurable signaling field may be described with reference to FIG. 137. The configurable signaling field may include TI signaling information having a constant value in a super-frame. In other words, information included in the configurable signaling field may be changed using a super-frame as a unit and not be changed in the same super-frame. The configurable signaling field may be separately signaled in the S-PLP mode and the M-PLP mode according to NUM_PLP that indicates the number of PLPs.

Signaling information for an operation of the CI of the S-PLP mode may include PLP_TI_NUM_ROW_MAX, PLP_TI_ROW_SIZE, PLP_TI_START_ROW and/or PLP_TI_FECBLOCK_START. In addition, the signaling information for the operation of the CI of the S-PLP mode may further include FRAME_INTERVAL. A definition of signaling will be described below in detail. In this instance, additional signal information may be added to the configurable signaling field for the S-PLP mode to support a flexible operation of the CI.

PLP_TI_NUM_ROW_MAX is information indicating a maximum number of delay lines included in the CI, and each delay line may be expressed by a row.

PLP_TI_NUM_ROW is information indicating the number of delay lines included in the CI, and each delay line may be expressed by a row.

PLP_TI_START_ROW is information indicating a start position of a switch of the time deinterleaver, and may indicate a row from which the switch starts deinterleaving in a starting part of an FEC frame. In other words, PLP_TI_S-TART_ROW may be information indicating a location of an interleaver selector in a starting part of a signal frame. In the present specification, a switch of a deinterleaver may be expressed by a selector or a commutator. In the present specification, PLP_TI_START_ROW may be expressed by LID_CI_start_row.

PLP_TI_FECBLOCK_START is information indicating a start position of a first complete FEC block in an ATSC signal frame. In the present specification, an FEC block related to the S-PLP mode may be referred to as an FEC frame, and PLP_TI_FECBLOCK_START may be expressed by L1D_CI_fecframe_start.

FRAME_INTERVAL will be described below in the M-PLP mode.

Signaling information necessary to operate a hybrid TI of an M-PLP mode corresponds to PLP_NUM_BLOCKS_MAX, TIME_IL_LENGTH, TIME_IL_TYPE, FRAME_INTERVAL, etc., and a definition of signaling will be described below in detail.

PLP_NUM_BLOCKS_MAX is information indicating a maximum number of FEC blocks. In other words, PLP_NUM_BLOCKS_MAX may indicate a maximum number of FEC blocks per interleaving frame for a current PLP.

TIME_IL_TYPE corresponds to a 1-bit field, and may correspond to information indicating a type or a mode of time interleaving. In the present specification, TIME_IL_TYPE may be referred to as LID_HTI_inter frame. When a value of TIME_IL_TYPE is set to 0, the value may indicate that inter-frame interleaving is not used and intra-frame interleaving is used. Here, an interleaving frame may include one or a plurality of TI blocks. When TIME_IL_TYPE is set to 1, the value may indicate that inter-frame interleaving is used, and one interleaving frame may include one TI block. In addition, one TI block included in an interleaving frame may be spread over a plurality of ATSC broadcast signal frames.

TIME_IL_LENGTH may be defined as below according to TIME_IL_TYPE described above. In the present specification, TIME_IL_LENGTH may be indicated by LID_HTI_num_ti_blocks. When a value of TIME_IL_TYPE is set to 1, TIME_IL_LENGTH may refer to P_I that indicates the number of frames. Here, the number of frames may refer to the number of conveyed frames when a memory unit included in one TI block is spread by time interleaving.

When a value of TIME_IL_TYPE is set to 0, TIME_IL_LENGTH corresponds to information indicating N_TI which is the number of TI blocks per interleaving frame, and may indicate the number of TI blocks included in one interleaving frame.

When one TI block is included per interleaving frame and one signal frame is present per interleaving frame, TIME_IL_LENGTH may be set to 1 and TIME_IL_TYPE may be set to 0. When time interleaving is not used for a PLP, TIME_IL_LENGTH may be set to 0 and TIME_L_TYPE may be set to 0.

FRAME_INTERVAL is information indicating I_JUMP which is an ATSC frame interval. FRAME_INTERVAL may indicate an ATSC frame interval in a super-frame for a linked PLP. In addition, FRAME_INTERVAL may indicate a distance between two ATSC frames that convey memory units included in one TI block. For PLPs that appear in some frames rather than every frame in a super-frame, FRAME_INTERVAL may have the same value as an interval between contiguous frames. As an example, when a certain PLP belongs to frame 1, frame 4 and frame 7, a value of FRAME_INTERVAL may be set to 3. As another example, when a certain PLP appears in every frame, a value of FRAME_INTERVAL may be set to 1.

FIG. 138 illustrates the other portion of the time interleaving signaling information according to an embodiment of the present invention. TI signaling information may include a configurable signaling field and a dynamic signaling field. Information included in the dynamic signaling field may be described with reference to FIG. 138. The dynamic signaling field may include TI signaling information having a constant value in one frame. Information included in the dynamic signaling field may be changed for every frame. In other words, the information included in the dynamic signaling field may be changed using a frame as a unit and may not be changed in the same frame. The dynamic signaling field may be separately signaled in the S-PLP mode and the M-PLP mode according to NUM_PLP that indicates the number of PLPs.

Signaling information for an operation of the CI of the S-PLP mode may include PLP_TI_NUM_ROW, PLP_TI_START_ROW and/or PLP_TI_FECBLOCK_START. A definition of signaling will be described below in detail. Here, information of PLP_TI_NUM_ROW, PLP_TI_START_ROW, and PLP_TI_FECBLOCK_START may not be used or may not be defined when a configuration and an operation of the CI are not changed for every frame.

PLP_TI_NUM_ROW is information indicating the number of delay lines included in the CI, and each delay line may be expressed by a row.

PLP_TI_START_ROW is information indicating a start position of a switch of the time deinterleaver, and may indicate a row from which the switch starts deinterleaving in a starting part of an FEC frame. In the present specification, a switch of a deinterleaver may be expressed by a selector or a commutator. In the present specification, PLP_TI_S-TART_ROW may be expressed by LID_CI_start_row.

PLP_TI_FECBLOCK_START is information indicating a start position of a first complete FEC block in an ATSC signal frame. In the present specification, an FEC block related to the S-PLP mode may be referred to as an FEC frame, and PLP_TI_FECBLOCK_START may be expressed by L1D_CI_fecframe_start.

Signaling information necessary to operate a hybrid TI of an M-PLP mode may include PLP_NUM_BLOCKS. PLP_NUM_BLOCKS may be a field to which 8 bits are allocated. PLP_NUM_BLOCKS may indicate information that indicates the number of FEC blocks included in an interleaving frame for a current PLP. In the present specification, PLP_NUM_BLOCKS may be expressed by LID_HTI_num_fec_blocks.

FIG. 139 illustrates a time deinterleaver according to an embodiment of the present invention. In other words, FIG. 139(a) illustrates a configuration of a time deinterleaver according to a PLP mode in a broadcast signal reception system according to an embodiment of the present invention. As described in the foregoing, the time deinterleaver may include a convolutional delay line and a twisted BDI in an M-PLP mode. In the present specification, the convolutional delay line included in the time deinterleaver may perform inverse processing of the convolutional delay line included in the time interleaver. The time deinterleaver including the convolutional delay line and the twisted BDI may be referred to as a hybrid TDI. On the other hand, in an S-PLP mode, only an arbitrary CDI may be used.

A (modified) cell deinterleaver may be applied to both the S-PLP & M-PLP modes, and have the same operation and specific characteristic or a different operation and specific characteristic according to a given PLP mode.

Each block included in the TDI may operate using TI signaling information. In other words, as illustrated in the figure, the cell deinterleaver, the twisted BDI, the convolutional delay line, and the CDI included in the TDI may operate according to TI signaling information. The TI signaling information may include configurable signaling and dynamic signaling. The TI signaling information received and used by the TDI is the same as the TI signaling information transmitted by the broadcast signal transmission apparatus described above and may be received by a broadcast signal reception apparatus through L1 signaling.

FIG. 139(b) is a block diagram equivalently illustrating a time deinterleaver according to an embodiment of the present invention. The time deinterleaver may have the same configuration as that of the above-described time deinterleaver. The time deinterleaver may include a twisted BDI and a convolutional delay line in the M-PLP mode and include an arbitrary CDI in the S-PLP mode. In addition, the TDI may further include a cell deinterleaver in each PLP mode. As illustrated in the figure, TI signaling may deliver information related to operations of the cell deinterleaver, the twisted BDI, the convolutional delay line, and the CDI included in the TDI, and may include configurable signaling and dynamic signaling. In addition, when the time deinterleaver includes another deinterleaver in each PLP mode, TI signaling information may be delivered to the corresponding deinterleaver. The TI signaling information received and used by the TDI is the same as the TI signaling information transmitted by the broadcast signal transmission apparatus described above and may be received by a broadcast signal reception apparatus through L1 signaling.

FIG. 140 illustrates an operation method of a broadcast signal transmission apparatus according to an embodiment of the present invention. In S14010, the broadcast signal transmission apparatus may encode data. The broadcast signal transmission apparatus may FEC-encode PLP data which is input using a PLP as a unit. As described in the foregoing, the PLP data may be encoded using at least one of a BCH encoder and an LDPC encoder, and the encoded PLP data may be additionally interleaved by a bit interleaver or mapped by a symbol mapper using a symbol as a unit.

In S14020, the broadcast signal transmission apparatus may interleave the encoded data. The encoded PLP data may be interleaved by a time interleaver. The time interleaver may differently operate according to a PLP mode as described above. In other words, an operation of the time interleaver may be different between an S-PLP mode and an M-PLP mode, and at least one interleaver included in the time interleaver may be different between the respective modes. A detailed description may be replaced by the above description with reference to figures. The time interleaver may operate according to an interleaving parameter. Interleaving parameters referred to during time interleaving may be included in signaling information. The broadcast signal transmission apparatus may deliver the signaling information about the interleaving parameters to the broadcast signal reception apparatus through L1 signaling described above. The interleaving parameters delivered to the broadcast signal reception apparatus may be referred to during a deinterleaving operation. A detailed description about the interleaving parameters may be replaced by the above description with reference to figures.

In S14030, the broadcast signal transmission apparatus may build a signal frame including interleaved data. The broadcast signal transmission apparatus may build a broadcast signal frame including interleaved PLP data and the above-described L1 signaling information. Here, the L1 signaling information may include an interleaving parameter.

In S14040, the broadcast signal transmission apparatus may transmit the built signal frame. The broadcast signal transmission apparatus may modulate and transmit the built signal frame. The signal frame may be modulated using an OFDM modulation scheme and transmitted through an RF.

FIG. 141 illustrates an operation method of a broadcast signal reception apparatus according to an embodiment of the present invention. In S14110, the broadcast signal reception apparatus may receive a broadcast signal. The broadcast signal reception apparatus may receive the broadcast signal through an RF using a tuner. The broadcast signal reception apparatus may demodulate the received broadcast signal using an OFDM scheme.

In S14120, the broadcast signal reception apparatus may parse a signal frame included in the received broadcast signal. The broadcast signal reception apparatus may parse a signal frame obtained from the demodulated broadcast signal using a frame parser. The broadcast signal reception apparatus may acquire data included in the parsed signal frame.

In S14130, the broadcast signal reception apparatus may deinterleave the acquired data. The acquired data may be PLP data, and the broadcast signal reception apparatus may perform deinterleaving corresponding to a reverse operation of interleaving of a transmitting end. A deinterleaver included in the broadcast signal reception apparatus may perform deinterleaving with reference to an interleaving parameter included in information which is received through L1 signaling. A detailed description of a method of performing deinterleaving and the interleaving parameter may be replaced by the above description with reference to figures.

In S14140, the broadcast signal reception apparatus may decode the deinterleaved data. Time-deinterleaved PLP data may be decoded by a decoder. The time-deinterleaved PLP data may be demapped by a symbol demapper using a bit as a unit before being decoded, and bit-deinterleaved by a bit deinterleaver. Through this process, the broadcast signal reception apparatus may provide desired data to a user.

As described in the foregoing, the broadcast signal transmission apparatus and the broadcast signal reception apparatus according to the present invention may enhance robustness of a transmitted broadcast signal using time interleaving and time deinterleaving. In this way, a broadcast signal may be robust against signal attenuation and fading due to a characteristic of a radio channel, and the broadcast signal transmission apparatus may provide high-quality broadcast content to the user.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

What is claimed is:

1. A method for transmitting broadcast signals, the method comprising:
encoding service data;
time interleaving the encoded service data in a first mode or a second mode,
wherein a time interleaving of the second mode further includes:
block interleaving the encoded service data by column-wise writing at least one Forward Error Correction (FEC) block having the encoded service data in a Time Interleaving (TI) memory by using a TI block, and
diagonal-wise reading to read out cells of the TI memory;
wherein the TI block includes at least one virtual FEC block which is ahead of the at least one FEC block in the TI block, and virtual cells corresponding to the at least one virtual FEC block are skipped during the diagonal-wise reading:
building at least one signal frame including the time interleaved service data;
modulating data in the at least one signal frame by an Orthogonal Frequency Division Multiplex (OFDM) scheme; and
transmitting the broadcast signals having the modulated data,
wherein the at least one signal frame further includes signaling information indicating whether an inter-frame interleaving scheme is used in the time interleaving of the second mode.

2. The method of claim 1, wherein the time interleaving includes a convolutional interleaving which interleaves the encoded service data in the first mode.

3. The method of claim 1, wherein the time interleaving includes a cell interleaving and a convolutional interleaving which interleave the encoded service data in the second mode.

4. The method of claim 1, the method further comprising:
bit interleaving the encoded service data.

5. An apparatus for transmitting broadcast signals, the apparatus comprising:
an encoder to encode service data;
a time interleaver to interleave the encoded service data in a first mode or a second mode,
wherein a time interleaver of the second mode further includes:
a block interleaver to block interleave the encoded service data by column-wise writing at least one Forward Error Correction (FEC) block having the encoded service data in a Time Interleaving (TI) memory by using a TI block, and
diagonal-wise reading to read out cells of the TI memory;
wherein the TI block includes at least one virtual FEC block which is ahead of the at least one FEC block in the TI block, and virtual cells corresponding to the at least one virtual FEC block are skipped during the diagonal-wise reading;
a frame builder to build at least one signal frame including the time interleaved service data;
a modulator to modulate data in the at least one signal frame by an Orthogonal Frequency Division Multiplex (OFDM) scheme; and
a transmitter to transmit the broadcast signals having the modulated data,
wherein the at least one signal frame further includes signaling information indicating whether an inter-frame interleaving scheme is used in the time interleaving of the second mode.

6. The apparatus of claim 5, wherein the time interleaver includes a convolutional interleaver to interleave the encoded service data in the first mode.

7. The apparatus of claim 5, wherein the time interleaver includes a cell interleaver and a convolutional interleaver to time interleave the encoded service data in the second mode.

8. The apparatus of claim 5, the apparatus further comprising:
a bit interleaver to interleave the encoded service data.

* * * * *